US009557643B2

(12) United States Patent
Takizawa et al.

(10) Patent No.: US 9,557,643 B2

(45) Date of Patent: Jan. 31, 2017

(54) PATTERN FORMING METHOD, ACTINIC RAY-SENSITIVE OR RADIATION-SENSITIVE RESIN COMPOSITION, RESIST FILM, MANUFACTURING METHOD OF ELECTRONIC DEVICE USING THE SAME AND ELECTRONIC DEVICE

(71) Applicant: FUJIFILM Corporation, Minato-ku, Tokyo (JP)

(72) Inventors: Hiroo Takizawa, Shizuoka (JP); Tomotaka Tsuchimura, Shizuoka (JP); Takeshi Kawabata, Shizuoka (JP); Takuya Tsuruta, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 160 days.

(21) Appl. No.: 14/451,901

(22) Filed: Aug. 5, 2014

(65) Prior Publication Data

US 2014/0349224 A1 Nov. 27, 2014

Related U.S. Application Data

(63) Continuation of application No. PCT/JP2013/052969, filed on Feb. 4, 2013.

(30) Foreign Application Priority Data

Feb. 6, 2012 (JP) ................................ 2012-023386

(51) Int. Cl.

*G03F 7/038* (2006.01)
*G03F 7/004* (2006.01)
*G03F 7/039* (2006.01)
*G03F 7/32* (2006.01)
*G03F 7/20* (2006.01)

(52) U.S. Cl.

CPC ........... *G03F 7/0388* (2013.01); *G03F 7/0045* (2013.01); *G03F 7/0046* (2013.01); *G03F 7/038* (2013.01); *G03F 7/0397* (2013.01); *G03F 7/20* (2013.01); *G03F 7/2002* (2013.01); *G03F 7/325* (2013.01)

(58) Field of Classification Search

CPC .... G03F 7/0045; G03F 7/0046; G03F 7/0397; G03F 7/2002; G03F 7/038; G03F 7/0388; G03F 7/20; G03F 7/325; G03F 7/0382

USPC .... 430/18, 270.1, 286.1, 296, 311, 319, 325

See application file for complete search history.

(56) References Cited

U.S. PATENT DOCUMENTS

2002/0068236 A1 6/2002 Imai
2002/0068237 A1 6/2002 Imai
2011/0183258 A1 7/2011 Takahashi et al.
2011/0236831 A1 9/2011 Hasegawa et al.
2011/0300485 A1 12/2011 Tsubaki et al.
2013/0011785 A1 1/2013 Kato et al.
2013/0122427 A1 5/2013 Kataoka et al.

FOREIGN PATENT DOCUMENTS

JP 2002-122987 A 4/2002
JP 2005-157247 A 6/2005
JP 2009-025707 A 2/2009
JP 2009-075428 A 4/2009
JP 2010-217884 A 9/2010
JP 2011-033729 A 2/2011
JP 2011-209520 A 10/2011
JP 2011-219742 A 11/2011
JP 2011-221509 A 11/2011
KR 10-2004-0004404 A 1/2004
KR 10-2011-0107294 A 9/2011
WO 2009/022681 A1 2/2009
WO 2011/162408 A1 12/2011

OTHER PUBLICATIONS

Search Report dated Mar. 5, 2013, issued by the International Searching Authority in counterpart International Application No. PCT/JP2013/052969.
Written Opinion dated Mar. 5, 2013, issued by the International Searching Authority in counterpart International Application No. PCT/JP2013/052969.
Office Action dated May 19, 2015, issued by the Japanese Patent Office in counterpart Japanese Application No. 2012-023386.
Office Action issued on Apr. 26, 2016, by the Taiwanese Patent Office in counterpart Taiwanese Application No. 102104643.
Office Action dated Mar. 7, 2016, issued by the Korean Intellectual Property Office in corresponding Korean Application No. 10-2014-7022075.
Office Action dated Aug. 15, 2016, issued by the Taiwanese Patent Office in counterpart Taiwanese Application No. 102104643.
Office Action dated Aug. 23, 2016 issued by the Korean Intellectual Property Office in corresponding Korean Application No. 10-2014-7022075.
Office Action dated Oct. 17, 2016 issued by the Korean Intellectual Property Office in counterpart Korean Patent Application No. 10-2014-7022075.

*Primary Examiner* — John A McPherson

(74) *Attorney, Agent, or Firm* — Sughrue Mion, PLLC

(57) ABSTRACT

There is provided a pattern forming method comprising (1) a step of forming a film by using an actinic ray-sensitive or radiation-sensitive resin composition containing (A) a resin containing an acid-decomposable repeating unit and being capable of decreasing the solubility for an organic solvent-containing developer by the action of an acid, (B) a compound capable of generating an acid upon irradiation with an actinic ray or radiation, (C) a compound capable of decomposing by the action of an acid to generate an acid, and (D) a solvent; (2) a step of exposing the film by using an actinic ray or radiation, and (4) a step of developing the exposed film by using an organic solvent-containing developer to form a negative pattern.

14 Claims, No Drawings

PATTERN FORMING METHOD, ACTINIC RAY-SENSITIVE OR RADIATION-SENSITIVE RESIN COMPOSITION, RESIST FILM, MANUFACTURING METHOD OF ELECTRONIC DEVICE USING THE SAME AND ELECTRONIC DEVICE

CROSS REFERENCE TO RELATED APPLICATION

This is a continuation of International Application No. PCT/JP2013/052969 filed on Feb. 4, 2013, and claims priority from Japanese Patent Application No. 2012-023386 filed on Feb. 6, 2012, the entire disclosures of which are incorporated therein by reference.

TECHNICAL FIELD

The present invention relates to a pattern forming method using a developer containing an organic solvent, an actinic ray-sensitive or radiation-sensitive resin composition, and a resist film, which are suitably used for the ultramicrolithography process such as production of VLSI or high-capacity microchip or in other photofabrication processes, and also relates to a manufacturing method of an electronic device using the same, and an electronic device. More specifically, the present invention relates to a resist pattern forming method using a developer containing an organic solvent, an actinic ray-sensitive or radiation-sensitive resin composition, and a resist film, which can be suitably used for semiconductor microfabrication employing an actinic ray or radiation, and also relates to a manufacturing method of an electronic device using the same, and an electronic device.

BACKGROUND ART

In the process of producing a semiconductor device such as IC and LSI, microfabrication by lithography using a photoresist composition has been conventionally performed. Recently, with the increase in integration degree of an integrated circuit, formation of an ultrafine pattern in the sub-micron or quarter-micron region is required. To cope with this requirement, the exposure wavelength also tends to become shorter, for example, from g line to i line or further to KrF excimer laser light. At present, other than the excimer laser light, development of lithography using electron beam, X-ray or EUV light is also proceeding.

The lithography using electron beam, X-ray or EUV light is positioned as a next-generation or next-next-generation pattern formation technology, and a high-sensitivity and high-resolution resist composition is being demanded.

Among others, elevation of the sensitivity is a very important task so as to shorten the wafer processing time, but when higher sensitivity is sought for, the pattern profile or the resolution indicated by the limiting resolution line width is deteriorated, and development of a resist composition satisfying all of these properties at the same time is strongly demanded.

High sensitivity is in a trade-off relationship with high resolution and good pattern profile, and it is very important how to satisfy all of these properties at the same time.

The actinic ray-sensitive or radiation-sensitive resin composition generally includes "a positive type" using a resin sparingly soluble or insoluble in an alkali developer, where the exposed area is solubilized in an alkali developer upon exposure to radiation and a pattern is thereby formed, and "a negative type" using a resin soluble in an alkali developer, where the exposed area is sparingly solubilized or insolubilized in an alkali developer upon exposure to radiation and a pattern is thereby formed.

As the actinic ray-sensitive or radiation-sensitive resin composition suitable for such a lithography process using electron beam, X-ray or EUV light, a chemical amplification positive resist composition utilizing an acid catalytic reaction is mainly studied from the standpoint of elevating the sensitivity, and a chemical amplification positive resist composition using, as the main component, a phenolic resin having a property of being insoluble or sparingly soluble in an alkali developer but becoming soluble in an alkali developer by the action of an acid (hereinafter simply referred to as a "phenolic acid-decomposable resin"), and containing an acid generator is being effectively used.

Also, in order to provide a chemical amplification resist composition remarkably improved in the photosensitive speed by amplifying a photochemical reaction, it is known to use, together with the above-described acid generator, an acid-increasing agent capable of newly generating an acid (for example, a sulfonic acid) by the action of an acid generated from the acid generator (see, for example, JP-A-2011-33729 (the term "JP-A" as used herein means an "unexamined published Japanese patent application")).

On the other hand, in the production of a semiconductor device or the like, patterns having various profiles such as line, trench and hole need to be formed. For meeting the requirement to form patterns having various profiles, not only a positive composition but also a negative actinic ray-sensitive or radiation-sensitive resin composition are under development and, for example, in forming a fine pattern having a line width of 50 nm or less, more improvements are demanded on the reduction of resolution and the pattern profile.

In order to solve this problem, there has been also proposed a method where an acid-decomposable resin is developed using an organic developer other than an alkali developer (see, for example, JP-A-2010-217884).

However, it is demanded to satisfy all of high sensitivity, high resolution and high line width roughness (LWR) performance at a high level, for example, in the fine region where the line width is 50 nm or less.

SUMMARY OF INVENTION

An object of the present invention is to provide a pattern forming method, an actinic ray-sensitive or radiation-sensitive resin composition, and a resist film, ensuring that in the microfabrication such as formation of a fine pattern for a semiconductor device, particularly, in the negative pattern formation by organic development, high sensitivity, high resolution and excellent line width roughness (LWR) performance are achieved, and also provide a manufacturing method of an electronic device using the same, and an electronic device.

That is, the present invention is as follows.

[1] A pattern forming method comprising:

(1) a step of forming a film by using an actinic ray-sensitive or radiation-sensitive resin composition containing (A) a resin containing an acid-decomposable repeating unit and being capable of decreasing the solubility for an organic solvent-containing developer by the action of an acid, (B) a compound capable of generating an acid upon irradiation with an actinic ray or radiation, (C) a compound capable of decomposing by the action of an acid to generate an acid, and (D) a solvent, (2) a step of exposing the film by using an actinic ray or radiation, and (4) a step of developing the exposed film by using an organic solvent-containing developer to form a negative pattern.

[2] The pattern forming method as described in [1], wherein the (C) compound capable of decomposing by the action of an acid to generate an acid is a compound represented by any one of the following formulae (1) to (8):

Formula (1)

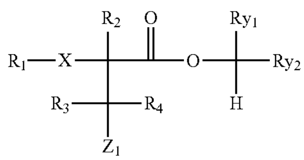

Formula (2)

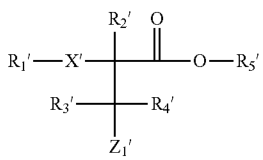

Formula (3)

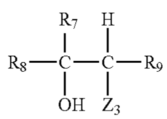

Formula (4)

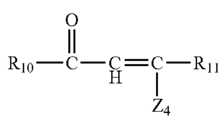

Formula (5)

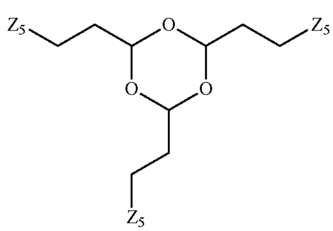

Formula (6)

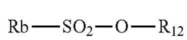

Formula (7)

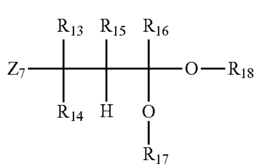

Formula (8)

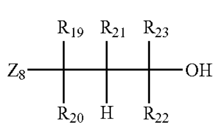

wherein in formula (1), $R_1$ represents an alkyl group, a cycloalkyl group, an alkoxy group, an aryl group or an aryloxy group, $R_2$ represents an alkyl group or a cycloalkyl group, $R_1$ and $R_2$ may combine to form a monocyclic or polycyclic cyclic hydrocarbon structure, each of $R_3$ and $R_4$ independently represents a hydrogen atom or an alkyl group, $Ry_1$ represents a hydrogen atom, an alkyl group, a cycloalkyl group, an alkoxy group, an aryl group, or an alkylene group combining with $Ry_2$, $Ry_2$ represents an aryl group or an aryloxy group, and X represents —$SO_2$—, —SO— or —CO—;

in formula (2), $R_1$' represents an alkyl group, a cycloalkyl group, an alkoxy group, an aryl group or an aryloxy group, $R_2$' represents an alkyl group or a cycloalkyl group, $R_1$' and $R_2$' may combine to form a monocyclic or polycyclic cyclic hydrocarbon structure, each of $R_3$' and $R_4$' independently represents a hydrogen atom or an alkyl group, $R_5$' represents an aryl group-free group capable of leaving by the action of an acid, and X' represents —$SO_2$—, —SO— or —CO—;

in formulae (3) to (6),

Rb represents an alkyl group, a cycloalkyl group, an aryl group or an aralkyl group, $R_7$ represents a hydrogen atom, an alkyl group, a cycloalkyl group, an aryl group or an aralkyl group, $R_8$ represents an alkyl group, a cycloalkyl group, an aryl group or an aralkyl group, $R_9$ represents a hydrogen atom, an alkyl group, a cycloalkyl group, an aryl group or an aralkyl group, $R_9$ may combine with $R_7$ to form a ring, $R_{10}$ represents an alkyl group, a cycloalkyl group, an alkoxy group, an aryl group, an aralkyl group, an aryloxy group or an alkenyloxy group, $R_{11}$ represents an alkyl group, a cycloalkyl group, an alkoxy group, an aryl group, an aralkyl group, an aryloxy group or an alkenyl group, $R_{10}$ and $R_{11}$ may combine with each other to form a ring, and $R_{12}$ represents an alkyl group, a cycloalkyl group, an aryl group, an alkenyl group, an alkynyl group or a cyclic imide group;

in formulae (7) and (8), each of $R_{13}$ to $R_{16}$ and $R_{19}$ to $R_{23}$ represents a hydrogen atom or a monovalent substituent, each of $R_{17}$ and $R_{18}$ represents a monovalent substituent, and $R_{17}$ and $R_{18}$ may combine with each other to form a ring; and in formulae (1) to (5), (7) and (8), each of $Z_1$, $Z_1$', $Z_3$, $Z_4$, $Z_5$, $Z_7$ and $Z_8$ is independently a group represented by any one of the following formulae (Z-a) to (Z-d), and each $Z_5$ may be the same as or different from every other $Z_5$:

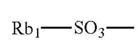

(Z-a)

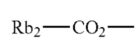

(Z-b)

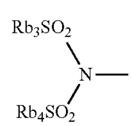

(Z-c)

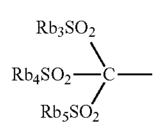

(Z-d)

wherein in formulae (Z-a) to (Z-d), each of $Rb_1$ and $Rb_2$ independently represents an organic group, each of $Rb_3$, $Rb_4$ and $Rb_5$ independently represents an organic group, and $Rb_3$ and $Rb_4$ may combine to form a ring.

[3] The pattern forming method as described in [2], wherein in formulae (1) to (5), (7) and (8), each of $Z_1$, $Z_1'$, $Z_3$, $Z_4$, $Z_5$, $Z_7$ and $Z_8$ is independently a group ($Rb_1$—$SO_3$—) represented by formula (Z-a).

[4] The pattern forming method as described in [2] or [3], wherein the (C) compound capable of decomposing by the action of an acid to produce an acid is a compound represented by formula (1), (2), (7) or (8).

[5] The pattern forming method as described in any one of [1] to [4], wherein the resin (A) further contains a repeating unit having a polar group.

[6] The pattern forming method as described in [5], wherein the polar group is selected from a hydroxyl group, a cyano group, a lactone group, a carboxylic acid group, a sulfonic acid group, an amide group, a sulfonamide group, an ammonium group, a sulfonium group, and a group formed by combining two or more thereof.

[7] The pattern forming method as described in any one of [1] to [6], wherein the resin (A) further contain a repeating unit having an acidic group.

[8] The pattern forming method as described in [7], wherein the acidic group is a phenolic hydroxyl group, a carboxylic acid group, a sulfonic acid group, a fluorinated alcohol group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group or a tris (alkylsulfonyl)methylene group.

[9] The pattern forming method as described in any one of [1] to [8], wherein the actinic ray-sensitive or radiation-sensitive resin composition further contains a hydrophobic resin.

[10] The pattern forming method as described in any one of [1] to [9], wherein the exposure is an exposure to an electron beam, an X-ray or EUV light.

[11] The pattern forming method as described in any one of [1] to [10], which is used for making a semiconductor fine circuit.

[12] An actinic ray-sensitive or radiation-sensitive resin composition used for the pattern forming method described in any one of [1] to [11].

[13] A resist film formed using the actinic ray-sensitive or radiation-sensitive resin composition described in [12].

[14] A method for manufacturing an electronic device, comprising the pattern forming method described in any one of [1] to [11].

[15] An electronic device manufactured by the manufacturing method of an electronic device described in [14].

The present invention preferably further includes the following configurations.

[16] The pattern forming method as described in any one of [2] to [10], wherein in formula (Z-a), $Rb_1$ is an alkyl group, a cycloalkyl group, an aryl group, or a group formed by connecting a plurality of these members through a single bond, —O—, —$CO_2$—, —S—, —$SO_3$— or —$SO_2N(Rc_1)$- (wherein $Rc_1$ represents a hydrogen atom or an alkyl group).

[17] The pattern forming method as described in [4], wherein the (C) compound capable of decomposing by the action of an acid to generate an acid is a compound represented by formula (7) or (8).

[18] The pattern forming method as described in any one of [2] to [10], [16] and [17], wherein in formula (7), each of $R_{13}$ to $R_{16}$ is independently a hydrogen atom, an alkyl group, a cycloalkyl group or an aryl group and $R_{17}$ and $R_{18}$ are combined with each other to form a cyclic acetal structure.

[19] The pattern forming method as described in any one of [2] to [10], [16] and [17], wherein in formula (8), each of $R_{19}$ to $R_{23}$ is independently a hydrogen atom, an alkyl group, a cycloalkyl group, an aryl group, an aralkyl group, an alkoxy group, an aryloxy group or an alkenyloxy group.

[20] The pattern forming method as described in any one of [1] to [10] and [16] to [19], wherein the acid generated from the (C) compound capable of decomposing by the action of an acid to generate an acid is a sulfonic acid having a volume of 240 $Å^3$ or more.

According to the present invention, a pattern forming method, an actinic ray-sensitive or radiation-sensitive resin composition, and a resist film, ensuring that in the negative pattern formation by organic solvent development, high sensitivity, high resolution and excellent LWR performance are achieved, can be provided, and a manufacturing method of an electronic device using the same, and an electronic device, can be also provided.

DESCRIPTION OF EMBODIMENTS

The mode for carrying out the present invention is described below.

In the description of the present invention, when a group (atomic group) is denoted without specifying whether substituted or unsubstituted, the group encompasses both a group having no substituent and a group having a substituent. For example, "an alkyl group" encompasses not only an alkyl group having no substituent (unsubstituted alkyl group) but also an alkyl group having a substituent (substituted alkyl group).

In the description of the present invention, the "actinic ray" or "radiation" means, for example, a bright line spectrum of mercury lamp, a far ultraviolet ray typified by excimer laser, an extreme-ultraviolet ray (EUV light), an X-ray or an electron beam (EB). Also, in the present invention, the "light" means an actinic ray or radiation.

Furthermore, in the description of the present invention, unless otherwise indicated, the "exposure" encompasses not only exposure to a mercury lamp, a far ultraviolet ray typified by excimer laser, an extreme ultraviolet ray, an X-ray, EUV light or the like but also lithography with a particle beam such as electron beam and ion beam.

[Pattern Forming Method]

The pattern forming method of the present invention is described below.

The pattern forming method of the present invention comprises: (1) a step of forming a film by using an actinic ray-sensitive or radiation-sensitive resin composition containing (A) a resin containing an acid-decomposable repeating unit and being capable of decreasing the solubility for an organic solvent-containing developer by the action of an acid, (B) a compound capable of generating an acid upon irradiation with an actinic ray or radiation, (C) a compound capable of decomposing by the action of an acid to generate an acid, and (D) a solvent; (2) a step of exposing the film by using an actinic ray or radiation, and (4) a step of developing the exposed film by using an organic solvent-containing developer to form a negative pattern.

The reason why according to the pattern forming method of the present invention using (C) a compound capable of decomposing by the action of an acid to generate an acid, high sensitivity, high resolution and excellent LWR performance are achieved in the negative pattern formation by organic solvent development is not clearly known but is presumed as follows.

In the method of performing development by using an organic solvent-containing developer (hereinafter, sometimes referred to as an organic developer) to form a negative pattern, the acid-decomposable group in the resin (A) decomposes by the action of an acid generated from the compound (B) (hereinafter, sometimes referred to as an acid generator) upon exposure, as a result, the polarity of the resin (A) is increased and the solubility for an organic developer is decreased.

Subsequently, the resist film is developed using an organic developer, whereby the unexposed area is removed and a pattern is formed.

In the method of performing development by using an organic developer to form a negative pattern, it has been a problem that the contrast in dissolution for an organic developer between the exposed area and the unexposed area in a resist film is low.

In the present invention, the compound (C) is decomposed by the action of an acid generated from the acid generator and further generates an acid, whereby the amount of the acid generated is amplified in the exposed area of the resist film. This is presumed to produce an effect that the decomposition of the acid-decomposable group of the resin (A) is enhanced in the exposed area of the resist film and the contrast in dissolution for an organic developer between the exposed area and the unexposed is increased, as a result, LWR and resolution are improved.

Among others, in the method of forming a negative pattern through exposure to an electron beam, an X-ray, EUV light or the like, the amount of the acid generated from the acid generator upon exposure is disadvantageously small.

In the present invention, it is presumed that since the amount of the acid generated is amplified as described above, a shortage of the amount of the acid generated is eliminated and the sensitivity, LWR and resolution are improved.

Also, for example, in the case of forming a line-and-space pattern where the line width is 50 nm or less and the ratio between the line width and the space width is 1:1, a stronger capillary force is readily generated in the channel of the formed fine space during development and at the discharging of the developer from the fine space channel, the capillary force is applied on sidewalls of the pattern having a fine line width. In the case of forming a positive pattern by using an alkali developer, it is considered that since the affinity of the pattern using a resin as the main component for the alkali developer tends to be low, the capillary force applied on the sidewall of the pattern is large and the resolution and LWR are liable to be deteriorated.

On the other hand, in the case of forming a negative pattern by using an organic developer as in the present invention, it is considered that since the affinity of the pattern using a resin as the main component for the organic developer tends to be high, the capillary force applied on the sidewall of the pattern is small and the resolution and LWR performance are improved.

(1) Film Formation

The resist film of the present invention is a film formed of the above-described actinic ray-sensitive or radiation-sensitive resin composition.

More specifically, respective components described later of the actinic ray-sensitive or radiation-sensitive resin composition are dissolved in a solvent, and the solution is filtered through a filter, if desired, and then coated on a support (substrate), whereby the resist film can be formed. The filter is preferably a polytetrafluoroethylene-, polyethylene- or nylon-made filter having a pore size of 0.1 μm or less, more preferably 0.05 μm or less, still more preferably 0.03 μm or less.

The composition is coated on such a substrate as used in the production of an integrated circuit device (for example, a silicon- or silicon dioxide-coated substrate) by an appropriate coating method such as spin coater and then dried to form a photosensitive film. In the drying stage, heating (prebaking) is preferably performed.

The film thickness is not particularly limited but is preferably adjusted to a range of 10 to 500 nm, more preferably from 10 to 200 nm, still more preferably from 10 to 80 nm. In the case of coating the actinic ray-sensitive or radiation-sensitive resin composition by a spinner, the rotation speed of the spinner is usually from 500 to 3,000 rpm, preferably from 800 to 2,000 rpm, more preferably from 1,000 to 1,500 rpm.

The heating (prebaking) is preferably performed at a temperature of 60 to 200° C., more preferably at 80 to 150° C., still more preferably at 90 to 140° C.

The heating (prebaking) time is not particularly limited but is preferably from 30 to 300 seconds, more preferably from 30 to 180 seconds, still more preferably from 30 to 90 seconds.

The heating may be performed by means of a device usually attached to an exposure/developing machine or may be also performed using a hot plate or the like.

If desired, a commercially available inorganic or organic antireflection film may be used. Also, an antireflection film may be used by coating it as an underlying layer of the actinic ray-sensitive or radiation-sensitive resin composition. The antireflection film which can be used may be either an inorganic film type such as titanium, titanium dioxide, titanium nitride, chromium oxide, carbon and amorphous silicon, or an organic film type composed of a light absorber and a polymer material. Furthermore, a commercially available organic antireflection film such as DUV30 Series and DUV-40 Series produced by Brewer Science, Inc., or AR-2, AR-3 and AR-5 produced by Shipley Co., Ltd., can be used as the organic antireflection film.

(2) Exposure

The light source used for the exposure apparatus in the present invention is not limited in its wavelength, but examples of the radiation include infrared light, visible light, ultraviolet light, far ultraviolet light, extreme-ultraviolet light (EUV light), X-ray and electron beam (EB). The radiation is preferably far ultraviolet light having a wavelength of 250 nm or less, more preferably 220 nm or less, still more preferably from 1 to 200 nm, and specific examples thereof include a KrF excimer laser (248 nm), an ArF excimer laser (193 nm), an $F_2$ excimer laser (157 nm), an X-ray, EUV (13 nm), and an electron beam (EB). Among these, a KrF excimer laser, an ArF excimer laser, an X-ray, EUV light and electron beam are preferred, and an electron beam, an X-ray and EUV light are more preferred.

In the case of using an exposure light source that emits an extreme ultraviolet ray (EUV light) or the like, the film formed is preferably irradiated with EUV light (near 13 nm) through a predetermined mask. In the case of irradiation with an electron beam (EB), lithography without the intervention of a mask (direct lithography) is the common practice.

(3) Baking

After the exposure, baking (heating) is preferably performed before performing development.

The heating is preferably performed at a temperature of 60 to 150° C., more preferably at 80 to 150° C., still more preferably at 90 to 140° C.

The heating time is not particularly limited but is preferably from 30 to 300 seconds, more preferably from 30 to 180 seconds, still more preferably from 30 to 90 seconds.

The heating may be performed by means of a device usually attached to an exposure/developing machine or may be also performed using a hot plate or the like.

The reaction of the exposed area is accelerated by the baking and in turn, the sensitivity or pattern profile is improved. It is also preferred to contain a heating step (post-baking) after the rinsing step. The heating temperature and the heating time are as described above. By the baking, the developer and rinsing solution remaining between patterns and in the inside of the pattern are removed.

(4) Development

In the present invention, development is performed using a developer containing an organic solvent.

Developer:

The vapor pressure of the developer (in the case of a mixed solvent, the vapor pressure as a whole) is, at 20° C., preferably 5 kPa or less, more preferably 3 kPa or less, still more preferably 2 kPa or less. By setting the vapor pressure of the organic solvent to 5 kPa or less, evaporation of the developer on a substrate or in a development cup is suppressed and the temperature uniformity in the wafer plane is enhanced, as a result, the dimensional uniformity in the wafer plane is improved.

As the organic solvent used for the developer, various organic solvents may be widely used but, for example, a solvent such as ester-based solvent, ketone-based solvent, alcohol-based solvent, amide-based solvent, ether-based solvent and hydrocarbon-based solvent may be used.

In the present invention, the ester-based solvent is a solvent having an ester group in the molecule; the ketone-based solvent is a solvent having a ketone group in the molecule; the alcohol-based solvent is a solvent having an alcoholic hydroxyl group in the molecule; the amide-based solvent is a solvent having an amide group in the molecule; and the ether-based solvent is a solvent having an ether bond in the molecule. Some of these solvents have a plurality of kinds of the above-described functional groups per molecule, and in such a case, the solvent comes under all of solvent species containing the functional group that is contained in the solvent. For example, diethylene glycol monomethyl ether comes under both of the alcohol-based solvent and the ether-based solvent in the categories above. Also, the hydrocarbon-based solvent means a hydrocarbon solvent not having a substituent.

Above all, a developer containing at least one kind of a solvent selected from a ketone-based solvent, an ester-based solvent, an alcohol-based solvent and an ether-based solvent is preferred.

Examples of the ester-based solvent include methyl acetate, ethyl acetate, butyl acetate, pentyl acetate, isopropyl acetate, amyl acetate, isoamyl acetate, ethyl methoxyacetate, ethyl ethoxyacetate, propylene glycol monomethyl ether acetate (PGMEA; another name: 1-methoxy-2-acetoxypropane), ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, diethylene glycol monoethyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl-3-methoxypropionate, ethyl-3-methoxypropionate, ethyl-3-ethoxypropionate, and propyl-3-methoxypropionate.

Examples of the ketone-based solvent include 1-octanone, 2-octanone, 1-nonanone, 2-nonanone, acetone, 2-heptanone, 4-heptanone, 1-hexanone, 2-hexanone, diisobutyl ketone, cyclohexanone, methylcyclohexanone, phenylacetone, methyl ethyl ketone, methyl isobutyl ketone, acetylacetone, acetonylacetone, ionone, diacetonyl alcohol, acetylcarbinol, acetophenone, methyl naphthyl ketone, isophorone, propylene carbonate, and γ-butyrolactone.

Examples of the alcohol-based solvent include an alcohol such as methyl alcohol, ethyl alcohol, n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol, n-decanol and 3-methoxy-1-butanol; a glycol-based solvent such as ethylene glycol, diethylene glycol and triethylene glycol; and a hydroxyl group-containing glycol ether-based solvent such as ethylene glycol monomethyl ether, propylene glycol monomethyl ether (PGME; another name: 1-methoxy-2-propanol), diethylene glycol monomethyl ether, triethylene glycol monoethyl ether, methoxymethyl butanol, ethylene glycol monoethyl ether, ethylene glycol monopropyl ether, ethylene glycol monobutyl ether, propylene glycol monoethyl ether, propylene glycol monopropyl ether, propylene glycol monobutyl ether and propylene glycol monophenyl ether. Among these, a glycol ether-based solvent is preferably used.

Examples of the ether-based solvent include, in addition to the hydroxyl group-containing glycol ether-based solvents above, a hydroxyl group-free glycol ether-based solvent such as propylene glycol dimethyl ether, propylene glycol diethyl ether, diethylene glycol dimethyl ether and diethylene glycol diethyl ether; an aromatic ether solvent such as anisole and phenetole; dioxane; tetrahydrofuran; tetrahydropyrane; perfluoro-2-butyltetrahydrofuran; perfluorotetrahydrofuran; and 1,4-dioxane. A glycol ether-based solvent or an aromatic ether solvent such as anisole is preferably used.

Examples of the amide-based solvent which can be used include N-methyl-2-pyrrolidone, N,N-dimethylacetamide, N,N-dimethylformamide, hexamethylphosphoric triamide and 1,3-dimethyl-2-imidazolidinone.

Examples of the hydrocarbon-based solvent include an aliphatic hydrocarbon-based solvent such as pentane, hexane, octane, decane, 2,2,4-trimethylpentane, 2,2,3-trimethylhexane, perfluorohexane and perfluoroheptane, and an aromatic hydrocarbon-based solvent such as toluene, xylene, ethylbenzene, propylbenzene, 1-methylpropylbenzene, 2-methylpropylbenzene, dimethylbenzene, diethylbenzene, ethylmethylbenzene, trimethylbenzene, ethyldimethylbenzene and dipropylbenzene. Among these, an aromatic hydrocarbon-based solvent is preferred.

A plurality of these solvents may be mixed, or the solvent may be mixed with a solvent other than those described above or with water and used. However, in order to sufficiently bring out the effects of the present invention, the percentage of water content in the entire developer is preferably less than 10 mass %, and it is more preferred to contain substantially no water. (In this specification, mass ratio is equal to weight ratio.)

The concentration of the organic solvent (in the case of mixing a plurality of kinds of organic solvents, the total concentration) in the developer is preferably 50 mass % or more, more preferably 70 mass % or more, still more preferably 90 mass % or more. Above all, the developer is preferably composed of substantially only an organic solvent. The expression “composed of substantially only an organic solvent” encompasses a case containing a slight amount of a surfactant, an antioxidant, a stabilizer, a defoaming agent or the like.

Among the solvents above, it is more preferred to contain one or more selected from the group consisting of butyl acetate, pentyl acetate, isopentyl acetate, propylene glycol monomethyl ether acetate and anisole.

The organic solvent used as the developer may be suitably an ester-based solvent.

The ester-based solvent used here is preferably a solvent represented by formula (S1) described below or a solvent represented by formula (S2) described below, more preferably a solvent represented by formula (S1), still more preferably an alkyl acetate, and most preferably butyl acetate, pentyl acetate or isopentyl acetate.

R—C(=O)—O—R' Formula (S1)

In formula (S1), each of R and R' independently represents a hydrogen atom, an alkyl group, a cycloalkyl group, an alkoxyl group, an alkoxycarbonyl group, a carboxyl group, a hydroxyl group, a cyano group or a halogen atom. R and R' may combine with each other to form a ring.

The carbon number of the alkyl group, alkoxy group and alkoxycarbonyl group of R and R' is preferably from 1 to 15, and the carbon number of the cycloalkyl group is preferably from 3 to 15.

Each of R and R' is preferably a hydrogen atom or an alkyl group, and the alkyl group, cycloalkyl group, alkoxyl group and alkoxycarbonyl group of R and R' and the ring formed by combining R and R' with each other may be substituted with a hydroxyl group, a carbonyl group-containing group (such as acyl group, aldehyde group and alkoxycarbonyl group), a cyano group or the like.

Examples of the solvent represented by formula (S1) include methyl acetate, butyl acetate, ethyl acetate, isopropyl acetate, amyl acetate, isoamyl acetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, and ethyl 2-hydroxypropionate.

Among these, a solvent where R and R' are an unsubstituted alkyl group is preferred.

The solvent represented by formula (S1) is preferably an alkyl acetate, more preferably butyl acetate, pentyl acetate or isopentyl acetate.

The solvent represented by formula (S1) may be used in combination with one or more other organic solvents. In this case, the combined solvent is not particularly limited as long as it can be mixed with the solvent represented by formula (S1) without causing separation, and the solvents represented by formula (S1) may be used in combination or the solvent represented by formula (S1) may be used by mixing it with a solvent selected from other ester-based, ketone-based, alcohol-based, amide-based, ether-based and hydrocarbon-based solvents. As for the combined solvent, one or more kinds of solvents may be used, but from the standpoint of obtaining a stable performance, it is preferred to use one kind of a solvent. In the case where one kind of a combined solvent is mixed and used, the mixing ratio between the solvent represented by formula (S1) and the combined solvent is, in mass ratio, usually from 20:80 to 99:1, preferably from 50:50 to 97:3, more preferably from 60:40 to 95:5, and most preferably from 60:40 to 90:10.

R''—C(=O)—O—R'''—O—R'''' Formula (S2)

In formula (S2), each of R'' and R'''' independently represents a hydrogen atom, an alkyl group, a cycloalkyl group, an alkoxyl group, an alkoxycarbonyl group, a carboxyl group, a hydroxyl group, a cyano group or a halogen atom, and R'' and R'''' may combine with each other to form a ring.

Each of R'' and R'''' is preferably a hydrogen atom or an alkyl group. The carbon number of the alkyl group, alkoxyl group and alkoxycarbonyl group of R'' and R'''' is preferably from 1 to 15, and the carbon number of the cycloalkyl group is preferably from 3 to 15.

R''' represents an alkylene group or a cycloalkylene group. R''' is preferably an alkylene group. The carbon number of the alkylene group of R''' is preferably from 1 to 10, and the carbon number of the cycloalkylene group of R''' is preferably from 3 to 10.

The alkyl group, cycloalkyl group, alkoxyl group and alkoxycarbonyl group of R'' and R'''', the alkylene group and cycloalkylene group of R''', and the ring formed by combining R'' and R'''' with each other may be substituted with a hydroxyl group, a carbonyl group-containing group (such as acyl group, aldehyde group and alkoxycarbonyl group), a cyano group or the like.

In formula (S2), the alkylene group of R''' may have an ether bond in the alkylene chain.

Examples of the solvent represented by formula (S2) include propylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monophenyl ether acetate, diethylene glycol monobutyl ether acetate, diethylene glycol monoethyl ether acetate, propylene glycol monoethyl ether acetate, propylene glycol monopropyl ether acetate, methyl-3-methoxypropionate, ethyl-3-methoxypropionate, ethyl-3-ethoxypropionate, propyl-3-methoxypropionate, ethyl methoxyacetate, ethyl ethoxyacetate, 2-methoxybutyl acetate, 3-methoxybutyl acetate, 4-methoxybutyl acetate, 3-methyl-3-methoxybutyl acetate, 3-ethyl-3-methoxybutyl acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, and 4-methyl-4-methoxypentyl acetate, with propylene glycol monomethyl ether acetate being preferred.

Among others, a solvent where R" and R"" are an unsubstituted alkyl group and R"' is an unsubstituted alkylene group is preferred, a solvent where R" and R"" are either a methyl group or an ethyl group is more preferred, and a solvent where R" and R"" are a methyl group is still more preferred.

The solvent represented by formula (S2) may be used in combination with one or more other organic solvents. In this case, the combined solvent is not particularly limited as long as it can be mixed with the solvent represented by formula (S2) without causing separation, and the solvents represented by formula (S2) may be used in combination or the solvent represented by formula (S2) may be used by mixing it with a solvent selected from other ester-based, ketone-based, alcohol-based, amide-based, ether-based and hydrocarbon-based solvents. As for the combined solvent, one or more kinds of solvents may be used, but from the standpoint of obtaining a stable performance, it is preferred to use one kind of a solvent. In the case where one kind of a combined solvent is mixed and used, the mixing ratio between the solvent represented by formula (S2) and the combined solvent is, in mass ratio, usually from 20:80 to 99:1, preferably from 50:50 to 97:3, more preferably from 60:40 to 95:5, and most preferably from 60:40 to 90:10.

The organic solvent used as the developer may be also suitably an ether-based solvent.

The ether-based solvent which can be used includes the ether-based solvents described above. Among these, an ether-based solvent containing one or more aromatic rings is preferred, a solvent represented by the following formula (S3) is more preferred, and anisole is most preferred.

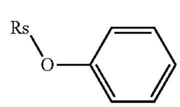

(S3)

In formula (S3), Rs represents an alkyl group. The alkyl group is preferably an alkyl group having a carbon number of 1 to 4, more preferably a methyl group or an ethyl group, and most preferably a methyl group.

In the present invention, the percentage of water content in the developer is usually 10 mass % or less, preferably 5 mass % or less, more preferably 1 mass % or less, and it is most preferred to contain substantially no water.

Surfactant:

Into the developer containing an organic solvent, an appropriate amount of a surfactant can be incorporated, if desired.

As the surfactant, the same as the later-described surfactant used in the actinic ray-sensitive or radiation-sensitive resin composition may be used.

The amount of the surfactant used is usually from 0.001 to 5 mass %, preferably from 0.005 to 2 mass %, more preferably from 0.01 to 0.5 mass %, based on the total amount of the developer.

Developing Method:

As the developing method, for example, a method of dipping the substrate in a bath filled with the developer for a fixed time (dipping method), a method of raising the developer on the substrate surface by the effect of a surface tension and keeping it still for a fixed time, thereby performing the development (puddle method), a method of spraying the developer on the substrate surface (spraying method), and a method of continuously ejecting the developer on the substrate spinning at a constant speed while scanning the developer ejecting nozzle at a constant rate (dynamic dispense method) may be applied.

Also, after the step of performing development, a step of stopping the development while replacing the developer with another solvent may be practiced.

The development time is not particularly limited as long as it is long enough to sufficiently dissolve the resin of the unexposed area, and the development time is usually from 10 to 300 seconds, preferably from 20 to 120 seconds.

The temperature of the developer is preferably from 0 to 50° C., more preferably from 15 to 35° C.

(5) Rinsing

The pattern forming method of the present invention may contain (5) a step of rinsing the film by using a rinsing solution containing an organic solvent, after the development step (4).

Rinsing Solution:

The vapor pressure of the rinsing solution (in the case of a mixed solvent, the vapor pressure as a whole) used after development is, at 20° C., preferably from 0.05 to 5 kPa, more preferably from 0.1 to 5 kPa, and most preferably from 0.12 to 3 kPa. By setting the vapor pressure of the rinsing solution to from 0.05 to 5 kPa, the temperature uniformity in the wafer plane is enhanced and swelling ascribable to permeation of the rinsing solution is suppressed, as a result, the dimensional uniformity in the wafer plane is improved.

As the rinsing solution, various organic solvents may be used, but it is preferred to use a rinsing solution containing at least one kind of an organic solvent selected from a hydrocarbon-based solvent, a ketone-based solvent, an ester-based solvent, an alcohol-based solvent, an amide-based solvent and an ether-based solvent, or water.

More preferably, a step of washing the film by using a rinsing solution containing at least one kind of an organic solvent selected from a ketone-based solvent, an ester-based solvent, an alcohol-based solvent, an amide-based solvent and a hydrocarbon-based solvent is preformed after development. Still more preferably, a step of washing the film by using a rinsing solution containing an alcohol-based solvent or a hydrocarbon-based solvent is preformed after development.

Among others, a rinsing solution containing at least one or more members selected from the group consisting of a monohydric alcohol-based solvent and a hydrocarbon-based solvent is preferably used.

The monohydric alcohol used in the rinsing step after development includes a linear, branched or cyclic monohydric alcohol, and specific examples of the monohydric alcohol which can be used include 1-butanol, 2-butanol, 3-methyl-1-butanol, tert-butyl alcohol, 1-pentanol, 2-pentanol, 1-hexanol, 1-heptanol, 1-octanol, 2-hexanol, 2-heptanol, 2-octanol, 3-hexanol, 3-heptanol, 3-octanol, 4-octanol, 3-methyl-3-pentanol, cyclopentanol, 2,3-dimethyl-2-butanol, 3,3-dimethyl-2-butanol, 2-methyl-2-pentanol, 2-methyl-3-pentanol, 3-methyl-2-pentanol, 3-methyl-3-pentanol, 4-methyl-2-pentanol, 4-methyl-3-pentanol, cyclohexanol, 5-methyl-2-hexanol, 4-methyl-2-hexanol, 4,5-dimethyl-2-hexanol, 6-methyl-2-heptanol, 7-methyl-2-octanol, 8-methyl-2-nonanol, and 9-methyl-2-decanol. Of these, 1-hexanol, 2-hexanol, 1-pentanol, 3-methyl-1-butanol, 3-methyl-2-pentanol, 3-methyl-3-pentanol, 4-methyl-2-pentanol and 4-methyl-3-pentanol are preferred, and 1-hexanol and 4-methyl-2-pentanol are most preferred.

The hydrocarbon-based solvent includes an aromatic hydrocarbon-based solvent such as toluene and xylene, and an aliphatic hydrocarbon-based solvent such as octane and decane.

The rinsing solution preferably contains one or more members selected from 1-hexanol, 4-methyl-2-pentanol and decane.

As for these components, a plurality of components may be mixed, or the component may be used by mixing it with an organic solvent other than those described above. The above-described solvent may be mixed with water, but the percentage of water content in the rinsing solution is usually 60 mass % or less, preferably 30 mass % or less, more preferably 10 mass % or less, and most preferably 5 mass % or less. By setting the percentage of water content to 60 mass % or less, good rinsing characteristics can be obtained.

The rinsing solution may be also used after incorporating thereinto an appropriate amount of a surfactant.

As the surfactant, the same as the later-described surfactant used in the actinic ray-sensitive or radiation-sensitive resin composition may be used, and the amount used thereof is usually from 0.001 to 5 mass %, preferably from 0.005 to 2 mass %, more preferably from 0.01 to 0.5 mass %, based on the total amount of the rinsing solution.

Rinsing Method:

In the rinsing step, the developed wafer is washed using the above-described rinsing solution containing an organic solvent.

The method for washing treatment is not particularly limited but, for example, a method of continuously ejecting the rinsing solution on the substrate spinning at a constant speed (spin ejection method), a method of dipping the substrate in a bath filled with the rinsing solution for a fixed time (dipping method), and a method of spraying the rinsing solution on the substrate surface (spraying method) may be applied. Among others, it is preferred to perform the washing treatment by the spin ejection method and after the washing, remove the rinsing solution from the substrate surface by spinning the substrate at a rotation speed of 2,000 to 4,000 rpm.

The rinsing time is not particularly limited but is usually from 10 to 300 seconds, preferably from 10 to 180 seconds, and most preferably from 20 to 120 seconds.

The temperature of the rinsing solution is preferably from 0 to 50° C., more preferably from 15 to 35° C.

After the development or rinsing, a treatment for removing the developer or rinsing solution adhering on the pattern with a supercritical fluid may be performed.

Furthermore, after the development, rinsing or treatment with a supercritical fluid, a heating treatment for removing the solvent remaining in the pattern may be performed. The heating temperature is not particularly limited as long as a good resist pattern can be obtained, but the heating temperature is usually from 40 to 160° C., preferably from 50 to 150° C., and most preferably from 50 to 110° C. The heating time is not particularly limited as long as a good resist pattern can be obtained, but the heating time is usually from 15 to 300 seconds, preferably from 15 to 180 seconds.

Alkali Development:

The pattern forming method of the present invention may further include a step of performing development by using an aqueous alkali solution to form a resist pattern (alkali development step), and by this development, a finer pattern can be formed.

In the present invention, the portion of low exposure intensity is removed in the organic solvent development step (4), and by further performing the alkali development step, the portion of high exposure intensity is also removed. By virtue of the multiple development process of performing development a plurality of times in this way, a pattern can be formed by keeping only the region of intermediate exposure intensity from being dissolved, so that a finer pattern than usual can be formed (the same mechanism as disclosed in [0077] of JP-A-2008-292975).

The alkali development may be performed either before or after the step (4) of performing the development by using a developer containing an inorganic solvent but is preferably performed before the organic solvent development step (4).

Examples of the aqueous alkali solution which can be used for alkali development include an alkaline aqueous solution of inorganic alkalis such as sodium hydroxide, potassium hydroxide, sodium carbonate, sodium silicate, sodium metasilicate and aqueous ammonia, primary amines such as ethylamine and n-propylamine, secondary amines such as diethylamine and di-n-butylamine, tertiary amines such as triethylamine and methyldiethylamine, alcohol amines such as dimethylethanolamine and triethanolamine, quaternary ammonium salts such as tetramethylammonium hydroxide and tetraethylammonium hydroxide, or cyclic amines such as pyrrole and piperidine.

The alkaline aqueous solution above may be also used after adding thereto alcohols and a surfactant each in an appropriate amount.

The alkali concentration of the alkali developer is usually from 0.1 to 20 mass %.

The pH of the alkali developer is usually from 10.0 to 15.0.

In particular, an aqueous solution of 2.38 mass % tetramethylammonium hydroxide is preferred.

The alkali development time is not particularly limited and is usually from 10 to 300 seconds, preferably from 20 to 120 seconds.

The temperature of the alkali developer is preferably from 0 to 50° C., more preferably from 15 to 35° C.

After the development with an aqueous alkali solution, a rinsing treatment may be performed. The rinsing solution in the rinsing treatment is preferably pure water, and the rinsing solution may be also used after adding thereto an appropriate amount of a surfactant.

Moreover, after the development or rinsing, a heating treatment for removing water remaining in the pattern may be performed.

Furthermore, a treatment for removing the remaining developer or rinsing solution by heating may be performed. The heating temperature is not particularly limited as long as a good resist pattern can be obtained, but the heating temperature is usually from 40 to 160° C., preferably from 50 to 150° C., and most preferably from 50 to 110° C. The heating time is not particularly limited as long as a good resist pattern can be obtained, but the heating time is usually from 15 to 300 seconds, preferably from 15 to 180 seconds.

With respect to the film formed from the resist composition of the present invention, the exposure may be also performed by filling a liquid (immersion medium) having a refractive index higher than that of air between the film and a lens at the irradiation with an actinic ray or radiation (immersion exposure). By this exposure, the resolution can be enhanced. The immersion medium used may be any liquid as long as it has a refractive index higher than that of air, but pure water is preferred.

The immersion liquid used in the immersion exposure is described below.

The immersion liquid is preferably a liquid being transparent to light at the exposure wavelength and having as small a temperature coefficient of refractive index as possible so as to minimize the distortion of an optical image projected on the resist film, and water is preferably used in view of easy availability and easy handleability in addition to the above-described aspects.

Furthermore, a medium having a refractive index of 1.5 or more can be also used from the standpoint that the refractive index can be more enhanced. This medium may be either an aqueous solution or an organic solvent.

In the case of using water as the immersion liquid, for the purpose of decreasing the surface tension of water and increasing the surface activity, an additive (liquid) which does not dissolve the resist film on a wafer and at the same time, gives only a negligible effect on the optical coat at the undersurface of the lens element, may be added in a small ratio. The additive is preferably an aliphatic alcohol having a refractive index nearly equal to that of water, and specific examples thereof include methyl alcohol, ethyl alcohol and isopropyl alcohol. By virtue of adding an alcohol having a refractive index nearly equal to that of water, even when the alcohol component in water is evaporated and its content concentration is changed, the change in the refractive index of the entire liquid can be advantageously made very small. On the other hand, if an impurity greatly differing in the refractive index from water is mingled, this incurs distortion of the optical image projected on the resist film. Therefore, the water used is preferably distilled water. Pure water obtained by further filtering the distilled water through an ion exchange filter or the like may be also used.

The electrical resistance of water is preferably 18.3 MΩcm or more, and TOC (total organic carbon) is preferably 20 ppb or less. Also, the water is preferably subjected to a deaeration treatment.

The lithography performance can be enhanced by elevating the refractive index of the immersion liquid. From such a standpoint, an additive for elevating the refractive index may be added to water, or heavy water ($D_2O$) may be used in place of water.

In order to prevent the film from directly contacting with the immersion liquid, a film (hereinafter, sometimes referred to as a "topcoat") sparingly soluble in the immersion liquid may be provided between the film formed of the composition of the present invention and the immersion liquid. The functions required of the topcoat are suitability for coating as an overlayer of the composition film and sparing solubility in the immersion liquid. The topcoat is preferably unmixable with the composition film and capable of being uniformly coated as an overlayer of the composition film.

Specific examples of the topcoat include a hydrocarbon polymer, an acrylic acid ester polymer, a polymethacrylic acid, a polyacrylic acid, a polyvinyl ether, a silicon-containing polymer, and a fluorine-containing polymer. If an impurity is dissolved out into the immersion liquid from the topcoat, the optical lens is contaminated. In this viewpoint, the amount of residual monomer components of the polymer contained in the topcoat is preferably smaller.

On peeling off the topcoat, a developer may be used or a releasing agent may be separately used. The releasing agent is preferably a solvent hardly permeating the film. From the standpoint that the peeling step can be performed simultaneously with the development step of the film, the topcoat is preferably peelable with an organic solvent-containing developer.

With no difference in the refractive index between the topcoat and the immersion liquid, the resolution is enhanced. In the case of using water as the immersion liquid, the topcoat preferably has a refractive index close to that of the immersion liquid. From the standpoint of having a refractive index close to that of the immersion liquid, the topcoat preferably contains a fluorine atom. Also, in view of transparency and refractive index, the topcoat is preferably a thin film.

The topcoat is preferably unmixable with the film and further unmixable with the immersion liquid. From this standpoint, when the immersion liquid is water, the solvent used for the topcoat is preferably a medium that is sparingly soluble in the solvent used for the composition of the present invention and at the same time, is insoluble in water. In the case where the immersion liquid is an organic solvent, the topcoat may be either water-soluble or water-insoluble.

[1] Actinic Ray-Sensitive or Radiation-Sensitive Resin Composition

The actinic ray-sensitive or radiation-sensitive resin composition which can be used in the present invention is described below.

The actinic ray-sensitive or radiation-sensitive resin composition according to the present invention is used for negative development (development where the solubility for developer is decreased when exposed, as a result, the exposed area remains as a pattern and the unexposed area is removed). That is, the actinic ray-sensitive or radiation-sensitive resin composition according to the present invention can be an actinic ray-sensitive or radiation-sensitive resin composition for organic solvent development, which is used for development using an organic solvent-containing developer. The "for organic solvent development" as used herein means usage where the composition is subjected to at least a step of performing development by using an organic solvent-containing developer.

In this way, the present invention also relates to an actinic ray-sensitive or radiation-sensitive resin composition used for the above-described pattern forming method of the present invention.

The actinic ray-sensitive or radiation-sensitive resin composition of the present invention is typically a resist composition and is preferably a negative resist composition (that is, a resist composition for organic solvent development), because particularly high effects can be obtained. The composition according to the present invention is typically a chemical amplification resist composition.

The composition for use in the present invention contains (A) a resin having an acid-decomposable repeating unit and being capable of decreasing the solubility for an organic solvent by the action of an acid, (B) a compound capable of generating an acid upon irradiation with an actinic ray or radiation, (C) a compound capable of decomposing by the action of an acid to generate an acid, and (D) a solvent. The resin (A) is described below.

[1] (A) Resin (a) Repeating Unit Having Acid-Decomposable Group

The resin (A) is a resin capable of decreasing the solubility for an organic solvent-containing developer by the action of an acid and contains an acid-decomposable repeating unit. The acid-decomposable repeating unit is, for example, a repeating unit having a group capable of decomposing by the action of an acid (hereinafter sometimes referred to as "acid-decomposable group"), on either one or both of the main chain and the side chain of the resin. The group produced by the decomposition is preferably a polar group, because the affinity for an organic solvent-containing developer is reduced and insolubilization or difficult solubilization (negative conversion) proceeds. The polar group is more preferably an acidic group. Definition of the polar group is the same as the definition described later in the paragraph of Repeating Unit (b), and examples of the polar group produced resulting from decomposition of the acid-decomposable group include an alcoholic hydroxyl group, an amino group and an acidic group.

The polar group produced resulting from decomposition of the acid-decomposable group is preferably an acidic group.

The acidic group is not particularly limited as long as it is a group insolubilized in an organic solvent-containing developer, but the acidic group is preferably a phenolic hydroxyl group, a carboxylic acid group, a sulfonic acid group, a fluorinated alcohol group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group or a tris(alkylsulfonyl)methylene group, more preferably a carboxylic acid group, a fluorinated alcohol group (preferably hexafluoroisopropanol), a phenolic hydroxyl group, or an acidic group (a group capable of dissociating in an aqueous 2.38 mass % tetramethylammonium hydroxide solution that is conventionally used as the developer for resist) such as sulfonic acid group.

The group preferred as the acid-decomposable group is a group where a hydrogen atom of the group above is substituted for by a group capable of leaving by the action of an acid.

Examples of the group capable of leaving by the action of an acid include —C($R_{36}$)($R_{37}$)($R_{38}$), —C($R_{36}$)($R_{37}$)($OR_{39}$), and —C($R_{01}$)($R_{02}$)($OR_{39}$).

In the formulae, each of $R_{36}$ to $R_{39}$ independently represents an alkyl group, a cycloalkyl group, a monovalent aromatic ring group, a group formed by combining an alkylene group and a monovalent aromatic ring group, or an alkenyl group, and $R_{36}$ and $R_{37}$ may combine with each other to form a ring.

Each of $R_{01}$ and $R_{02}$ independently represents a hydrogen atom, an alkyl group, a cycloalkyl group, a monovalent aromatic ring group, a group formed by combining an alkylene group and a monovalent aromatic ring group, or an alkenyl group.

The acid-decomposable group is preferably a cumyl ester group, an enol ester group, an acetal ester group, a tertiary alkyl ester group or the like, more preferably a tertiary alkyl ester group.

The repeating unit (a) is preferably a repeating unit represented by the following formula (V):

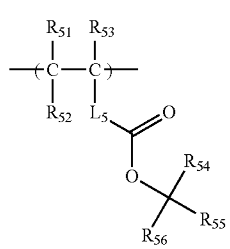

(V)

In formula (V), each of $R_{51}$, $R_{52}$ and $R_{53}$ independently represents a hydrogen atom, an alkyl group, a cycloalkyl group, a halogen atom, a cyano group or an alkoxycarbonyl group. $R_{52}$ may combine with $L_5$ to form a ring, and in this case, $R_{52}$ represents an alkylene group.

$L_5$ represents a single bond or a divalent linking group, and in the case of forming a ring with $R_{52}$, $L_5$ represents a trivalent linking group.

$R_{54}$ represents an alkyl group, and each of $R_{55}$ and $R_{56}$ independently represents a hydrogen atom, an alkyl group, a cycloalkyl group, a monovalent aromatic ring group, or an aralkyl group. $R_{55}$ and $R_{56}$ may combine with each other to form a ring. However, $R_{55}$ and $R_{56}$ are not a hydrogen atom at the same time.

Formula (V) is described in more detail.

The alkyl group of $R_{51}$ to $R_{53}$ in formula (V) is preferably an alkyl group having a carbon number of 20 or less, such as methyl group, ethyl group, propyl group, isopropyl group, n-butyl group, sec-butyl group, hexyl group, 2-ethylhexyl group, octyl group and dodecyl group, which may have a substituent. The alkyl group is more preferably an alkyl group having a carbon number of 8 or less, still more preferably an alkyl group having a carbon number of 3 or less.

As the alkyl group contained in the alkoxycarbonyl group, the same alkyl group as in $R_{51}$ to $R_{53}$ is preferred.

The cycloalkyl group may be either monocyclic or polycyclic. The cycloalkyl group is preferably a monocyclic cycloalkyl group having a carbon number of 3 to 8, such as cyclopropyl group, cyclopentyl group and cyclohexyl group, which may have a substituent.

The halogen atom includes fluorine atom, chlorine atom, bromine atom and iodine atom, with fluorine atom being preferred.

Preferred examples of the substituent on each of these groups include an alkyl group, a cycloalkyl group, an aryl group, an amino group, an amido group, a ureido group, a urethane group, a hydroxyl group, a carboxyl group, a halogen atom, an alkoxy group, a thioether group, an acyl group, an acyloxy group, an alkoxycarbonyl group, a cyano group, and a nitro group. The carbon number of the substituent is preferably 8 or less.

In the case where $R_{52}$ is an alkylene group and forms a ring with $L_5$, the alkylene group is preferably an alkylene group having a carbon number of 1 to 8, such as methylene group, ethylene group, propylene group, butylene group, hexylene group and octylene group, more preferably an alkylene group having a carbon number of 1 to 4, still more preferably an alkylene group having a carbon number of 1 to 2. The ring formed by combining $R_{52}$ and $L_5$ is preferably a 5- or 6-membered ring.

In formula (V), each of $R_{51}$ and $R_{53}$ is preferably a hydrogen atom, an alkyl group or a halogen atom, more preferably a hydrogen atom, a methyl group, an ethyl group, a trifluoromethyl group (—$CF_3$), a hydroxymethyl group (—$CH_2$—OH), a chloromethyl group (—$CH_2$—Cl) or a fluorine atom (—F). $R_{52}$ is preferably a hydrogen atom, an alkyl group, a halogen atom or an alkylene group (forms a ring with $L_5$), more preferably a hydrogen atom, a methyl group, an ethyl group, a trifluoromethyl group (—$CF_3$), a hydroxymethyl group (—$CH_2$—OH), a chloromethyl group (—$CH_2$—Cl), a fluorine atom (—F), a methylene group (forms a ring with $L_5$) or an ethylene group (forms a ring with $L_5$).

Examples of the divalent linking group represented by $L_5$ include an alkylene group, a divalent aromatic ring group, —COO-$L_1$-, —O-$L_1$-, and a group formed by combining two or more of these groups. Here, $L_1$ represents an alkylene group, a cycloalkylene group, a divalent aromatic ring group, or a group formed by combining an alkylene group and a divalent aromatic ring group.

$L_5$ is preferably a single bond, a group represented by —COO-$L_1$-, or a divalent aromatic ring group. $L_1$ is preferably an alkylene group having a carbon number of 1 to 5, more preferably a methylene group or a propylene group. The divalent aromatic ring group is preferably a 1,4-phenylene group, a 1,3-phenylene group, a 1,2-phenylene group or a 1,4-naphthylene group, more preferably a 1,4-phenylene group.

In the case where $L_5$ combines with $R_{52}$ to form a ring, preferred examples of the trivalent linking group represented by $L_5$ include groups formed by removing one arbitrary hydrogen atom from specific examples above of the divalent linking group represented by $L_5$.

The alkyl group of $R_{54}$ to $R_{56}$ is preferably an alkyl group having a carbon number of 1 to 20, more preferably an alkyl group having a carbon number of 1 to 10, still more preferably an alkyl group having a carbon number of 1 to 4, such as methyl group, ethyl group, n-propyl group, isopropyl group, n-butyl group, isobutyl group and tert-butyl group.

The cycloalkyl group represented by $R_{55}$ and $R_{56}$ is preferably a cycloalkyl group having a carbon number of 3 to 20 and may be a monocyclic cycloalkyl group such as cyclopentyl group and cyclohexyl group, or a polycyclic cycloalkyl group such as norbornyl group, adamantyl group, tetracyclodecanyl group and tetracyclododecanyl group.

The ring formed by combining $R_{55}$ and $R_{56}$ with each other is preferably a ring having a carbon number of 3 to 20 and may be a monocyclic ring such as cyclopentyl group and cyclohexyl group, or a polycyclic ring such as norbornyl group, adamantyl group, tetracyclodecanyl group and tetracyclododecanyl group. In the case where $R_{55}$ and $R_{56}$ combine with each other to form a ring, $R_{54}$ is preferably an alkyl group having a carbon number of 1 to 3, more preferably a methyl group or an ethyl group.

The monovalent aromatic ring group represented by $R_{55}$ and $R_{56}$ is preferably a monovalent aromatic ring group having a carbon number of 6 to 20 and may be monocyclic or polycyclic or may have a substituent. Examples thereof include a phenyl group, a 1-naphthyl group, a 2-naphthyl group, a 4-methylphenyl group, and a 4-methoxyphenyl group. In the case where either one of $R_{55}$ and $R_{56}$ is a hydrogen atom, the other is preferably a monovalent aromatic ring group.

The aralkyl group represented by $R_{55}$ and $R_{56}$ may be monocyclic or polycyclic or may have a substituent and is preferably an aralkyl group having a carbon number of 7 to 21, and examples thereof include a benzyl group and a 1-naphthylmethyl group.

The synthesis method of the monomer corresponding to the repeating unit represented by formula (V) is not particularly limited, and synthesis methods for general polymerizable group-containing esters can be applied.

Specific examples of the repeating unit (a) represented by formula (V) are illustrated below, but the present invention is not limited thereto.

In specific examples, each of Rx and $Xa_1$ represents a hydrogen atom, $CH_3$, $CF_3$ or $CH_2OH$, and each of Rxa and Rxb independently represents an alkyl group having a carbon number of 1 to 4, an aryl group having a carbon number of 6 to 18, or an aralkyl group having a carbon number of 7 to 19. Z represents a substituent. p represents 0 or a positive integer and is preferably 0 to 2, more preferably 0 or 1. In the case where a plurality of Z's are present, each may be the same as or different from every other. From the standpoint of increasing the contrast of dissolution for the organic solvent-containing developer between before and after acid decomposition, Z is suitably a hydrogen atom or a group composed of only carbon atom and is preferably, for example, a linear or branched alkyl group or a cycloalkyl group.

1

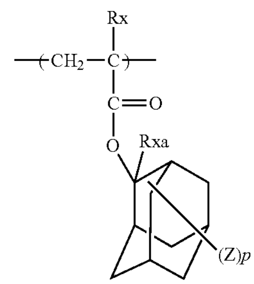

2

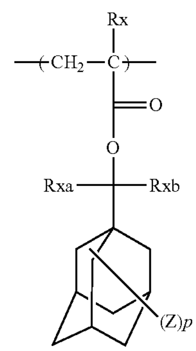

3

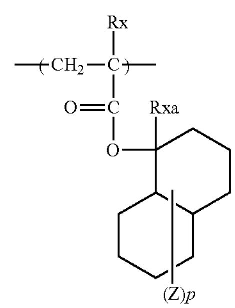

4

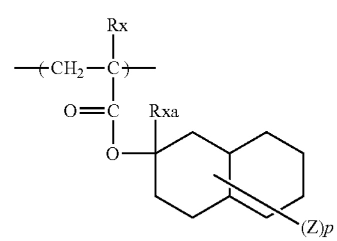

5

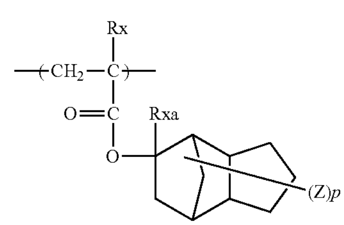

-continued
6
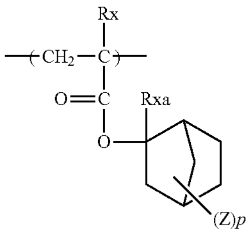
7
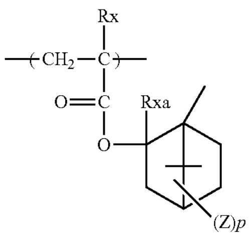
8
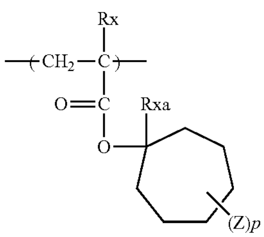
9
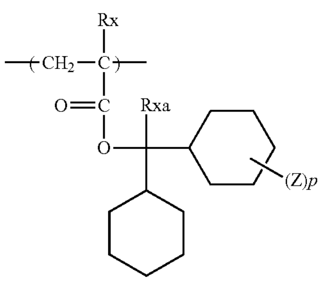
10
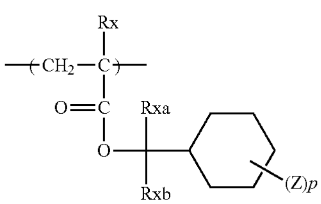
11
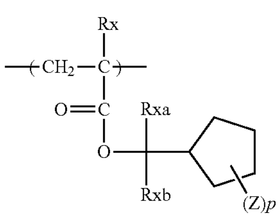
12
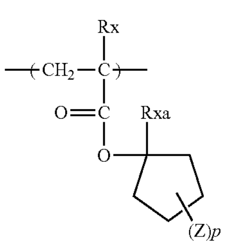
-continued
13
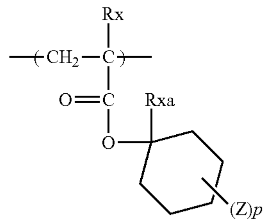
14
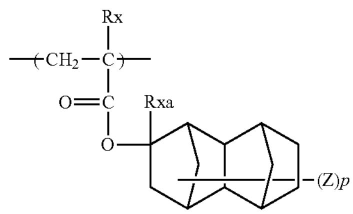
15
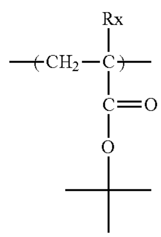
16
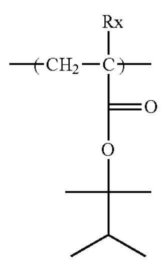
17
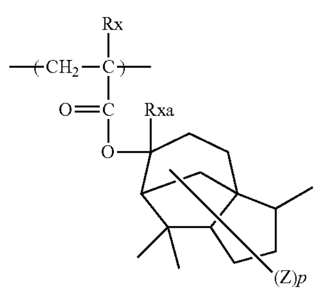
18
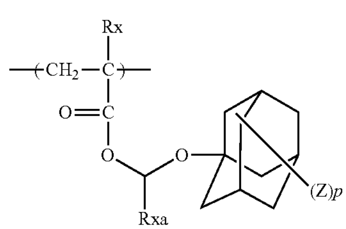

-continued
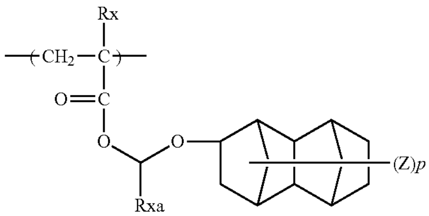
19
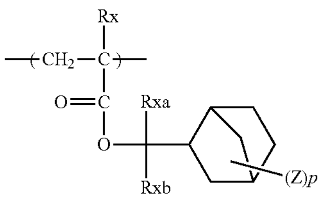
20
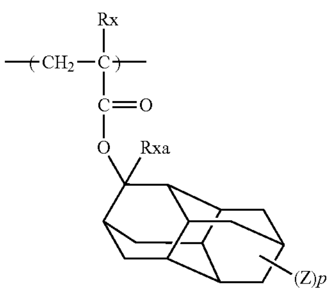
21
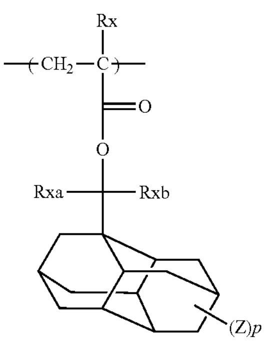
22
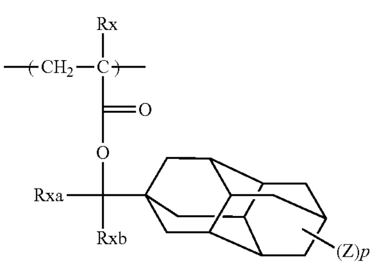
23
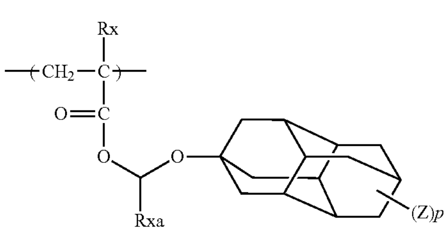
24
-continued
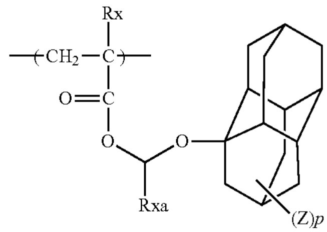
25
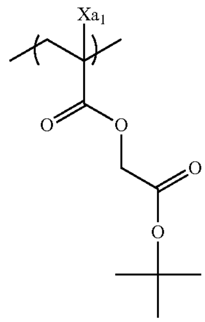
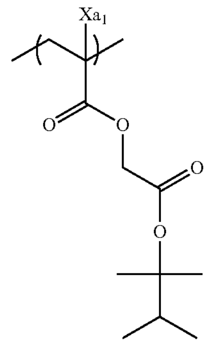
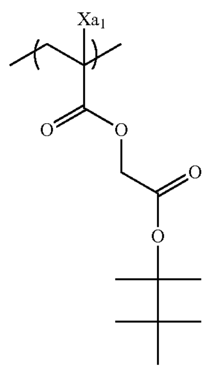
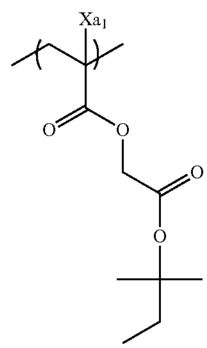
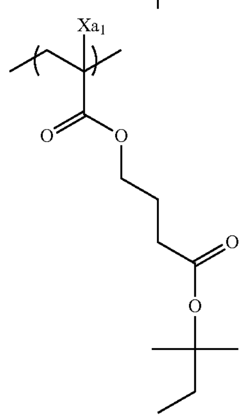
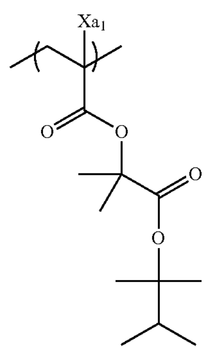
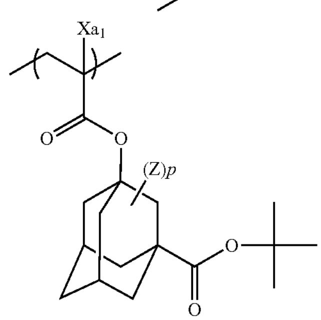

-continued
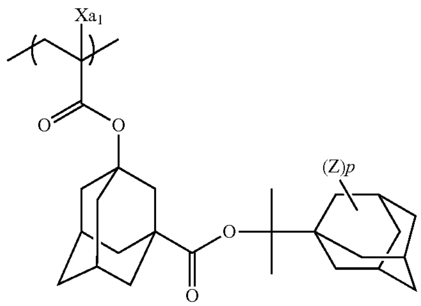
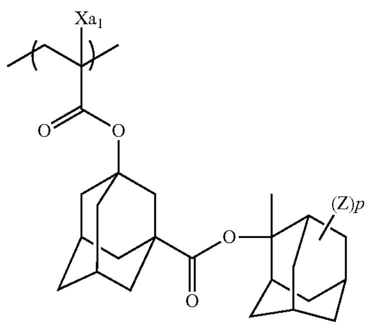
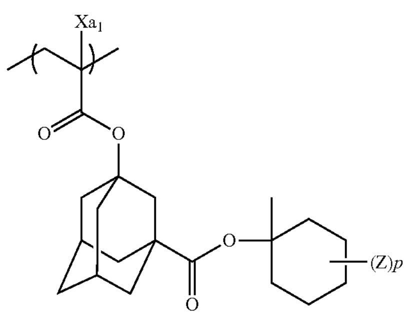
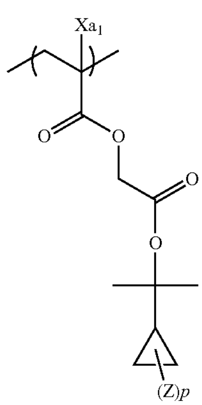
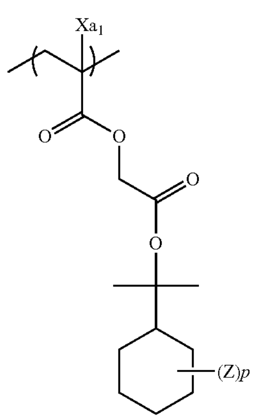
-continued
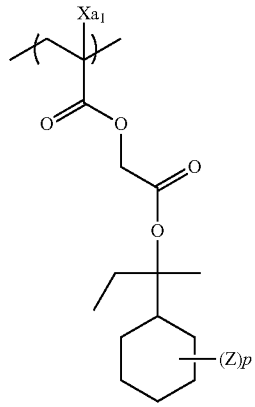
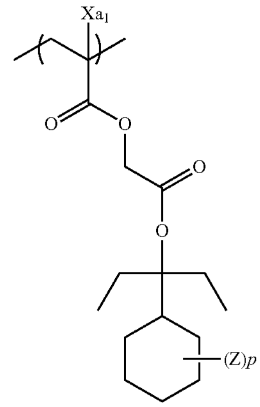
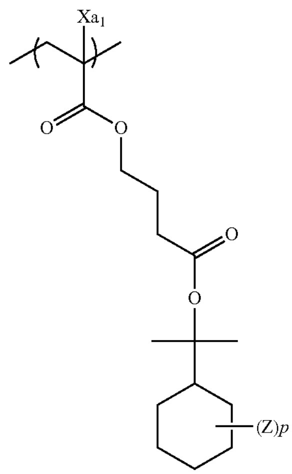
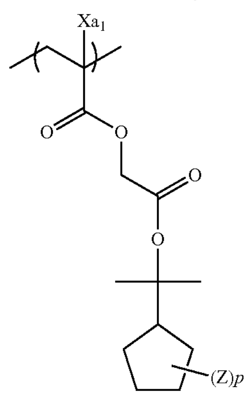
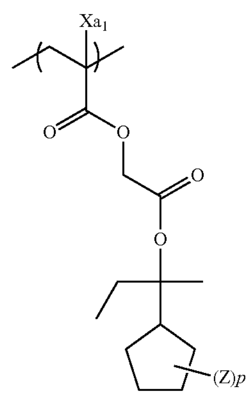
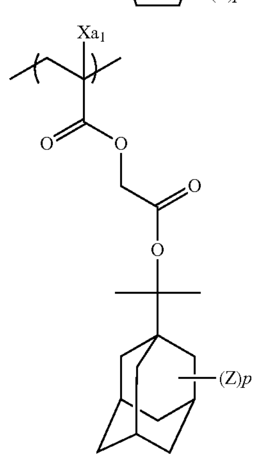

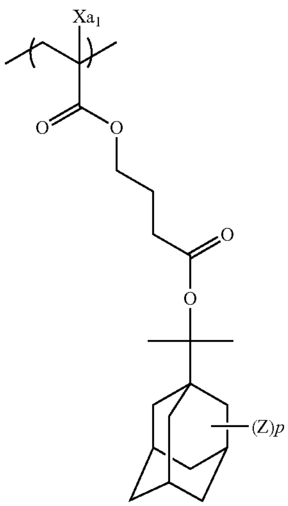
Xa1
O
O
O
O
(Z)p
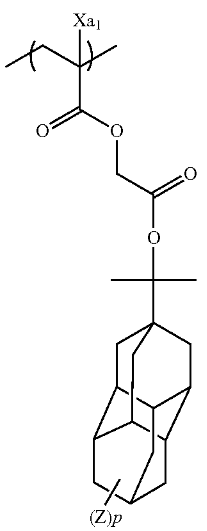
Xa1
O
O
O
O
(Z)p
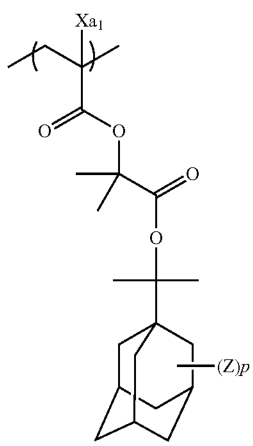
Xa1
O
O
O
O
(Z)p
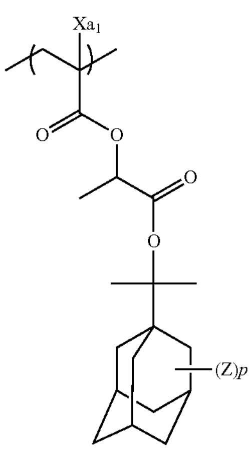
Xa1
O
O
O
O
(Z)p
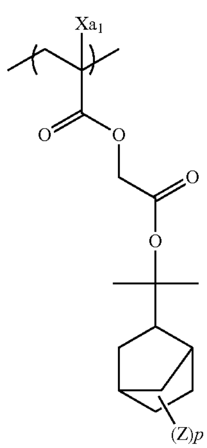
Xa1
O
O
O
O
(Z)p
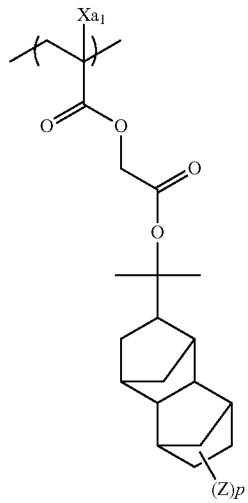
Xa1
O
O
O
O
(Z)p
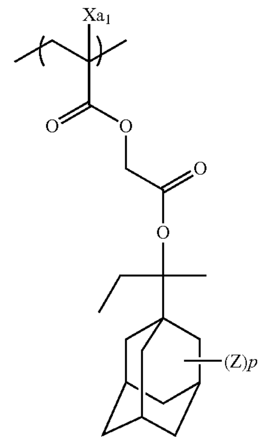
Xa1
O
O
O
O
(Z)p
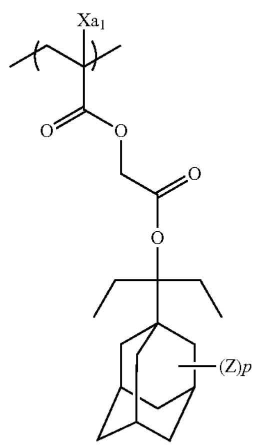
Xa1
O
O
O
O
(Z)p
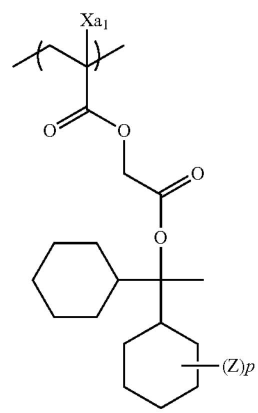
Xa1
O
O
O
O
(Z)p
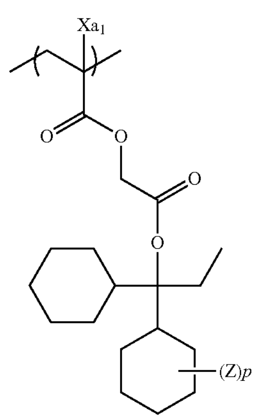
Xa1
O
O
O
O
(Z)p -continued
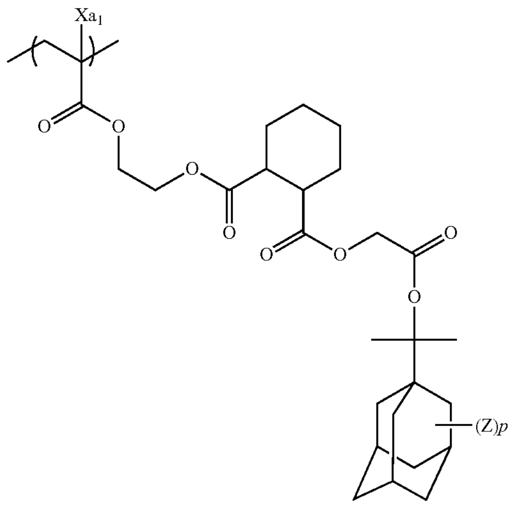
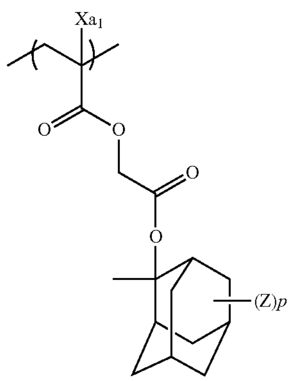
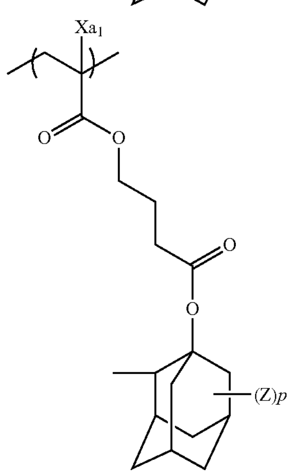
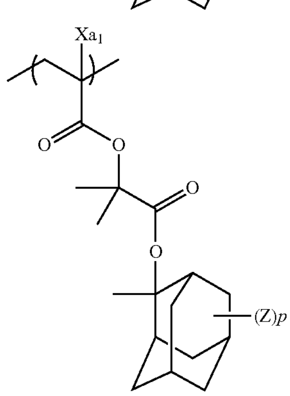
-continued
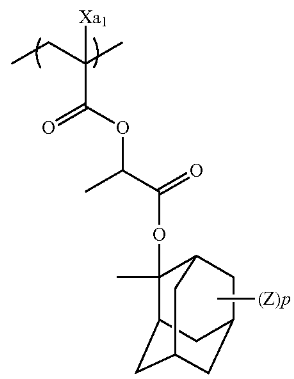
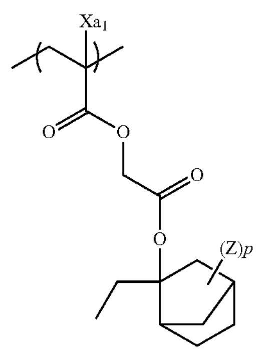
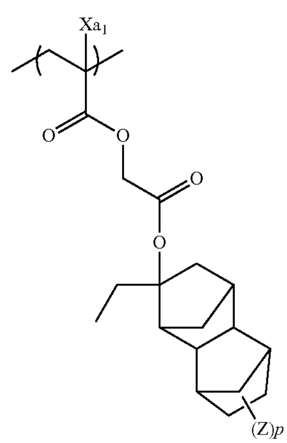
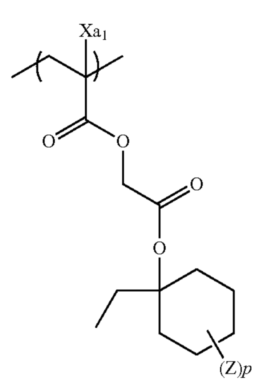
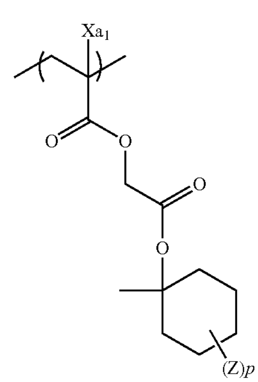

-continued
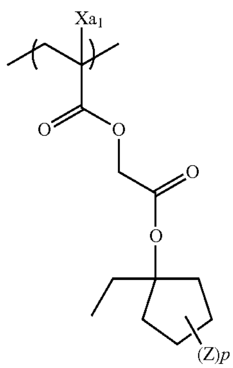
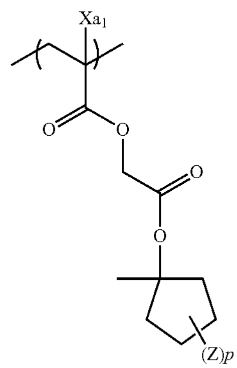
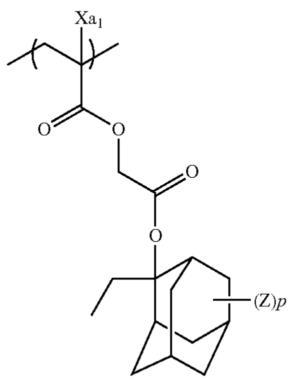
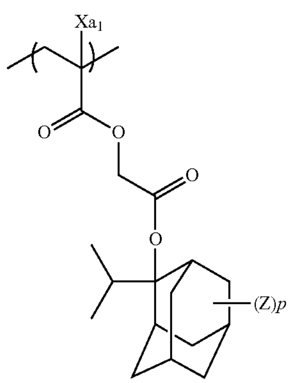
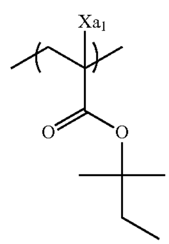
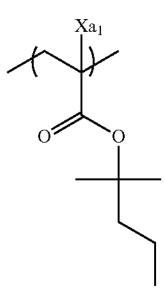
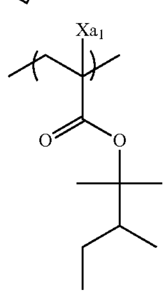
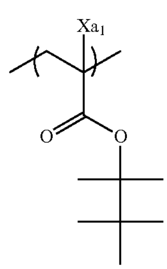
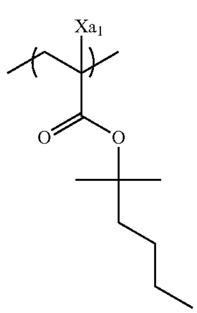
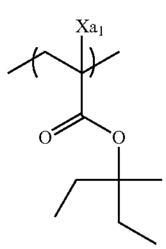
-continued
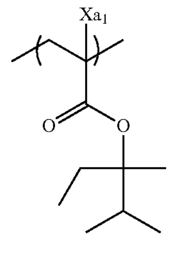
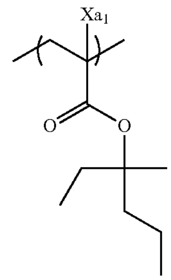
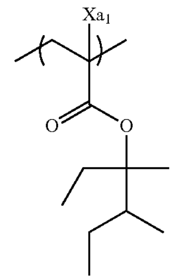
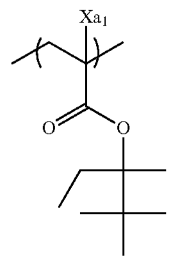
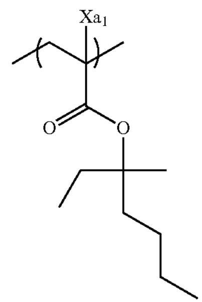
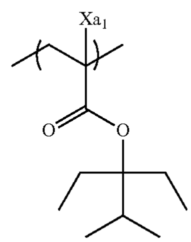
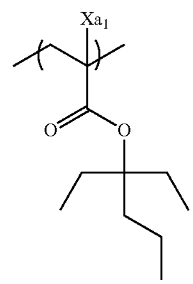
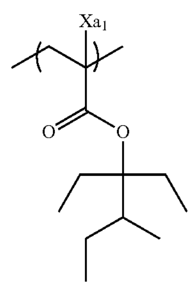
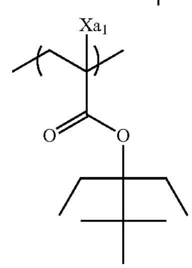
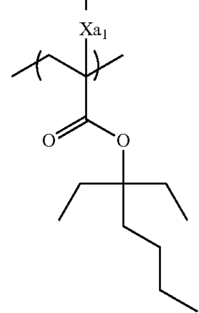
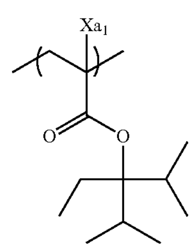
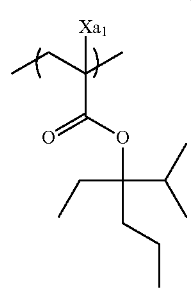
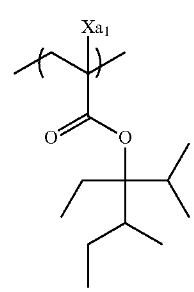

-continued
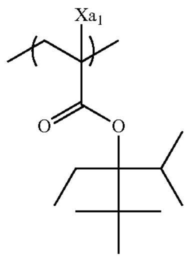
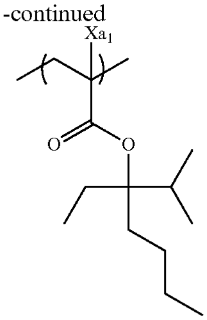
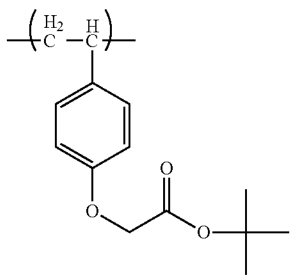
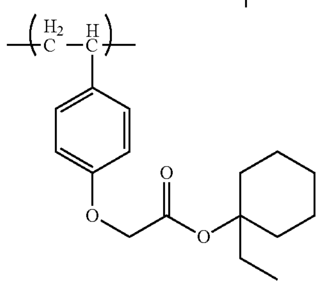
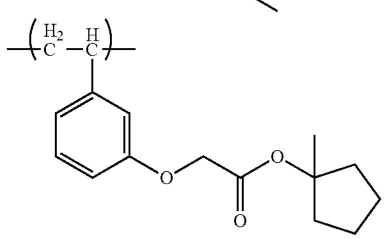
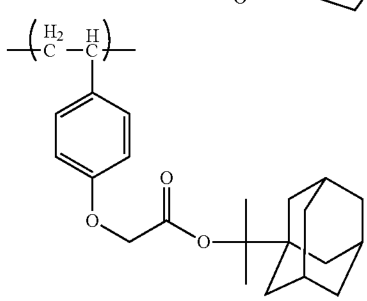
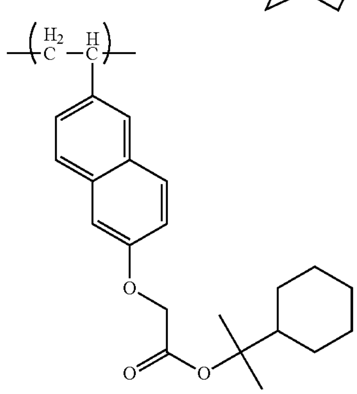
-continued
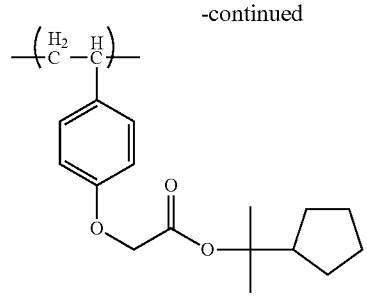
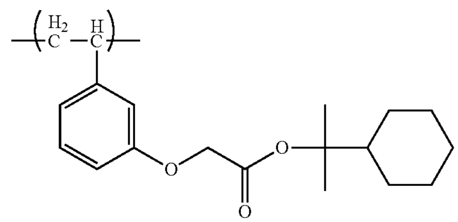
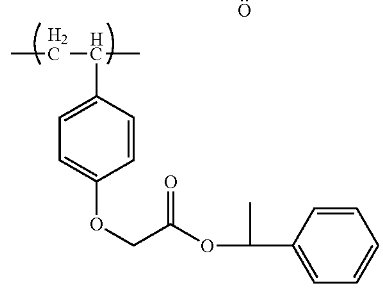
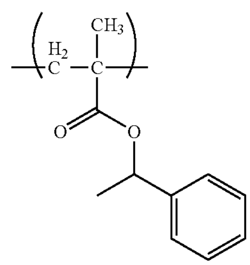
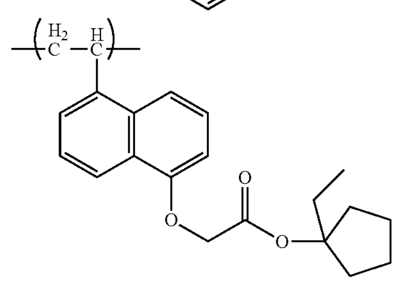
The resin (A) may contain, as the repeating unit (a), a repeating unit represented by the following formula (VI):
(VI)
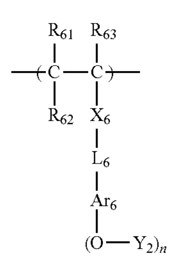

In formula (VI), each of $R_{61}$, $R_{62}$ and $R_{63}$ independently represents a hydrogen atom, an alkyl group, a cycloalkyl group, a halogen atom, a cyano group or an alkoxycarbonyl group. $R_{62}$ may combine with $Ar_6$ to form a ring, and in this case, $R_{62}$ represents a single bond or an alkylene group.

$X_6$ represents a single bond, —COO— or —CONR$_{64}$—, and $R_{64}$ represents a hydrogen atom or an alkyl group.

$L_6$ represents a single bond or an alkylene group.

$Ar_6$ represents an (n+1)-valent aromatic ring group and in the case of combining with $R_{62}$ to form a ring, $Ar_6$ represents an (n+2)-valent aromatic ring group.

$Y_2$ represents, when n≥2, each independently represents, a hydrogen atom or a group capable of leaving by the action of an acid, provided that at least one $Y_2$ represents a group capable of leaving by the action of an acid.

n represents an integer of 1 to 4.

Formula (VI) is described in more detail below.

The alkyl group of $R_{61}$ to $R_{63}$ in formula (VI) is preferably an alkyl group having a carbon number of 20 or less, such as methyl group, ethyl group, propyl group, isopropyl group, n-butyl group, sec-butyl group, hexyl group, 2-ethylhexyl group, octyl group and dodecyl group, which may have a substituent, more preferably an alkyl group having a carbon number of 8 or less.

As the alkyl group contained in the alkoxycarbonyl group, the same as the alkyl group in $R_{61}$ to $R_{63}$ is preferred.

The cycloalkyl group may be either monocyclic or polycyclic and is preferably a monocyclic cycloalkyl group having a carbon number of 3 to 8, such as cyclopropyl group, cyclopentyl group and cyclohexyl group, which may have a substituent.

The halogen atom includes fluorine atom, chlorine atom, bromine atom and iodine atom, with fluorine atom being preferred.

In the case where $R_{62}$ represents an alkylene group, the alkylene group is preferably an alkylene group having a carbon atom of 1 to 8, such as methylene group, ethylene group, propylene group, butylene group, hexylene group and octylene group, which may have a substituent.

Examples of the alkyl group of $R_{64}$ in —CONR$_{64}$— ($R_{64}$ represents a hydrogen atom or an alkyl group) represented by $X_6$ are the same as those of the alkyl group of $R_{61}$ to $R_{63}$.

$X_6$ is preferably a single bond, —COO— or —CONH—, more preferably a single bond or —COO—.

The alkylene group in $L_6$ is preferably an alkylene group having a carbon number of 1 to 8, such as methylene group, ethylene group, propylene group, butylene group, hexylene group and octylene group, which may have a substituent. The ring formed by combining $R_{62}$ and $L_6$ is preferably a 5- or 6-membered ring.

$Ar_6$ represents an (n+1)-valent aromatic ring. The divalent aromatic ring group when n is 1 may have a substituent, and preferred examples of the divalent aromatic ring group include an arylene group having a carbon number of 6 to 18, such as phenylene group, tolylene group and naphthylene group, and a divalent aromatic ring group containing a heterocyclic ring such as thiophene, furan, pyrrole, benzothiophene, benzofuran, benzopyrrole, triazine, imidazole, benzimidazole, triazole, thiadiazole and thiazole.

Specific examples of the (n+1)-valent aromatic ring group when n is an integer of 2 or more include groups formed by removing arbitrary (n−1) hydrogen atoms from the above-described specific examples of the divalent aromatic ring group.

The (n+1)-valent aromatic ring group may further have a substituent.

Examples of the substituent which may be substituted on the above-described alkyl group, cycloalkyl group, alkoxycarbonyl group, alkylene group and (n+1)-valent aromatic ring group are the same as specific examples of the substituent which may be substituted on each of the groups represented by $R_{51}$ to $R_{53}$ in formula (V).

n is preferably 1 or 2, more preferably 1.

Each of n $Y_2$s independently represents a hydrogen atom or a group capable of leaving by the action of an acid, provided that at least one of n Ys represents a group capable of leaving by the action of an acid.

Examples of the group $Y_2$ capable of leaving by the action of an acid include —C($R_{36}$)($R_{37}$)($R_{38}$), —C(═O)—O—C($R_{36}$)($R_{37}$)($R_{38}$), —C($R_{01}$)($R_{02}$)(OR$_{39}$), —C($R_{01}$)($R_{02}$)—C(═O)—O—C($R_{36}$)($R_{37}$)($R_{38}$) and —CH($R_{36}$)(Ar).

In the formulae, each of $R_{36}$ to $R_{39}$ independently represents an alkyl group, a cycloalkyl group, a monovalent aromatic ring group, a group formed by combining an alkylene group and a monovalent aromatic ring group, or an alkenyl group. $R_{36}$ and $R_{37}$ may combine with each other to form a ring.

Each of $R_{01}$ and $R_{02}$ independently represents a hydrogen atom, an alkyl group, a cycloalkyl group, a monovalent aromatic ring group, a group formed by combining an alkylene group and a monovalent aromatic ring group, or an alkenyl group.

Ar represents a monovalent aromatic ring group.

The alkyl group of $R_{36}$ to $R_{39}$, $R_{01}$ and $R_{02}$ is preferably an alkyl group having a carbon number of 1 to 8, and examples thereof include a methyl group, an ethyl group, a propyl group, an n-butyl group, a sec-butyl group, a hexyl group, and an octyl group.

The cycloalkyl group of $R_{36}$ to $R_{39}$, $R_{01}$ and $R_{02}$ may be monocyclic or polycyclic. The monocyclic cycloalkyl group is preferably a cycloalkyl group having a carbon number of 3 to 8, and examples thereof include a cyclopropyl group, a cyclobutyl group, a cyclopentyl group, a cyclohexyl group, and a cyclooctyl group. The polycyclic cycloalkyl group is preferably a cycloalkyl group having a carbon number of 6 to 20, and examples thereof include an adamantyl group, a norbornyl group, an isoboronyl group, a camphanyl group, a dicyclopentyl group, an α-pinel group, a tricyclodecanyl group, a tetracyclododecyl group, and an androstanyl group. Incidentally, a part of carbon atoms in the cycloalkyl group may be substituted with a heteroatom such as oxygen atom.

The monovalent aromatic ring group of $R_{36}$ to $R_{39}$, $R_{01}$, $R_{02}$ and Ar is preferably a monovalent aromatic ring group having a carbon number of 6 to 10, and examples thereof include an aryl group such as phenyl group, naphthyl group and anthryl group, and a divalent aromatic ring group containing a heterocyclic ring such as thiophene, furan, pyrrole, benzothiophene, benzofuran, benzopyrrole, triazine, imidazole, benzimidazole, triazole, thiadiazole and thiazole.

The group formed by combining an alkylene group and a monovalent aromatic ring group of $R_{36}$ to $R_{39}$, $R_{01}$ and $R_{02}$ is preferably an aralkyl group having a carbon number of 7 to 12, and examples thereof include a benzyl group, a phenethyl group and a naphthylmethyl group.

The alkenyl group of $R_{36}$ to $R_{39}$, $R_{01}$ and $R_{02}$ is preferably an alkenyl group having a carbon number of 2 to 8, and examples thereof include a vinyl group, an allyl group, a butenyl group, and a cyclohexenyl group.

The ring formed by combining $R_{36}$ and $R_{37}$ with each other may be monocyclic or polycyclic. The monocyclic ring structure is preferably a cycloalkyl structure having a carbon number of 3 to 8, and examples thereof include a cyclopropane structure, a cyclobutane structure, a cyclopentane structure, a cyclohexane structure, a cycloheptane structure, and a cyclooctane structure. The polycyclic ring structure is preferably a cycloalkyl structure having a carbon number of 6 to 20, and examples thereof include an adamantane structure, a norbornane structure, a dicyclopentane structure, a tricyclodecane structure, and a tetracyclododecane structure. Incidentally, a part of carbon atoms in the cycloalkyl structure may be substituted with a heteroatom such as oxygen atom.

Each of these groups as $R_{36}$ to $R_{39}$, $R_{01}$, $R_{02}$ and Ar may have a substituent, and examples of the substituent include an alkyl group, a cycloalkyl group, an aryl group, an amino group, an amido group, a ureido group, a urethane group, a hydroxyl group, a carboxyl group, a halogen atom, an alkoxy group, a thioether group, an acyl group, an acyloxy group, an alkoxycarbonyl group, a cyano group, and a nitro group. The carbon number of the substituent is preferably 8 or less.

The group $Y_2$ capable of leaving by the action of an acid is more preferably a structure represented by the following formula (VI-A):

(VI-A)

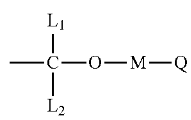

In the formula, each of $L_1$ and $L_2$ independently represents a hydrogen atom, an alkyl group, a cycloalkyl group, a monovalent aromatic ring group, or a group formed by combining an alkylene group and a monovalent aromatic ring group.

M represents a single bond or a divalent linking group.

Q represents an alkyl group, a cycloalkyl group which may contain a heteroatom, a monovalent aromatic ring group which may contain a heteroatom, an amino group, an ammonium group, a mercapto group, a cyano group or an aldehyde group.

At least two members of Q, M and $L_1$ may combine to form a ring (preferably a 5- or 6-membered ring).

The alkyl group as $L_1$ and $L_2$ is, for example, an alkyl group having a carbon number of 1 to 8, and specific preferred examples thereof include a methyl group, an ethyl group, a propyl group, an n-butyl group, a sec-butyl group, a hexyl group, and an octyl group.

The cycloalkyl group as $L_1$ and $L_2$ is, for example, a cycloalkyl group having a carbon number of 3 to 15, and specific preferred examples thereof include a cyclopentyl group, a cyclohexyl group, a norbornyl group, and an adamantyl group.

The monovalent aromatic ring group as $L_1$ and $L_2$ is, for example, an aryl group having a carbon number of 6 to 15, and specific preferred examples thereof include a phenyl group, a tolyl group, a naphthyl group, and an anthryl group.

The group formed by combining an alkylene group and a monovalent aromatic ring group as $L_1$ and $L_2$ is, for example, an aralkyl group having a carbon number of 6 to 20, such as benzyl group and phenethyl group.

Examples of the divalent linking group as M include an alkylene group (such as methylene group, ethylene group, propylene group, butylene group, hexylene group and octylene group), a cycloalkylene group (such as cyclopentylene group, cyclohexylene group and adamantylene group), an alkenylene group (such as vinylene group, propenylene group and butenylene group), a divalent aromatic ring group (such as phenylene group, tolylene group and naphthylene group), —S—, —O—, —CO—, —$SO_2$—, —N($R_0$)—, and a divalent linking group formed by combining a plurality thereof. Here, $R_0$ is a hydrogen atom or an alkyl group (for example, an alkyl group having a carbon number of 1 to 8, and specific examples thereof include a methyl group, an ethyl group, a propyl group, an n-butyl group, a sec-butyl group, a hexyl group, and an octyl group).

Examples of the alkyl group as Q are the same as those of the alkyl group of $L_1$ and $L_2$.

Examples of the heteroatom-free aliphatic hydrocarbon ring group and the heteroatom-free monovalent aromatic ring group in the cycloalkyl group which may contain a heteroatom and the monovalent aromatic ring group which may contain a heteroatom as Q include the cycloalkyl group and monovalent aromatic ring group described above for $L_1$ and $L_2$, and the carbon number is preferably from 3 to 15.

Examples of the heteroatom-containing cycloalkyl group and the heteroatom-containing monovalent aromatic ring group include a group having a heterocyclic structure such as thiirane, cyclothiolane, thiophene, furan, pyrrole, benzothiophene, benzofuran, benzopyrrole, triazine, imidazole, benzimidazole, triazole, thiadiazole, thiazole and pyrrolidone, but the structure is not limited thereto as long as it is a structure generally called a heterocyclic ring (a ring composed of carbon and a heteroatom, or a ring composed of a heteroatom).

Examples of the ring which may be formed by combining at least two members of Q, M and $L_1$ include an oxygen atom-containing 5- or 6-membered ring formed by combining at least two members of Q, M and $L_1$ and thereby forming, for example, a propylene group or a butylene group.

In formula (VI-A), each of the groups represented by $L_1$, $L_2$, M and Q may have a substituent, and examples of the substituent include those described above as the substituent which may be substituted on $R_{36}$ to $R_{39}$, $R_{01}$, $R_{02}$ and Ar. The carbon number of the substituent is preferably 8 or less.

The group represented by -M-Q is preferably a group composed of 1 to 30 carbons, more preferably a group composed of 5 to 20 carbons.

As specific preferred examples of the repeating unit (a), specific examples of the repeating unit represented by formula (VI) are illustrated below, but the present invention is not limited thereto.

(VI-1)

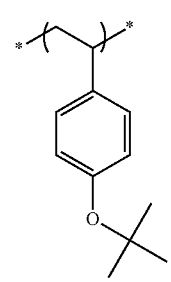

-continued
(VI-2)
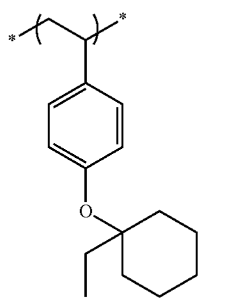
(VI-3)
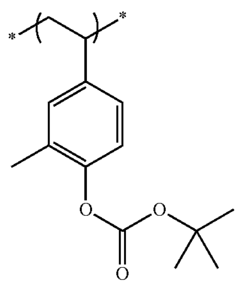
(VI-4)
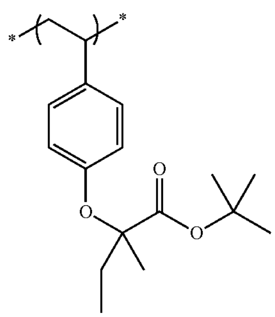
(VI-5)
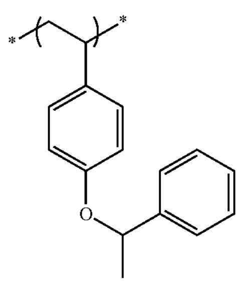
(VI-6)
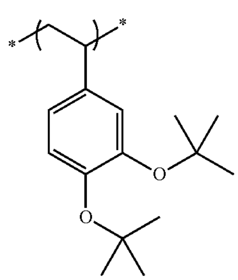
-continued
(VI-7)
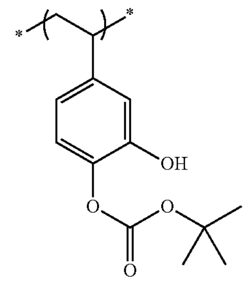
(VI-8)
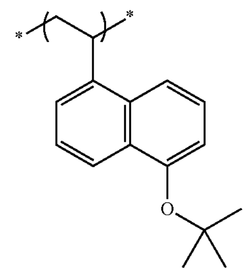
(VI-9)
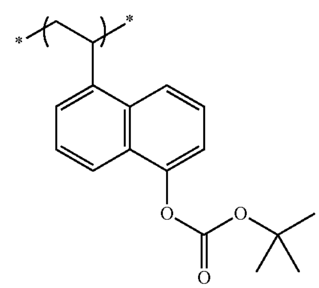
(VI-10)
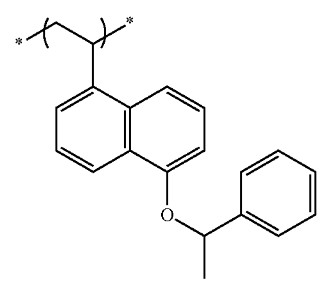
(VI-11)
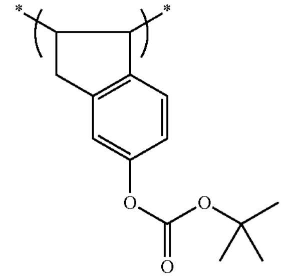

-continued
(VI-12)
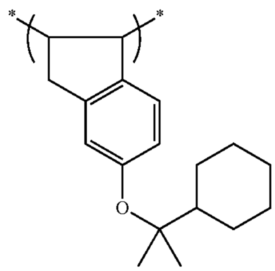
(VI-13)
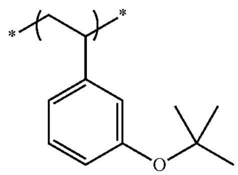
(VI-14)
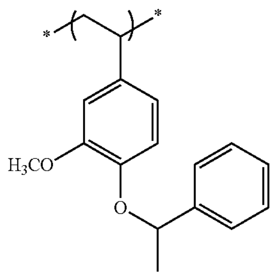
(VI-15)
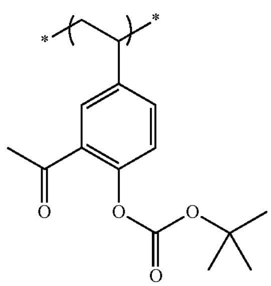
(VI-16)
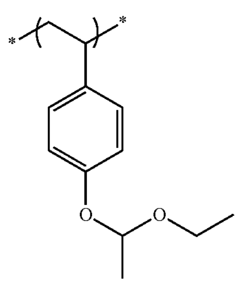
(VI-17)
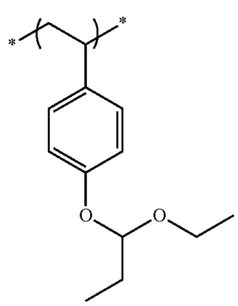
-continued
(VI-18)
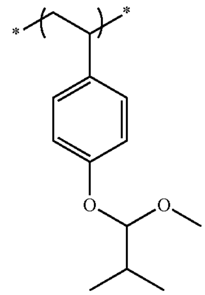
(VI-19)
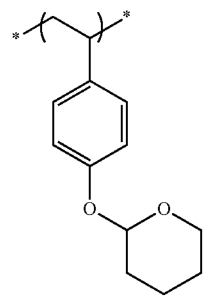
(VI-20)
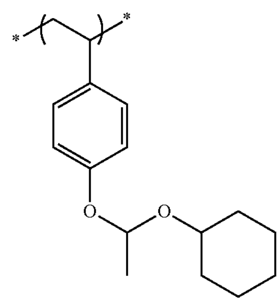
(VI-21)
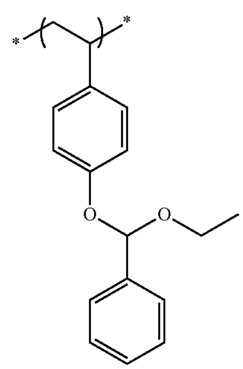
(VI-22)
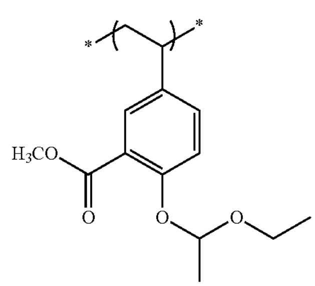

-continued
(VI-23)
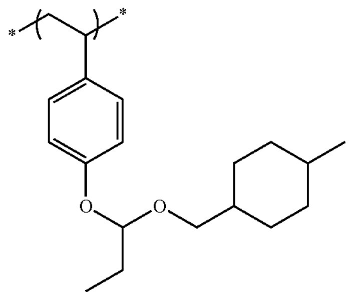
(VI-24)
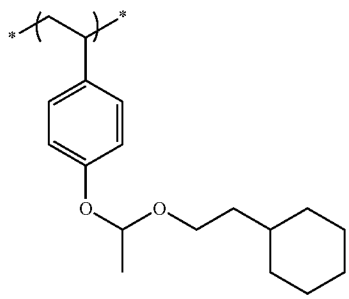
(VI-25)
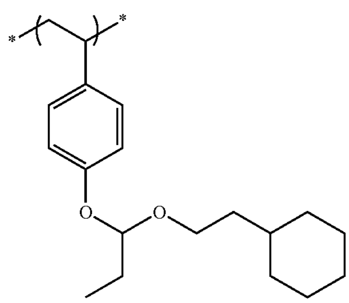
(VI-26)
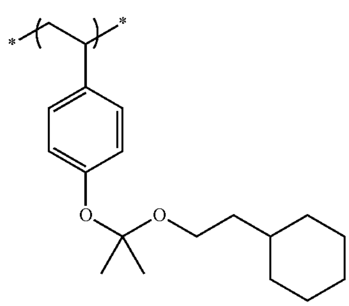
(VI-27)
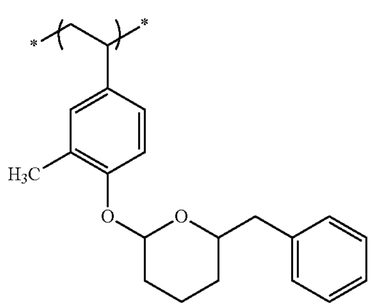
-continued
(VI-28)
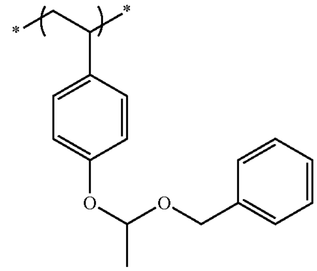
(VI-29)
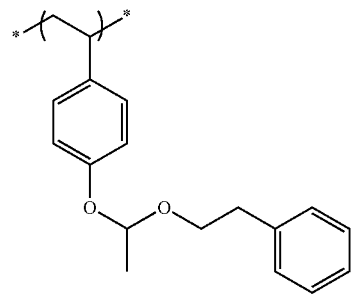
(VI-30)
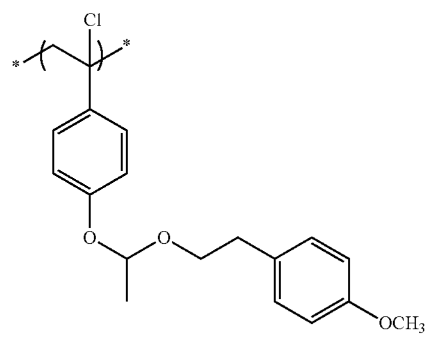
(VI-31)
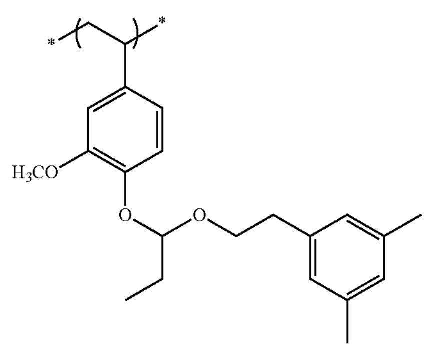
(VI-32)
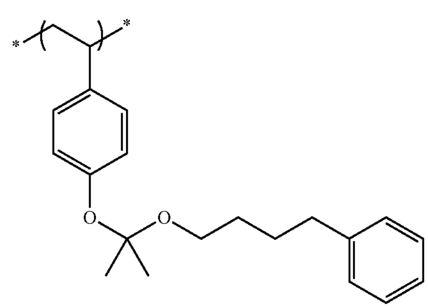

-continued
(VI-33)
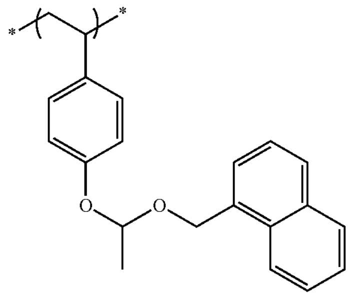
(VI-34)
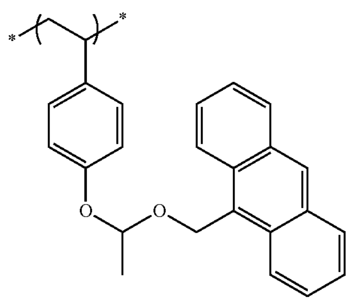
(VI-35)
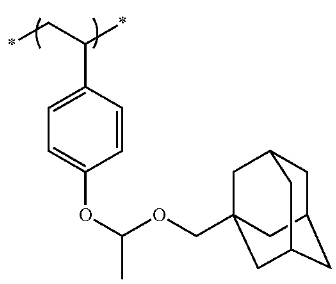
(VI-36)
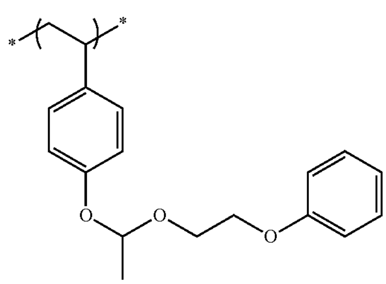
(VI-37)
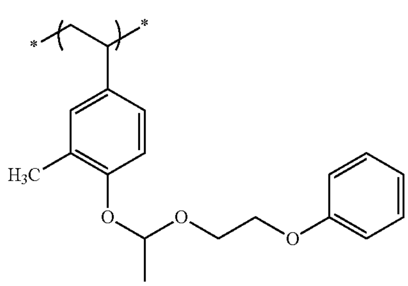
-continued
(VI-38)
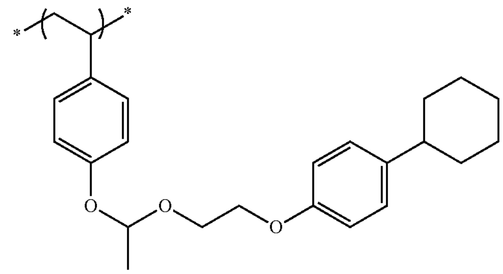
(VI-39)
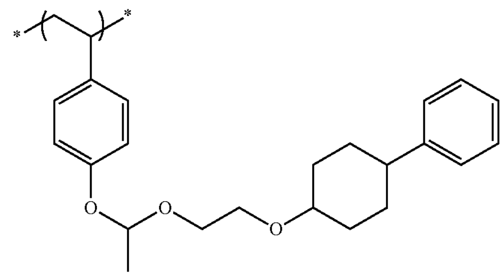
(VI-40)
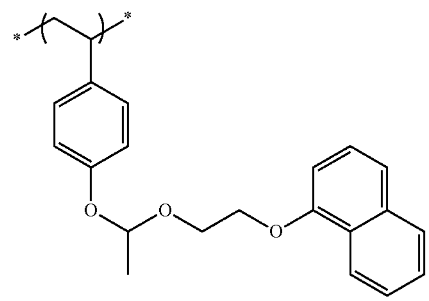
(VI-41)
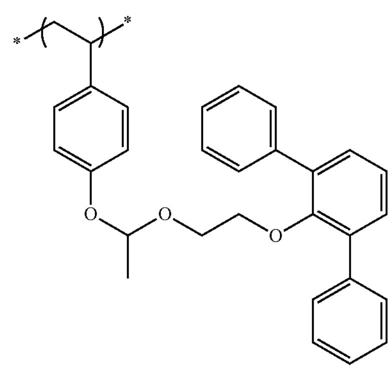
(VI-42)
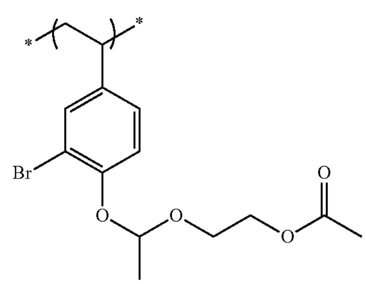

-continued
(VI-43)
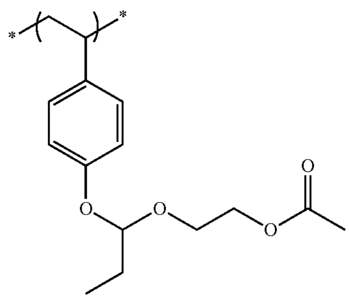
(VI-44)
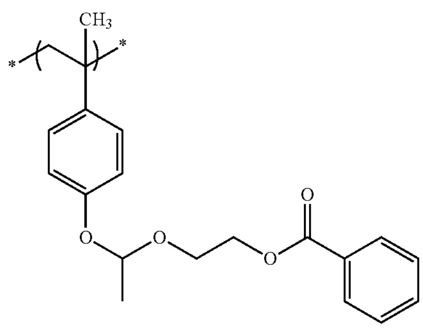
(VI-45)
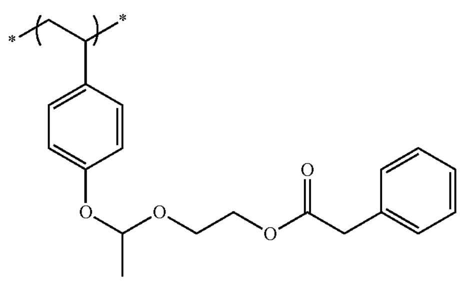
(VI-46)
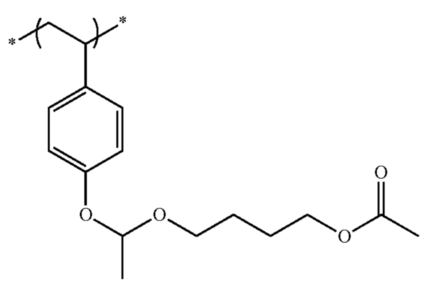
(VI-47)
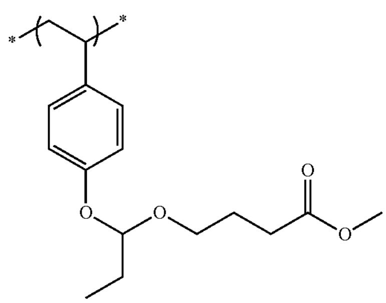
-continued
(VI-48)
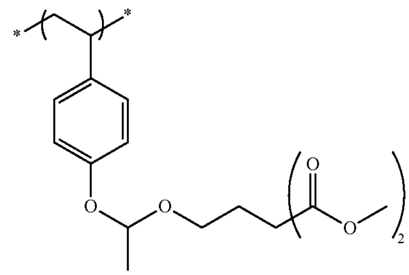
(VI-49)
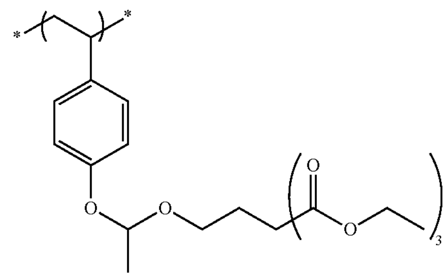
(VI-50)
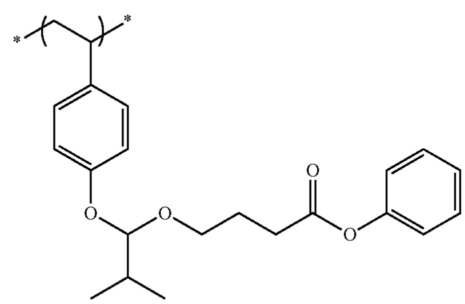
(VI-51)
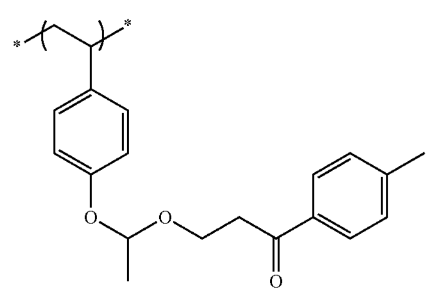
(VI-52)
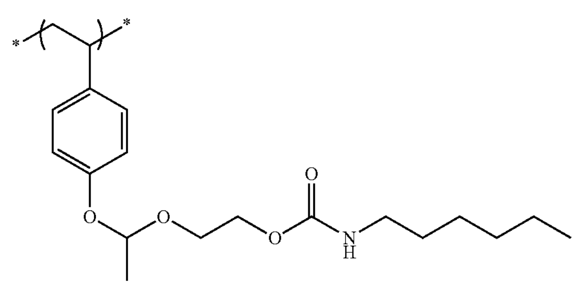

-continued
(VI-53)
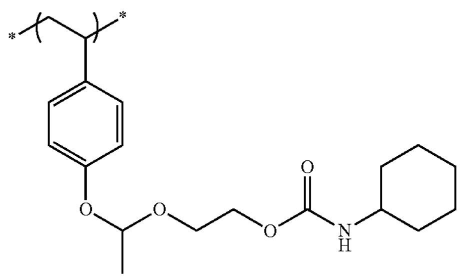
(VI-54)
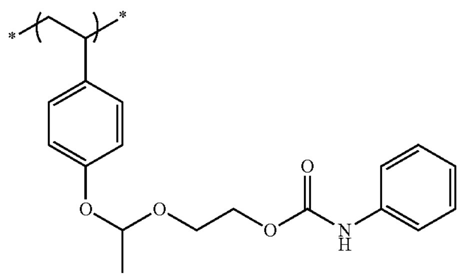
(VI-55)
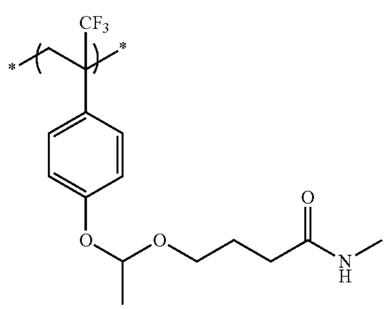
(VI-56)
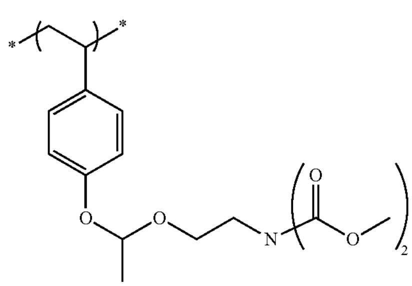
(VI-57)
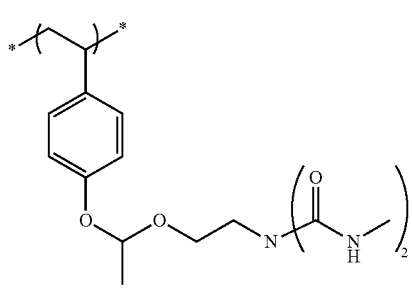
-continued
(VI-58)
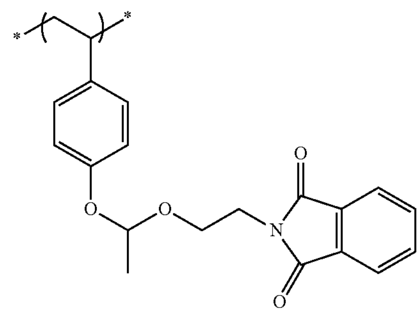
(VI-59)
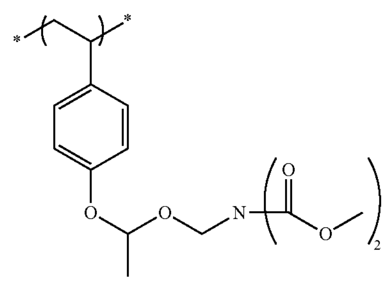
(VI-60)
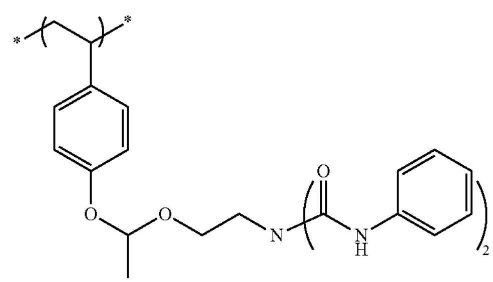
(VI-61)
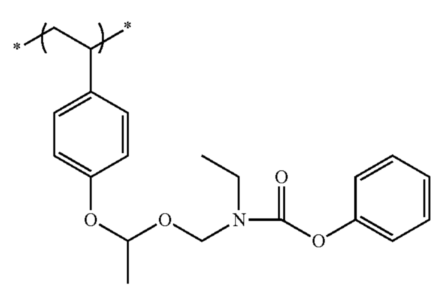
(VI-62)
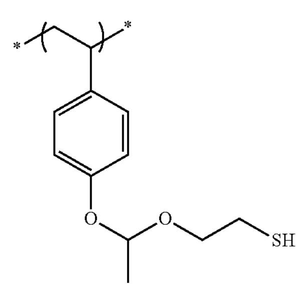

-continued
(VI-63)
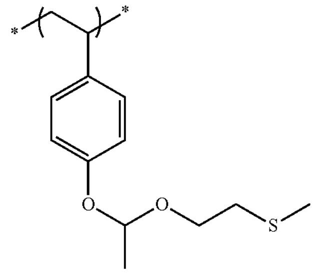
(VI-64)
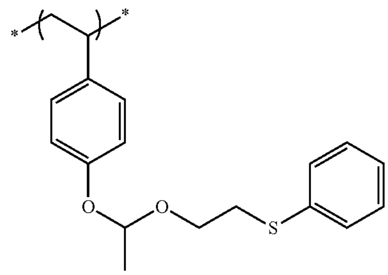
(VI-65)
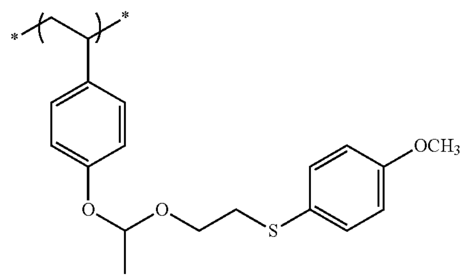
(VI-66)
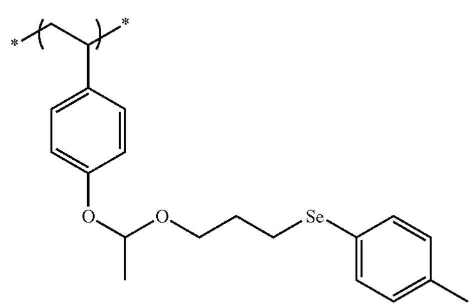
(VI-67)
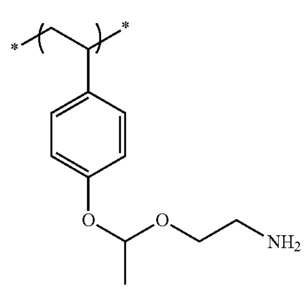
-continued
(VI-68)
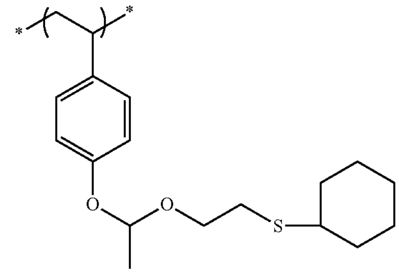
(VI-69)
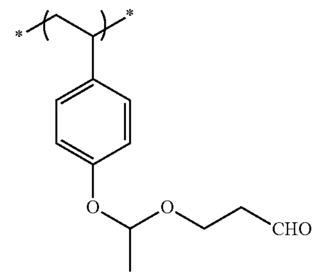
(VI-70)
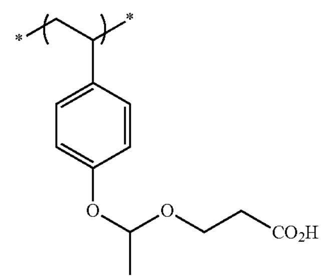
(VI-71)
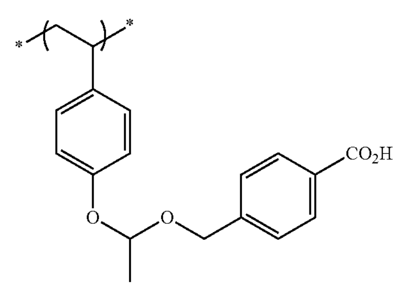
(VI-72)
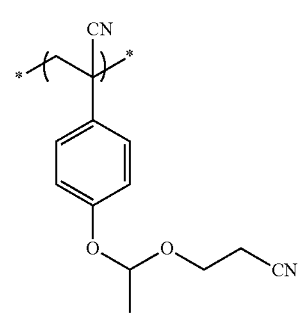

-continued
(VI-73)
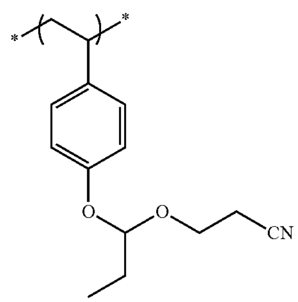
(VI-74)
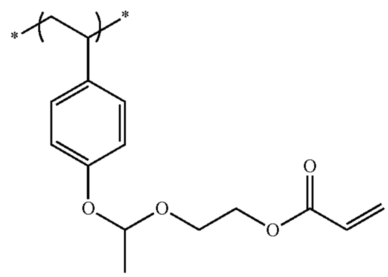
(VI-75)
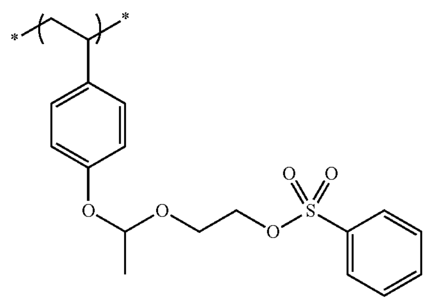
(VI-76)
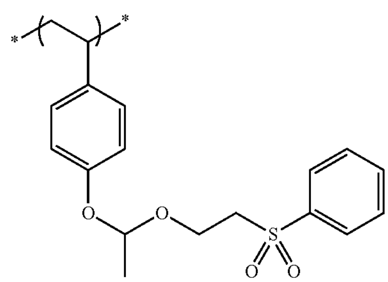
(VI-77)
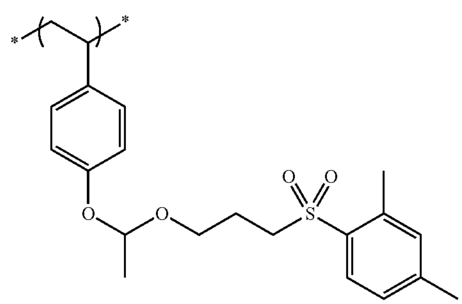
-continued
(VI-78)
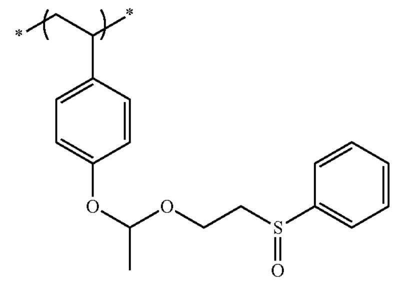
(VI-79)
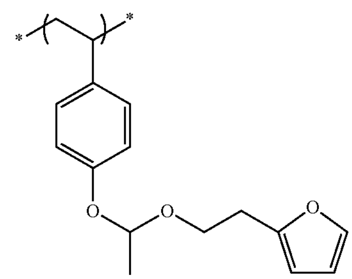
(VI-80)
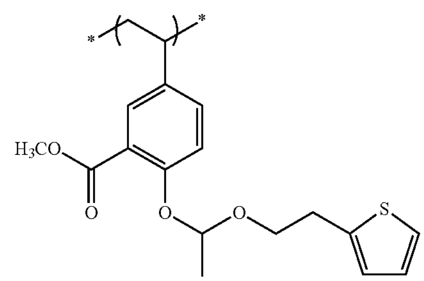
(VI-81)
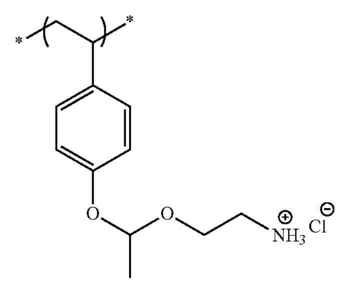
(VI-82)
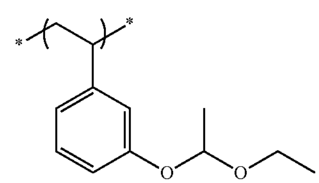
(VI-83)
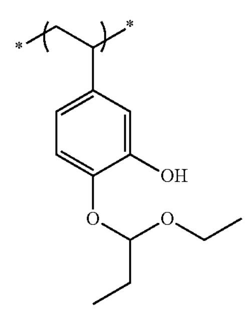

-continued
(VI-84)
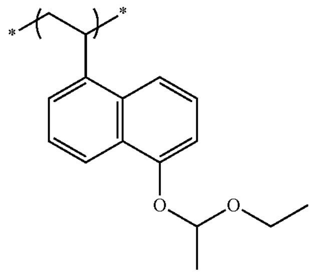
(VI-85)
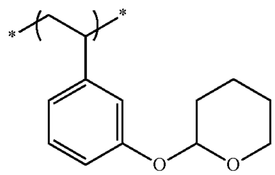
(VI-86)
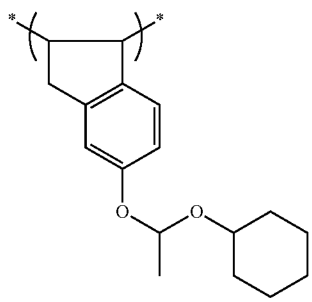
(VI-87)
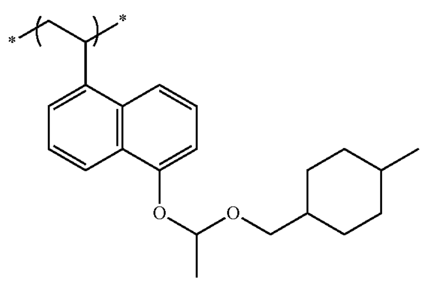
(VI-88)
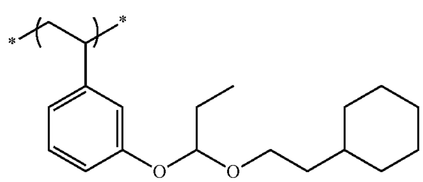
(VI-89)
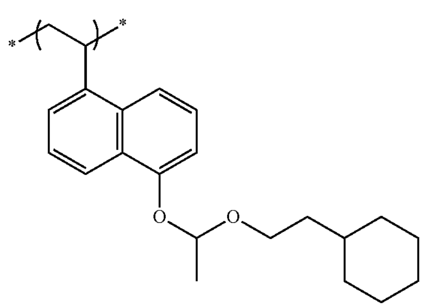
-continued
(VI-90)
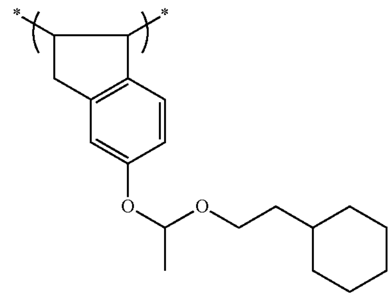
(VI-91)
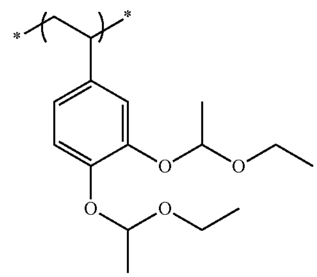
(VI-92)
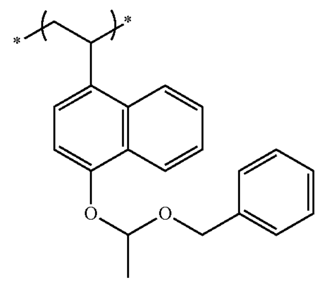
(VI-93)
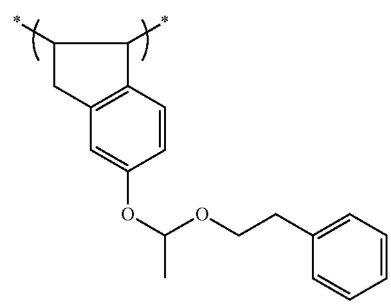
(VI-94)
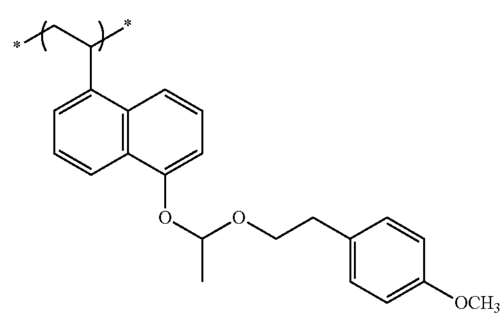

-continued
(VI-95)
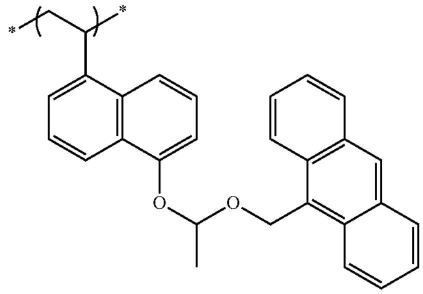
(VI-96)
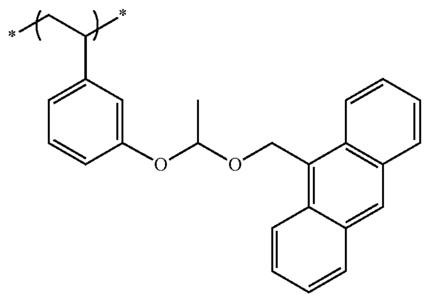
(VI-97)
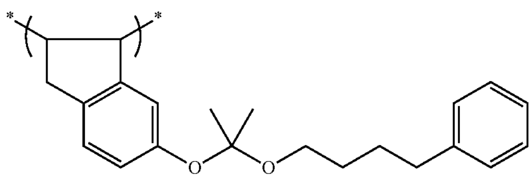
(VI-98)
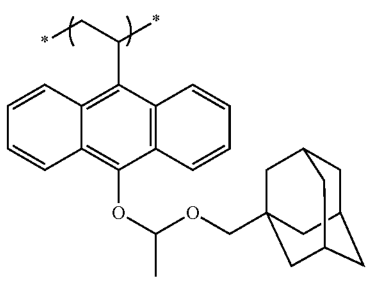
(VI-99)
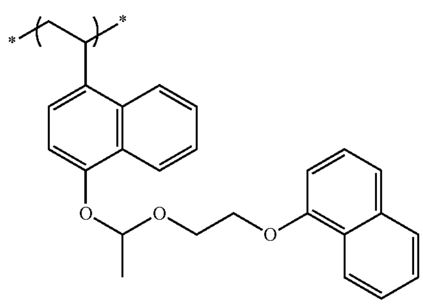
(VI-100)
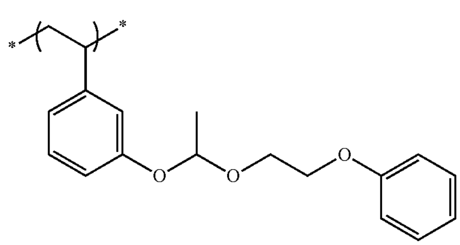
-continued
(VI-101)
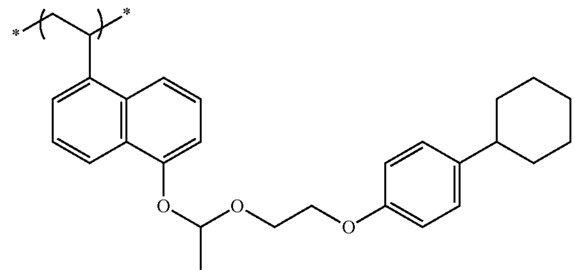
(VI-102)
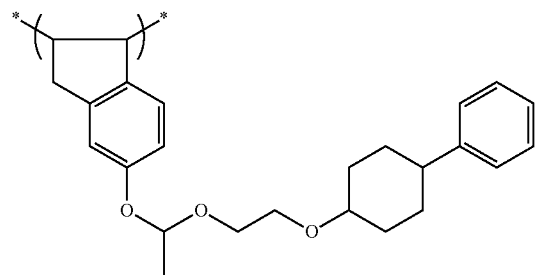
(VI-103)
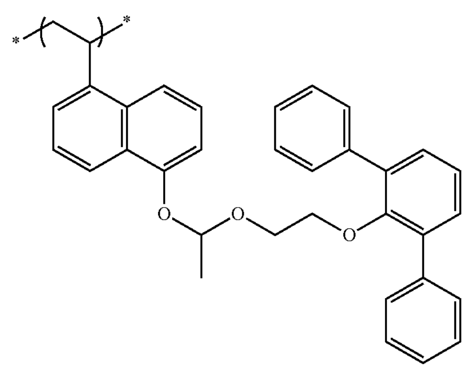
(VI-104)
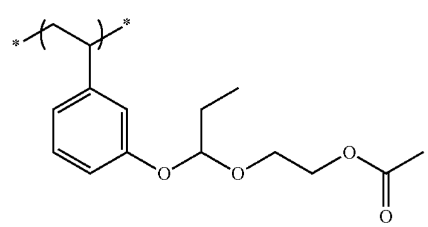
(VI-105)
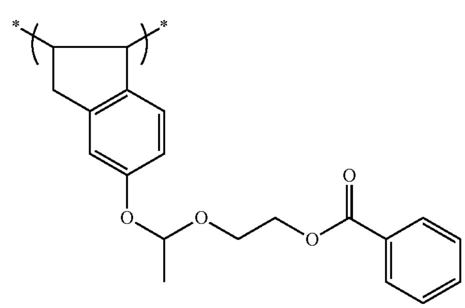

-continued
(VI-106)
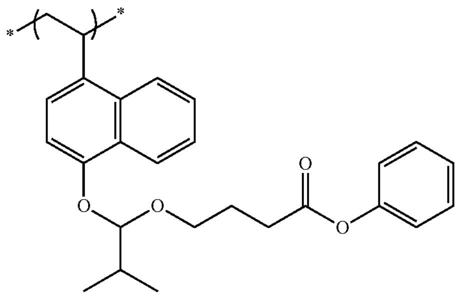
(VI-107)
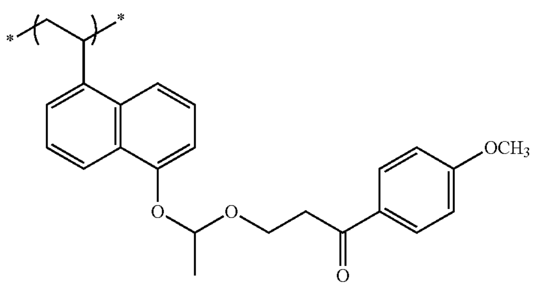
(VI-108)
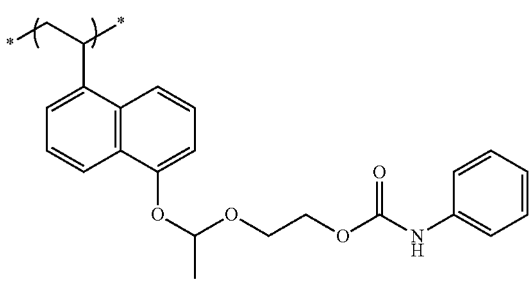
(VI-109)
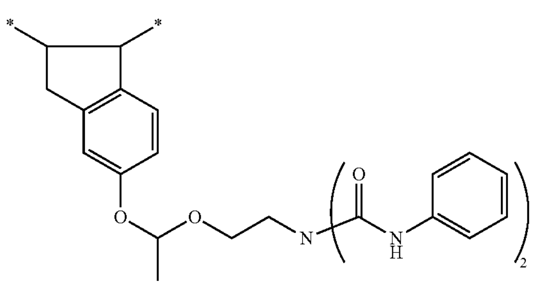
(VI-110)
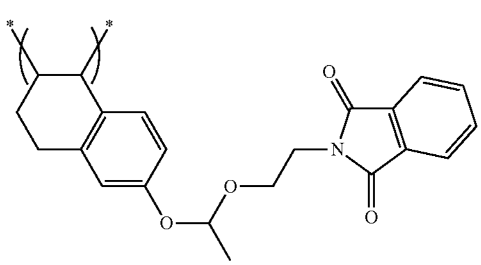
-continued
(VI-111)
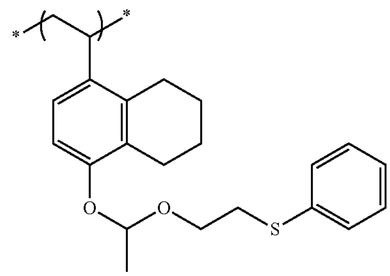
(VI-112)
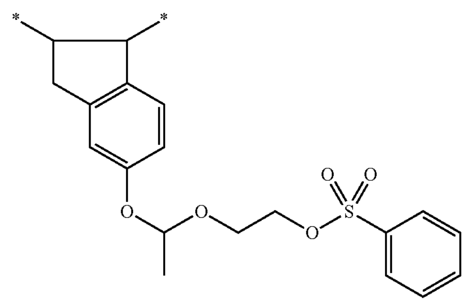
(VI-113)
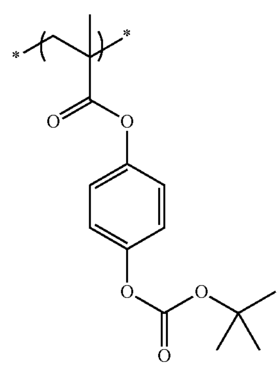
(VI-114)
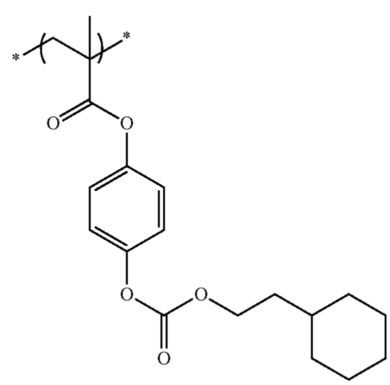

-continued
(VI-115)
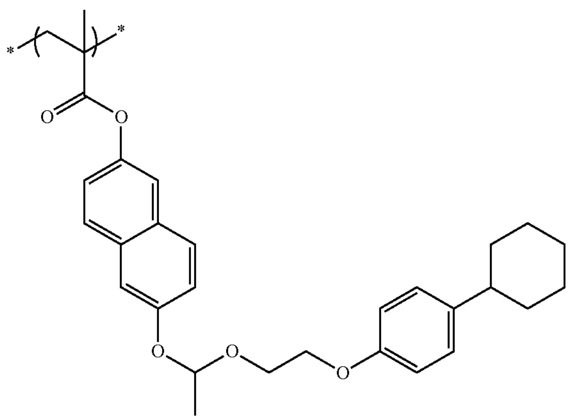
(VI-116)
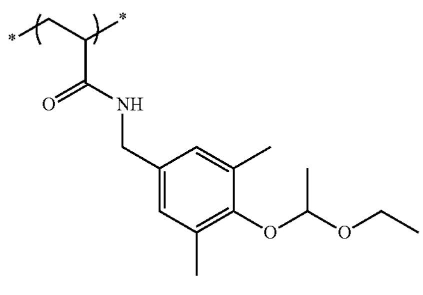
(VI-117)
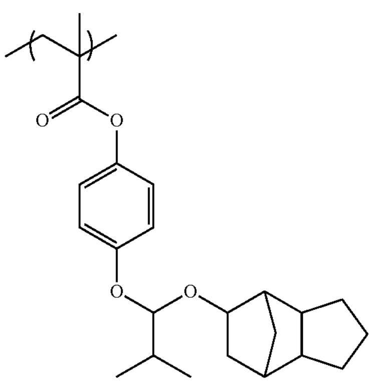
(VI-118)
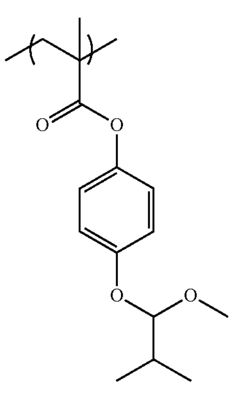
-continued
(VI-119)
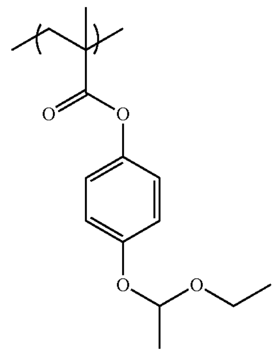
(VI-120)
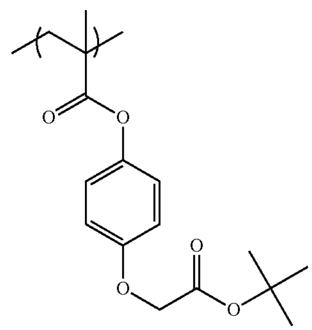
(VI-121)
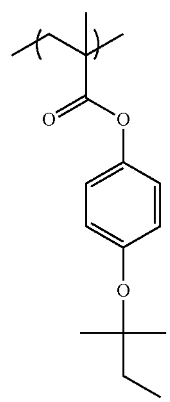
(VI-122)
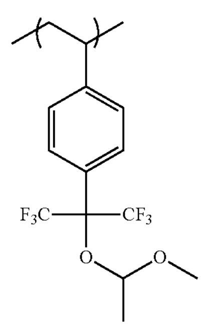

-continued
(VI-123)
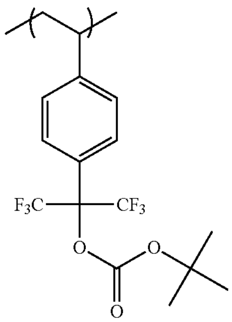
(VI-124)
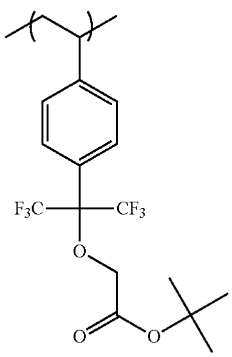
(VI-125)
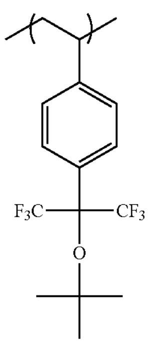
(VI-126)
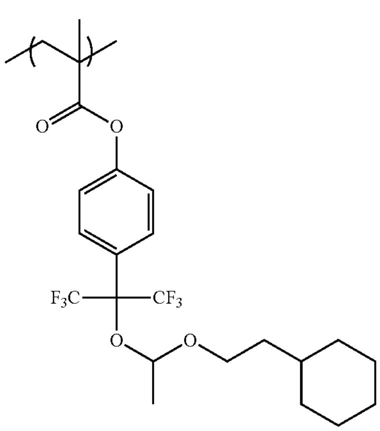
-continued
(VI-127)
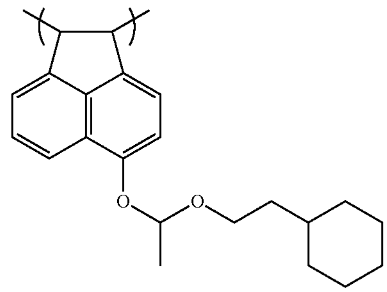
(VI-128)
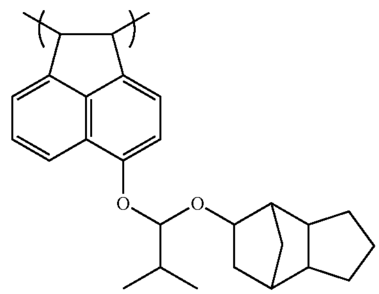
(VI-129)
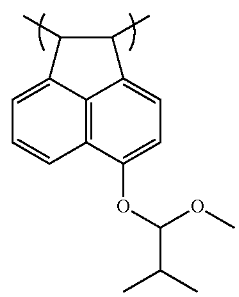
(VI-130)
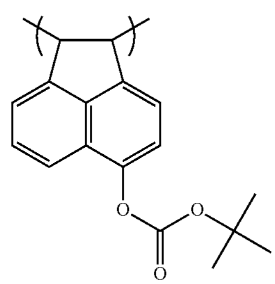
(VI-131)
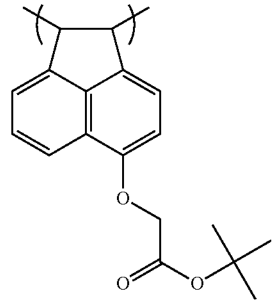

-continued
(VI-132)
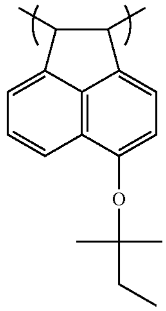
(VI-133)
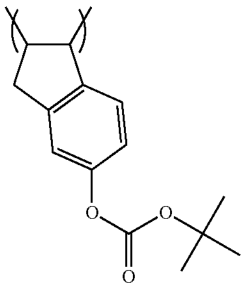
(VI-134)
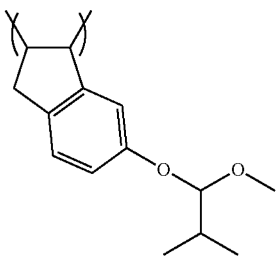
(VI-135)
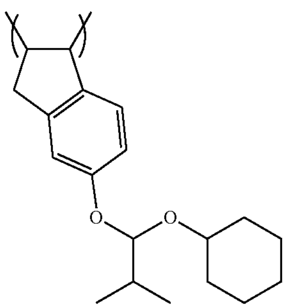
(VI-136)
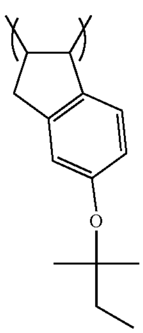
-continued
(VI-137)
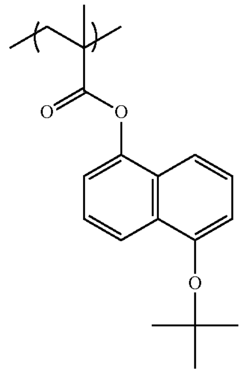
(VI-138)
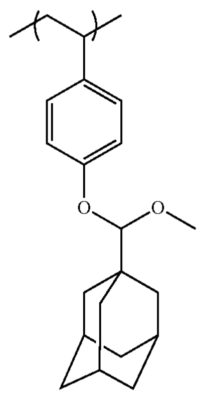
(VI-139)
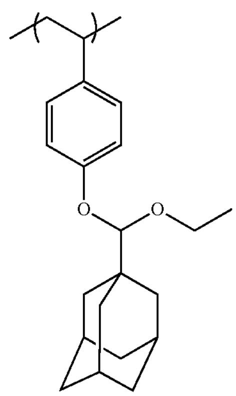
(VI-140)
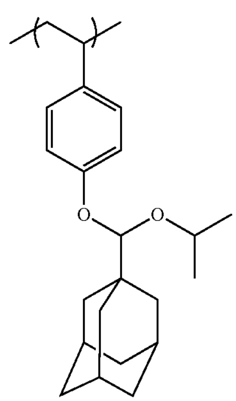

-continued (VI-141)

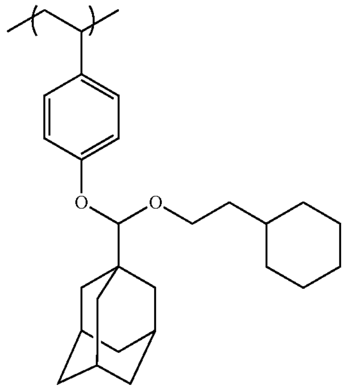

Also, the resin (A) may contain, as the repeating unit (a), a repeating unit represented by the following formula (BZ):

(BZ)

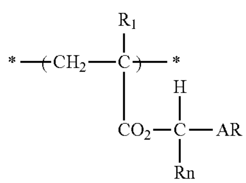

In formula (BZ), AR represents an aryl group, Rn represents an alkyl group, a cycloalkyl group or an aryl group, and Rn and AR may combine with each other to form a non-aromatic ring.

$R_1$ represents a hydrogen atom, an alkyl group, a cycloalkyl group, a halogen atom, a cyano group or an alkyloxycarbonyl group.

The aryl group of AR is preferably an aryl group having a carbon number 6 to 20, such as phenyl group, naphthyl group, anthryl group and fluorene group, more preferably an aryl group having a carbon number of 6 to 15.

When AR is a naphthyl group, an anthryl group or a fluorene group, the bonding position of AR to the carbon atom to which Rn is bonded is not particularly limited. For example, when AR is a naphthyl group, the carbon atom may be bonded to the α-position or β-position of the naphthyl group. When AR is an anthryl group, the carbon atom may be bonded to the 1-position, 2-position or 9-position of the anthryl group.

The aryl group as AR may have one or more substituents. Specific examples of the substituent include a linear or branched alkyl group having a carbon number of 1 to 20, such as methyl group, ethyl group, propyl group, isopropyl group, n-butyl group, isobutyl group, tert-butyl group, pentyl group, hexyl group, octyl group and dodecyl group, an alkoxy group containing such an alkyl group moiety, a cycloalkyl group such as cyclopentyl group and cyclohexyl group, a cycloalkoxy group containing such a cycloalkyl group moiety, a hydroxyl group, a halogen atom, an aryl group, a cyano group, a nitro group, an acyl group, an acyloxy group, an acylamino group, a sulfonylamino group, an alkylthio group, an arylthio group, an aralkylthio group, a thiophenecarbonyloxy group, a thiophenemethylcarbonyloxy group, and a heterocyclic residue such as pyrrolidone residue. The substituent is preferably a linear or branched alkyl group having a carbon number of 1 to 5 or an alkoxy group containing such an alkyl group moiety, more preferably a para-methyl group or a para-methoxy group.

In the case where the aryl group as AR has a plurality of substituents, at least two members of the plurality of substituents may combine with each other to form a ring. The ring is preferably a 5- to 8-membered ring, more preferably a 5- or 6-membered ring. The ring may be a heterocyclic ring containing a heteroatom such as oxygen atom, nitrogen atom and sulfur atom, in the ring members.

Furthermore, this ring may have a substituent. Examples of the substituent are the same as those described later for the further substituent which may be substituted on Rn.

In view of the roughness performance, the repeating unit (a) represented by formula (BZ) preferably contains two or more aromatic rings. Usually, the number of aromatic rings contained in the repeating unit is preferably 5 or less, more preferably 3 or less.

Also, in the repeating unit (a) represented by formula (BZ), in view of the roughness performance, AR preferably contains two or more aromatic rings, and it is more preferred that AR is a naphthyl group or a biphenyl group. Usually, the number of aromatic rings contained in AR is preferably 5 or less, more preferably 3 or less.

As described above, Rn represents an alkyl group, a cycloalkyl group or an aryl group.

The alkyl group of Rn may be a linear alkyl group or a branched alkyl group. The alkyl group is preferably an alky group having a carbon number of 1 to 20, such as methyl group, ethyl group, propyl group, isopropyl group, n-butyl group, isobutyl group, tert-butyl group, pentyl group, hexyl group, cyclohexyl group, octyl group and dodecyl group. The alkyl group of Rn is preferably an alkyl group having a carbon number of 1 to 5, more preferably an alkyl group having a carbon number of 1 to 3.

The cycloalkyl group of Rn includes, for example, a cycloalkyl group having a carbon number of 3 to 15, such as cyclopentyl group and cyclohexyl group.

The aryl group of Rn is preferably, for example, an aryl group having a carbon number of 6 to 14, such as phenyl group, xylyl group, toluoyl group, cumenyl group, naphthyl group and anthryl group.

Each of the alkyl group, cycloalkyl group and aryl group as Rn may further have a substituent. Examples of the substituent include an alkoxy group, a hydroxyl group, a halogen atom, a nitro group, an acyl group, an acyloxy group, an acylamino group, a sulfonylamino group, a dialkylamino group, an alkylthio group, an arylthio group, an aralkylthio group, a thiophenecarbonyloxy group, a thiophenemethylcarbonyloxy group, and a heterocyclic residue such as pyrrolidone residue. Among these, an alkoxy group, a hydroxyl group, a halogen atom, a nitro group, an acyl group, an acyloxy group, an acylamino group and a sulfonylamino group are preferred.

As described above, $R_1$ represents a hydrogen atom, an alkyl group, a cycloalkyl group, a halogen atom, a cyano group or an alkyloxycarbonyl group.

Examples of the alkyl group and cycloalkyl group of $R_1$ are the same as those described above for Rn. Each of these alkyl group and cycloalkyl group may have a substituent. Examples of this substituent are the same as those described above for Rn.

In the case where $R_1$ is an alkyl or cycloalkyl group having a substituent, particularly preferred examples of $R_1$ include a trifluoromethyl group, an alkyloxycarbonylmethyl group, an alkylcarbonyloxymethyl group, a hydroxymethyl group, and an alkoxymethyl group.

The halogen atom of $R_1$ includes fluorine atom, chlorine atom, bromine atom and iodine atom, with fluorine atom being preferred.

As the alkyl group moiety contained in the alkyloxycarbonyl group of $R_1$, for example, the configuration described above as the alkyl group of $R_1$ may be employed.

Rn and AR preferably combine with each other to form a non-aromatic ring and in this case, the roughness performance can be more improved, among others.

The non-aromatic ring which may be formed by combining Rn and AR with each other is preferably a 5- to 8-membered ring, more preferably a 5- or 6-membered ring.

The non-aromatic ring may be an aliphatic ring or a heterocyclic ring containing a heteroatom such as oxygen atom, nitrogen atom and sulfur atom, as a ring member.

The non-aromatic ring may have a substituent. Examples of the substituent are the same as those described above for the further substituent which Rn may have.

Specific examples of the repeating unit (a) represented by formula (BZ) are illustrated below, but the present invention is not limited thereto.

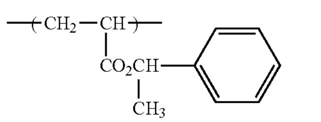
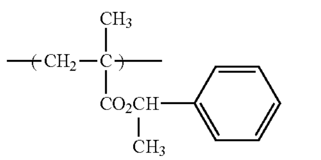
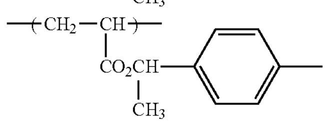
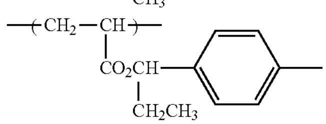
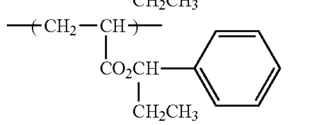
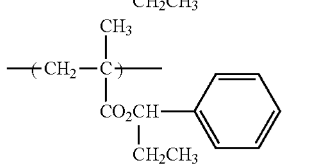
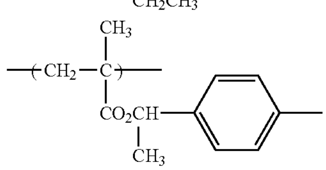
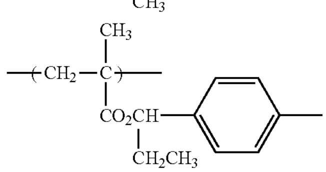

-continued

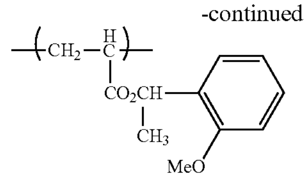
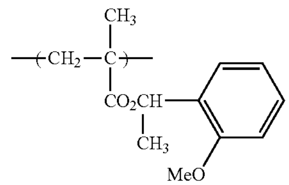
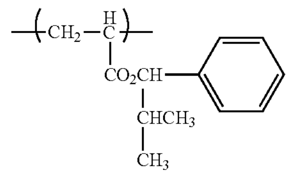
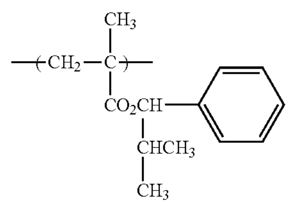
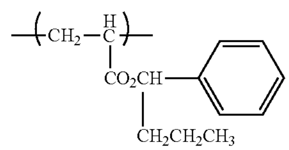
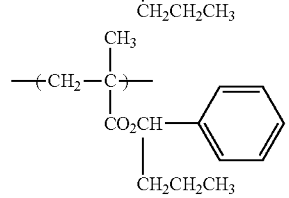
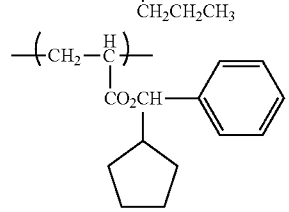
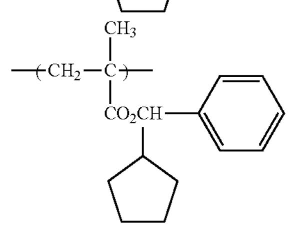
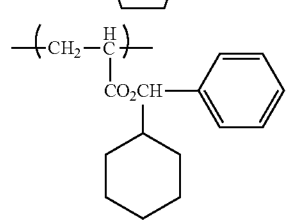

-continued
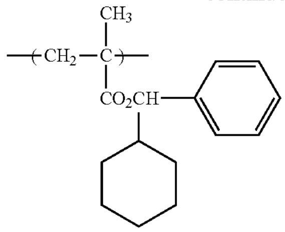
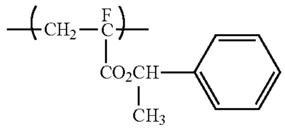
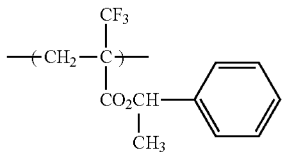
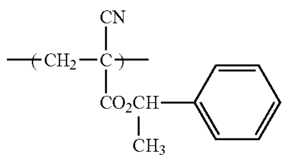
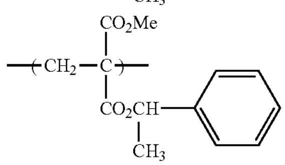
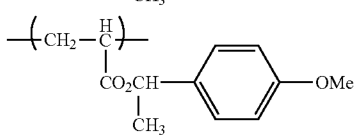
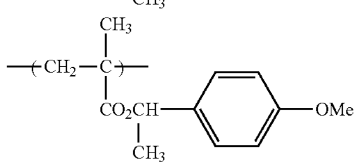
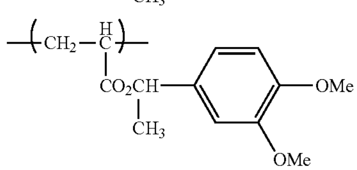
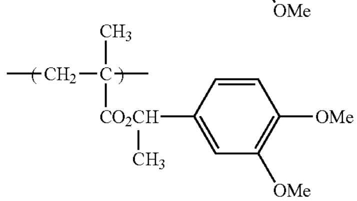
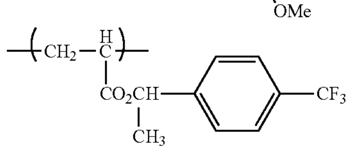
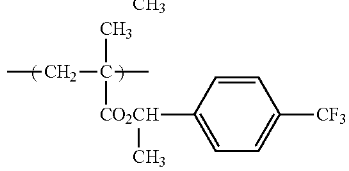
-continued
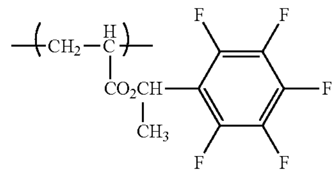
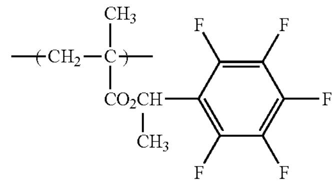
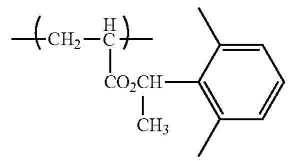
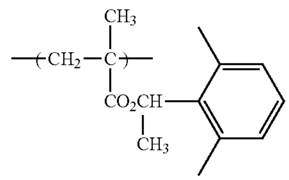
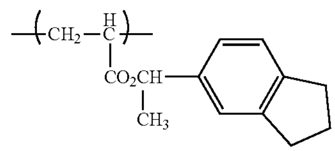
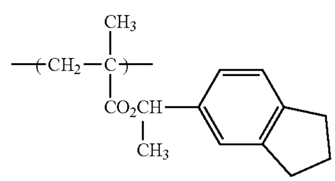
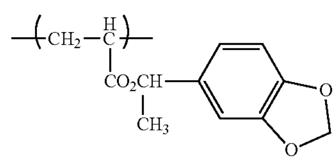
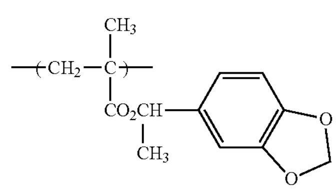
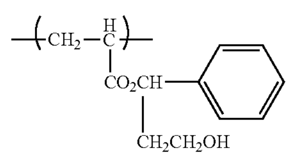
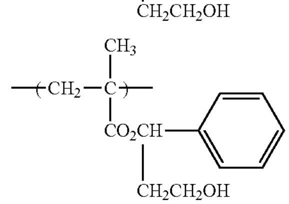

-continued
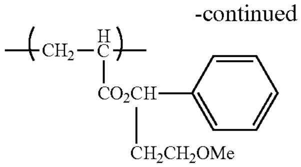
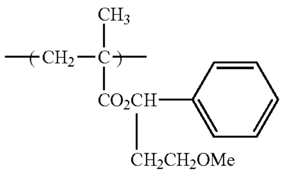
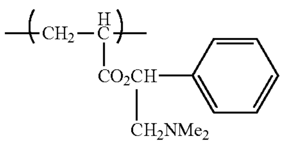
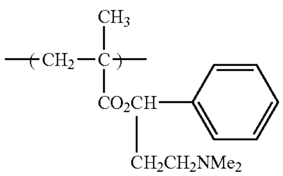
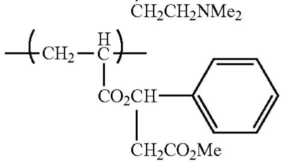
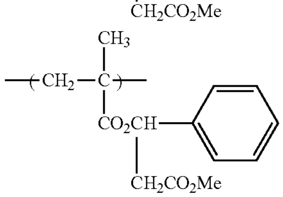
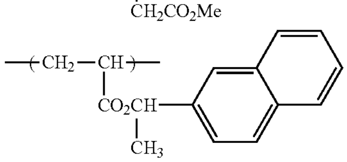
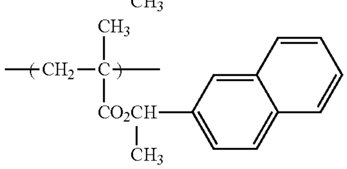
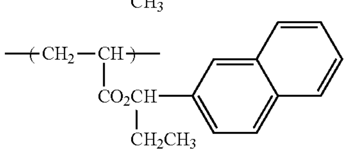
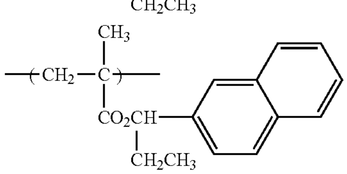
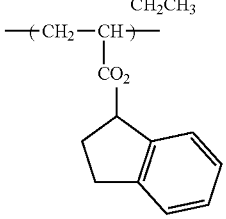
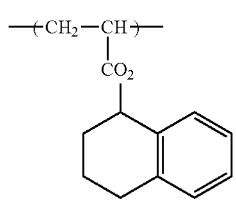
-continued
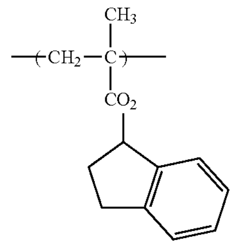
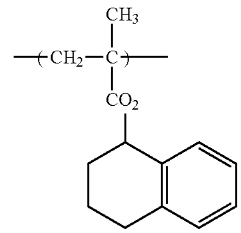
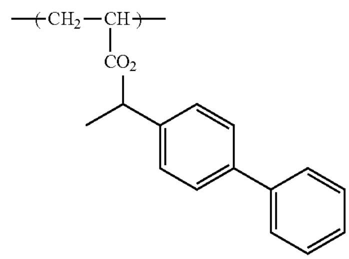
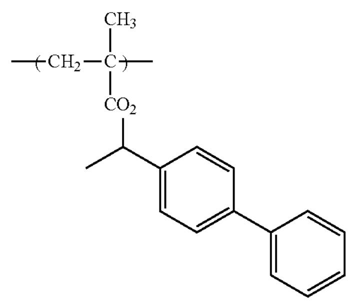
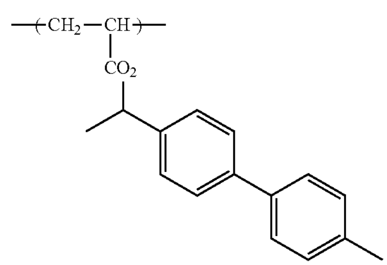
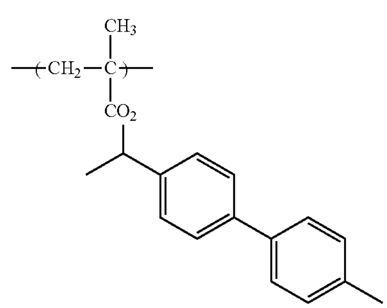
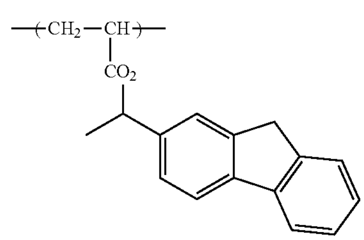

-continued
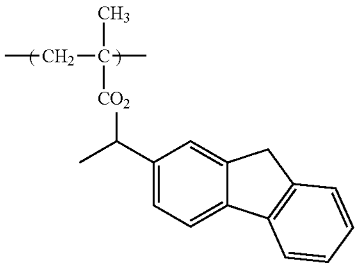
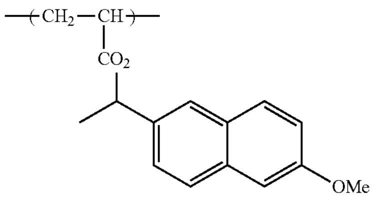
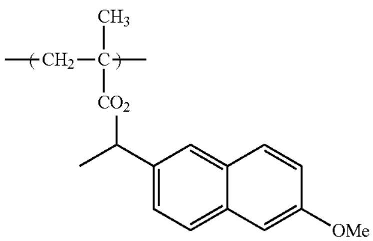
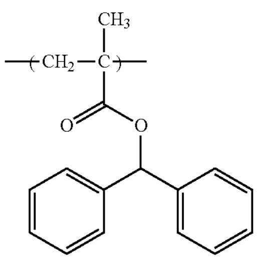
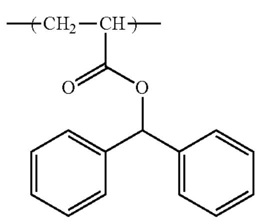
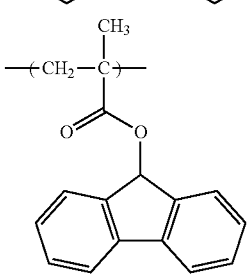
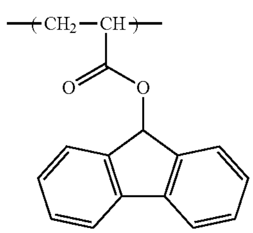
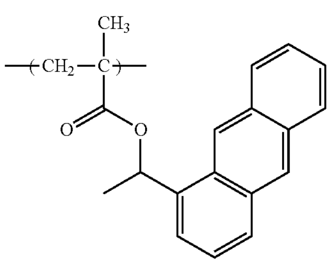
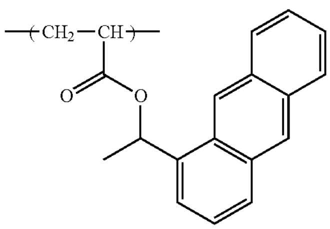
-continued
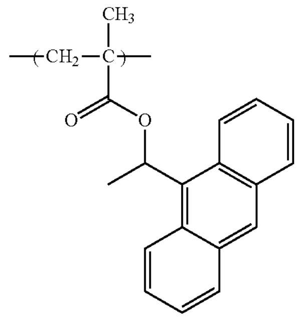
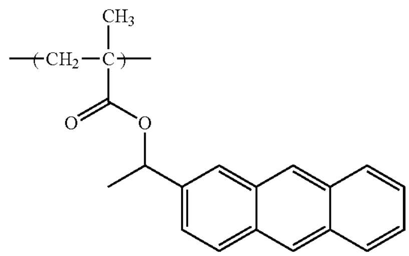
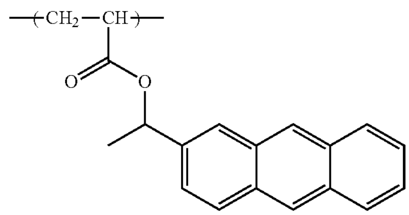
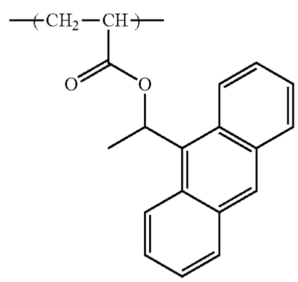
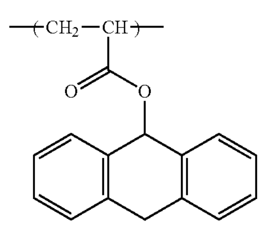
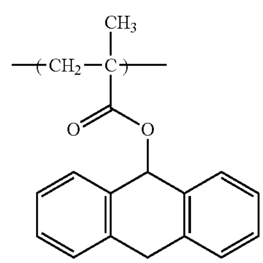
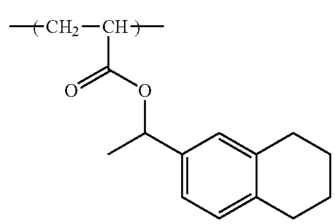

-continued

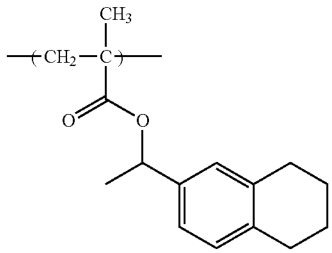

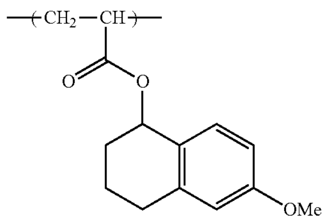

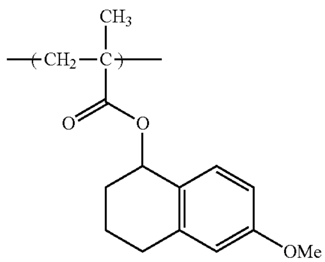

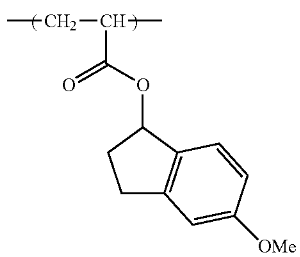

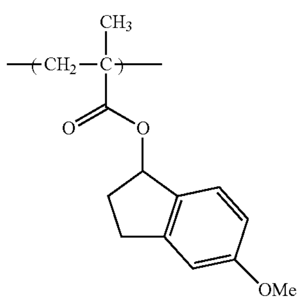

As the embodiment of the acid-decomposable group-containing repeating unit different from the repeating units exemplified above, the repeating unit may be in an embodiment of producing an alcoholic hydroxyl group. In this case, the repeating unit is preferably represented by at least one formula selected from the group consisting of the following formulae (I-1) to (I-10). The repeating unit is more preferably represented by at least one formula selected from the group consisting of the following formulae (I-1) to (I-3), still more preferably represented by the following formula (I-1).

(I-1)

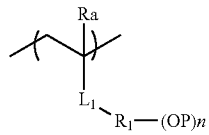

(I-2)

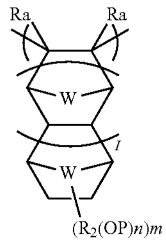

(I-3)

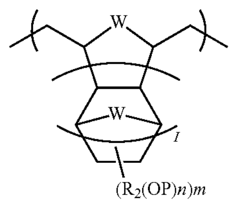

(I-4)

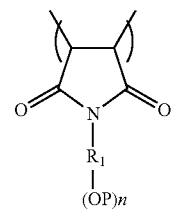

(I-5)

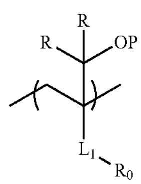

(I-6)

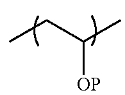

(I-7)

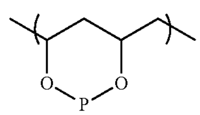

(I-8)

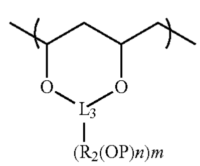

(I-9)

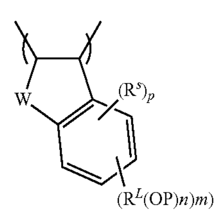

-continued (I-10)

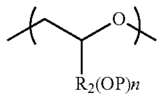

In the formulae, each Ra independently represents a hydrogen atom, an alkyl group or a group represented by —$CH_2$—O—$Ra_2$, wherein $Ra_2$ represents a hydrogen atom, an alkyl group or an acyl group.

$R_1$ represents an (n+1)-valent organic group.

$R_2$ represents, when m≥2, each independently represents, a single bond or an (n+1)-valent organic group.

Each OP independently represents a group capable of decomposing by the action of an acid to produce an alcoholic hydroxy group, and when n≥2 and/or m≥2, two or more OP's may combine with each other to form a ring.

W represents a methylene group, an oxygen atom or a sulfur atom.

n and m represent an integer of 1 or more. Incidentally, in the case where $R_2$ in formula (I-2), (I-3) or (I-8) represents a single bond, n is 1.

l represents an integer of 0 or more.

$L_1$ represents a linking group represented by —COO—, —COO—, —CONH—, —O—, —Ar—, —$SO_3$— or —$SO_2$NH—, wherein Ar represents a divalent aromatic ring group.

Each R independently represents a hydrogen atom or an alkyl group.

$R_0$ represents a hydrogen atom or an organic group.

$L_3$ represents an (m+2)-valent linking group.

$R^L$ represents, when m≥2 each, independently represents, an (n+1)-valent linking group.

$R^S$ represents, when p≥2, each independently represents, a substituent, and when p≥2, the plurality of $R^S$s may combine with each other to form a ring.

p represents an integer of 0 to 3.

Ra represents a hydrogen atom, an alkyl group or a group represented by —$CH_2$—O—$Ra_2$. Ra is preferably a hydrogen atom or an alkyl group having a carbon number of 1 to 10, more preferably a hydrogen or a methyl group.

W represents a methylene group, an oxygen atom or a sulfur atom. W is preferably a methylene group or an oxygen atom.

$R_1$ represents an (n+1)-valent organic group. $R_1$ is preferably a non-aromatic hydrocarbon group. In this case, $R_1$ may be a chain hydrocarbon group or an alicyclic hydrocarbon group. $R_1$ is more preferably an alicyclic hydrocarbon group.

$R_2$ represents a single bond or an (n+1)-valent organic group. $R_2$ is preferably a single bond or a non-aromatic hydrocarbon group. In this case, $R_2$ may be a chain hydrocarbon group or an alicyclic hydrocarbon group.

In the case where $R_1$ and/or $R_2$ are a chain hydrocarbon group, this chain hydrocarbon group may be linear or branched. The carbon number of the chain hydrocarbon group is preferably from 1 to 8. For example, when $R_1$ and/or $R_2$ are an alkylene group, $R_1$ and/or $R_2$ are preferably a methylene group, an ethylene group, an n-propylene group, an isopropylene group, an n-butylene group, an isobutylene group or a sec-butylene group.

In the case where $R_1$ and/or $R_2$ are an alicyclic hydrocarbon group, this alicyclic hydrocarbon group may be monocyclic or polycyclic. The alicylcic hydrocarbon group has, for example, a monocyclo, bicyclo, tricyclo or tetracyclo structure. The carbon number of the alicyclic hydrocarbon group is usually 5 or more, preferably from 6 to 30, more preferably from 7 to 25.

The alicyclic hydrocarbon group includes, for example, those having a partial structure illustrated below. Each of these partial structures may have a substituent. Also, in each of these partial structures, the methylene group (—$CH_2$—) may be substituted with an oxygen atom (—O—), a sulfur atom (—S—), a carbonyl group [—C(═O)—], a sulfonyl group [—S(═O)$_2$—], a sulfinyl group [—S(═O)—] or an imino group [—N(R)—] (wherein R is a hydrogen atom or an alkyl group).

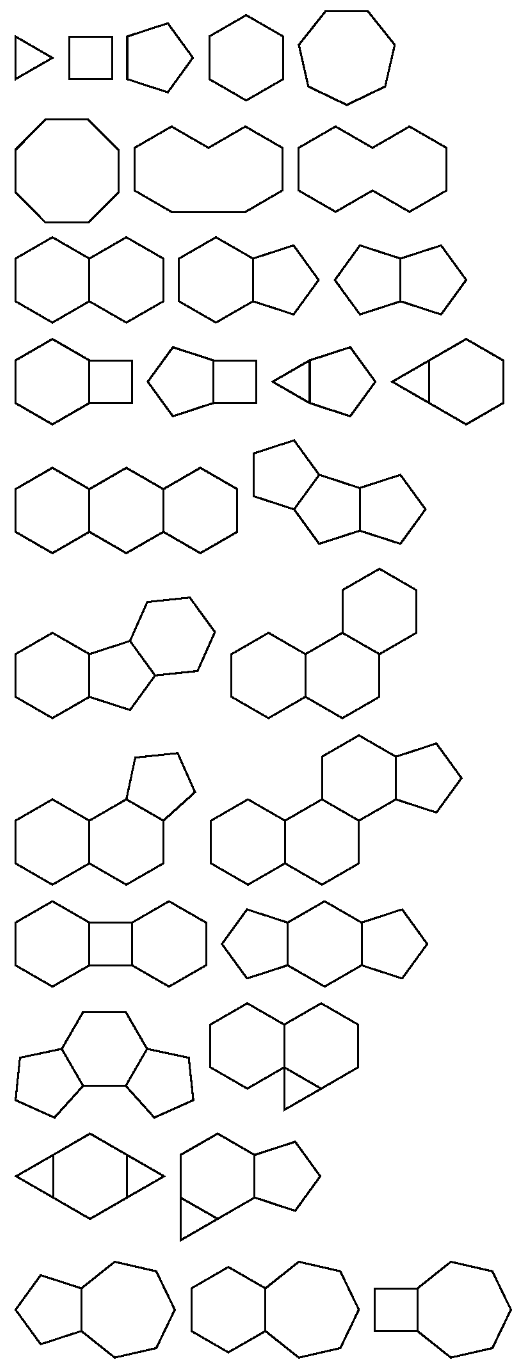

-continued

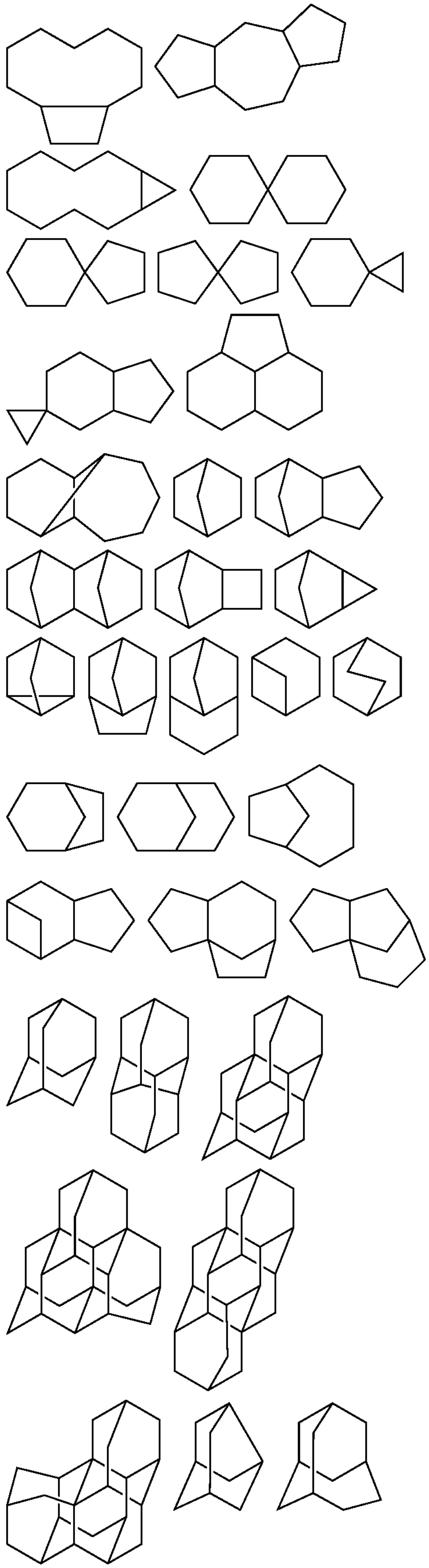

-continued

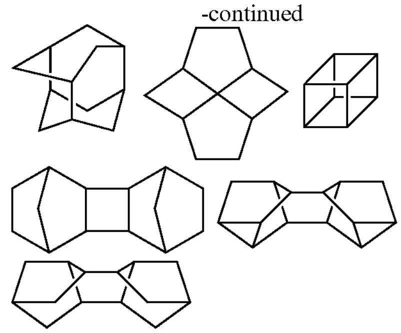

For example, when $R_1$ and/or $R_2$ are a cycloalkylene group, $R_1$ and/or $R_2$ are preferably an adamantylene group, a noradamantylene group, a decahydronaphthylene group, a tricyclodecanylene group, a tetracyclododecanylene group, a norbornylene group, a cyclopentylene group, a cyclohexylene group, a cycloheptylene group, a cyclooctylene group, a cyclodecanylene group or a cyclododecanylene group, more preferably an adamantylene group, a norbornylene group, a cyclohexylene group, a cyclopentylene group, a tetracyclododecanylene group or a tricyclodecanylene group.

The non-aromatic hydrocarbon group of $R_1$ and/or $R_2$ may have a substituent. Examples of this substituent include an alkyl group having a carbon number of 1 to 4, a halogen atom, a hydroxy group, an alkoxy group having a carbon number of 1 to 4, a carboxy group, and an alkoxycarbonyl group having a carbon number of 2 to 6. These alkyl group, alkoxy group and alkoxycarbonyl group may further have a substituent, and examples of the substituent include a hydroxy group, a halogen atom, and an alkoxy group.

$L_1$ represents a linking group represented by —COO—, —OCO—, —CONH—, —O—, —Ar—, $—SO_3—$ or $—SO_2NH—$, wherein Ar represents a divalent aromatic ring group. $L_1$ is preferably a linking group represented by —COO—, —CONH— or —Ar—, more preferably a linking group represented by —COO— or —CONH—.

R represents a hydrogen atom or an alkyl group. The alkyl group may be linear or branched. The carbon number of this alkyl group is preferably from 1 to 6, more preferably from 1 to 3. R is preferably a hydrogen atom or a methyl group, more preferably a hydrogen atom.

$R_0$ represents a hydrogen atom or an organic group. Examples of the organic group include an alkyl group, a cycloalkyl group, an aryl group, an alkynyl group, and an alkenyl group. $R_0$ is preferably a hydrogen atom or an alkyl group, more preferably a hydrogen atom or a methyl group.

$L_3$ represents an (m+2)-valent linking group. That is, $L_3$ represents a trivalent or higher valent linking group. Examples of such a linking group include corresponding groups in specific examples illustrated later.

$R^L$ represents an (n+1)-valent linking group. That is, $R^L$ represents a divalent or higher valent linking group. Examples of such a linking group include an alkylene group, a cycloalkylene group, and corresponding groups in specific examples illustrated later. $R^L$ may combine with another $R^L$ or $R^S$ to form a ring structure.

$R^S$ represents a substituent. The substituent includes, for example, an alkyl group, an alkenyl group, an alkynyl group, an aryl group, an alkoxy group, an acyloxy group, an alkoxycarbonyl group, and a halogen atom.

n is an integer of 1 or more. n is preferably an integer of 1 to 3, more preferably 1 or 2. Also, when n is an integer of 2 or more, the dissolution contrast for an organic solvent-containing developer can be more enhanced and in turn, the limiting resolution and roughness characteristics can be more improved.

m is an integer of 1 or more. m is preferably an integer of 1 to 3, more preferably 1 or 2.

l an integer of 0 or more. l is preferably 0 or 1.

p is an integer of 0 to 3.

Specific examples of the repeating unit having a group capable of decomposing by the action of an acid to produce an alcoholic hydroxy group are illustrated below. In specific examples, Ra and OP have the same meanings as in formulae (I-1) to (I-3). In the case where a plurality of OP's are combined to form a ring, the corresponding ring structure is denoted by "O—P—O" for the sake of convenience.

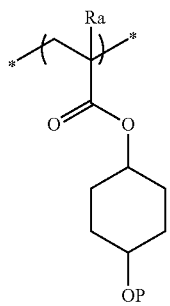

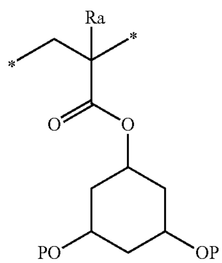

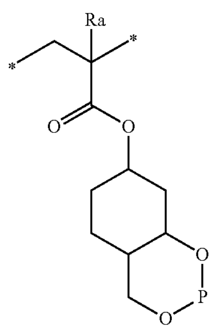

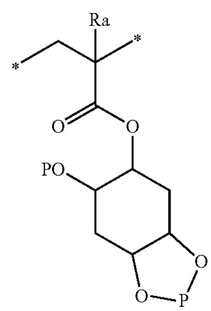

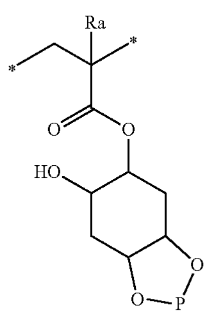

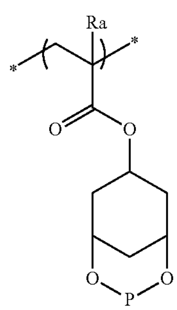

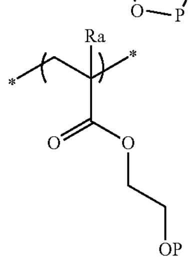

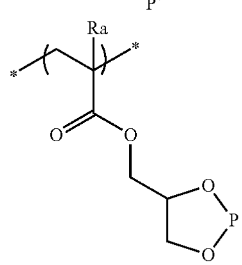

-continued

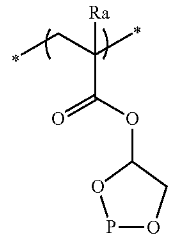

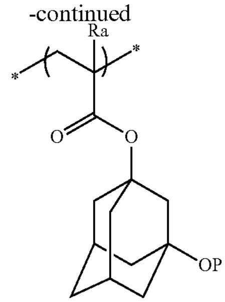

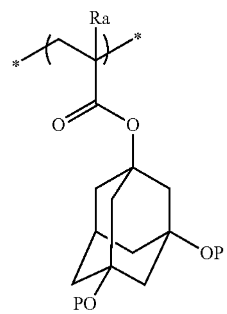

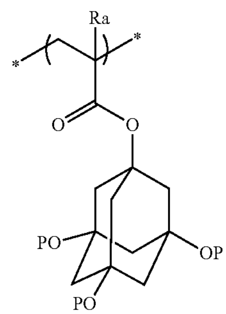

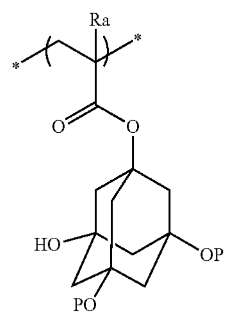

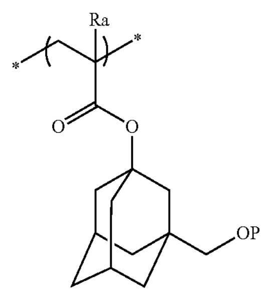

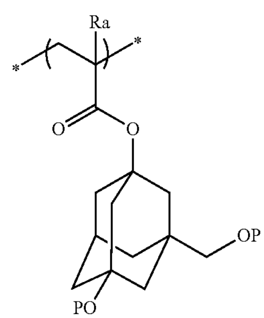

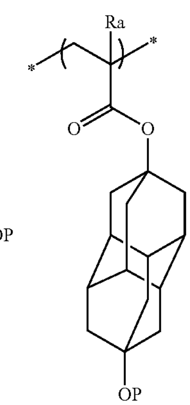

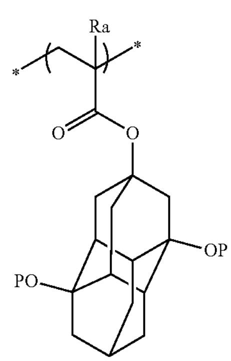

-continued

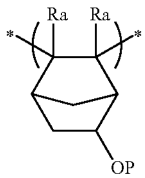
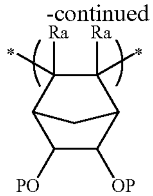
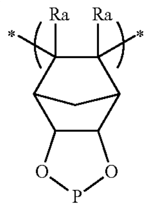
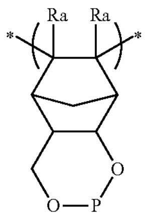
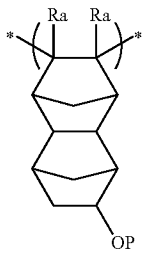
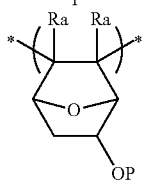
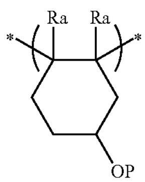
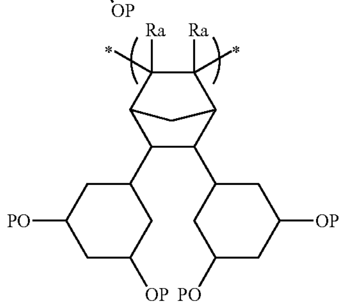
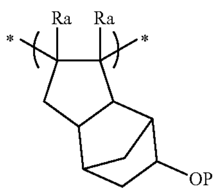
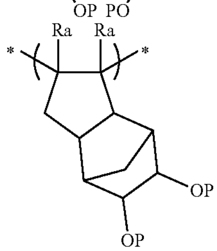
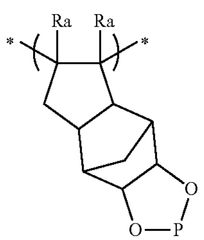
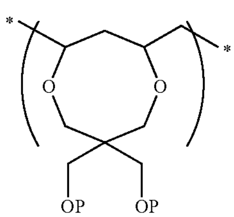
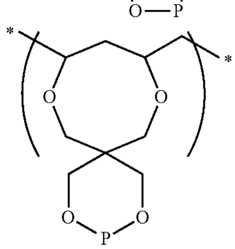

The group capable of decomposing by the action of an acid to produce an alcoholic hydroxy group is preferably represented by at least one formula selected from the group consisting of the following formulae (II-1) to (II-4):

(II-1)

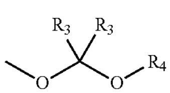

-continued (II-2)

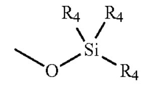

(II-3)

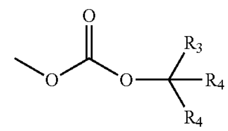

(II-4)

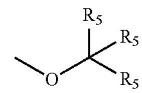

In the formulae, each $R_3$ independently represents a hydrogen atom or a monovalent organic group. $R_3$s may combine with each other to form a ring.

Each $R_4$ independently represents a monovalent organic group. $R_4$s may combine with each other to form a ring. $R_3$ and $R_4$ may combine with each other to form a ring.

Each $R_5$ independently represents a hydrogen atom, an alkyl group, a cycloalkyl group, an aryl group, an alkenyl group or an alkynyl group. At least two $R_5$s may combine with each other to form a ring, provided that when one or two of three $R_5$s are a hydrogen atom, at least one of the remaining $R_5$s represents an aryl group, an alkenyl group or an alkynyl group.

The group capable of decomposing by the action of an acid to produce an alcoholic hydroxy group is also preferably represented by at least one formula selected from the group consisting of the following formulae (II-5) to (II-9):

(II-5)

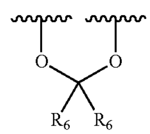

(II-6)

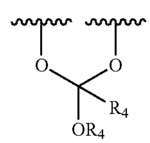

(II-7)

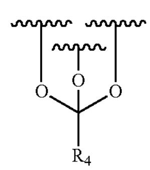

(II-8)

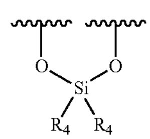

(II-9)

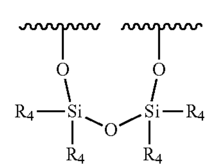

In the formulae, $R_4$ has the same meaning as in formulae (II-1) to (II-3).

Each $R_6$ independently represents a hydrogen atom or a monovalent organic group. $R_6$s may combine with each other to form a ring.

The group capable of decomposing by the action of an acid to produce an alcoholic hydroxy group is more preferably represented by at least one formula selected from formulae (II-1) to (II-3), still more preferably represented by formula (II-1) or (II-3), yet still more preferably represented by formula (II-1).

$R_3$ represents a hydrogen atom or a monovalent organic group as described above. $R_3$ is preferably a hydrogen atom, an alkyl group or a cycloalkyl group, more preferably a hydrogen atom or an alkyl group.

The alkyl group of $R_3$ may be linear or branched. The carbon number of the alkyl group of $R_3$ is preferably from 1 to 10, more preferably from 1 to 3. Examples of the alkyl group of $R_3$ include a methyl group, an ethyl group, an n-propyl group, an isopropyl group, and an n-butyl group.

The cycloalkyl group of $R_3$ may be monocyclic or polycyclic. The carbon number of the cycloalkyl group of $R_3$ is preferably 3 to 10, more preferably 4 to 8. Examples of the cycloalkyl group of $R_3$ include a cyclopropyl group, a cyclobutyl group, a cyclopentyl group, a cyclohexyl group, a norbornyl group, and an adamantyl group.

In formula (II-1), at least either one $R_3$ is preferably a monovalent organic group. When such a configuration is employed, high sensitivity can be achieved among others.

$R_4$ represents a monovalent organic group. $R_4$ is preferably an alkyl group or a cycloalkyl group, more preferably an alkyl group. These alkyl group and cycloalkyl group may have a substituent.

The alkyl group of $R_4$ preferably has no substituent or has one or more aryl groups and/or one or more silyl groups as the substituent. The carbon number of the unsubstituted alkyl group is preferably from 1 to 20. The carbon number of the alkyl group moiety in the alkyl group substituted with one or more aryl groups is preferably from 1 to 25. The carbon number of the alkyl group moiety in the alkyl group substituted with one or more silyl groups is preferably from 1 to 30. Also, in the case where the cycloalkyl group of $R_4$ does not have a substituent, the carbon number thereof is preferably from 3 to 20.

$R_5$ represents a hydrogen atom, an alkyl group, a cycloalkyl group, an aryl group, an alkenyl group or an alkynyl group. However, when one or two of three $R_5$s are a hydrogen atom, at least one of the remaining $R_5$s represents an aryl group, an alkenyl group or an alkynyl group. $R_5$ is preferably a hydrogen atom or an alkyl group. The alkyl group may or may not have a substituent. When the alkyl group does not have a substituent, the carbon number thereof is preferably from 1 to 6, more preferably from 1 to 3.

$R_6$ represents a hydrogen atom or a monovalent organic group as described above. $R_6$ is preferably a hydrogen atom, an alkyl group or a cycloalkyl group, more preferably a hydrogen atom or an alkyl group, still more preferably a hydrogen atom or an alkyl group having no substituent. $R_6$ is preferably a hydrogen atom or an alkyl group having a carbon number of 1 to 10, more preferably a hydrogen atom or an alkyl group having a carbon number of 1 to 10 and having no substituent.

Examples of the alkyl group and cycloalkyl group of $R_4$, $R_5$ and $R_6$ are the same as those described for $R_3$ above.

Specific examples of the group capable of decomposing by the action of an acid to produce an alcoholic hydroxy group are illustrated below.

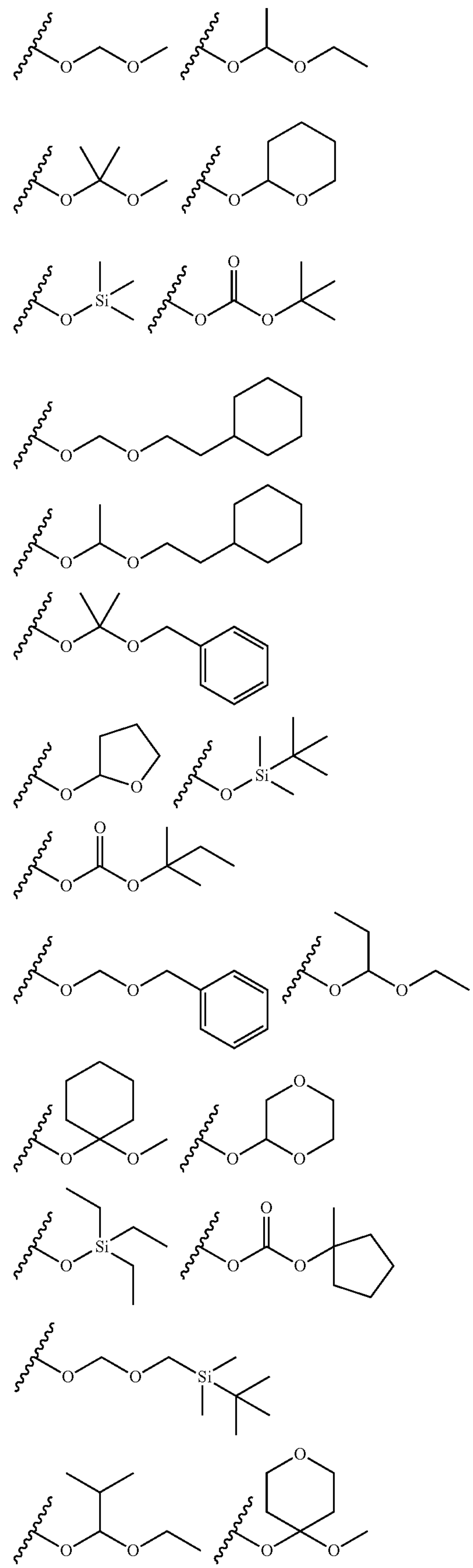

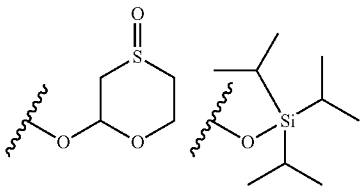
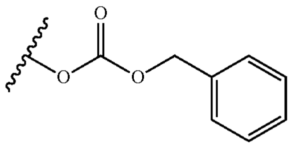
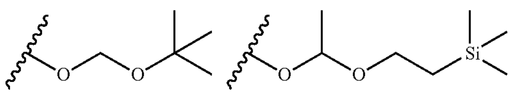
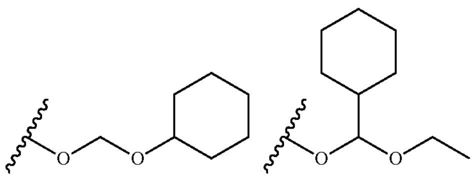
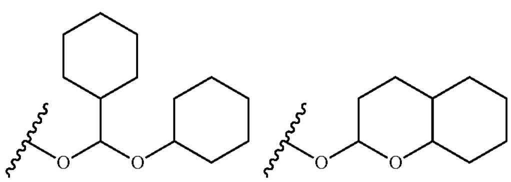
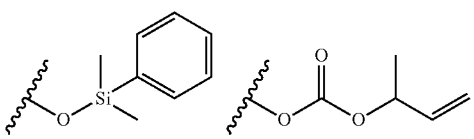
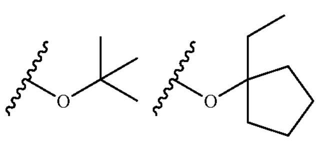
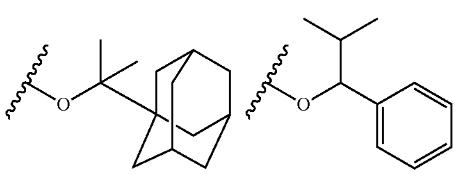
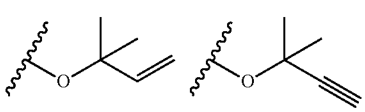
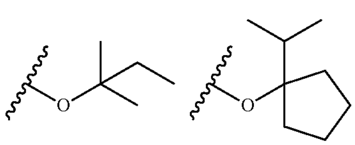
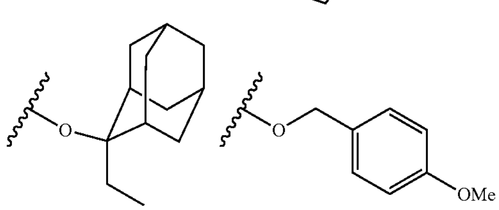
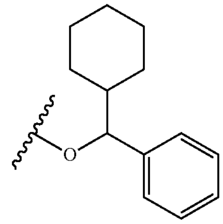
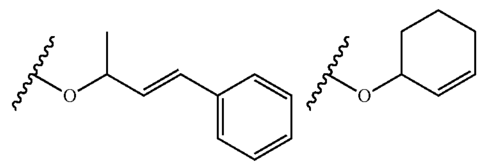
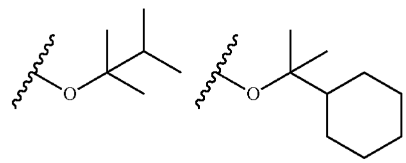
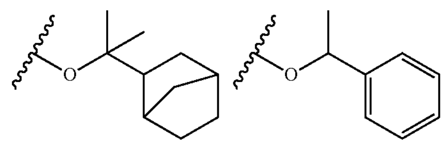
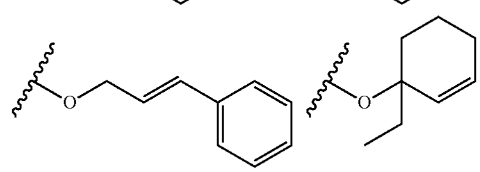
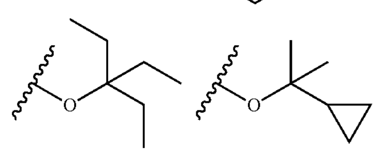
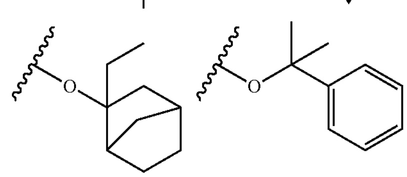
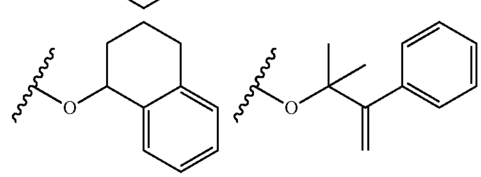
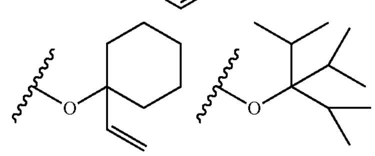
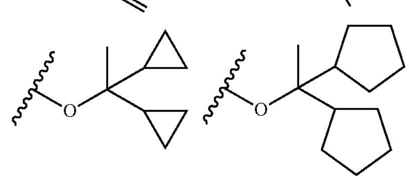

-continued
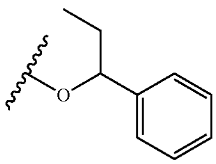
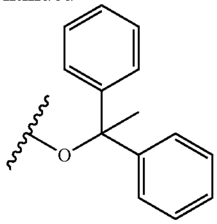
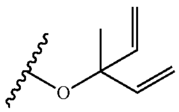
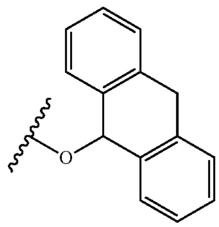
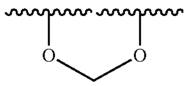
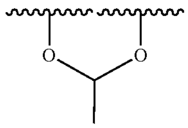
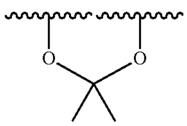
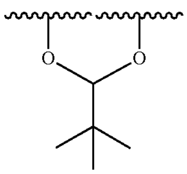
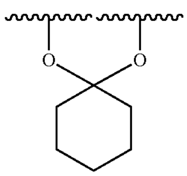
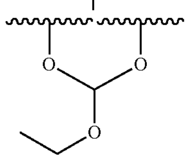
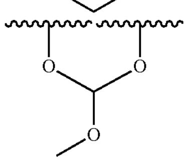
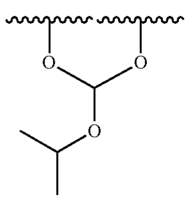
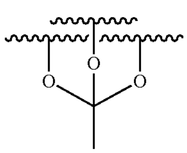
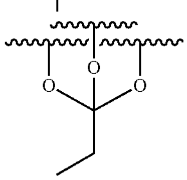
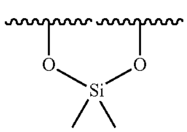
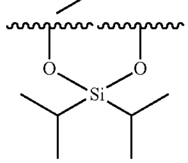
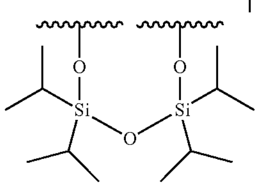
Specific examples of the repeating unit having a group capable of decomposing by the action of an acid to produce an alcoholic hydroxy group are illustrated below, In specific examples, $Xa_1$ represents a hydrogen atom, $CH_3$, $CF_3$ or $CH_2OH$.
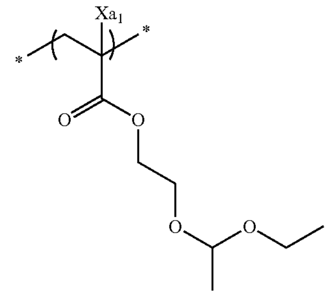
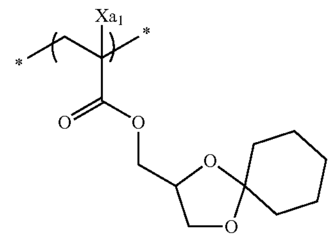
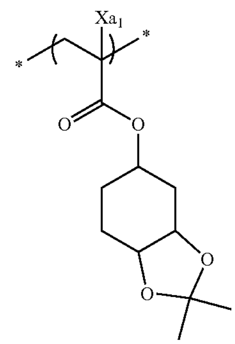
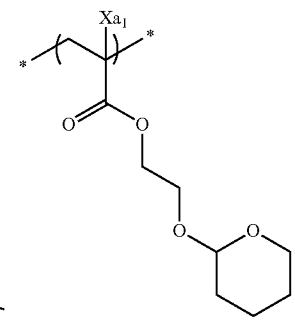
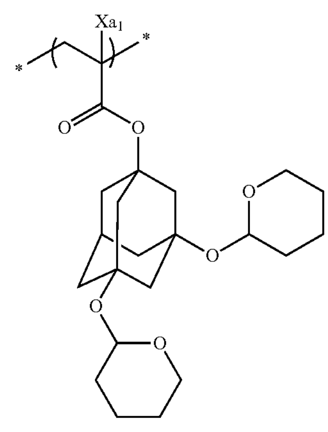
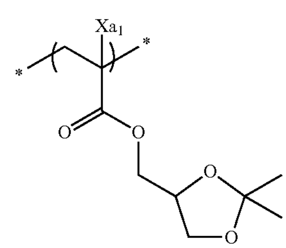

-continued
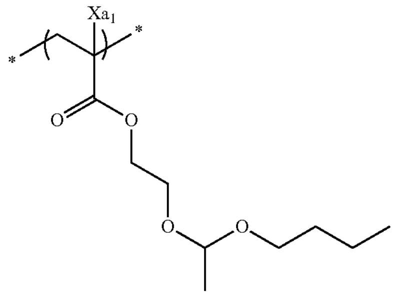
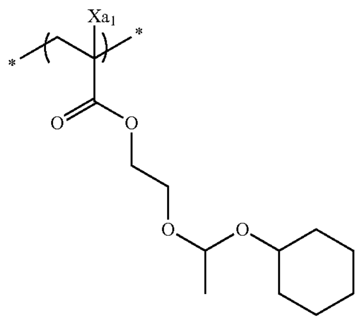
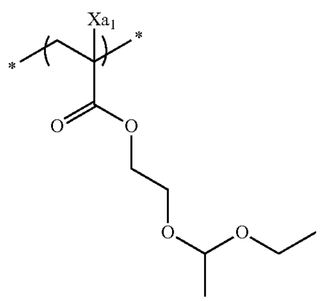
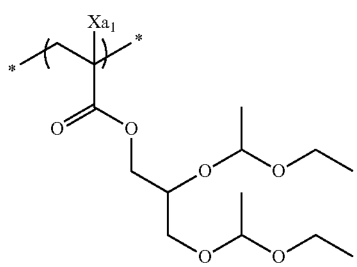
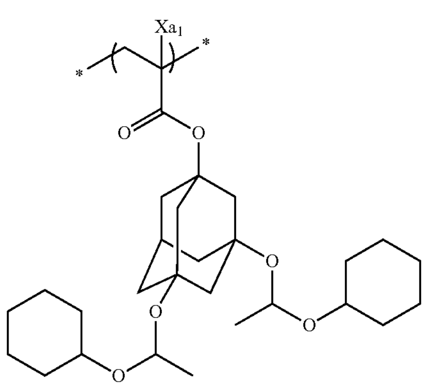
-continued
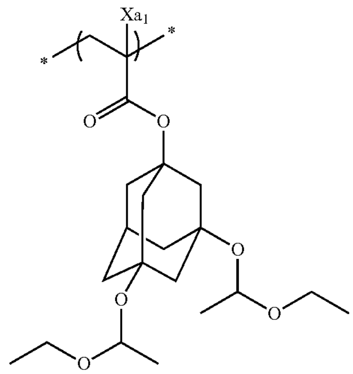
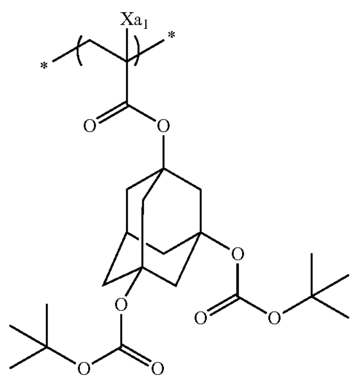
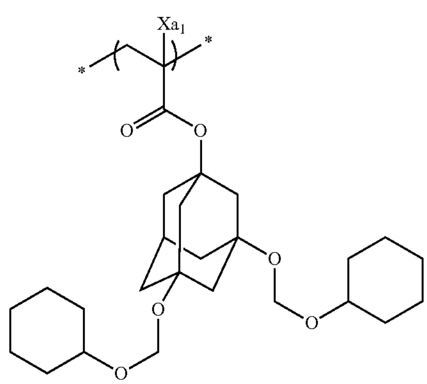
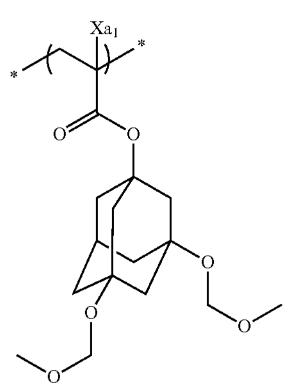

-continued

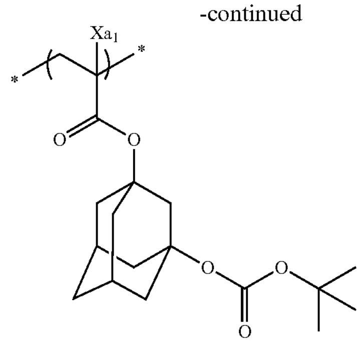

As for the repeating unit having an acid-decomposable group, one kind may be used alone, or two or more kinds may be used in combination.

The content of the repeating unit having an acid-decomposable group (in the case of containing a plurality of kinds of repeating units, the total thereof) in the resin (A) is preferably from 5 to 80 mol %, more preferably from 5 to 75 mol %, still more preferably from 10 to 65 mol %, based on all repeating units in the resin (A).

(b) Repeating Unit Having Polar Group

The resin (A) preferably contains (b) a repeating unit having a polar group. By containing the repeating unit (b), for example, the sensitivity of the composition containing the resin can be enhanced. The repeating unit (b) is preferably a non-acid-decomposable repeating unit (that is, does not have an acid-decomposable group).

The "polar group" which can be contained in the repeating unit (b) includes, for example, the following (1) to (4). In the following, the "electronegativity" means a Pauling's value.

(1) A functional group containing a structure where an oxygen atom and an atom with the electronegativity difference from oxygen atom being 1.1 or more are bonded through a single bond Examples of this polar group include a group containing a structure represented by O—H, such as hydroxy group.

(2) A functional group containing a structure where a nitrogen atom and an atom with the electronegativity difference from nitrogen atom being 0.6 or more are bonded through a single bond Examples of this polar group include a group containing a structure represented by N—H, such as amino group.

(3) A functional group containing a structure where two atoms differing in the electronegativity by 0.5 or more are bonded through a double bond or a triple bond Examples of this polar group include a group containing a structure represented by C≡N, C=N, N=O, S=O or C=N.

(4) A functional group having an ionic moiety

Examples of this polar group include a group having a moiety represented by $N^+$ or $S^+$.

Specific examples of the structure which can be contained in the "polar group" are illustrated below.

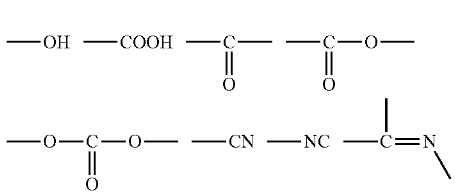

-continued

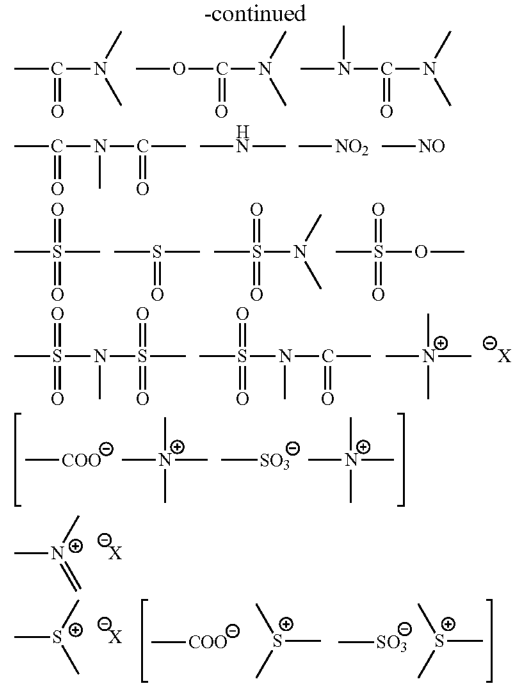

The "polar group" which can be contained in the repeating unit (b) is preferably, for example, at least one selected from the group consisting of (I) a hydroxy group, (II) a cyano group, (III) a lactone group, (IV) a carboxylic acid group or a sulfonic acid group, (V) an amide group, a sulfonamide group or a group corresponding to a derivative thereof, (VI) an ammonium group or a sulfonium group, and a group formed by combining two or more thereof.

The polar group is preferably selected from a hydroxyl group, a cyano group, a lactone group, a carboxylic acid group, a sulfonic acid group, an amide group, a sulfonamide group, an ammonium group, a sulfonium group, and a group formed by combining two or more thereof, more preferably an alcoholic hydroxy group, a cyano group, a lactone group, or a cyanolactone structure-containing group.

When a repeating unit having an alcoholic hydroxy group is further incorporated into the resin, the exposure latitude (EL) of a composition containing the resin can be more enhanced.

When a repeating unit having a cyano group is further incorporated into the resin, the sensitivity of a composition containing the resin can be more enhanced.

When a repeating unit having a lactone group is further incorporated into the resin, the dissolution contrast for an organic solvent-containing developer can be more enhanced. Also, the composition containing the resin can be more improved in the dry etching resistance, coatability and adherence to substrate.

When a repeating unit having a group containing a cyano group-containing lactone structure is further incorporated into the resin, the dissolution contrast for an organic solvent-containing developer can be more enhanced. Also, the composition containing the resin can be more improved in the sensitivity, dry etching resistance, coatability and adherence to substrate. In addition, a single repeating unit can play functions attributable to a cyano group and a lactone group, respectively, and the latitude in designing the resin can be more broadened.

In the case where the polar group contained in the repeating unit (b) is an alcoholic hydroxy group, the repeating unit is preferably represented by at least one formula selected from the group consisting of the following formulae (I-1H) to (I-10H), more preferably represented by at least one formula selected from the group consisting of the following formulae (I-1H) to (I-3H), still more preferably represented by the following formula (I-1H).

(I-1H)

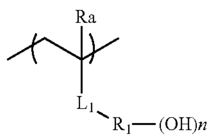

(I-2H)

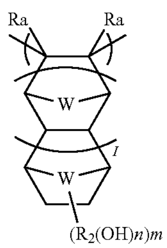

(I-3H)

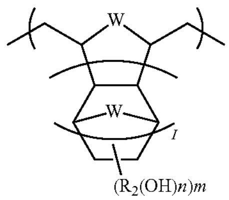

(I-4H)

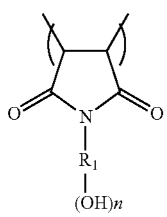

(I-5H)

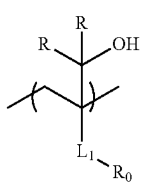

(I-6H)

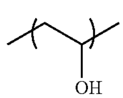

(I-7H)

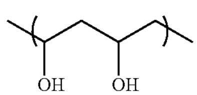

(I-8H)

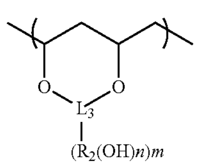

-continued (I-9H)

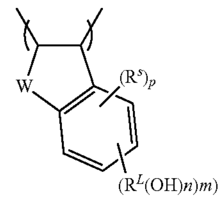

(I-10H)

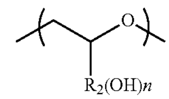

In the formulae, Ra, $R_1$, $R_2$, W, n, m, l, $L_1$, R, $R_0$, $L_3$, $R^L$, $R^S$ and p have the same meanings as in formulae (I-1) to (I-10).

When a repeating unit having a group capable of decomposing by the action of an acid to produce an alcoholic hydroxy group and a repeating unit represented by at least one formula selected from the group consisting of formulae (I-1H) to (I-10H) are used in combination, for example, thanks to suppression of acid diffusion by the alcoholic hydroxy group and increase in the sensitivity brought about by the group capable of decomposing by the action of an acid to produce an alcoholic hydroxy group, the exposure latitude (EL) can be improved without deteriorating other performances.

The content percentage of the repeating unit having an alcoholic hydroxy group is preferably from 1 to 60 mol %, more preferably from 3 to 50 mol %, still more preferably from 5 to 40 mol %, based on all repeating units in the resin (A).

Specific examples of the repeating unit represented by any one of formulae (I-1H) to (I-10H) are illustrated below. In specific examples, Ra has the same meaning as in formulae (I-1H) to (I-10H).

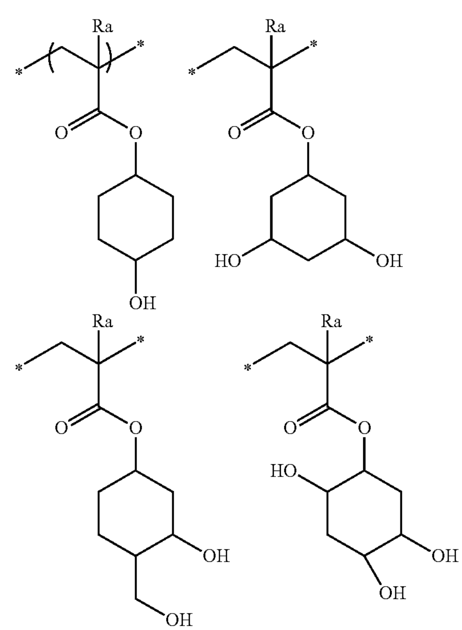

-continued

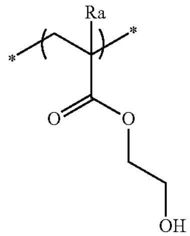
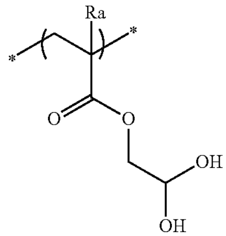
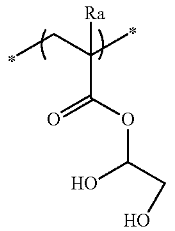
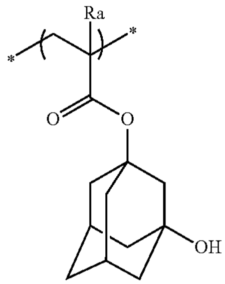
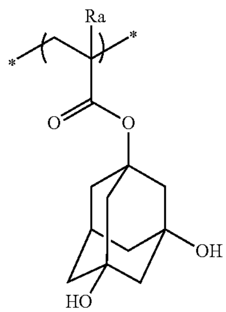
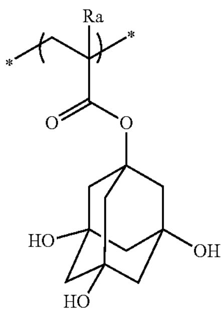
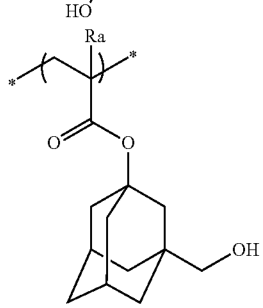
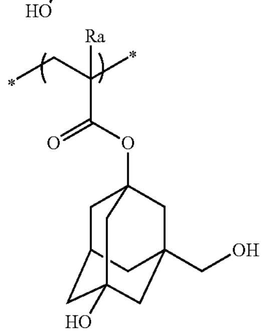
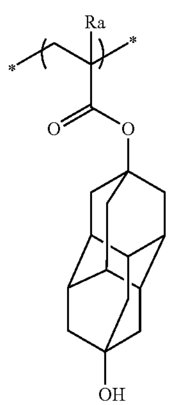
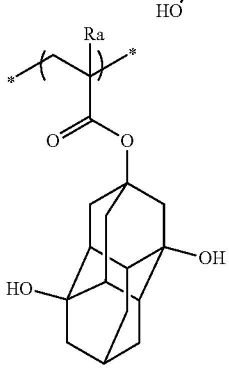
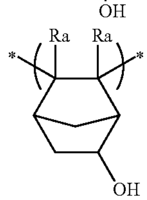
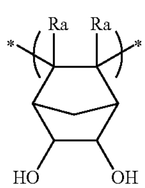

-continued

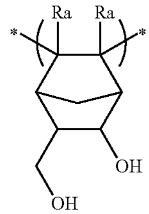
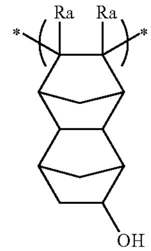
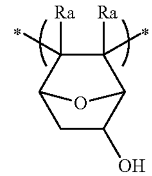
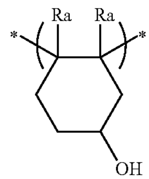
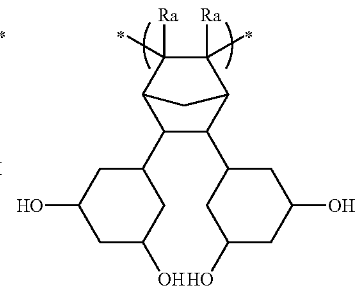
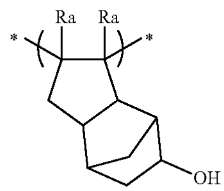
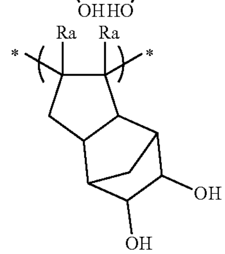
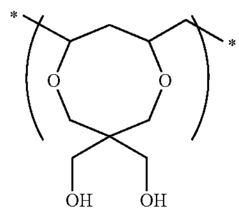

In the case where the polar group contained in the repeating unit (b) is an alcoholic hydroxy group or a cyano group, one preferred embodiment of the repeating unit is a repeating unit having an alicyclic hydrocarbon structure substituted with a hydroxyl group or a cyano group. At this time, it is preferred to have no acid-decomposable group. The alicyclic hydrocarbon structure in the alicyclic hydrocarbon structure substituted with a hydroxyl group or a cyano group is preferably an adamantyl group, a diamantyl group or a norbornane group. The alicyclic hydrocarbon structure substituted with a hydroxyl group or a cyano group is preferably a partial structure represented by the following formulae (VIIa) to (VIIc). Thanks to this repeating unit, adherence to substrate and affinity for developer are enhanced.

(VIIa)

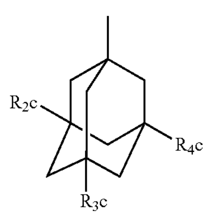

-continued (VIIb)

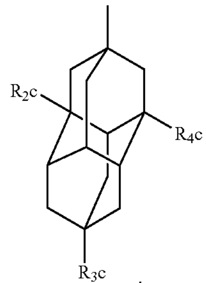

(VIIc)

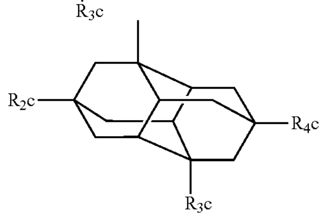

In formulae (VIIa) to (VIIc), each of $R_2c$ to $R_4c$ independently represents a hydrogen atom, a hydroxyl group or a cyano group, provided that at least one of $R_2c$ to $R_4c$ represents a hydroxyl group. A structure where one or two members of $R_2c$ to $R_4c$ are a hydroxyl group with the remaining being a hydrogen atom is preferred. In formula (VIIa), it is more preferred that two members of $R_2c$ to $R_4c$ are a hydroxyl group and the remaining is a hydrogen atom.

The repeating unit having a partial structure represented by formulae (VIIa) to (VIIc) includes repeating units represented by the following formulae (AIIa) to (AIIc):

(AIIa)

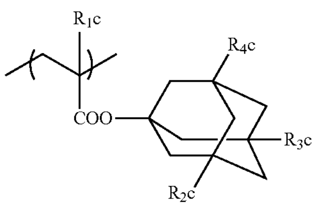

(AIIb)

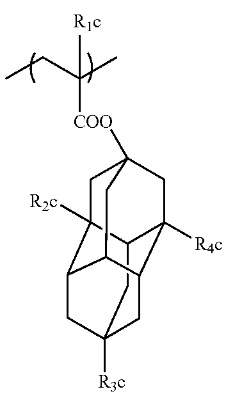

(AIIc)

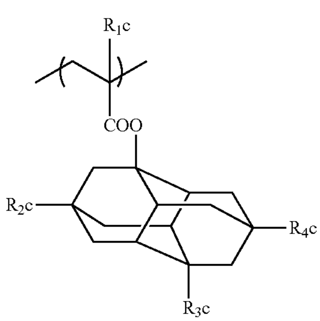

In formulae (AIIa) to (AIIc), $R_1c$ represents a hydrogen atom, a methyl group, a trifluoromethyl group or a hydroxymethyl group.

$R_2c$ to $R_4c$ have the same meanings as $R_2c$ to $R_4c$ in formulae (VIIa) to (VIIc).

The resin (A) may or may not contain a repeating unit having a hydroxyl group or a cyano group, but in the case of containing a repeating unit having a hydroxyl group or a cyano group, the content thereof is preferably from 1 to 60 mol %, more preferably from 3 to 50 mol %, still more preferably from 5 to 40 mol %, based on all repeating units in the resin (A).

Specific examples of the repeating unit having a hydroxyl group or a cyano group are illustrated below, but the present invention is not limited thereto.

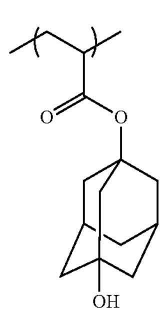

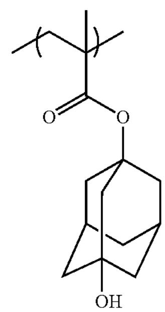

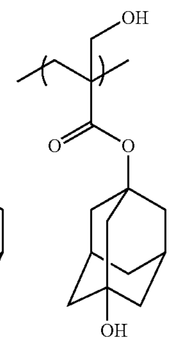

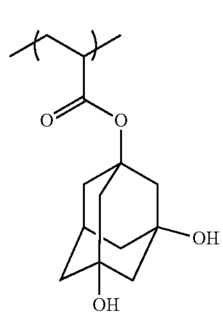

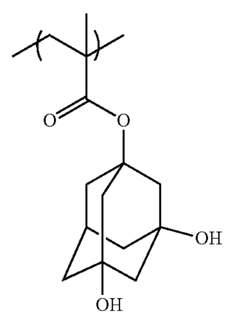

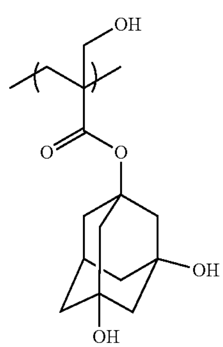

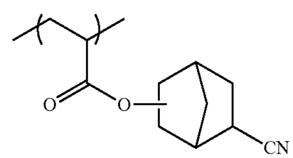

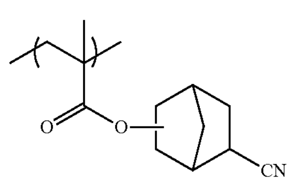

-continued

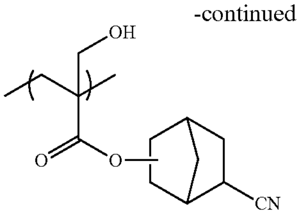

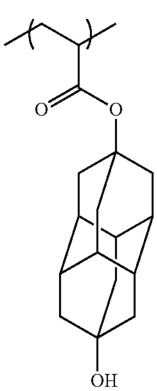

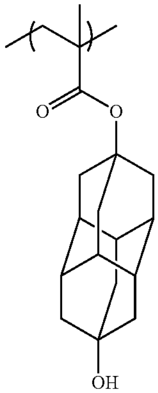

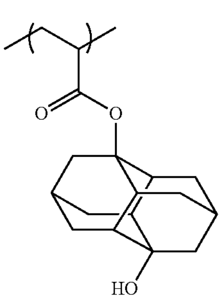

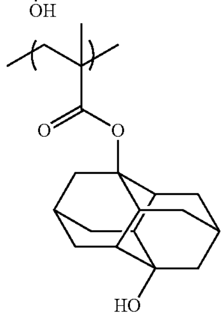

The repeating unit (b) may be a repeating unit having a lactone structure as the polar group.

The repeating unit having a lactone structure is preferably a repeating unit represented by the following formula (AII):

(AII)

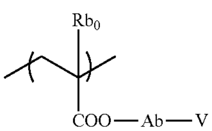

In formula (AII), $Rb_0$ represents a hydrogen atom, a halogen atom or an alkyl group (preferably having a carbon number of 1 to 4) which may have a substituent.

Preferred substituents which may be substituted on the alkyl group of $Rb_0$ include a hydroxyl group and a halogen atom. The halogen atom of $Rb_0$ includes fluorine atom, chlorine atom, bromine atom and iodine atom. $Rb_0$ is preferably a hydrogen atom, a methyl group, a hydroxymethyl group or a trifluoromethyl group, more preferably a hydrogen atom or a methyl group.

Ab represents a single bond, an alkylene group, a divalent linking group having a monocyclic or polycyclic cycloalkyl structure, an ether bond, an ester bond, a carbonyl group, or a divalent linking group formed by a combination thereof. Ab is preferably a single bond or a divalent linking group represented by $-Ab_1-CO_2-$.

$Ab_1$ is a linear or branched alkylene group or a monocyclic or polycyclic cycloalkylene group and is preferably a methylene group, an ethylene group, a cyclohexylene group, an adamantylene group or a norbornylene group.

V represents a group having a lactone structure.

As the group having a lactone structure, any group may be used as long as it has a lactone structure, but a 5- to 7-membered ring lactone structure is preferred, and a 5- to 7-membered ring lactone structure to which another ring structure is fused to form a bicyclo or spiro structure is preferred. It is more preferred to contain a repeating unit having a lactone structure represented by any one of the following formulae (LC1-1) to (LC1-17). The lactone structure may be bonded directly to the main chain. Preferred lactone structures are (LC1-1), (LC1-4), (LC1-5), (LC1-6), (LC1-8), (LC1-13) and (LC1-14).

LC1-1

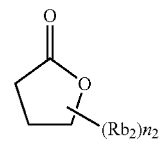

LC1-2

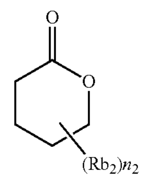

LC1-3

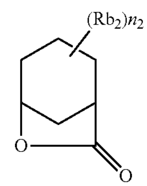

LC1-4

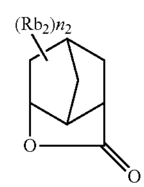

LC1-5

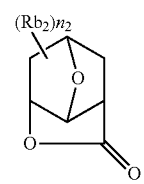

LC1-6

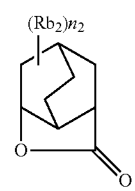

LC1-7

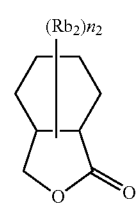

-continued

LC1-8

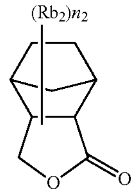

LC1-9

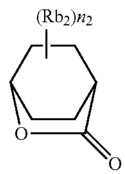

LC1-10

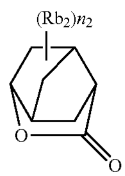

LC1-11

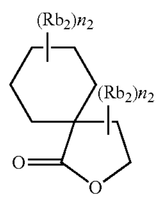

LC1-12

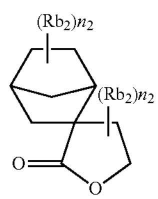

LC1-13

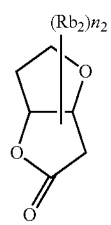

LC1-14

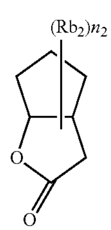

LC1-15

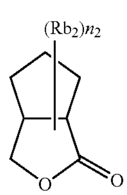

-continued

LC1-16

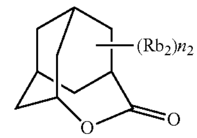

LC1-17

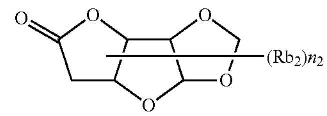

The lactone structure moiety may or may not have a substituent ($Rb_2$). Preferred examples of the substituent ($Rb_2$) include an alkyl group having a carbon number of 1 to 8, a monovalent cycloalkyl group having a carbon number of 4 to 7, an alkoxy group having a carbon number of 1 to 8, an alkoxycarbonyl group having a carbon number of 2 to 8, a carboxyl group, a halogen atom, a hydroxyl group, a cyano group, and an acid-decomposable group. Among these, an alkyl group having a carbon number of 1 to 4, a cyano group and an acid-decomposable group are more preferred. $n_2$ represents an integer of 0 to 4. When $n_2$ is 2 or more, each substituent ($Rb_2$) may be the same as or different from every other substituent ($Rb_2$) and also, the plurality of substituents ($Rb_2$) may combine with each other to form a ring.

The repeating unit having a lactone group usually has an optical isomer, and any optical isomer may be used. One optical isomer may be used alone, or a mixture of a plurality of optical isomers may be used. In the case of mainly using one optical isomer, the optical purity (ee) thereof is preferably 90% or more, more preferably 95% or more.

The resin (A) may or may not contain a repeating unit having a lactone structure, but in the case of containing a repeating unit having a lactone structure, the content of the repeating unit in the resin (A) is preferably from 1 to 70 mol %, more preferably from 3 to 65 mol %, still more preferably from 5 to 60 mol %, based on all repeating units.

Specific examples of the lactone structure-containing repeating unit in the resin (A) are illustrated below, but the present invention is not limited thereto. In the formulae, Rx represents H, $CH_3$, $CH_2OH$ or $CF_3$.

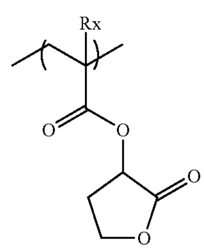

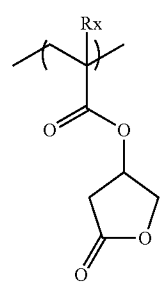

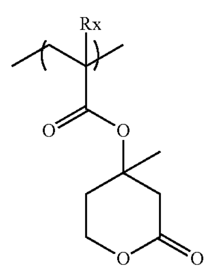

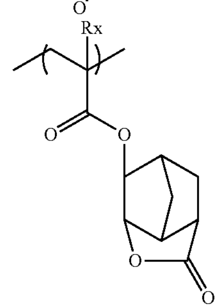

-continued

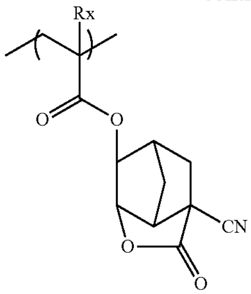

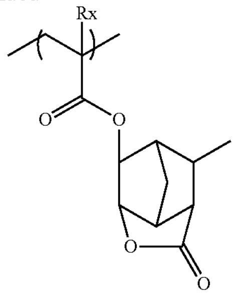

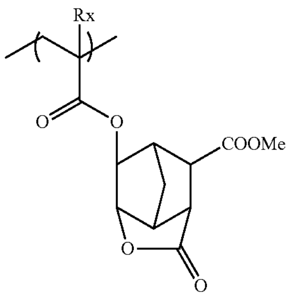

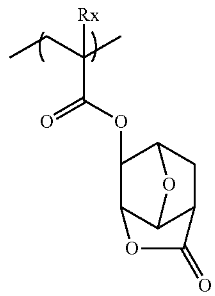

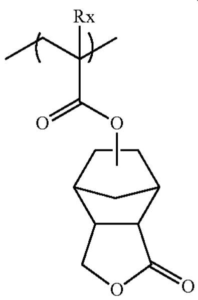

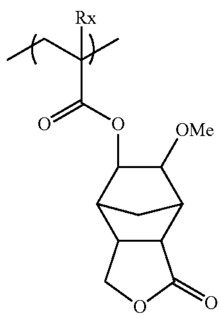

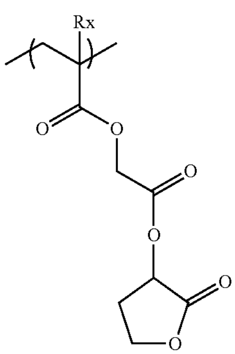

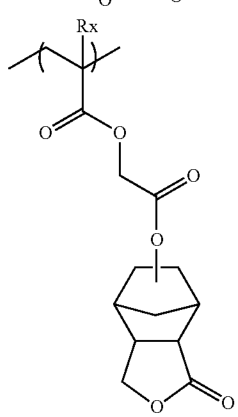

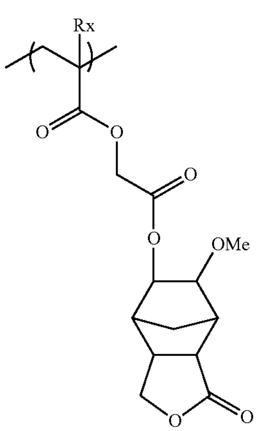

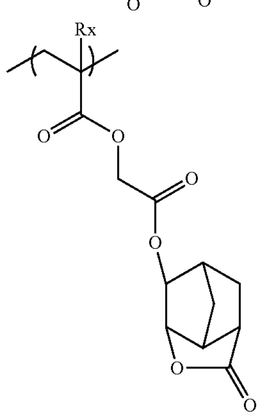

-continued

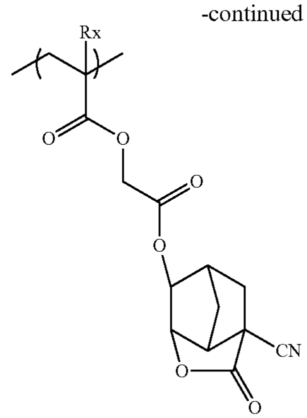

It is also one of particularly preferred embodiments that the polar group which can be contained in the repeating unit (b) is an acidic group. Preferred acidic groups include a phenolic hydroxyl group, a carboxylic acid group, a sulfonic acid group, a fluorinated alcohol group (such as hexafluoroisopropanol group), a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkyl sulfonyl)methyl ene group, a bis(alkylsulfonyl)imide group, tris(alkylcarbonyl)methylene group and a tris(alkylsulfonyl)methylene group. Among others, the repeating unit (b) is preferably a repeating unit having a carboxyl group. By virtue of containing a repeating unit having an acidic group, the resolution increases in usage of forming contact holes. As the repeating unit having an acidic group, all of a repeating unit where an acidic group is directly bonded to the main chain of the resin, such as repeating unit by an acrylic acid or a methacrylic acid, a repeating unit where an acidic group is bonded to the main chain of the resin through a linking group, and a repeating unit where an acidic group is introduced into the polymer chain terminal by using an acidic group-containing polymerization initiator or chain transfer agent at the polymerization, are preferred. In particular, a repeating unit by an acrylic acid or a methacrylic acid is preferred.

The acidic group which can be contained in the repeating unit (b) may or may not contain an aromatic ring, but in the case of containing an aromatic ring, the acidic group is preferably selected from acidic groups except for a phenolic hydroxyl group. In the case where the repeating unit (b) has an acidic group, the content of the repeating unit having an acidic group is preferably 30 mol % or less, more preferably 20 mol % or less, based on all repeating units in the resin (A). In the case where the resin (A) contains a repeating unit having an acidic group, the content of the repeating unit having an acidic group in the resin (A) is usually 1 mol % or more.

Specific examples of the repeating unit having an acidic group are illustrated below, but the present invention is not limited thereto.

In specific examples, Rx represents H, $CH_3$, $CH_2OH$ or $CF_3$.

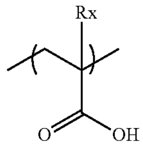

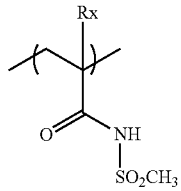

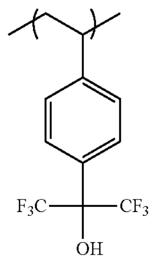

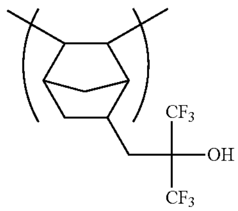

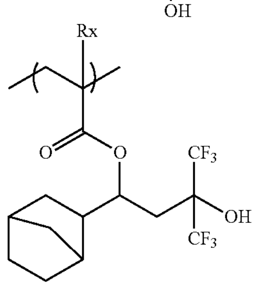

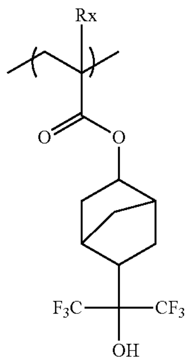

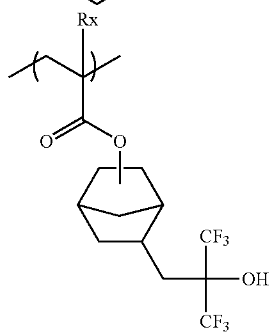

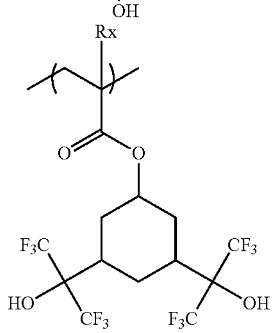

The resin (A) for use in the present invention may contain (b) a non-acid-decomposable repeating unit having a phenolic hydroxyl group. The repeating unit (b) here is preferably a structure represented by the following formula (I):

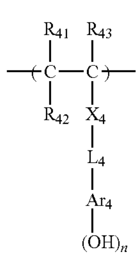

(I)

In the formula, each of $R_{41}$, $R_{42}$ and $R_{43}$ independently represents a hydrogen atom, an alkyl group, a halogen atom, a cyano group or an alkoxycarbonyl group. $R_{42}$ may combine with $Ar_4$ to form a ring, and in this case, $R_{42}$ represents a single bond or an alkylene group.

$X_4$ represents a single bond, —COO— or —$CONR_{64}$—, and $R_{64}$ represents a hydrogen atom or an alkyl group.

$L_4$ represents a single bond or an alkylene group.

$Ar_4$ represents an (n+1)-valent aromatic ring group, and in the case of combining with $R_{42}$ to form a ring, $Ar_4$ represents an (n+2)-valent aromatic ring group.

n represents an integer of 1 to 4.

Specific examples of the alkyl group, cycloalkyl group, halogen atom and alkoxycarbonyl group of $R_{41}$, $R_{42}$ and $R_{43}$ in formula (I) and the substituent which may be substituted on these groups are the same as specific examples described above for respective groups represented by $R_{51}$, $R_{52}$ and $R_{53}$ in formula (V).

$Ar_4$ represents an (n+1)-valent aromatic ring group. The divalent aromatic ring group when n is 1 may have a substituent, and preferred examples of the divalent aromatic ring group include an arylene group having a carbon number of 6 to 18, such as phenylene group, tolylene group, naphthylene group and anthracenylene group, and an aromatic ring group containing a heterocyclic ring such as thiophene, furan, pyrrole, benzothiophene, benzofuran, benzopyrrole, triazine, imidazole, benzimidazole, triazole, thiadiazole and thiazole.

Specific examples of the (n+1)-valent aromatic ring group when n is an integer of 2 or more include groups formed by removing arbitrary (n−1) hydrogen atoms from the above-described specific examples of the divalent aromatic ring group.

The (n+1)-valent aromatic ring group may further have a substituent.

Examples of the substituent which the above-described alkyl group, cycloalkyl group, alkoxycarbonyl group, alkylene group and (n+1)-valent aromatic ring group may have include the alkyl group described for $R_{51}$ to $R_{53}$ in formula (V), an alkoxy group such as methoxy group, ethoxy group, hydroxyethoxy group, propoxy group, hydroxypropoxy group and butoxy group, and an aryl group such as phenyl group.

Examples of the alkyl group of $R_{64}$ in —$CONR_{64}$— ($R_{64}$ represents a hydrogen atom or an alkyl group) represented by $X_4$ are the same as those of the alkyl group of $R_{61}$ to $R_{63}$.

$X_4$ is preferably a single bond, —COO— or —CONH—, more preferably a single bond or —COO—.

The alkylene group in $L_4$ is preferably an alkylene group having a carbon number of 1 to 8, such as methylene group, ethylene group, propylene group, butylene group, hexylene group and octylene group, which may have a substituent.

$Ar_4$ is preferably an aromatic ring group having a carbon number of 6 to 18, which may have a substituent, more preferably a benzene ring group, a naphthalene ring group or a biphenylene ring group.

The repeating unit (b) preferably has a hydroxystyrene structure, that is, $Ar_4$ is preferably a benzene ring group.

Specific examples of the repeating unit (b) represented by formula (I) are illustrated below, but the present invention is not limited thereto. In the formulae, a represents an integer of 1 or 2.

-continued
(B-1)
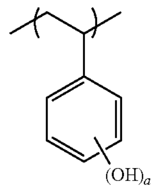
(B-2)
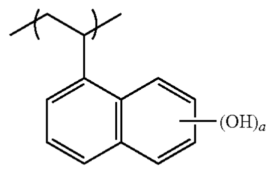
(B-3)
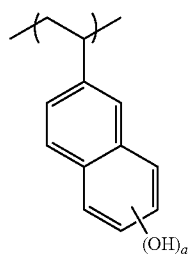
(B-4)
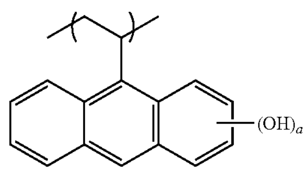
(B-5)
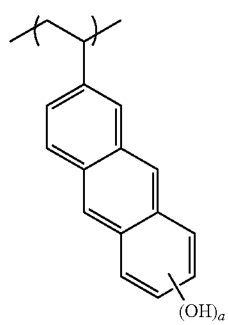
(B-6)
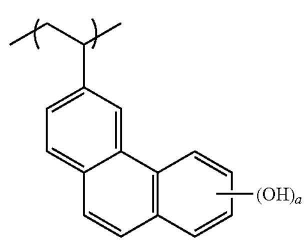
(B-7)
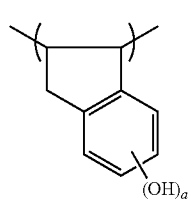
(B-8)
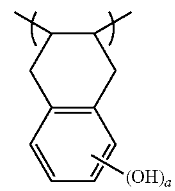
(B-9)
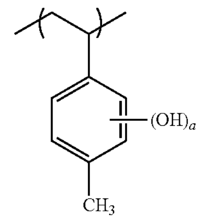
(B-10)
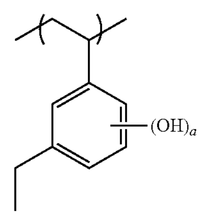
(B-11)
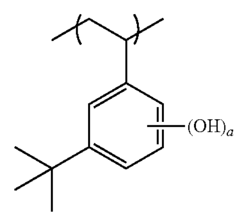
(B-12)
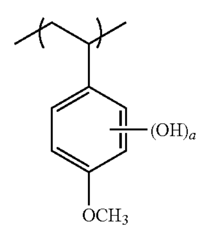
(B-13)
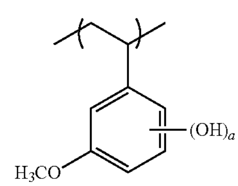
(B-14)
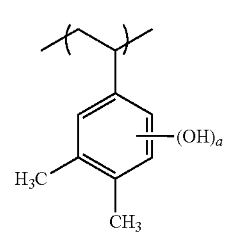

-continued
(B-15)
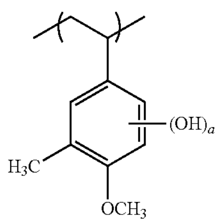
(B-16)
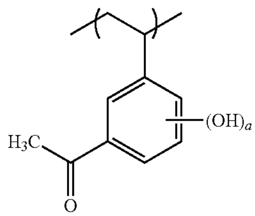
(B-17)
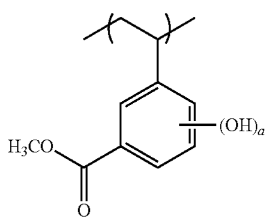
(B-18)
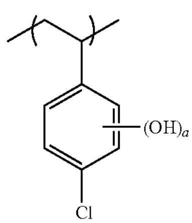
(B-19)
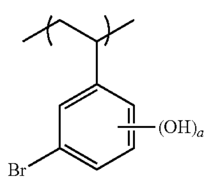
(B-20)
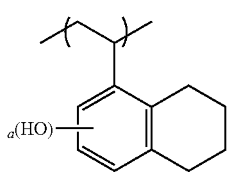
(B-21)
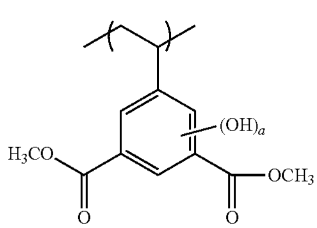
-continued
(B-22)
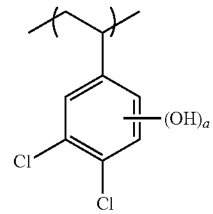
(B-23)
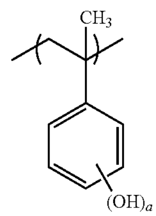
(B-24)
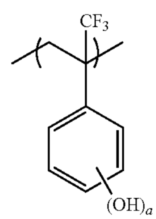
(B-25)
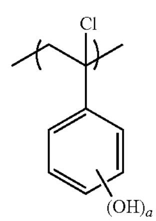
(B-26)
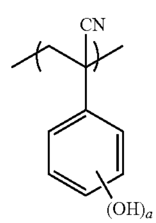
(B-27)
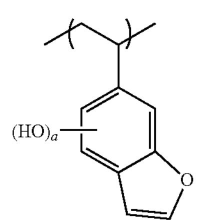
(B-28)
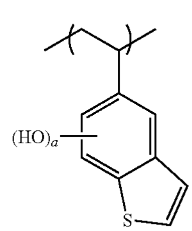

-continued (B-29)

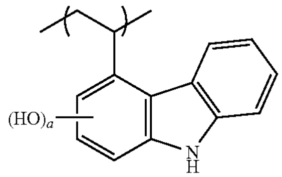

(B-30)

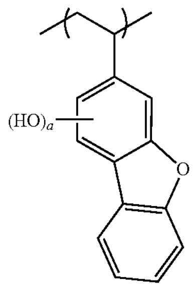

(B-31)

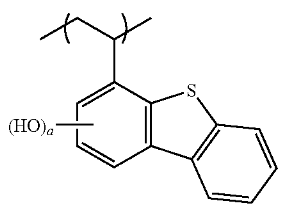

(B-32)

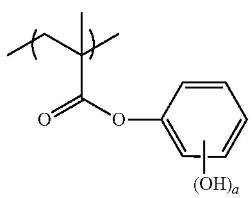

(B-33)

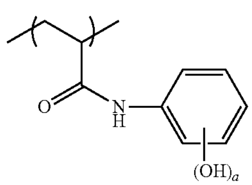

(B-34)

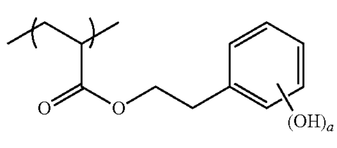

(B-35)

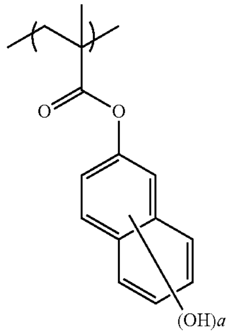

-continued (B-36)

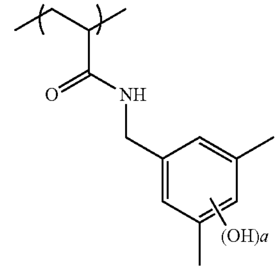

(B-37)

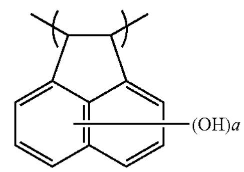

(B-38)

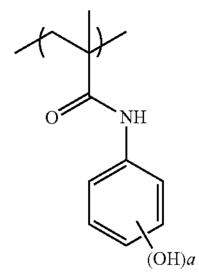

The resin (A) may contain two or more kinds of repeating units represented by formula (I).

(c) Repeating Unit Having a Plurality of Aromatic Rings

The resin (A) may contain (c) a repeating unit having a plurality of aromatic rings represented by the following formula (c1):

(c1)

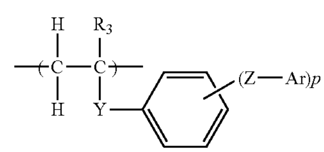

In formula (c1), $R_3$ represents a hydrogen atom, an alkyl group, a halogen atom, a cyano group or a nitro group;

Y represents a single bond or a divalent linking group;

Z represents a single bond or a divalent linking group;

Ar represents an aromatic ring group; and p represents an integer of 1 or more.

The alkyl group as $R_3$ may be either linear or branched, and examples thereof include a methyl group, an ethyl group, an n-propyl group, an i-propyl group, an n-butyl group, a sec-butyl group, a tert-butyl group, an n-pentyl group, an n-hexyl group, an n-heptyl group, an n-octyl group, an n-nonyl group, an n-decanyl group, and an i-butyl group. The alkyl group may further have a substituent, and preferred examples of the substituent include an alkoxy group, a hydroxyl group, a halogen atom, and a nitro group. Among others, the alkyl group having a substituent is preferably, for example, a $CF_3$ group, an alkyloxycarbonylmethyl group, an alkylcarbonyloxymethyl group, a hydroxymethyl group or an alkoxymethyl group.

The halogen atom as $R_3$ includes fluorine atom, chlorine atom, bromine atom and iodine atom, with fluorine atom being preferred.

Y represents a single bond or a divalent linking group, and examples of the divalent linking group include an ether group (oxygen atom), a thioether group (sulfur atom), an alkylene group, an arylene group, a carbonyl group, a sulfide group, a sulfone group, —COO—, —CONH—, $—SO_2NH—$, $—CF_2—$, $—CF_2CF_2—$, $—OCF_2O—$, $—CF_2OCF_2—$, —SS—, $—CH_2SO_2CH_2—$, $—CH_2COCH_2—$, $—COCF_2CO—$, —COCO—, —OCOO—, $—OSO_2O—$, an amino group (nitrogen atom), an acyl group, an alkylsulfonyl group, —CH═CH—, —C≡C—, an aminocarbonylamino group, an aminosulfonylamino group, and a group formed by a combination thereof. Y preferably has a carbon number of 15 or less, more preferably a carbon number of 10 or less.

Y is preferably a single bond, a —COO— group, a —COS— group or a —CONH— group, more preferably a —COO— group or a —CONH— group, still more preferably a —COO— group.

Z represents a single bond or a divalent linking group, and examples of the divalent linking group include an ether group (oxygen atom), a thioether group (sulfur atom), an alkylene group, an arylene group, a carbonyl group, a sulfide group, a sulfone group, —COO—, —CONH—, $—SO_2NH—$, an amino group (nitrogen atom), an acyl group, an alkylsulfonyl group, —CH═CH—, an aminocarbonylamino group, an aminosulfonylamino group, and a group formed by a combination thereof.

Z is preferably a single bond, an ether group, a carbonyl group or —COO—, more preferably a single bond or an ether group, still more preferably a single bond.

Ar represents an aromatic ring group, and specific examples thereof include a phenyl group, a naphthyl group, an anthracenyl group, a phenanthrenyl group, a quinolinyl group, a furanyl group, a thiophenyl group, a fluorenyl-9-on-yl group, an anthraquinolinyl group, a phenanthraquinolinyl group, and a pyrrole group, with a phenyl group being preferred. Such an aromatic ring group may further have a substituent, and preferred examples of the substituent include an alkyl group, an alkoxy group, a hydroxy group, a halogen atom, a nitro group, an acyl group, an acyloxy group, an acylamino group, a sulfonylamino group, an aryl group such as phenyl group, an aryloxy group, an arylcarbonyl group, and a heterocyclic residue. Among these, from the standpoint of preventing deterioration of the exposure latitude or pattern profile due to out-of-band light, a phenyl group is preferred.

p is an integer of 1 or more and is preferably an integer of 1 to 3.

The repeating unit (c) is more preferably a repeating unit represented by the following formula (c2):

(c2)

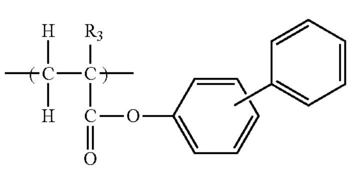

In formula (c2), $R_3$ represents a hydrogen atom or an alkyl group. Preferred examples of the alkyl group as $R_3$ are the same as in formula (c1).

Here, as concerns the extreme-ultraviolet (EUV) exposure, leakage light (out-of-band light) generated in the ultraviolet region at a wavelength of 100 to 400 nm worsens the surface roughness, as a result, the resolution and LWR performance tend to be impaired due to bridge between patterns or disconnection of pattern.

However, the aromatic ring in the repeating unit (c) functions as an internal filter capable of absorbing the above-described out-of-band light. Accordingly, in view of high resolution and low LWR, the resin (A) preferably contains the repeating unit (c).

In this connection, from the standpoint of obtaining high resolution, the repeating unit (c) is preferably free from a phenolic hydroxyl group (a hydroxyl group bonded directly on an aromatic ring).

Specific examples of the repeating unit (c) are illustrated below, but the present invention is not limited thereto.

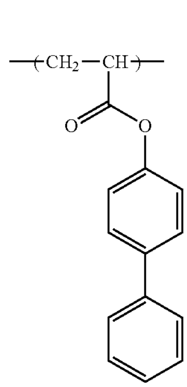

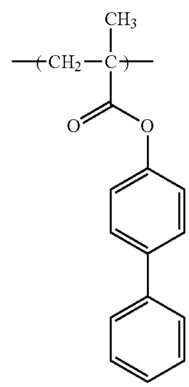

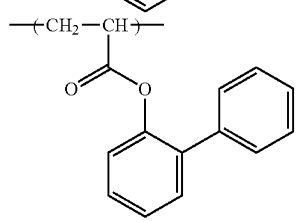

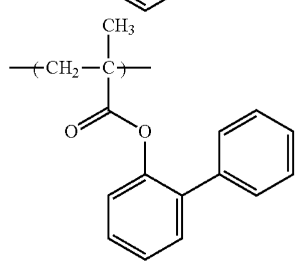

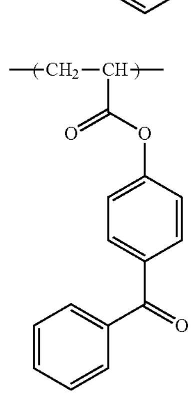

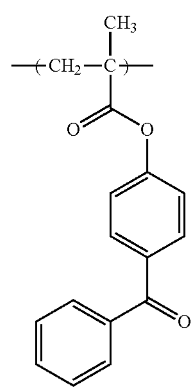

-continued
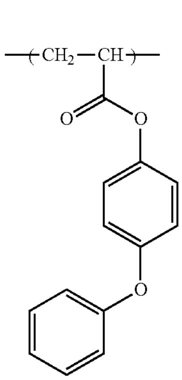
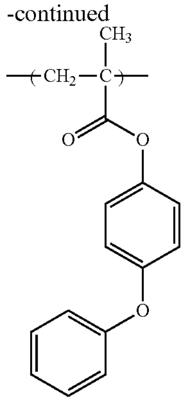
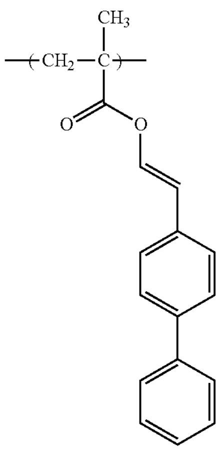
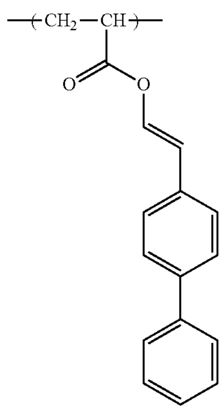
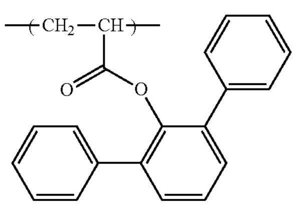
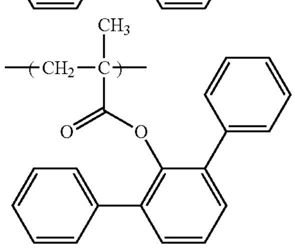
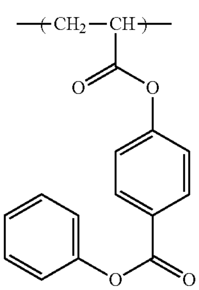
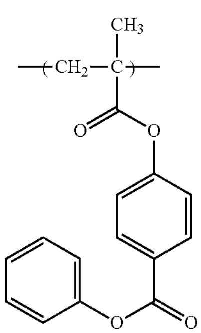
-continued
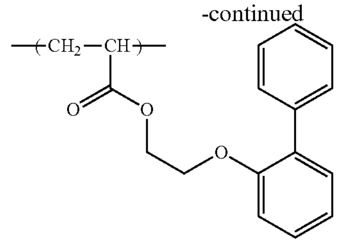
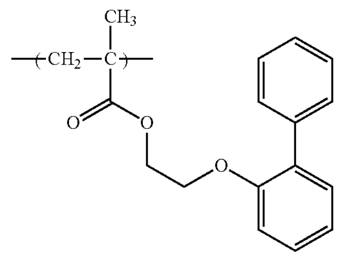
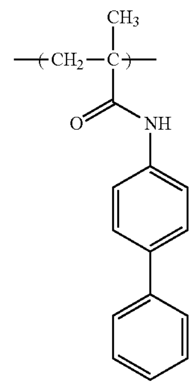
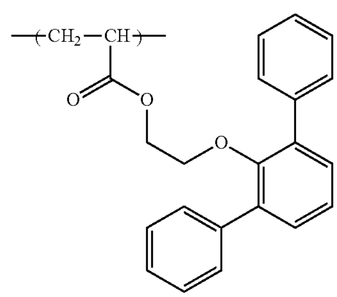
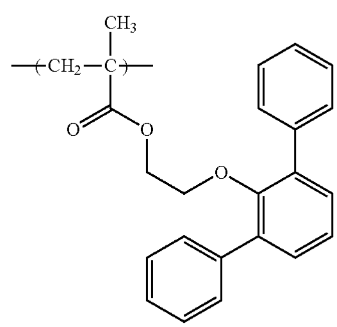
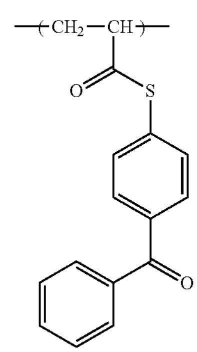
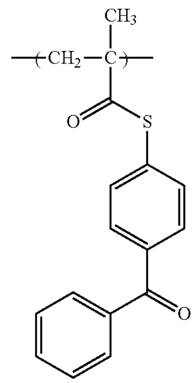

-continued
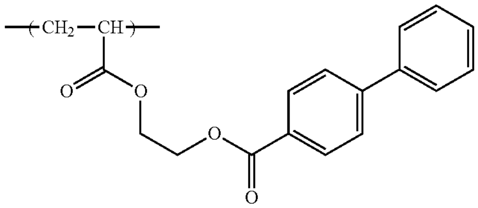
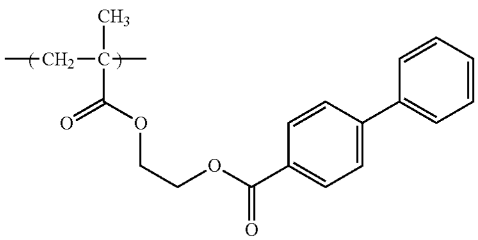
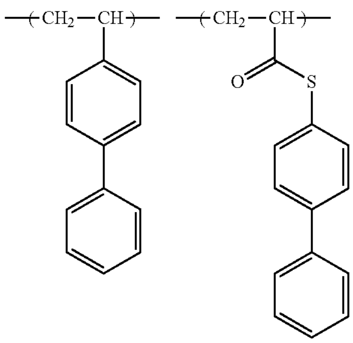
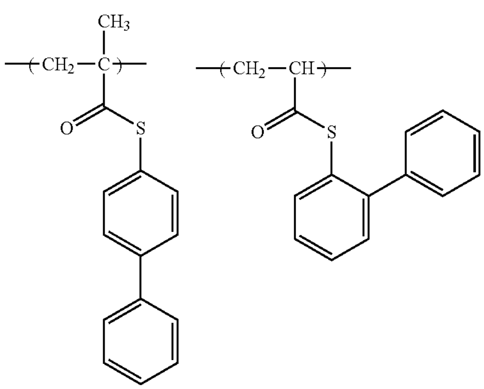
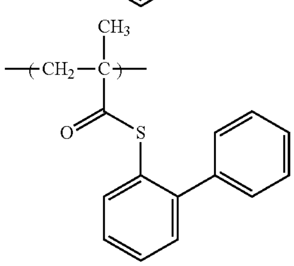
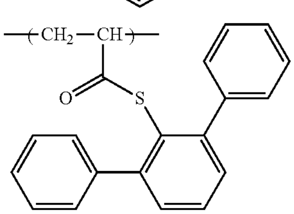
-continued
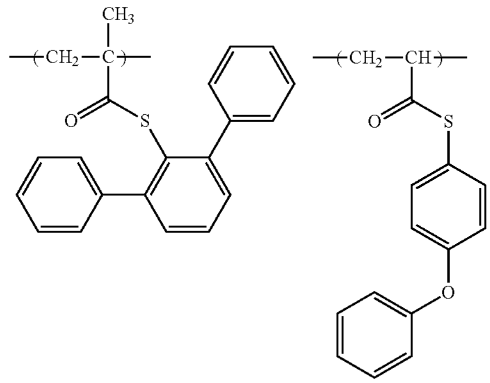
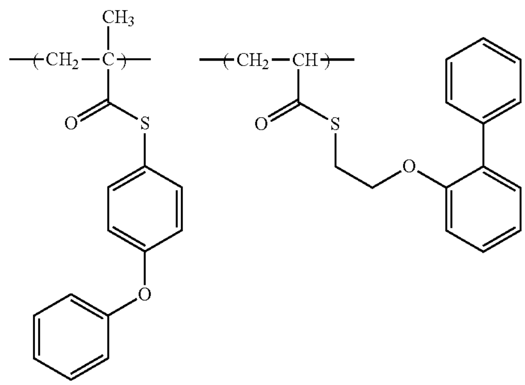
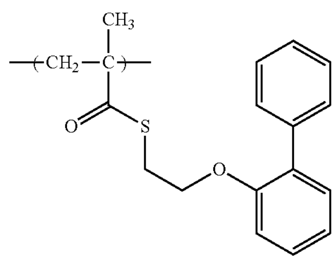
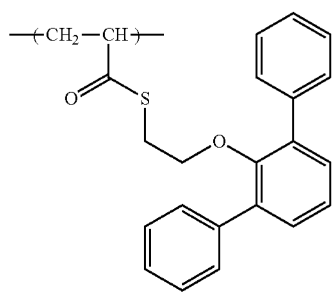
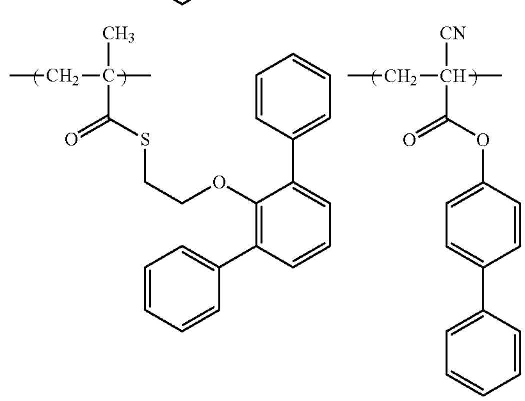

-continued

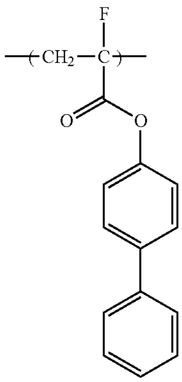

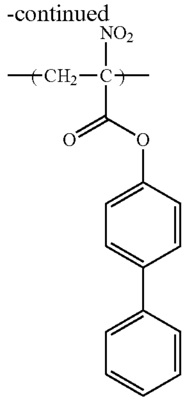

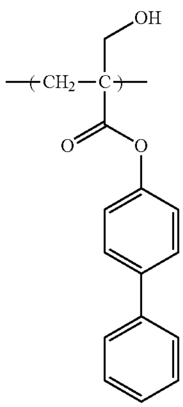

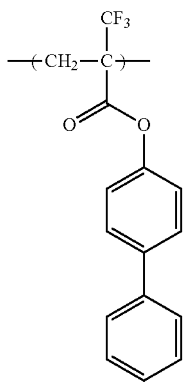

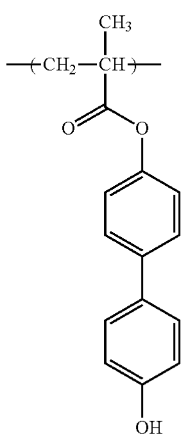

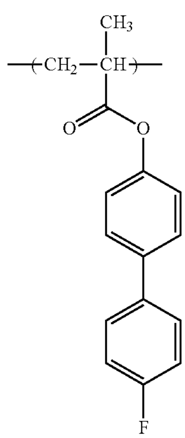

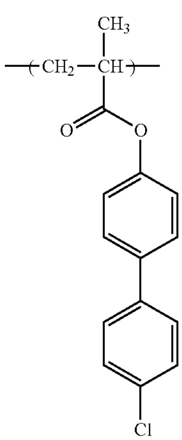

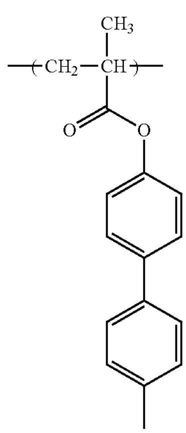

-continued

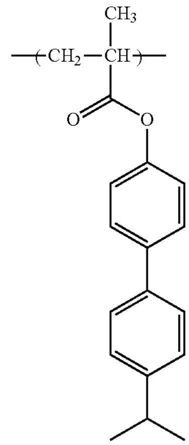

The resin (A) may or may not contain the repeating unit (c), but in the case containing the repeating unit (c), the content thereof is preferably from 1 to 30 mol %, more preferably from 1 to 20 mol %, still more preferably from 1 to 15 mol %, based on all repeating units in the resin (A). As for the repeating unit (c) contained in the resin (A), two or more kinds of repeating units may be contained in combination.

The resin (A) for use in the present invention may appropriately contain a repeating unit other than the above-described repeating units (a) to (c). As an example of such a repeating unit, the resin may contain a repeating unit having an alicyclic hydrocarbon structure free from a polar group (for example, the above-described acid group, a hydroxyl group or a cyano group) and not exhibiting acid decomposability. Thanks to this configuration, the solubility of the resin at the development using an organic solvent-containing developer can be appropriately adjusted. Such a repeating unit includes a repeating unit represented by formula (IV):

(IV)

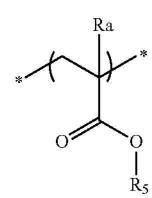

In formula (IV), $R_5$ represents a hydrocarbon group having at least one cyclic structure and having no polar group.

Ra represents a hydrogen atom, an alkyl group or a —$CH_2$—O—$Ra_2$ group, wherein $Ra_2$ represents a hydrogen atom, an alkyl group or an acyl group. Ra is preferably a hydrogen atom, a methyl group, a hydroxymethyl group or a trifluoromethyl group, more preferably a hydrogen atom or a methyl group.

The cyclic structure contained in $R_5$ includes a monocyclic hydrocarbon group and a polycyclic hydrocarbon group. Examples of the monocyclic hydrocarbon group include a cycloalkyl group having a carbon number of 3 to 12, such as cyclopentyl group, cyclohexyl group, cycloheptyl group and cyclooctyl group, and a cycloalkenyl group having a carbon number of 3 to 12, such as cyclohexenyl group. The monocyclic hydrocarbon group is preferably a monocyclic hydrocarbon group having a carbon number of 3 to 7, more preferably a cyclopentyl group or a cyclohexyl group.

The polycyclic hydrocarbon group includes a ring assembly hydrocarbon group and a crosslinked cyclic hydrocarbon group. Examples of the ring assembly hydrocarbon group include a bicyclohexyl group and a perhydronaphthalenyl group. Examples of the crosslinked cyclic hydrocarbon ring include a bicyclic hydrocarbon ring such as pinane ring, bornane ring, norpinane ring, norbornane ring and bicyclooctane ring (e.g., bicyclo[2.2.2]octane ring, bicyclo[3.2.1]octane ring), a tricyclic hydrocarbon ring such as homobledane ring, adamantane ring, tricyclo[5.2.1.$0^{2,6}$]decane ring and tricyclo[4.3.1.$1^{2,5}$]undecane ring, and a tetracyclic hydrocarbon ring such as tetracyclo[4.4.0.$1^{2,5}$.$1^{7,10}$]dodecane ring and perhydro-1,4-methano-5,8-methanonaphthalene ring. The crosslinked cyclic hydrocarbon ring also includes a condensed cyclic hydrocarbon ring, for example, a condensed ring formed by fusing a plurality of 5- to 8-membered cycloalkane rings, such as perhydronaphthalene (decalin) ring, perhydroanthracene ring, perhydrophenathrene ring, perhydroacenaphthene ring, perhydrofluorene ring, perhydroindene ring and perhydrophenalene ring.

Preferred examples of the crosslinked cyclic hydrocarbon ring include a norbornyl group, an adamantyl group, a bicyclooctanyl group, and a tricyclo[5,2,1,$0^{2,6}$]decanyl group. Among these crosslinked cyclic hydrocarbon rings, a norbornyl group and an adamantyl group are more preferred.

Such an alicyclic hydrocarbon group may have a substituent, and preferred examples of the substituent include a halogen atom, an alkyl group, a hydroxyl group with a hydrogen atom being substituted for, and an amino group with a hydrogen atom being substituted for. The halogen atom is preferably bromine atom, chlorine atom or fluorine atom, and the alkyl group is preferably a methyl group, an ethyl group, a butyl group or a tert-butyl group. This alkyl group may further have a substituent, and the substituent which may be further substituted on the alkyl group includes a halogen atom, an alkyl group, a hydroxyl group with a hydrogen atom being substituted for, and an amino group with a hydrogen atom being substituted for.

Examples of the substituent for the hydrogen atom include an alkyl group, a cycloalkyl group, an aralkyl group, a substituted methyl group, a substituted ethyl group, an alkoxycarbonyl group, and an aralkyloxycarbonyl group. The alkyl group is preferably an alkyl group having a carbon number of 1 to 4; the substituted methyl group is preferably a methoxymethyl group, a methoxythiomethyl group, a benzyloxymethyl group, a tert-butoxymethyl group or a 2-methoxyethoxymethyl group; the substituted ethyl group is preferably a 1-ethoxyethyl group or a 1-methyl-1-methoxyethyl group; the acyl group is preferably an aliphatic acyl group having a carbon number of 1 to 6, such as formyl group, acetyl group, propionyl group, butyryl group, isobutyryl group, valeryl group and pivaloyl group; and the alkoxycarbonyl group includes, for example, an alkoxycarbonyl group having a carbon number of 1 to 4.

The resin (A) may or may not contain a repeating unit having an alicyclic hydrocarbon structure free from a polar group and not exhibiting acid decomposability, but in the case of containing this repeating unit, the content thereof is preferably from 1 to 20 mol %, more preferably from 5 to 15 mol %, based on all repeating units in the resin (A).

Specific examples of the repeating unit having an alicyclic hydrocarbon structure free from a polar group and not exhibiting acid decomposability are illustrated below, but the present invention is not limited thereto. In the formulae, Ra represents H, $CH_3$, $CH_2OH$ or $CF_3$.

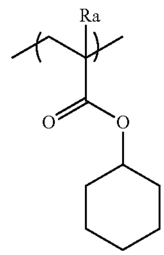
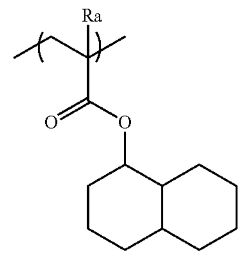
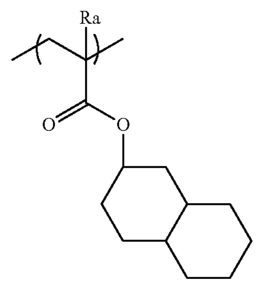
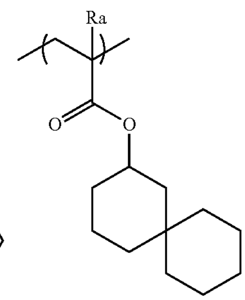
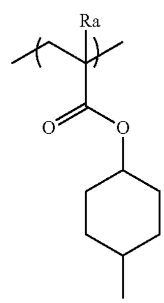
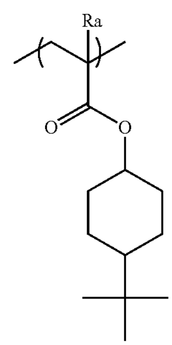
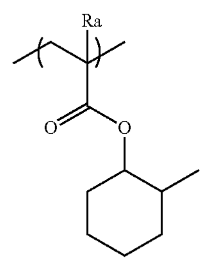
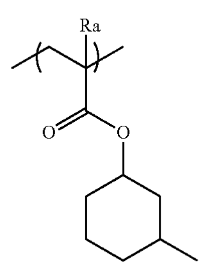
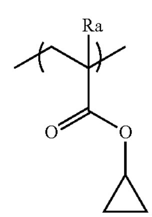
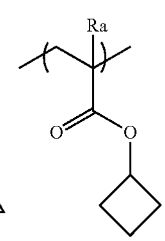
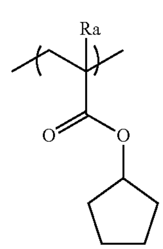
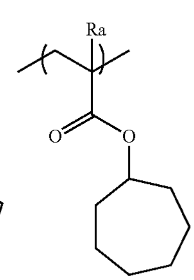

-continued

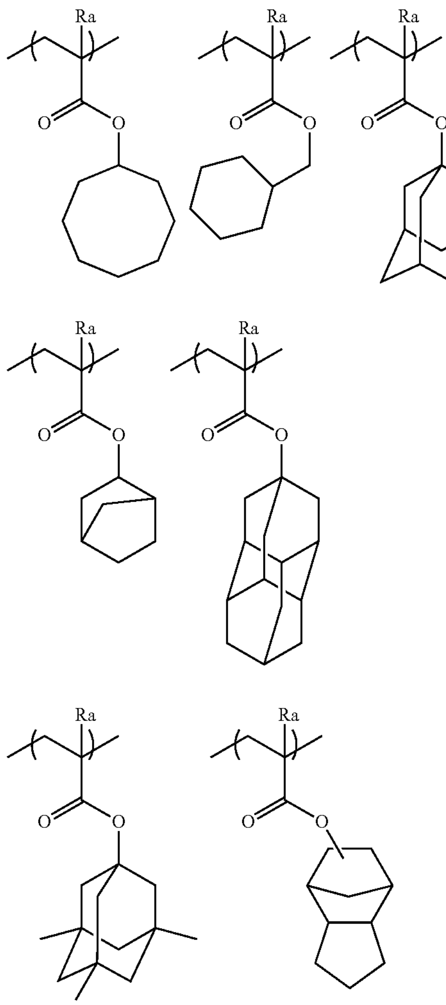

From the standpoint of elevating Tg, improving dry etching resistance and producing an effect such as internal filter for out-of-band-light, the resin (A) may contain the following monomer component.

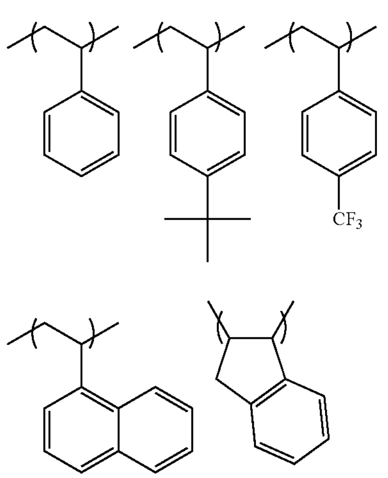

-continued

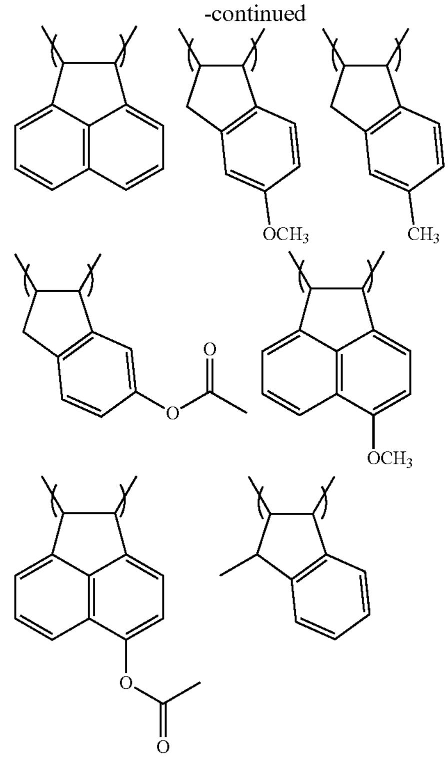

In the resin (A) for use in the composition of the present invention, the molar ratio of respective repeating structural units contained is appropriately set to control the dry etching resistance of resist, suitability for standard developer, adherence to substrate, resist profile and performances generally required of a resist, such as resolution, heat resistance and sensitivity.

The form of the resin (A) for use in the present invention may be any form of random type, block type, comb type and star type.

The resin (A) can be synthesized, for example, by radical, cationic or anionic polymerization of unsaturated monomers corresponding to respective structures. It is also possible to obtain the target resin by polymerizing unsaturated monomers corresponding to precursors of respective structures and then performing a polymer reaction.

Examples of the general synthesis method include a batch polymerization method of dissolving unsaturated monomers and a polymerization initiator in a solvent and heating the solution, thereby effecting the polymerization, and a dropping polymerization method of adding dropwise a solution containing unsaturated monomers and a polymerization initiator to a heated solvent over 1 to 10 hours. A dropping polymerization method is preferred.

Examples of the solvent used for the polymerization include a solvent which can be used when preparing the later-described actinic ray-sensitive or radiation-sensitive resin composition, and it is more preferred to perform the polymerization by using the same solvent as the solvent used in the composition of the present invention. By the use of this solvent, production of particles during storage can be suppressed.

The polymerization reaction is preferably performed in an inert gas atmosphere such as nitrogen or argon. As for the polymerization initiator, the polymerization is started using a commercially available radical initiator (e.g., azo-based initiator, peroxide). The radical initiator is preferably an azo-based initiator, and an azo-based initiator having an ester group, a cyano group or a carboxyl group is preferred. Preferred examples of the initiator include azobisisobutyronitrile, azobisdimethylvaleronitrile, and dimethyl 2,2'-azobis(2-methylpropionate). If desired, the polymerization may be performed in the presence of a chain transfer agent (e.g., alkylmercaptan).

The reaction concentration is from 5 to 70 mass %, preferably from 10 to 50 mass %, and the reaction temperature is usually from 10 to 150° C., preferably from 30 to 120° C., more preferably from 40 to 100° C.

The reaction time is usually from 1 to 48 hours, preferably from 1 to 24 hours, more preferably from 1 to 12 hours.

After the completion of reaction, the reaction solution is allowed to cool to room temperature and purified. In the purification, a conventional method, for example, a liquid-liquid extraction method of applying water washing or combining an appropriate solvent to remove residual monomers or oligomer components, a purification method in a solution state, such as ultrafiltration of removing by extraction only polymers having a molecular weight lower than a specific molecular weight, a reprecipitation method of adding dropwise the resin solution to a poor solvent to solidify the resin in the poor solvent and thereby remove residual monomers and the like, or a purification method in a solid state, such as washing of the resin slurry with a poor solvent after separation by filtration, may be applied. For example, the resin is precipitated as a solid by contacting the reaction solution with a solvent in which the resin is sparingly soluble or insoluble (poor solvent) and which is in a volumetric amount of 10 times or less, preferably from 10 to 5 times, the reaction solution.

The solvent used at the operation of precipitation or reprecipitation from the polymer solution (precipitation or reprecipitation solvent) may be sufficient if it is a poor solvent to the polymer, and the solvent which can be used may be appropriately selected from a hydrocarbon, a halogenated hydrocarbon, a nitro compound, an ether, a ketone, an ester, a carbonate, an alcohol, a carboxylic acid, water, a mixed solvent containing such a solvent, and the like, according to the kind of the polymer. Among these solvents, a solvent containing at least an alcohol (particularly, methanol or the like) or water is preferred as the precipitation or reprecipitation solvent.

The amount of the precipitation or reprecipitation solvent used may be appropriately selected by taking into consideration the efficiency, yield and the like, but in general, the amount used is from 100 to 10,000 parts by mass, preferably from 200 to 2,000 parts by mass, more preferably from 300 to 1,000 parts by mass, per 100 parts by mass of the polymer solution.

The temperature at the precipitation or reprecipitation may be appropriately selected by taking into consideration the efficiency or operability but is usually on the order of 0 to 50° C., preferably in the vicinity of room temperature (for example, approximately from 20 to 35° C.). The precipitation or reprecipitation operation may be performed using a commonly employed mixing vessel such as stirring tank, by a known method such as batch system and continuous system.

The precipitated or reprecipitated polymer is usually subjected to commonly employed solid-liquid separation such as filtration and centrifugation, then dried and used. The filtration is performed using a solvent-resistant filter element preferably under pressure. The drying is performed under atmospheric pressure or reduced pressure (preferably under reduced pressure) at a temperature of approximately from 30 to 100° C., preferably on the order of 30 to 50° C.

Incidentally, after the resin is once precipitated and separated, the resin may be again dissolved in a solvent and then put into contact with a solvent in which the resin is sparingly soluble or insoluble. That is, there may be used a method comprising, after the completion of radical polymerization reaction, bringing the polymer into contact with a solvent in which the polymer is sparingly soluble or insoluble, to precipitate a resin (step a), separating the resin from the solution (step b), anew dissolving the resin in a solvent to prepare a resin solution A (step c), bringing the resin solution A into contact with a solvent in which the resin is sparingly soluble or insoluble and which is in a volumetric amount of less than 10 times (preferably 5 times or less) the resin solution A, to precipitate a resin solid (step d), and separating the precipitated resin (step e).

The polymerization reaction is preferably performed in an inert gas atmosphere such as nitrogen or argon. As for the polymerization initiator, the polymerization is started using a commercially available radical initiator (e.g., azo-based initiator, peroxide). The radical initiator is preferably an azo-based initiator, and an azo-based initiator having an ester group, a cyano group or a carboxyl group is preferred. Preferred examples of the initiator include azobisisobutyronitrile, azobisdimethylvaleronitrile and dimethyl 2,2'-azobis(2-methylpropionate). The initiator is added additionally or in parts, if desired. After the completion of reaction, the reaction product is pored in a solvent, and the desired polymer is collected by a method for powder or solid recovery or the like. The reaction concentration is from 5 to 50 mass %, preferably from 10 to 30 mass %, and the reaction temperature is usually from 10 to 150° C., preferably from 30 to 120° C., more preferably from 60 to 100° C.

The molecular weight of the resin (A) according to the present invention is not particularly limited, but the weight average molecular weight is preferably from 1,000 to 100,000, more preferably from 1,500 to 60,000, still more preferably from 2,000 to 30,000. When the weight average molecular weight is from 1,000 to 100,000, the heat resistance and dry etching resistance can be kept from deterioration and at the same time, the film-forming property can be prevented from deteriorating due to degradation of developability or increase in the viscosity. Here, the weight average molecular weight of the resin indicates a molecular weight in terms of polystyrene measured by GPC (carrier: THF or N-methyl-2-pyrrolidone (NMP)).

The polydispersity (Mw/Mn) is preferably from 1.00 to 5.00, more preferably from 1.03 to 3.50, still more preferably from 1.05 to 2.50. As the molecular weight distribution is narrower, the resolution and resist profile are more excellent, the sidewall of the resist pattern is smoother, and the roughness is more improved.

As for the resin (A) used in the present invention, one kind of a resin may be used alone, or two or more kinds of resins may be used in combination. The content of the resin (A) is preferably from 20 to 99 mass %, more preferably from 30 to 89 mass %, still more preferably from 40 to 79 mass %, based on the total solid content in the actinic ray-sensitive or radiation-sensitive resin composition of the present invention.

[2] (B) Compound Capable of Generating Acid Upon Irradiation with Actinic Ray or Radiation The composition of the present invention contains a compound capable of generating an acid upon irradiation with an actinic ray or radiation (hereinafter, sometimes referred to as an "acid generator").

The acid generator is not particularly limited as long as it is a known acid generator, but a compound capable of generating an organic acid, for example, at least one of a sulfonic acid, a bis(alkylsulfonyl)imide and a tris(alkylsulfonyl)methide, upon irradiation with an actinic ray or radiation is preferred.

The compound is more preferably a compound represented by the following formula (ZI), (ZII) or (ZIII):

(ZI)

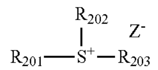

(ZII)

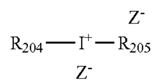

(ZIII)

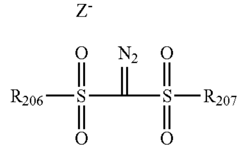

In formula (ZI), each of $R_{201}$, $R_{202}$ and $R_{203}$ independently represents an organic group.

The carbon number of the organic group as $R_{201}$, $R_{202}$ and $R_{203}$ is generally from 1 to 30, preferably from 1 to 20.

Two members out of $R_{201}$ to $R_{203}$ may combine to form a ring structure, and the ring may contain therein an oxygen atom, a sulfur atom, an ester bond, an amide bond or a carbonyl group. The group formed by combining two members out of $R_{201}$ to $R_{203}$ includes an alkylene group (e.g., butylene, pentylene).

$Z^-$ represents a non-nucleophilic anion (an anion having an extremely low ability of causing a nucleophilic reaction).

Examples of the non-nucleophilic anion include a sulfonate anion (such as aliphatic sulfonate anion, aromatic sulfonate anion and camphorsulfonate anion), a carboxylate anion (such as aliphatic carboxylate anion, aromatic carboxylate anion and aralkylcarboxylate anion), a sulfonylimide anion, a bis(alkylsulfonyl)imide anion, and a tris(alkylsulfonyl)methide anion.

The aliphatic moiety in the aliphatic sulfonate anion and aliphatic carboxylate anion may be an alkyl group or a cycloalkyl group but is preferably a linear or branched alkyl group having a carbon number of 1 to 30 or a cycloalkyl group having a carbon number of 3 to 30.

The aromatic group in the aromatic sulfonate anion and aromatic carboxylate anion is preferably an aryl group having a carbon number of 6 to 14, and examples thereof include a phenyl group, a tolyl group and a naphthyl group.

The alkyl group, cycloalkyl group and aryl group above may have a substituent. Specific examples of the substituent include a nitro group, a halogen atom such as fluorine atom, a carboxyl group, a hydroxyl group, an amino group, a cyano group, an alkoxy group (preferably having a carbon number of 1 to 15), a cycloalkyl group (preferably having a carbon number of 3 to 15), an aryl group (preferably having a carbon number of 6 to 14), an alkoxycarbonyl group (preferably having a carbon number of 2 to 7), an acyl group (preferably having a carbon number of 2 to 12), an alkoxycarbonyloxy group (preferably having a carbon number of 2 to 7), an alkylthio group (preferably having a carbon number of 1 to 15), an alkylsulfonyl group (preferably having a carbon number of 1 to 15), an alkyliminosulfonyl group (preferably having a carbon number of 2 to 15), an aryloxysulfonyl group (preferably having a carbon number of 6 to 20), an alkylaryloxysulfonyl group (preferably having a carbon number of 7 to 20), a cycloalkylaryloxysulfonyl group (preferably having a carbon number of 10 to 20), an alkyloxyalkyloxy group (preferably having a carbon number of 5 to 20), and a cycloalkylalkyloxyalkyloxy group (preferably having a carbon number of 8 to 20). The aryl group or ring structure, which each group has, may further have an alkyl group (preferably having a carbon number of 1 to 15) as a substituent.

The aralkyl group in the aralkylcarboxylate anion is preferably an aralkyl group having a carbon number of 7 to 12, and examples thereof include a benzyl group, a phenethyl group, a naphthylmethyl group, a naphthylethyl group and a naphthylbutyl group.

Examples of the sulfonylimide anion include saccharin anion.

The alkyl group in the bis(alkylsulfonyl)imide anion and tris(alkylsulfonyl)methide anion is preferably an alkyl group having a carbon number of 1 to 5, and examples of the substituent on this alkyl group include a halogen atom, a halogen atom-substituted alkyl group, an alkoxy group, an alkylthio group, an alkyloxysulfonyl group, an aryloxysulfonyl group, and a cycloalkylaryloxysulfonyl group, with a fluorine atom and a fluorine atom-substituted alkyl group being preferred.

Also, the alkyl groups in the bis(alkylsulfonyl)imide anion may combine with each other to form a ring structure. In this case, the acid strength is increased.

Other examples of the non-nucleophilic anion include fluorinated phosphorus (e.g., $PF_6^-$), fluorinated boron (e.g., $BF_4^-$), and fluorinated antimony (e.g., $SbF_6^-$).

The non-nucleophilic anion is preferably an aliphatic sulfonate anion substituted with a fluorine atom at least at the α-position of the sulfonic acid, an aromatic sulfonate anion substituted with a fluorine atom or a fluorine atom-containing group, a bis(alkylsulfonyl)imide anion in which the alkyl group is substituted with a fluorine atom, or a tris(alkylsulfonyl)methide anion in which the alkyl group is substituted with a fluorine atom. The non-nucleophilic anion is more preferably a perfluoroaliphatic sulfonate anion (preferably having a carbon number of 4 to 8) or a fluorine atom-containing benzenesulfonate anion, still more preferably nonafluorobutanesulfonate anion, perfluorooctanesulfonate anion, pentafluorobenzenesulfonate anion or 3,5-bis(trifluoromethyl)benzenesulfonate anion.

As regards the acid strength, the pKa of the acid generated is preferably −1 or less for enhancing the sensitivity.

An anion represented by the following formula (AN1) is also a preferred embodiment of the non-nucleophilic anion:

(AN1)

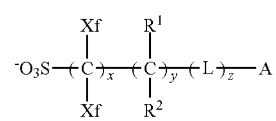

In the formula, each Xf independently represents a fluorine atom or an alkyl group substituted with at least one fluorine atom.

Each of $R^1$ and $R^2$ independently represents a hydrogen atom, a fluorine atom or an alkyl group, and when a plurality of $R^1$s or $R^2$s are present, each $R^1$ or $R^2$ may be the same as or different from every other $R^1$ or $R^2$.

L represents a divalent linking group, and when a plurality of L's are present, each L may be the same as or different from every other L.

A represents a cyclic organic group.

x represents an integer of 1 to 20, y represents an integer of 0 to 10, and z represents an integer of 0 to 10.

Formula (AN1) is described in more detail.

The alkyl group in the fluorine atom-substituted alkyl group of Xf is preferably an alkyl group having a carbon number of 1 to 10, more preferably from 1 to 4. Also, the fluorine atom-substituted alkyl group of Xf is preferably a perfluoroalkyl group.

Xf is preferably a fluorine atom or a perfluoroalkyl group having a carbon number of 1 to 4. Specific examples of Xf include a fluorine atom, $CF_3$, $C_2F_5$, $C_3F_7$, $C_4F_9$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$ and $CH_2CH_2C_4F_9$, with a fluorine atom and $CF_3$ being preferred. In particular, it is preferred that both Xf's are a fluorine atom.

The alkyl group of $R^1$ and $R^2$ may have a substituent (preferably a fluorine atom) and is preferably an alkyl group having a carbon number of 1 to 4, more preferably a perfluoroalkyl group having a carbon number of 1 to 4. Specific examples of the alkyl group having a substituent of $R^1$ and $R^2$ include $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$ and $CH_2CH_2C_4F_9$, with $CF_3$ being preferred.

Each of $R^1$ and $R^2$ is preferably a fluorine atom or $CF_3$.

x is preferably from 1 to 10, more preferably from 1 to 5.

y is preferably from 0 to 4, more preferably 0.

z is preferably from 0 to 5, more preferably from 0 to 3.

The divalent linking group of L is not particularly limited and includes, for example, —COO—, —OCO—, —CO—, —O—, —S—, —SO—, —$SO_2$—, an alkylene group, a cycloalkylene group, an alkenylene group, and a linking group formed by combining a plurality thereof. A linking group having a total carbon number of 12 or less is preferred. Among these, —COO—, —OCO—, —CO— and —O— are preferred, and —COO—, —OCO— are more preferred.

The cyclic organic group of A is not particularly limited as long as it has a cyclic structure, and examples thereof include an alicyclic group, an aryl group and a heterocyclic group (including not only those having aromaticity but also those having no aromaticity).

The alicyclic group may be monocyclic or polycyclic and is preferably a monocyclic cycloalkyl group such as cyclopentyl group, cyclohexyl group and cyclooctyl group, or a polycyclic cycloalkyl group such as norbornyl group, tricyclodecanyl group, tetracyclodecanyl group, tetracyclododecanyl group and adamantyl group. Above all, an alicyclic group having a bulky structure with a carbon number of 7 or more, such as norbornyl group, tricyclodecanyl group, tetracyclodecanyl group, tetracyclododecanyl group and adamantyl group, is preferred from the standpoint that the diffusion in the film during heating after exposure can be suppressed and MEEF can be improved.

The aryl group includes a benzene ring, a naphthalene ring, a phenanthrene ring, and an anthracene ring.

The heterocyclic group includes those derived from a furan ring, a thiophene ring, a benzofuran ring, a benzothiophene ring, a dibenzofuran ring, a dibenzothiophene ring and a pyridine ring. Among these, heterocyclic groups derived from a furan ring, a thiophene ring and a pyridine ring are preferred.

The cyclic organic group also includes a lactone structure. Specific examples thereof include lactone structures represented by formulae (LC1-1) to (LC1-17) which may be contained in the resin (A).

The cyclic organic group may have a substituent, and examples of the substituent include an alkyl group (may be any of linear, branched or cyclic; preferably having a carbon number of 1 to 12), a cycloalkyl group (may be any of monocyclic, polycyclic or spirocyclic; preferably having a carbon number of 3 to 20), an aryl group (preferably having a carbon number of 6 to 14), a hydroxy group, an alkoxy group, an ester group, an amide group, a urethane group, a ureido group, a thioether group, a sulfonamido group, and a sulfonic acid ester group. Incidentally, the carbon constituting the cyclic organic group (the carbon contributing to ring formation) may be a carbonyl carbon.

Examples of the organic group of $R_{201}$, $R_{202}$ and $R_{203}$ include an aryl group, an alkyl group, and a cycloalkyl group.

At least one of three members $R_{201}$, $R_{202}$ and $R_{203}$ is preferably an aryl group, and it is more preferred that all of these three members are an aryl group. The aryl group may be a heteroaryl group such as indole residue and pyrrole residue, other than a phenyl group, a naphthyl group and the like. The alkyl group and cycloalkyl group of $R_{201}$ to $R_{203}$ may be preferably a linear or branched alkyl group having a carbon number of 1 to 10 and a cycloalkyl group having a carbon number of 3 to 10. More preferred examples of the alkyl group include a methyl group, an ethyl group, an n-propyl group, an i-propyl group, and an n-butyl group. More preferred examples of the cycloalkyl group include a cyclopropyl group, a cyclobutyl group, a cyclopentyl group, a cyclohexyl group, and a cycloheptyl group. These groups may further have a substituent, and examples of the substituent include, but are not limited to, a nitro group, a halogen atom such as fluorine atom, a carboxyl group, a hydroxyl group, an amino group, a cyano group, an alkoxy group (preferably having a carbon number of 1 to 15), a cycloalkyl group (preferably having a carbon number of 3 to 15), an aryl group (preferably having a carbon number of 6 to 14), an alkoxycarbonyl group (preferably having a carbon number of 2 to 7), an acyl group (preferably having a carbon number of 2 to 12), and an alkoxycarbonyloxy group (preferably having a carbon number of 2 to 7).

In the case where two members out of $R_{201}$ to $R_{203}$ are combined to form a ring structure, the ring structure is preferably a structure represented by the following formula (A1):

(A1)

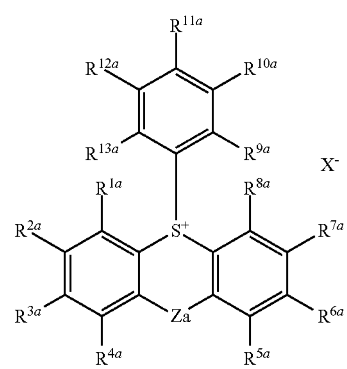

In formula (A1), each of $R^{1a}$ to $R^{13a}$ independently represents a hydrogen atom or a substituent.

It is preferred that from one to three members out of $R^{1a}$ to $R^{13a}$ are not a hydrogen atom; and it is more preferred that any one of $R^{9a}$ to $R^{13a}$ is not a hydrogen atom.

Za represents a single bond or a divalent linking group.

$X^-$ has the same meaning as $Z^-$ in formula (ZI).

Specific examples of $R^{1a}$ to $R^{13a}$ when these are not a hydrogen atom include a halogen atom, a linear, branched or cyclic alkyl group, an alkenyl group, an alkynyl group, an aryl group, a heterocyclic group, a cyano group, a nitro group, a carboxyl group, an alkoxy group, an aryloxy group, a silyloxy group, a heterocyclic oxy group, an acyloxy group, a carbamoyloxy group, an alkoxycarbonyloxy group, an aryloxycarbonyloxy group, an amino group (including an anilino group), an ammonio group, an acylamino group, an aminocarbonylamino group, an alkoxycarbonylamino group, an aryloxycarbonylamino group, a sulfamoylamino group, an alkylsulfonylamino group, an arylsulfonylamino group, a mercapto group, an alkylthio group, an arylthio group, a heterocyclic thio group, a sulfamoyl group, a sulfo group, an alkylsulfinyl group, an arylsulfinyl group, an alkylsulfonyl group, an arylsulfonyl group, an acyl group, an aryloxycarbonyl group, an alkoxycarbonyl group, a carbamoyl group, an arylazo group, a heterocyclic azo group, an imido group, a phosphino group, a phosphinyl group, a phosphinyloxy group, a phosphinylamino group, a phosphono group, a silyl group, a hydrazino group, a ureido group, a boronic acid group ($—B(OH)_2$), a phosphato group ($—OPO(OH)_2$), a sulfato group ($—OSO_3H$), and other known substituents.

In the case where $R^{1a}$ to $R^{13a}$ are not a hydrogen atom, each of $R^{1a}$ to $R^{13a}$ is preferably a linear, branched or cyclic alkyl group substituted with a hydroxyl group.

Examples of the divalent linking group of Za include an alkylene group, an arylene group, a carbonyl group, a sulfonyl group, a carbonyloxy group, a carbonylamino group, a sulfonylamide group, an ether bond, a thioether bond, an amino group, a disulfide group, $—(CH_2)_n—CO—$, $—(CH_2)_n—SO_2—$, $—CH{=}CH—$, an aminocarbonylamino group, and an aminosulfonylamino group (n is an integer of 1 to 3).

Incidentally, when at least one of $R_{201}$, $R_{202}$ and $R_{203}$ is not an aryl group, the preferred structure includes a cation structure such as compounds described in paragraphs 0047 and 0048 of JP-A-2004-233661 and paragraphs 0040 to 0046 of JP-A-2003-35948, compounds illustrated as formulae (I-1) to (I-70) in U.S. Patent Application Publication No. 2003/0224288A1, and compounds illustrated as formulae (IA-1) to (IA-54) and formulae (IB-1) to (IB-24) in U.S. Patent Application Publication No. 2003/0077540A1.

In formulae (ZII) and (ZIII), each of $R_{204}$ to $R_{207}$ independently represents an aryl group, an alkyl group or a cycloalkyl group.

The aryl group, alkyl group and cycloalkyl group of $R_{204}$ to $R_{207}$ are the same as the aryl group, alkyl group and cycloalkyl group of $R_{201}$ to $R_{203}$ in the compound (ZI).

The aryl group, alkyl group and cycloalkyl group of $R_{204}$ to $R_{207}$ may have a substituent. Examples of the substituent include those of the substituent which may be substituted on the aryl group, alkyl group and cycloalkyl group of $R_{201}$ to $R_{203}$ in the compound (ZI).

$Z^-$ represents a non-nucleophilic anion, and examples thereof are the same as those of the non-nucleophilic anion of $Z^-$ in formula (ZI).

The acid generator further includes compounds represented by the following formulae (ZIV), (ZV) and (ZVI):

$$Ar_3—SO_2—SO_2—Ar_4 \quad \text{(ZIV)}$$

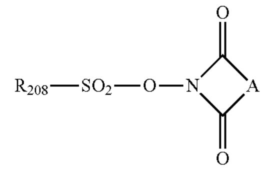

(ZV)

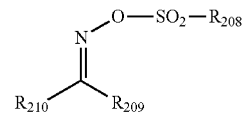

(ZVI)

In formulae (ZIV) to (ZVI), each of $Ar_3$ and $Ar_4$ independently represents an aryl group.

Each of $R_{208}$, $R_{209}$ and $R_{210}$ independently represents an alkyl group, a cycloalkyl group or an aryl group.

A represents an alkylene group, an alkenylene group or an arylene group.

Specific examples of the aryl group of $Ar_3$, $Ar_4$, $R_{208}$, $R_{209}$ and $R_{210}$ are the same as specific examples of the aryl group of $R_{201}$, $R_{202}$ and $R_{203}$ in formula (ZI).

Specific examples of the alkyl group and cycloalkyl group of $R_{208}$, $R_{209}$ and $R_{210}$ are the same as specific examples of the alkyl group and cycloalkyl group of $R_{201}$, $R_{202}$ and $R_{203}$ in formula (ZI).

The alkylene group of A includes an alkylene group having a carbon number of 1 to 12 (e.g., methylene group, ethylene group, propylene group, isopropylene group, butylenes group, isobutylene group); the alkenylene group of A includes an alkenylene group having a carbon number of 2 to 12 (e.g., ethenylene group, propenylene group, butenylene group); and the arylene group of A includes an arylene group having a carbon number of 6 to 10 (e.g., phenylene group, tolylene group, naphthylene group).

Out of the acid generators, particularly preferred examples are illustrated below.

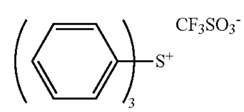

(z1)

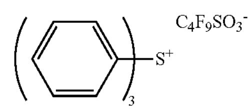

(z2)

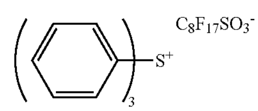

(z3)

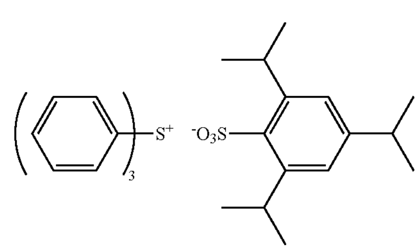

(z4)

-continued
(z5)
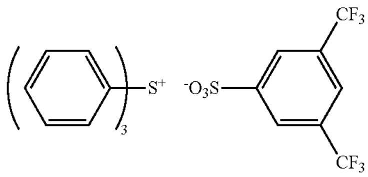
(z6)
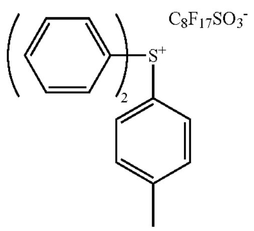
(z7)
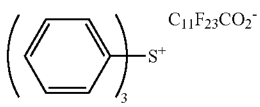
(z8)
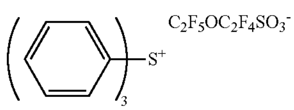
(z9)
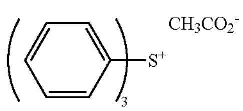
(z10)
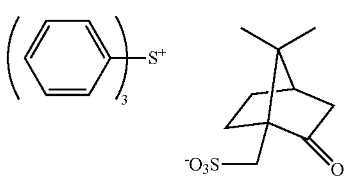
(z11)
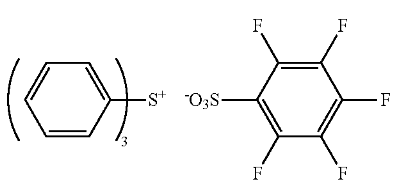
(z12)
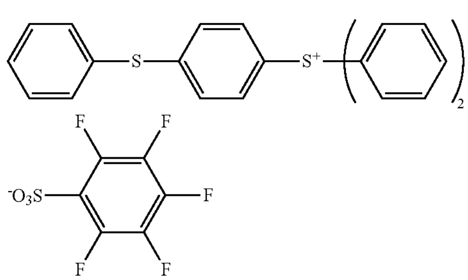
(z13)
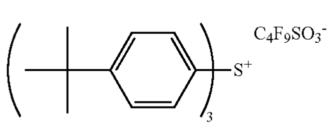
-continued
(z14)
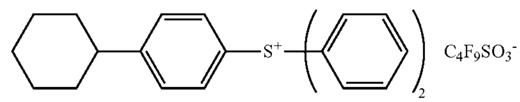
(z15)
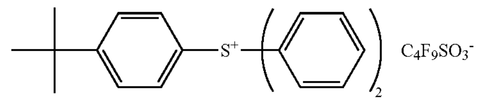
(z16)
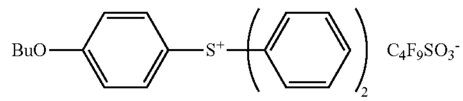
(z17)
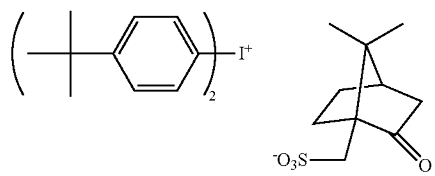
(z18)
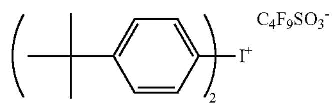
(z19)
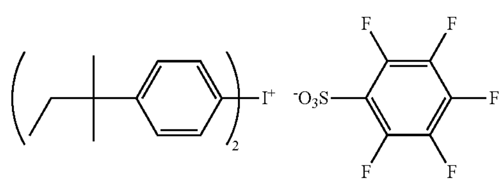
(z20)
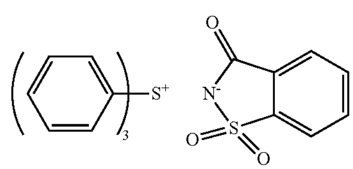
(z21)
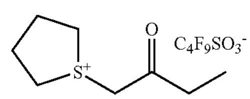
(z22)
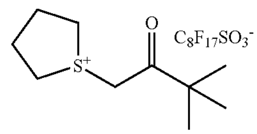
(z23)
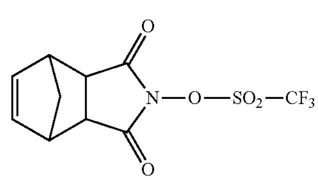
(z24)
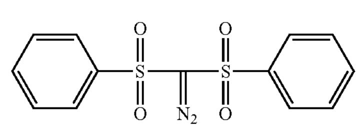

-continued
(z25)
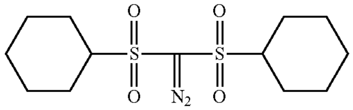
(z26)
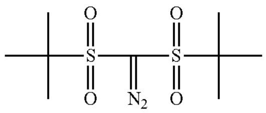
(z27)
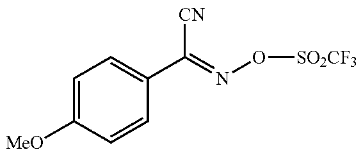
(z28)
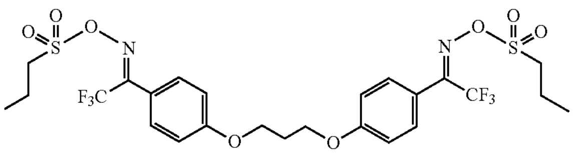
(z29)
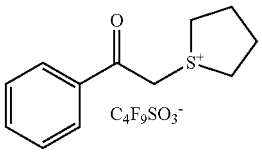
(z30)
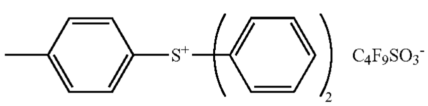
(z31)
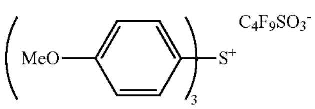
(z32)
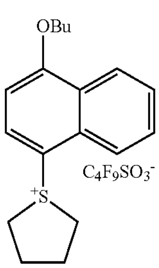
(z33)
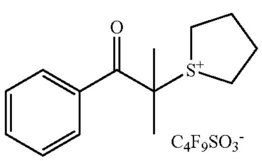
(z34)
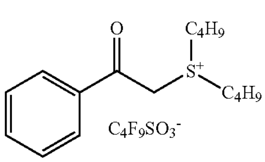
-continued
(z35)
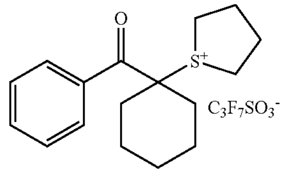
(z36)
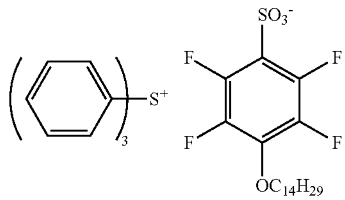
(z37)
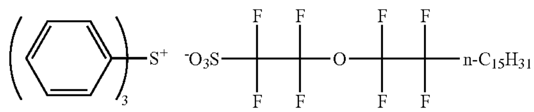
(z38)
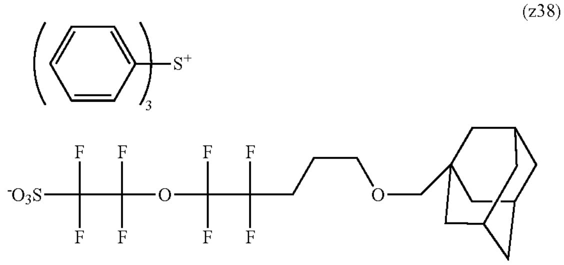
(z39)
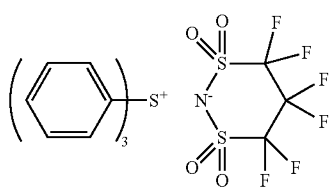
(z40)
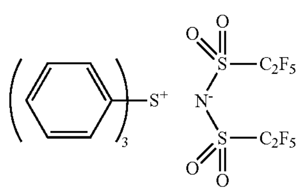
(z41)
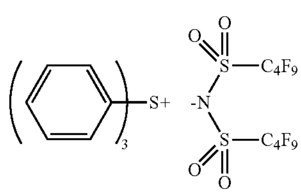
(z42)
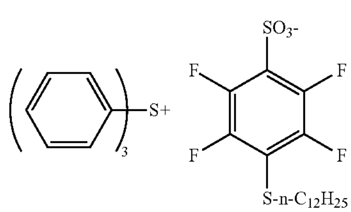

-continued
(z43)
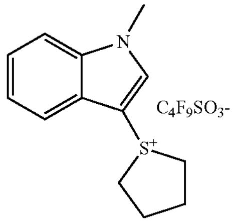
(z44)
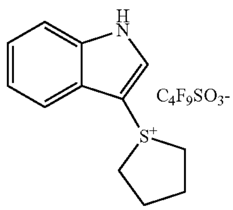
(z45)
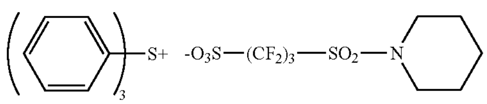
(z46)
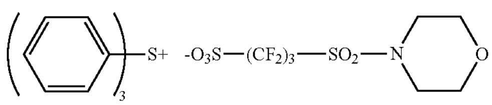
(z47)
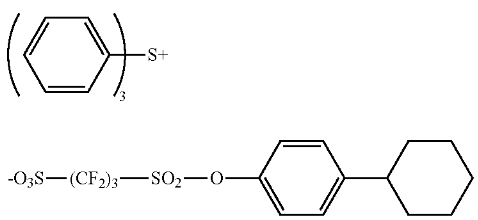
(z48)
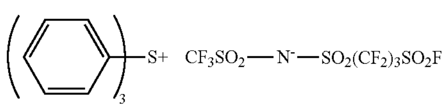
(z49)
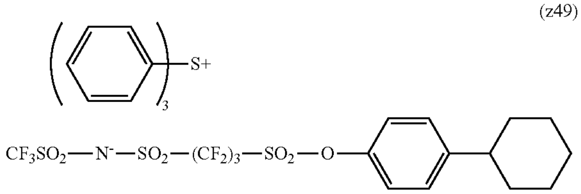
(z50)
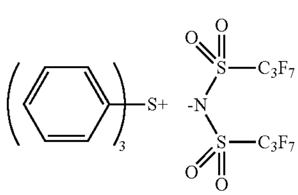
-continued
(z51)
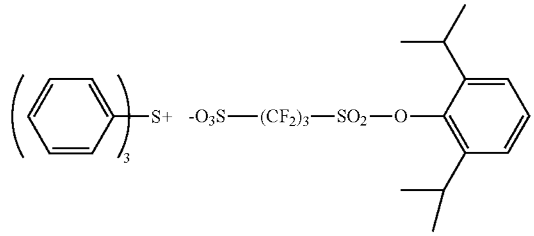
(z52)
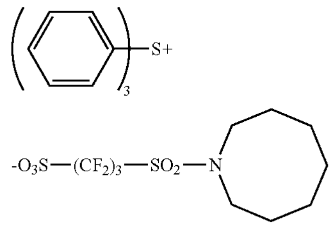
(z53)
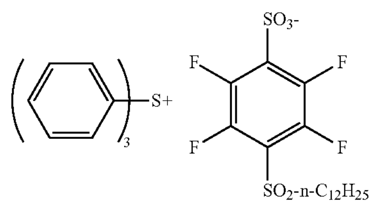
(z54)
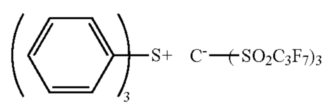
(z55)
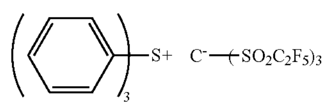
(z56)
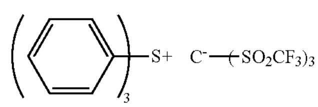
(z57)
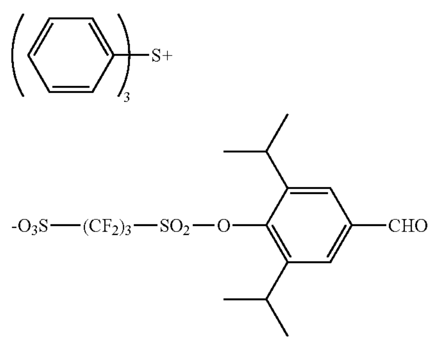
(z58)
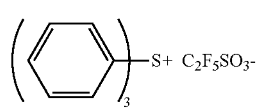
(z59)
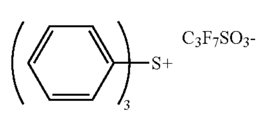

-continued
(z60)
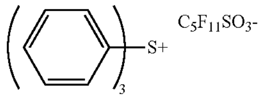
(z61)
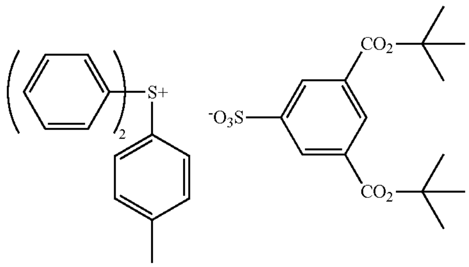
(z62)
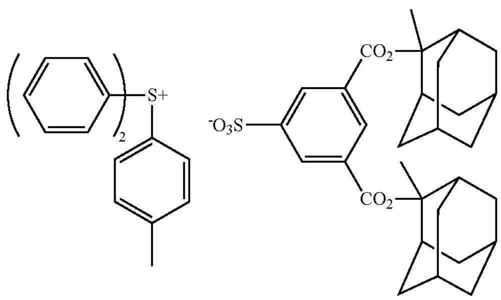
(z63)
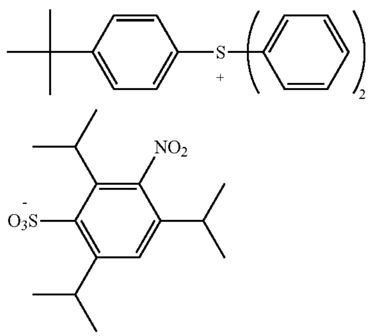
(z64)
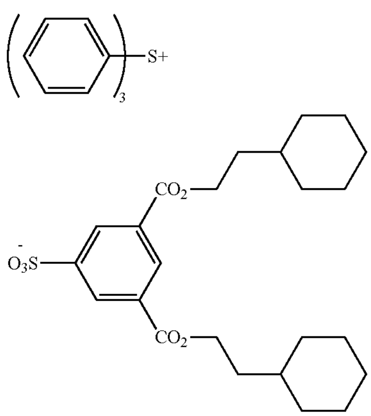
(z65)
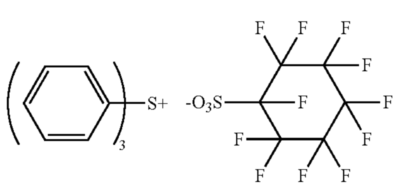
-continued
(z66)
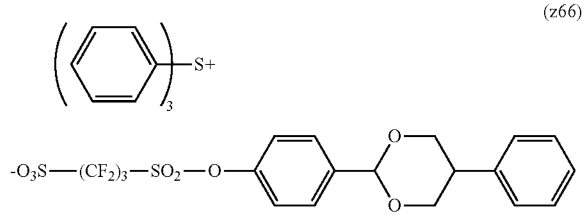
(z67)
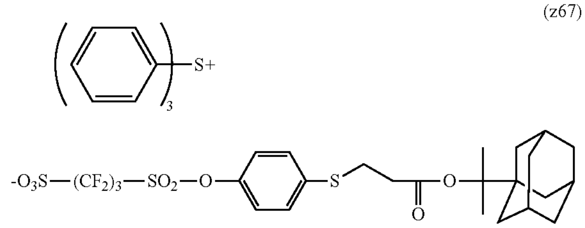
(z68)
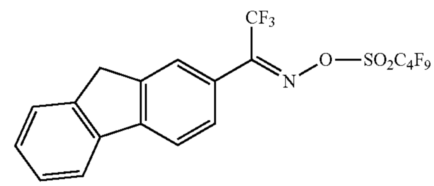
(z69)
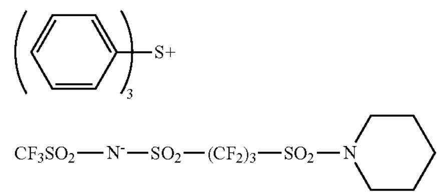
(z70)
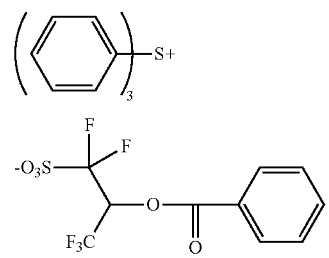
(z71)
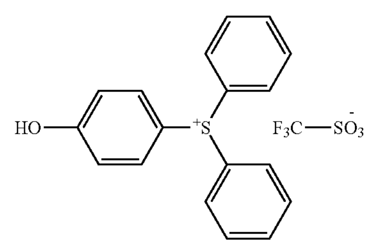
(z72)
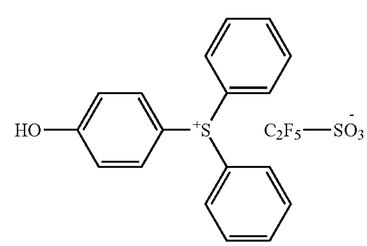

-continued
(z73)
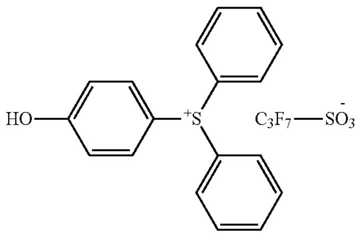
(z74)
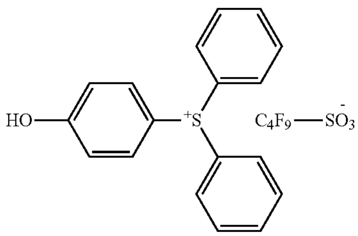
(z75)
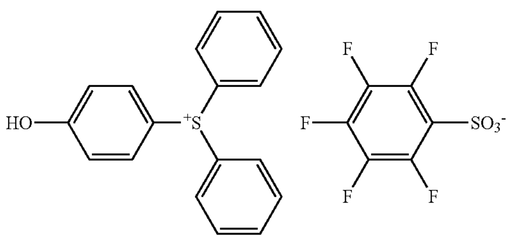
(z76)
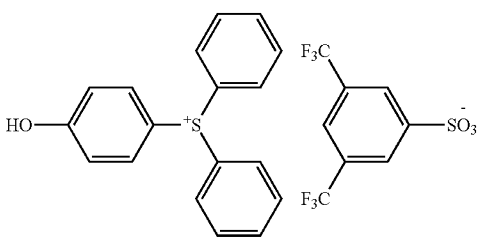
(z77)
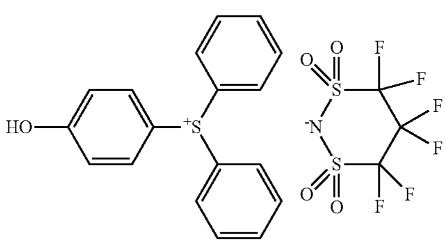
(z78)
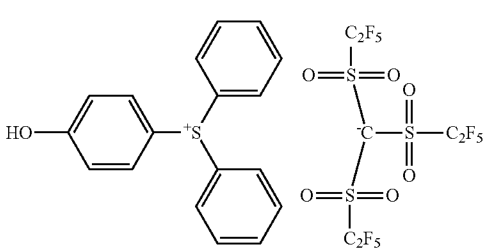
-continued
(z79)
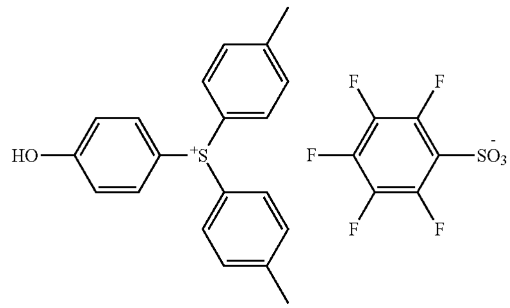
(z80)
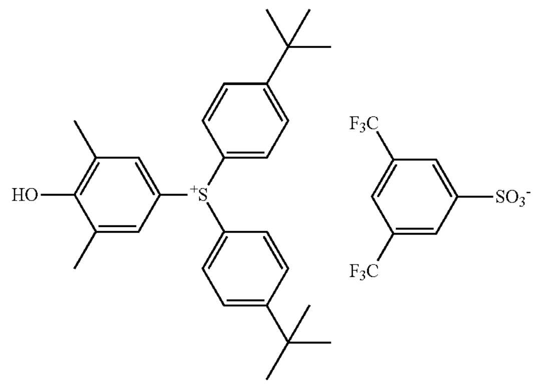
(z81)
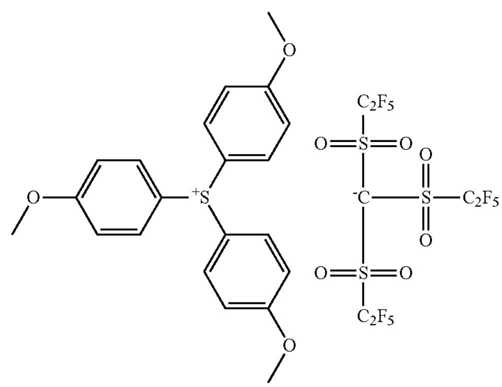
(z82)
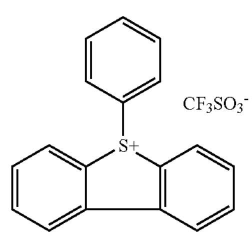
(z83)
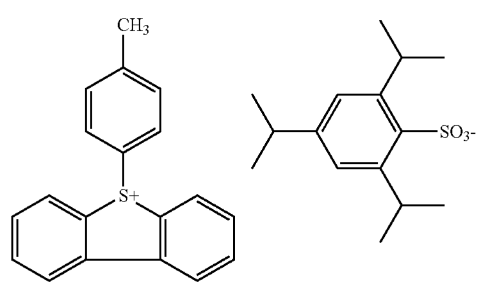

-continued
(z84)
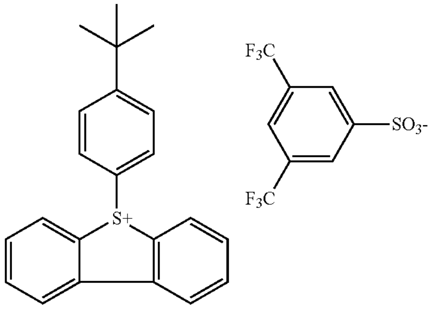
(z85)
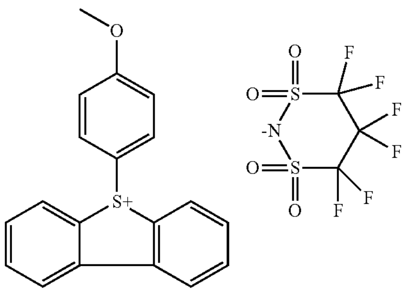
(z86)
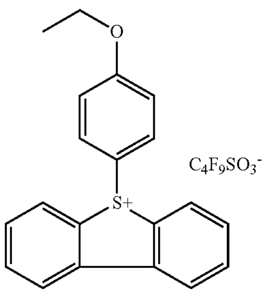
(z87)
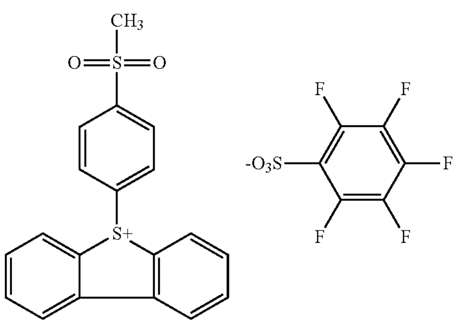
(z88)
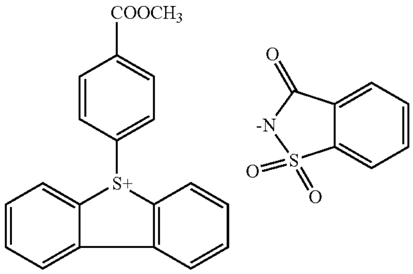
-continued
(z89)
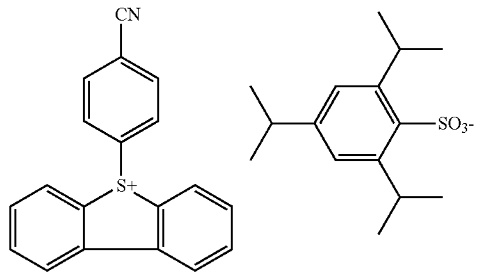
(z90)
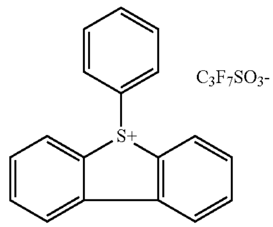
(z91)
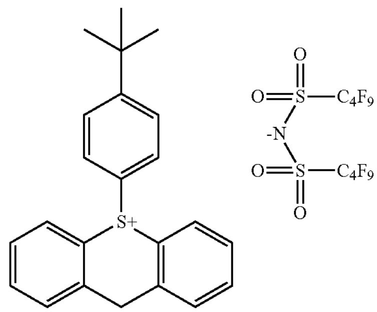
(z92)
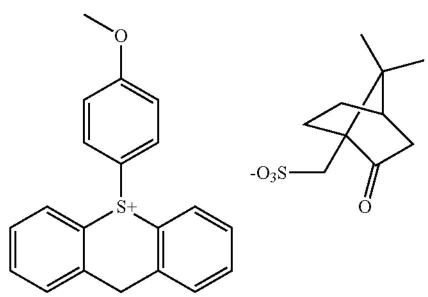
(z93)
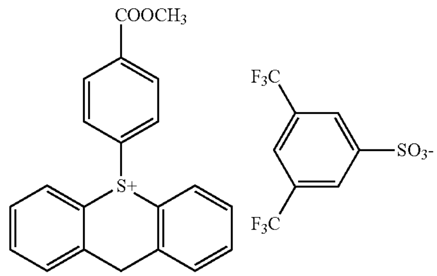

-continued
(z94)
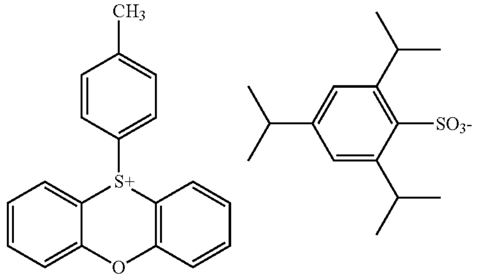
(z95)
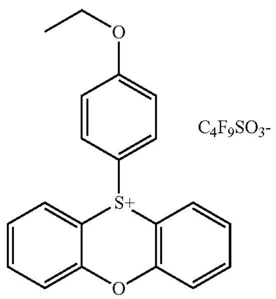
(z96)
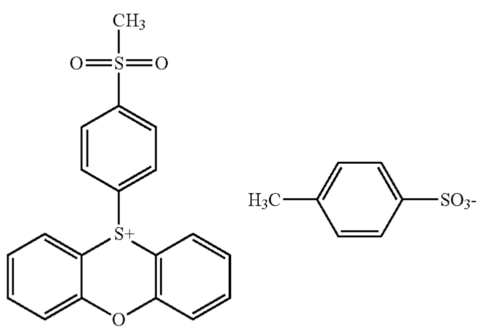
(z97)
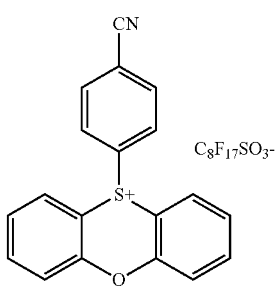
(z98)
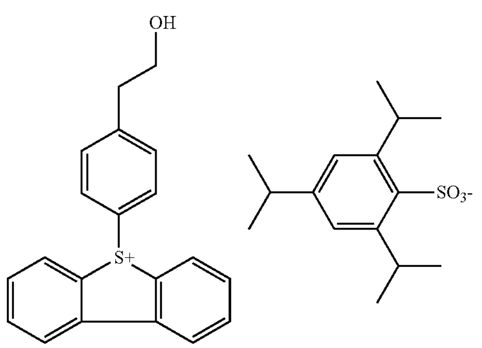
-continued
(z99)
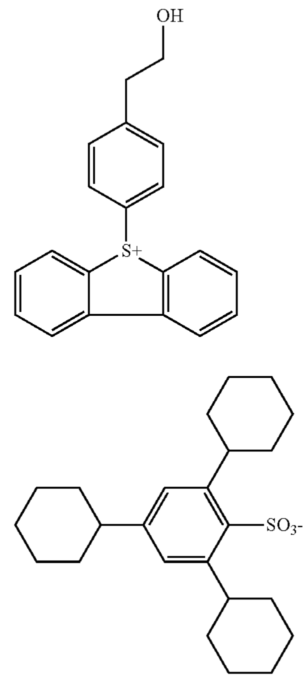
(z100)
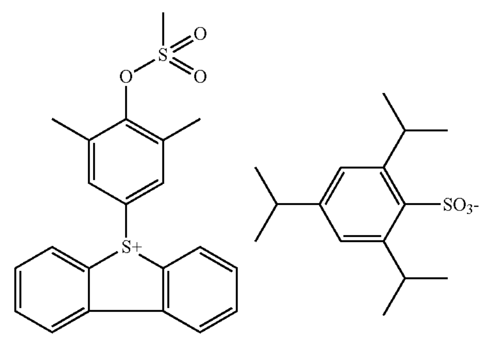
(z101)
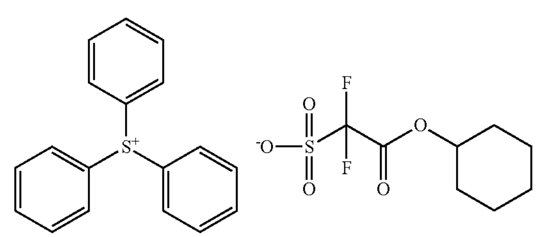
(z102)
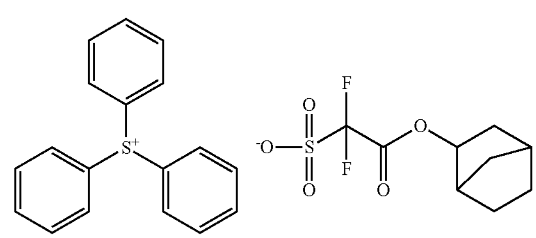

-continued
(z103)
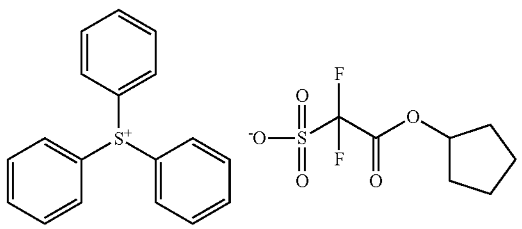
(z104)
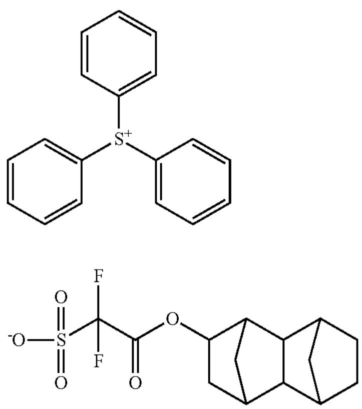
(z105)
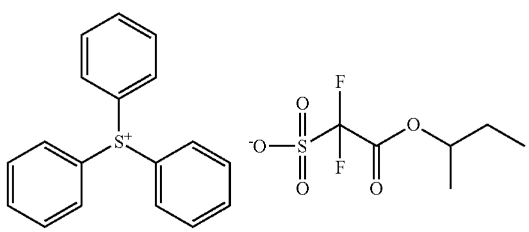
(z106)
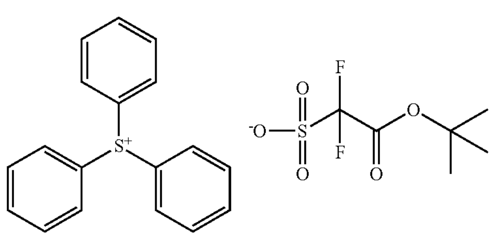
(z107)
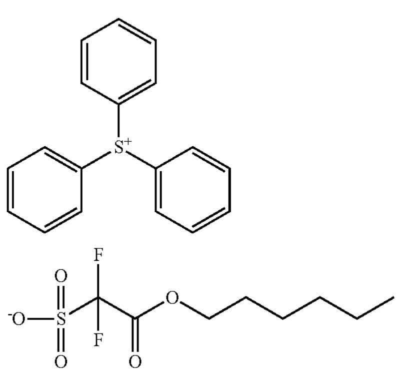
-continued
(z108)
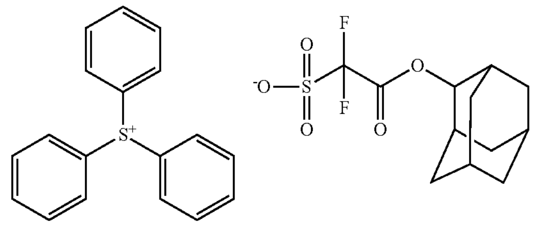
(z109)
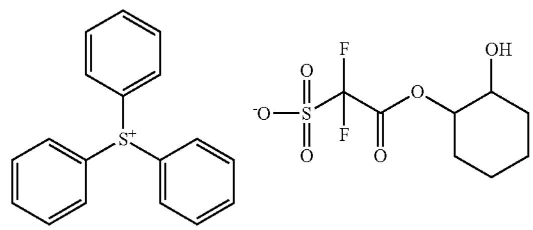
(z110)
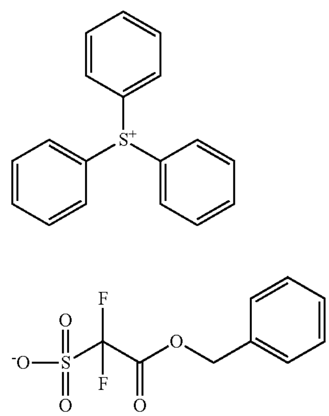
(z111)
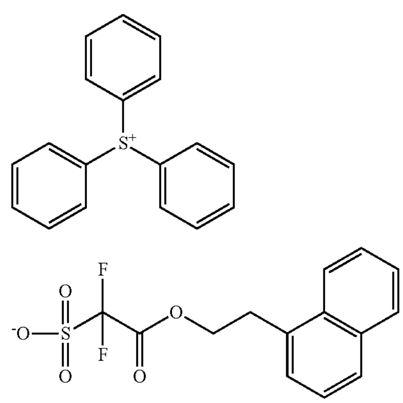
(z112)
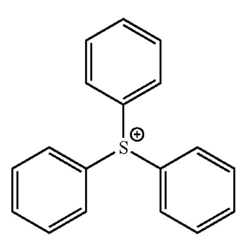

-continued
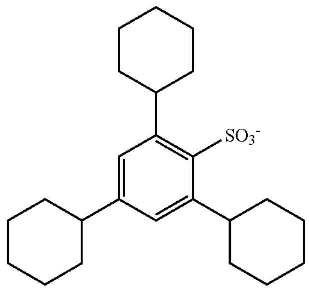
(z113)
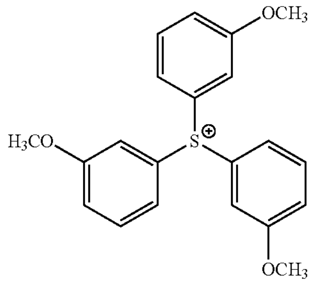
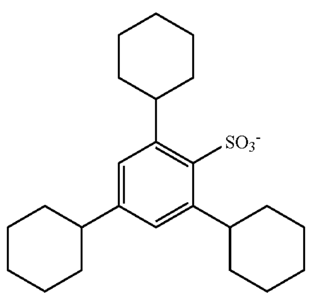
(z114)
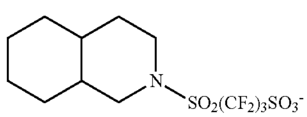
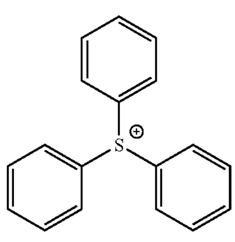
(z115)
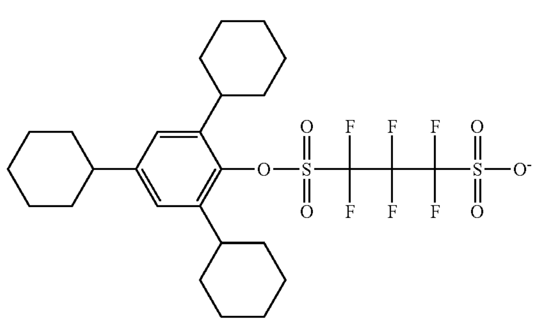
-continued
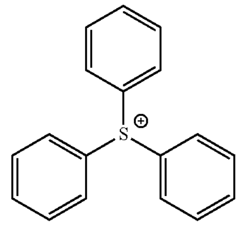
(z116)
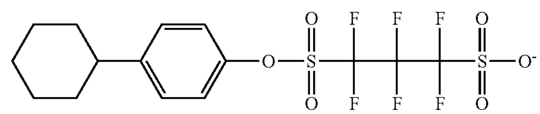
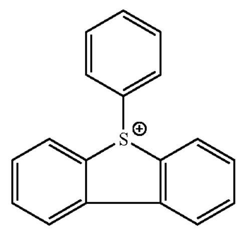
(z117)
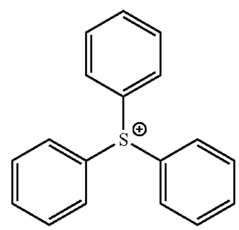
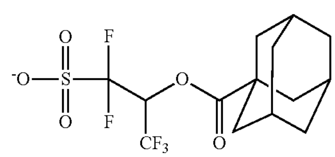
(z118)
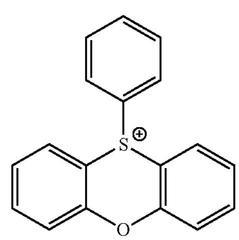
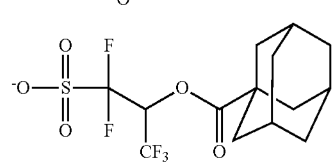
(z119)
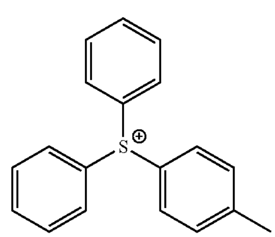

-continued

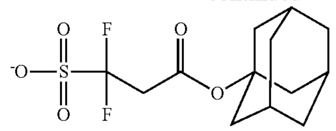

(z120)

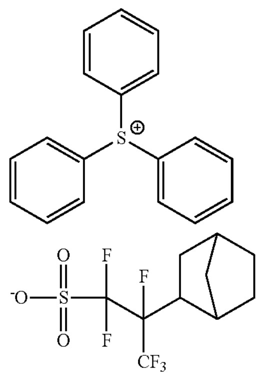

As for the acid generator, one kind of an acid generator may be used alone, or two or more kinds of acid generators may be used in combination.

The content of the acid generator in the composition is preferably from 0.1 to 40 mass %, more preferably from 0.5 to 35 mass %, still more preferably from 1.0 to 35 mass %, based on the total solid content of the composition. If the content is too small, high sensitivity and high LWR performance can be hardly brought out, whereas if the content is too large, high resolution and high LWR performance can be hardly brought out.

[3] (C) Compound Capable of Decomposing by the Action of an Acid to Produce an Acid The actinic ray-sensitive or radiation-sensitive resin composition of the present invention contains (C) a compound capable of decomposing by the action of an acid to produce an acid (hereinafter, sometimes simply referred to as "acid-increasing agent").

The acid-increasing agent as used in the present invention is a compound which is stable in the absence of an acid but is decomposed by the action of an acid generated from an acid generator upon exposure and produces an acid.

As the acid-increasing agent, one of acid-increasing agents described in WO95/29968, WO98/24000, JP-A-8-305262, JP-A-9-34106, JP-A-8-248561, JP-T-8-503082 (the term "JP-T" as used herein means a published Japanese translation of a PCT patent application), U.S. Pat. No. 5,445,917, JP-T-8-503081, U.S. Pat. Nos. 5,534,393, 5,395,736, 5,741,630, 5,334,489, 5,582,956, 5,578,424, 5,453,345 and 5,445,917, European Patents 665,960, 757,628 and 665,961, U.S. Pat. No. 5,667,943, JP-A-10-1508, JP-A-10-282642, JP-A-9-512498, JP-A-2000-62337 and JP-A-2005-17730 may be used, or two or more thereof may be used in combination.

In the present invention, the (C) compound capable of decomposing by the action of an acid to generate an acid is preferably a compound represented by any one of the following formulae (1) to (8), and in view of improving the sensitivity, resolution and LWR, more preferably a compound represented by the following formula (1), (2), (7) or (8), still more preferably a compound represented by the following formula (7) or (8):

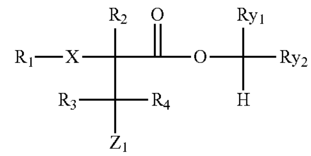

Formula (1)

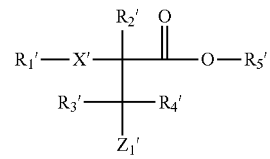

Formula (2)

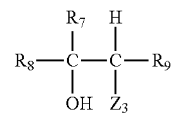

Formula (3)

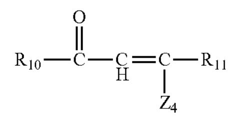

Formula (4)

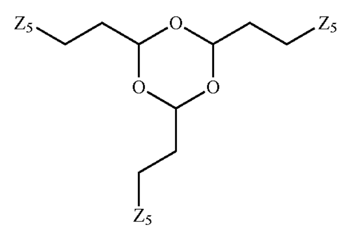

Formula (5)

$$Rb—SO_2—O—R_{12}$$

Formula (6)

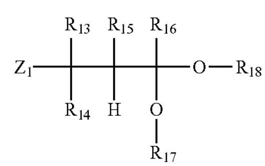

Formula (7)

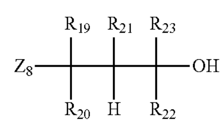

Formula (8)

In formula (1), $R_1$ represents an alkyl group, a cycloalkyl group, an alkoxy group, an aryl group or an aryloxy group.

$R_2$ represents an alkyl group or a cycloalkyl group.

$R_1$ and $R_2$ may combine to form a monocyclic or polycyclic cyclic hydrocarbon structure.

Each of $R_3$ and $R_4$ independently represents a hydrogen atom or an alkyl group.

$Ry_1$ represents a hydrogen atom, an alkyl group, a cycloalkyl group, an alkoxy group, an aryl group, or an alkylene group combining with $Ry_2$.

$Ry_2$ represents an aryl group or an aryloxy group.

X represents —$SO_2$—, —SO— or —CO—.

In formula (2), $R_1'$ represents an alkyl group, a cycloalkyl group, an alkoxy group, an aryl group or an aryloxy group.

$R_2'$ represents an alkyl group or a cycloalkyl group.

$R_1'$ and $R_2'$ may combine to form a monocyclic or polycyclic cyclic hydrocarbon structure.

Each of $R_3'$ and $R_4'$ independently represents a hydrogen atom or an alkyl group.

$R_5$' represents an aryl group-free group capable of leaving by the action of an acid.

X' represents —$SO_2$—, —SO— or —CO—.

In formulae (3) to (6), Rb represents an alkyl group, a cycloalkyl group, an aryl group or an aralkyl group.

$R_7$ represents a hydrogen atom, an alkyl group, a cycloalkyl group, an aryl group or an aralkyl group.

$R_8$ represents an alkyl group, a cycloalkyl group, an aryl group or an aralkyl group.

$R_9$ represents a hydrogen atom, an alkyl group, a cycloalkyl group, an aryl group or an aralkyl group.

$R_9$ may combine with $R_7$ to form a ring.

$R_{10}$ represents an alkyl group, a cycloalkyl group, an alkoxy group, an aryl group, an aralkyl group, an aryloxy group or an alkenyloxy group.

$R_{11}$ represents an alkyl group, a cycloalkyl group, an alkoxy group, an aryl group, an aralkyl group, an aryloxy group or an alkenyl group.

$R_{10}$ and $R_{11}$ may combine with each other to form a ring.

$R_{12}$ represents an alkyl group, a cycloalkyl group, an aryl group, an alkenyl group, an alkynyl group or a cyclic imide group.

In formulae (7) and (8), each of $R_{13}$ to $R_{16}$ and $R_{19}$ to $R_{23}$ represents a hydrogen atom or a monovalent substituent.

Each of $R_{17}$ and $R_{18}$ represents a monovalent substituent, and $R_{17}$ and $R_{18}$ may combine with each other to form a ring.

In formulae (1) to (5), (7) and (8), each of $Z_1$, $Z_1$', $Z_3$, $Z_4$, $Z_5$, $Z_7$ and $Z_8$ is independently a group represented by any one of the following formulae (Z-a) to (Z-d), and each $Z_5$ may be the same as or different from every other $Z_5$:

$Rb_1$—$SO_3$— (Z-a)

$Rb_2$—$CO_2$— (Z-b)

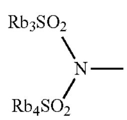

(Z-c)

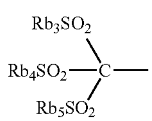

(Z-d)

In formulae (Z-a) to (Z-d), each of $Rb_1$ and $Rb_2$ independently represents an organic group.

The organic group of $Rb_1$ and $Rb_2$ is preferably an organic group having a carbon number of 1 to 30, and examples thereof include an alkyl group, a cycloalkyl group, an aryl group, and a group formed by connecting a plurality of these groups through a linking group such as single bond, —O—, —$CO_2$—, —S—, —$SO_3$— and —$SO_2N(Rc_1)$-, wherein $Rc_1$ represents a hydrogen atom or an alkyl group.

Each of $Rb_3$, $Rb_4$ and $Rb_5$ independently represents an organic group. Examples of the organic group of $Rb_3$, $Rb_4$ and $Rb_5$ are the same as those of the organic group of $Rb_1$, and a perfluoroalkyl group having a carbon number of 1 to 4 is particularly preferred.

$Rb_3$ and $Rb_4$ may combine to form a ring. The group formed by combining $Rb_3$ and $Rb_4$ includes an alkylene group and an arylene group and is preferably a perfluoroalkylene group having a carbon number of 2 to 4.

The organic group of $Rb_1$ to $Rb_5$ is preferably an alkyl group substituted with a fluorine atom or a fluoroalkyl group at the 1-position, or a phenyl group substituted with a fluorine atom or a fluoroalkyl group. By virtue of having a fluorine atom or a fluoroalkyl group, the acidity of the acid generated upon irradiation with light is increased and in turn, the sensitivity is enhanced.

Each group in formula (1) is described below.

In formula (1), the alkyl group of $R_1$, $R_2$, $R_3$, $R_4$ and $Ry_1$ is preferably an alkyl group having a carbon number of 1 to 8, and specific examples thereof include a methyl group, an ethyl group, a propyl group, an isopropyl group, a butyl group, and an octyl group.

The cycloalkyl group of $R_1$, $R_2$ and $Ry_1$ is preferably a cycloalkyl group having a carbon number of 4 to 10, and specific examples thereof include a cyclopropyl group, a cyclopentyl group, a cyclohexyl group, a cycloheptyl group, an adamantyl group, a boronyl group, an isoboronyl group, a tricyclodecanyl group, a dicyclopentenyl group, a norbornane epoxy group, a menthyl group, an isomenthyl group, a neomenthyl group, and a tetracyclododecanyl group.

The alkoxy group of $R_1$ and $Ry_1$ is preferably a linear or branched alkoxy group having a carbon number of 1 to 30, and examples thereof include a methoxy group, an ethoxy group, a propoxy group, an isopropoxy group, an n-butoxy group, an isobutoxy group, a sec-butoxy group, a tert-butoxy group, a hexyloxy group, a heptyloxy group, an octyloxy group, a nonyloxy group, a decyloxy group, an undecyloxy group, and a dodecyloxy group.

The aryl group of $R_1$, $Ry_1$ and $Ry_2$ is preferably an aryl group having a carbon number of 6 to 14, and examples thereof include a phenyl group and a naphthyl group.

The aryloxy group of $R_1$ and $Ry_2$ is preferably an aryloxy group having a carbon number of 6 to 20, and examples thereof include a phenoxy group and a naphthoxy group.

The monocyclic or polycyclic cyclic hydrocarbon structure formed by combining $R_1$ and $R_2$ is preferably a cyclic hydrocarbon structure having a carbon number of 3 to 15, and examples thereof include a cyclic hydrocarbon structure having an oxo group, such as cyclopentanone structure, cyclohexanone structure, norbornanone structure and adamantanone structure.

The alkylene group of $Ry_1$, which combines with $Ry_2$, is preferably an alkylene group having a carbon number of 1 to 5, and examples thereof include a methylene group, an ethylene group, a propylene group, and a butylene group.

Each of these groups may have a substituent. Examples of the substituent which each of these groups may have include a halogen atom, a hydroxyl group, a nitro group, a cyano group, a carboxyl group, a cycloalkyl group (preferably having a carbon number of 3 to 20), an aryl group (preferably having a carbon number of 6 to 14), an alkoxy group (preferably having a carbon number of 1 to 20), an acyl group (preferably having a carbon number of 2 to 20) and an acyloxy group (preferably having a carbon number of 2 to 20). The group having a cyclic structure, such as cycloalkyl group and aryl group, may further have an alkyl group (preferably having a carbon number of 1 to 20) as a substituent.

Formula (1) is preferably represented by the following formula (Ia) or (Ib):

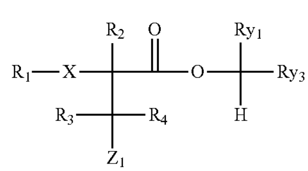

(Ia)

-continued (Ib)

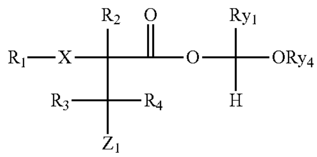

In formulae (Ia) and (Ib), $R_1$ to $R_4$, X and $Z_1$ have the same meanings as $R_1$ to $R_4$, X and $Z_1$ in formula (1).

$R_1$ and $R_2$ may combine to form a monocyclic or polycyclic cyclic hydrocarbon structure.

$Ry_1$ represents a hydrogen atom, an alkyl group, a cycloalkyl group, an alkoxy group, an aryl group, or an alkylene group combining with $Ry_3$ or $Ry_4$.

$Ry_3$ represents an aryl group.

$Ry_4$ represents an aryl group.

Examples of the aryl group of $Ry_3$ and $Ry_4$ in formulae (Ia) and (Ib) are the same as those of the aryl group of $Ry_2$.

The alkylene group of $Ry_1$, which combines with $Ry_3$ or $Ry_4$, is preferably an alkylene group having a carbon number of 1 to 5, and examples thereof include a methylene group, an ethylene group, a propylene group, and a butylene group.

Each of these groups may have a substituent. Specific examples and preferred examples of the substituent which each of these groups may have are the same as specific examples and preferred examples of the substituent which is described above as the substituent which each group in formula (1) may have.

The compound capable of decomposing by the action of an acid to generate an acid, represented by formula (1), can be synthesized as follows. First, an α-substituted acetic acid ester that is an active methylene compound is synthesized by a method of condensing an ester compound under base conditions, a method of reacting an alcohol and a diketene (described in *Synthesis,* 387-388 (1989)), or a method of reacting acetoacetate and chloromethyl ether, and after sequentially performing monoalkylation of the active methylene and hydroxymethylation of the active methylene by the method described in *J. Am. Chem. Soc.,* 120, 37-45 (1998), the hydroxymethylated product is finally reacted with sulfonic acid chloride in the presence of a base.

Specific examples of the acid-increasing agent represented by formula (1) are illustrated below, but the present invention is not limited thereto.

(I-1)

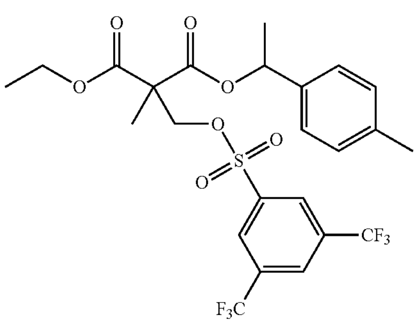

-continued (I-2)

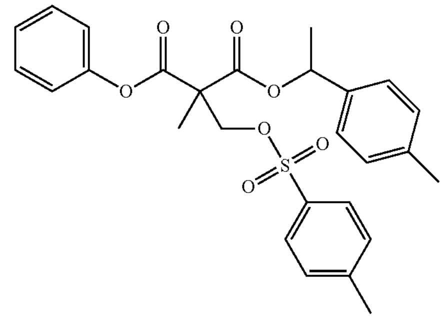

(I-3)

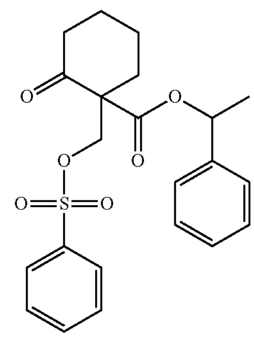

(I-4)

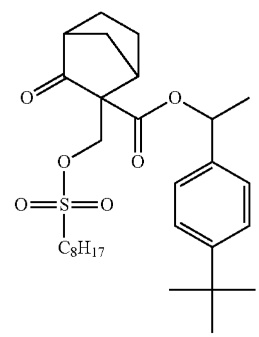

(I-5)

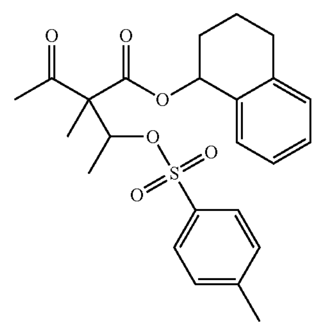

(I-6)

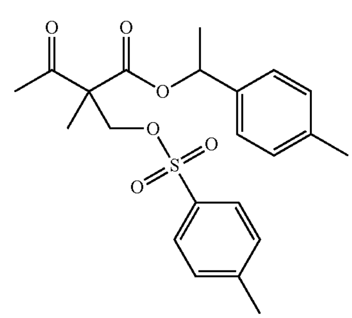

-continued
(I-7)
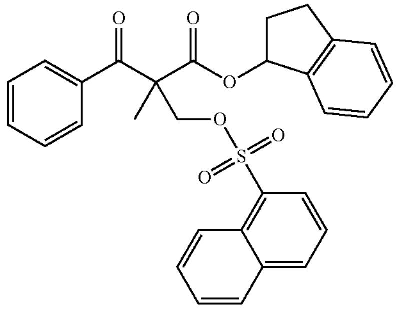
(I-8)
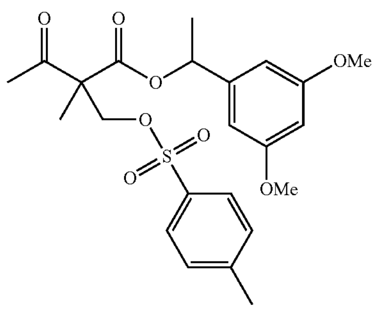
(I-9)
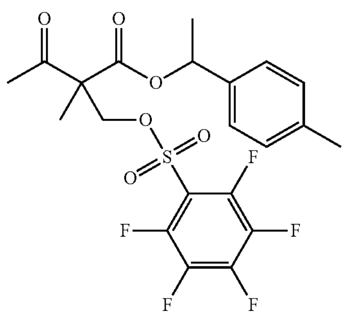
(I-10)
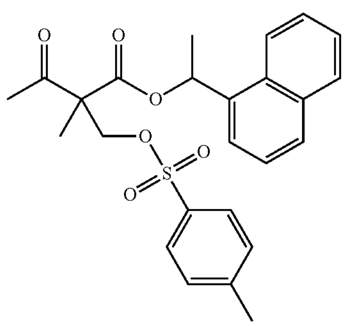
(I-11)
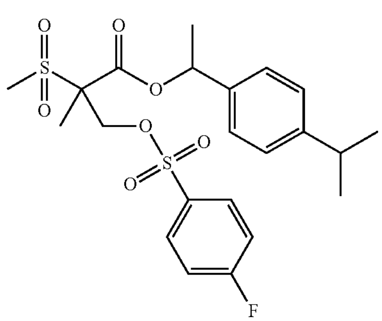
-continued
(I-12)
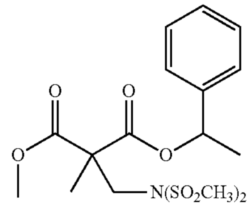
(I-13)
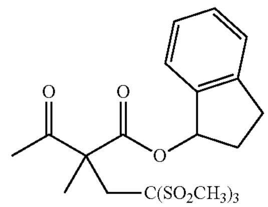
(I-14)
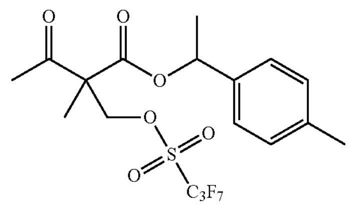
(I-15)
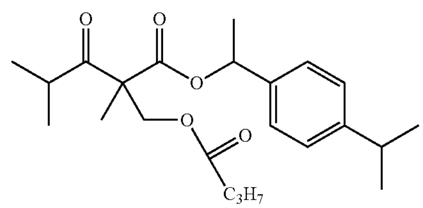
(I-16)
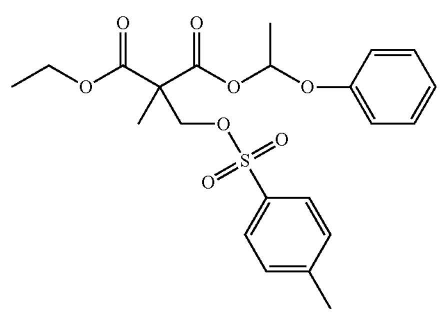
(I-17)
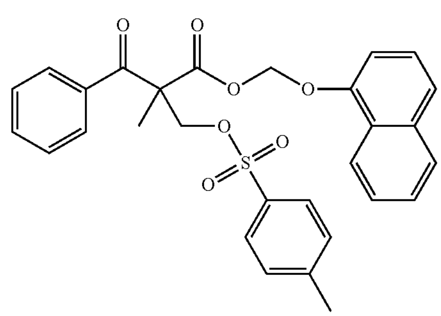

-continued
(I-18)
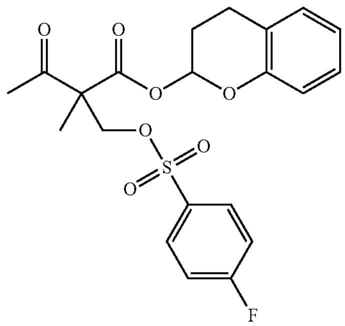
(I-19)
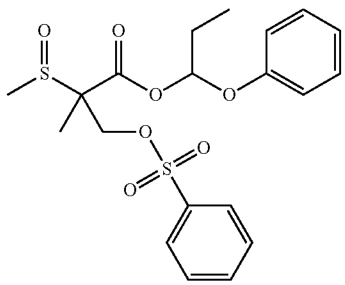
(I-20)
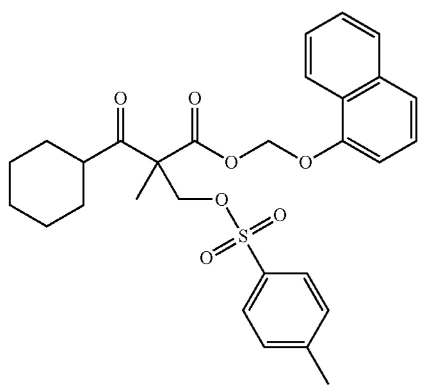
(I-21)
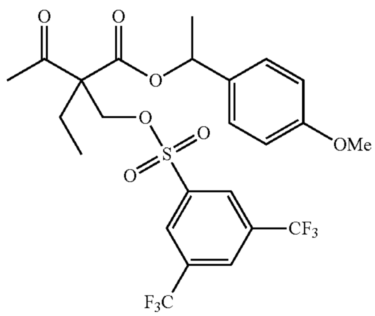
(I-22)
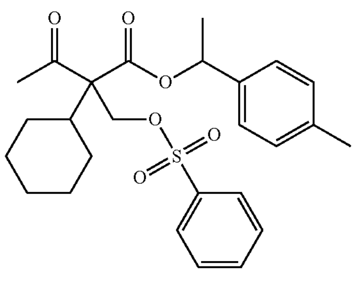
-continued
(I-23)
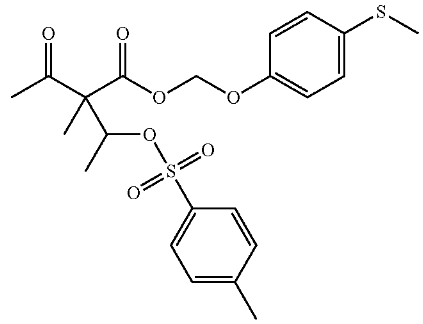
(I-24)
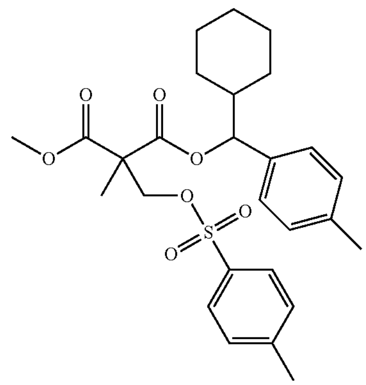
(I-25)
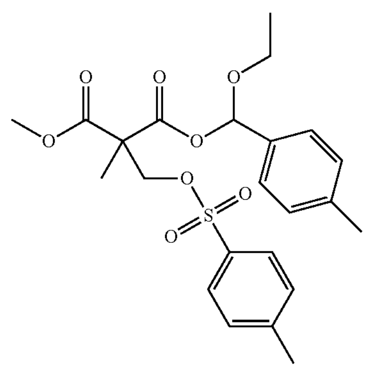
(I-26)
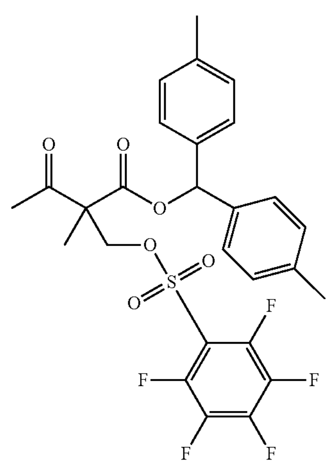
Respective groups in formula (2) are described below.
In formula (2), specific examples and preferred examples of the alkyl group of $R_1'$, $R_2'$, $R_3'$ and $R_4'$ are the same as specific examples and preferred examples of the alkyl group of $R_1$, $R_2$, $R_3$, $R_4$ and $Ry_1$ in formula (1).

Specific examples and preferred examples of the cycloalkyl group of $R_1'$ and $R_2'$ are the same as specific examples and preferred examples of the cycloalkyl group of $R_1$, $R_2$ and $Ry_1$ in formula (1).

Specific examples and preferred examples of the alkoxy group of $R_1'$ are the same as specific examples and preferred examples of the alkoxy group of $R_1$ and $Ry_1$ in formula (1).

Specific examples and preferred examples of the aryl group of $R_1'$ are the same as specific examples and preferred examples of the aryl group of $R_1$, $Ry_1$ and $Ry_2$ in formula (1).

Specific examples and preferred examples of the aryloxy group of $R_1'$ are the same as specific examples and preferred examples of the aryloxy group of $R_1$ and $Ry_2$ in formula (1).

Specific examples and preferred examples of the monocyclic or polycyclic cyclic hydrocarbon structure formed by combining $R_1'$ and $R_2'$ are the same as specific examples and preferred examples of the monocyclic or polycyclic cyclic hydrocarbon structure formed by combining $R_1$ and $R_2$ in formula (1).

Each of these groups may have a substituent. Specific examples and preferred examples of the substituent which each of these groups may have are the same as specific examples and preferred examples of the substituent described above as the substituent which each of the group in formula (1) may have.

The aryl group-free group capable of leaving by the action of an acid of $R_5'$ includes, for example, groups represented by the following formulae (pI) to (pV) and is preferably a group having a monocyclic or polycyclic alicyclic hydrocarbon structure:

(pI)

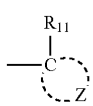

(pII)

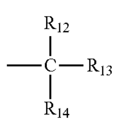

(pIII)

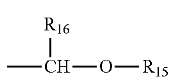

(pIV)

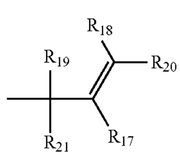

(pV)

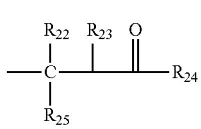

In formulae (pI) to (pV), $R_{11}$ represents an alkyl group.

Z represents an atomic group necessary for forming a cycloalkyl group together with the carbon atom.

Each of $R_{12}$ to $R_{14}$ independently represents an alkyl group or a cycloalkyl group. At least one of $R_{12}$ to $R_{14}$ is preferably a cycloalkyl group.

Each of $R_{15}$ and $R_{16}$ independently represents an alkyl group or a cycloalkyl group. At least either one of $R_{15}$ and $R_{16}$ is preferably a cycloalkyl group.

Each of $R_{17}$ to $R_{21}$ independently represents a hydrogen atom, an alkyl group or a cycloalkyl group, provided that either one of $R_{19}$ and $R_{21}$ represents an alkyl group or a cycloalkyl group. At least one of $R_{17}$ to $R_{21}$ is preferably a cycloalkyl group.

Each of $R_{22}$ to $R_{25}$ independently represents a hydrogen atom, an alkyl group or a cycloalkyl group. $R_{23}$ and $R_{24}$ may combine with each other to form a ring. At least one of $R_{22}$ to $R_{25}$ is preferably a cycloalkyl group.

In formulae (pI) to (pV), the alkyl group of $R_{11}$ to $R_{25}$ is preferably a linear or branched alkyl group having a carbon number of 1 to 4, and examples thereof include a methyl group, an ethyl group, an n-propyl group, an isopropyl group, an n-butyl group, an isobutyl group, and a sec-butyl group.

The cycloalkyl group of $R_{12}$ to $R_{25}$ and the cycloalkyl group formed by Z together with the carbon atom may be monocyclic or polycyclic. Specific examples thereof include a group having a monocyclo, bicyclo, tricyclo or tetracyclo structure with a carbon number of 5 or more. The carbon number thereof is preferably from 6 to 30, more preferably from 7 to 25.

Preferred cycloalkyl groups include an adamantyl group, a noradamantyl group, a decalin residue, a tricyclodecanyl group, a tetracyclododecanyl group, a norbornyl group, a cedrol group, a cyclopentyl group, a cyclohexyl group, a cycloheptyl group, a cyclooctyl group, a cyclodecanyl group, and a cyclododecanyl group. An adamantyl group, a norbornyl group, a cyclohexyl group, a cyclopentyl group, a tetracyclododecanyl group and a tricyclodecanyl group are more preferred.

These alkyl and cycloalkyl groups may further have a substituent. The further substituent on these alkyl and cycloalkyl groups includes an alkyl group (having a carbon number of 1 to 4), a halogen atom, a hydroxyl group, an alkoxy group (having a carbon number of 1 to 4), a carboxyl group, and an alkoxycarbonyl group (having a carbon number of 2 to 6). The substituent which may be further substituted on the above-described alkyl group, alkoxy group, alkoxycarbonyl group and the like includes a hydroxyl group, a halogen atom, and an alkoxy group.

Formula (2) is preferably the following formula (IIa) or (IIb):

(IIa)

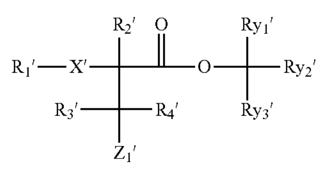

(IIb)

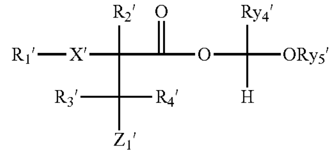

In formulae (IIa) and (IIb), $R_1'$ to $R_4'$, X' and $Z_1'$ have the same meanings as $R_1'$ to $R_4'$, X' and $Z_1'$ in formula (II).

$R_1'$ and $R_2'$ may combine to form a monocyclic or polycyclic cyclic hydrocarbon structure.

Each of $Ry_1'$ to $Ry_3'$ independently represents an alkyl group or a cycloalkyl group. At least two members out of $Ry_1'$ to $Ry_3'$ may combine to form a monocyclic or polycyclic cyclic hydrocarbon structure, provided that at least one of $Ry_1'$ to $Ry_3'$ represents a cycloalkyl group or at least two of $Ry_1'$ to $Ry_3'$ combine to form a monocyclic or polycyclic cyclic hydrocarbon structure.

$Ry_4'$ represents a hydrogen atom, an alkyl group or a cycloalkyl group.

$Ry_5'$ represents a cycloalkyl group.

$Ry_4'$ and $Ry_5'$ may combine to form a monocyclic or polycyclic cyclic hydrocarbon structure.

The alkyl group of $Ry_1'$ to $Ry_4'$ may be either a linear alkyl group or a branched alkyl group and may have a substituent. The linear or branched alkyl group is preferably an alkyl group having a carbon number of 1 to 8, more preferably from 1 to 4, and examples thereof include a methyl group, an ethyl group, a propyl group, an isopropyl group, a butyl group, an isobutyl group, and a tert-butyl group, with a methyl group and an ethyl group being preferred.

The cycloalkyl group of $Ry_1'$ to $Ry_5'$ includes, for example, a monocyclic cycloalkyl group having a carbon number of 3 to 8 and a polycyclic cycloalkyl group having a carbon number of 7 to 14 and may have a substituent. Preferred monocyclic cycloalkyl groups include a cyclopentyl group, a cyclohexyl group and a cyclopropyl group, and preferred polycyclic cycloalkyl groups include an adamantyl group, a norbornane group, a tetracyclododecanyl group, a tricyclodecanyl group and a diamantyl group.

The monocyclic cyclic hydrocarbon structure formed by combining at least two members out of $Ry_1'$ to $Ry_3'$ is preferably a cyclopentane structure or a cyclohexane structure. The polycyclic cyclic hydrocarbon structure formed by combining at least two members out of $Ry_1$ to $Ry_3$ is preferably an adamantane structure, a norbornane structure or a tetracyclododecane structure.

Examples of the monocyclic or polycyclic cyclic hydrocarbon structure formed by combining $Ry_4'$ and $Ry_5'$ include a tetramethylene oxide ring structure, a pentamethylene oxide ring structure, and a hexamethylene oxide ring structure.

Each of these groups may have a substituent. Specific examples and preferred examples of the substituent which each of these groups may have are the same as specific examples and preferred examples of the substituent described above as the substituent which each of groups in formula (1) may have.

The compound capable of decomposing by the action of an acid to generate an acid, represented by formula (2), can be synthesized as follows. First, an α-substituted acetic acid ester that is an active methylene compound is synthesized by a method of condensing an ester compound under base conditions, a method of reacting an alcohol and diketene (described in *Synthesis,* 387-388 (1989)), or a method of reacting acetoacetate and chloromethyl ether, and after sequentially performing monoalkylation of the active methylene and hydroxymethylation of the active methylene by the method described in *J. Am. Chem. Soc.,* 120, 37-45 (1998), the hydroxymethylated product is finally reacted with sulfonic acid chloride in the presence of a base.

Specific examples of the acid-increasing agent represented by formula (2) are illustrated below, but the present invention is not limited thereto.

(II-1)

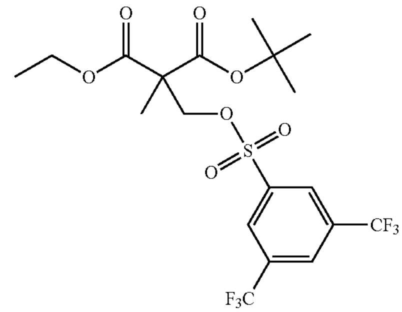

(II-2)

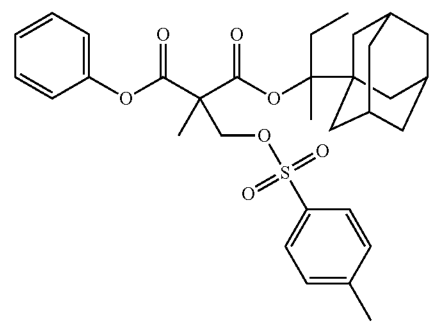

(II-3)

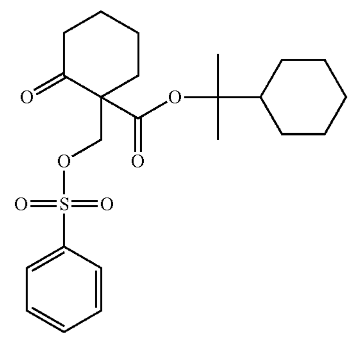

(II-4)

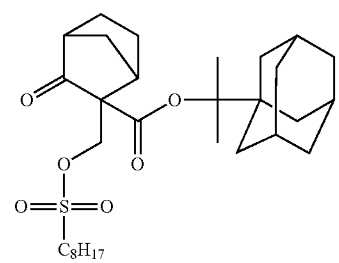

(II-5)

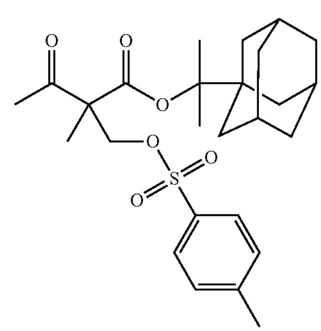

-continued
(II-6)
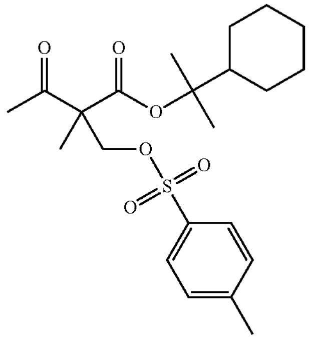
(I-7)
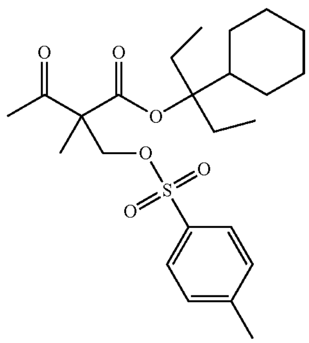
(II-8)
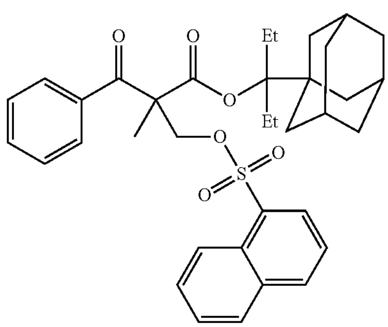
(II-9)
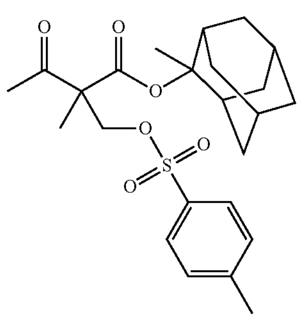
(II-10)
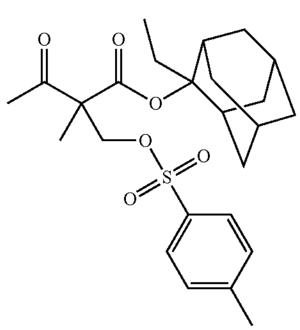
-continued
(II-11)
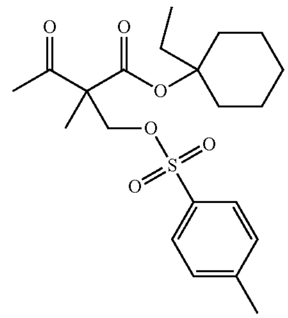
(II-12)
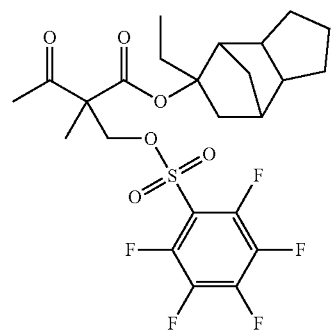
(II-13)
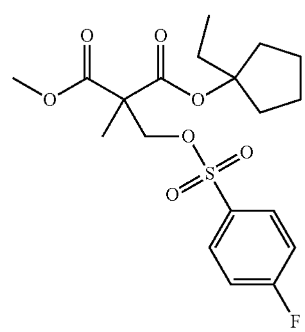
(II-14)
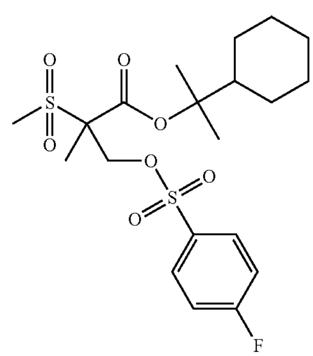

-continued
(II-15)
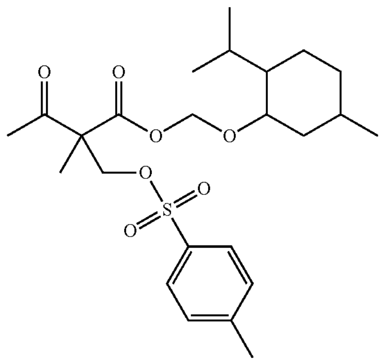
(II-16)
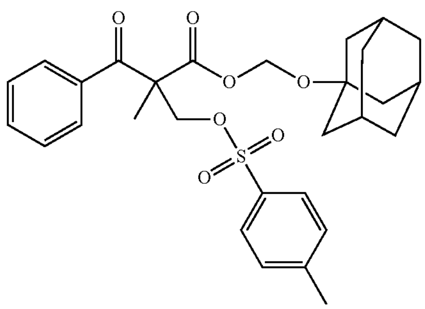
(II-17)
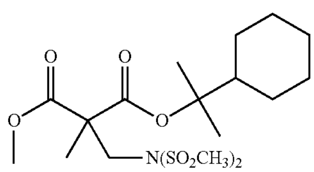
(II-18)
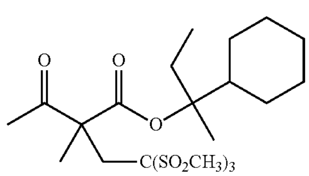
(II-19)
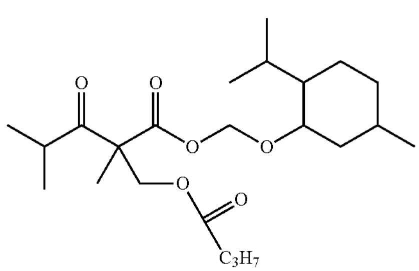
(II-20)
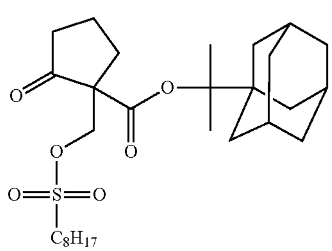
-continued
(II-21)
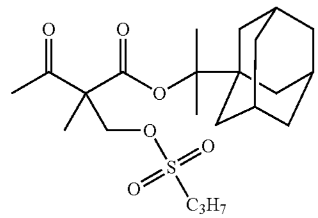
(II-22)
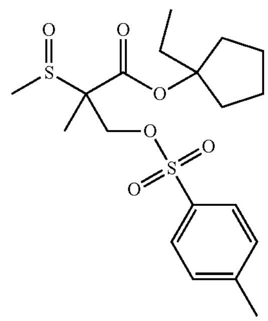
(II-23)
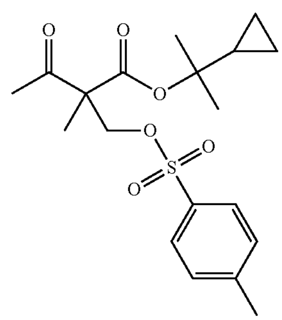
(II-23)
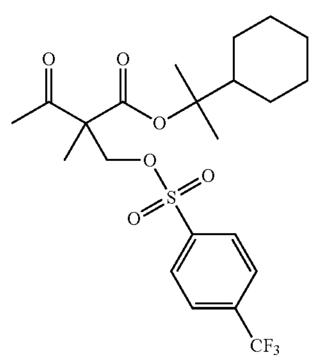
(II-24)
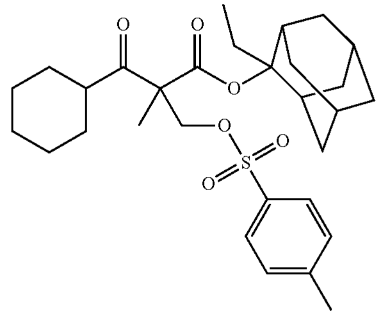

-continued
(II-25)
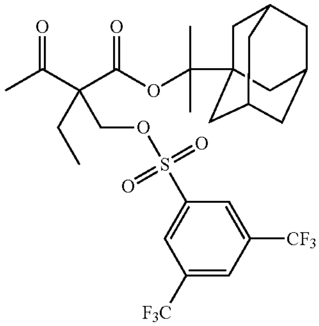
(II-26)
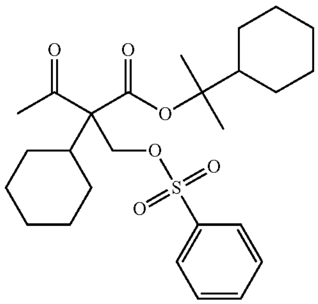
(II-27)
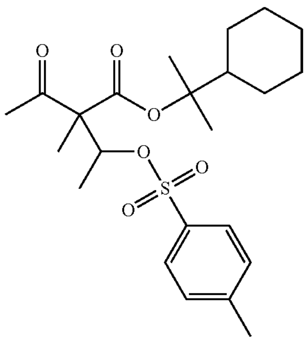
(II-28)
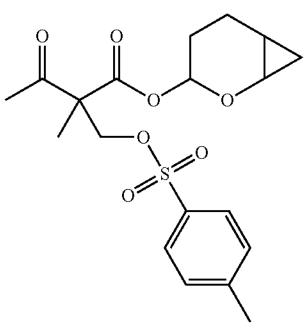
(II-29)
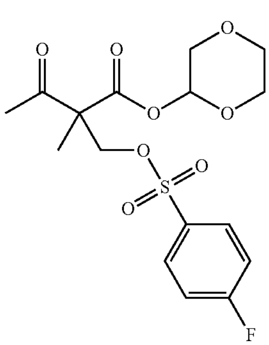
-continued
(II-30)
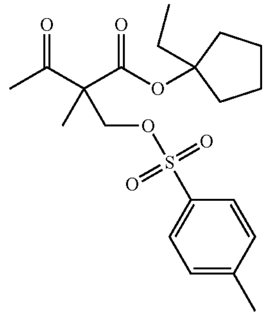
(II-31)
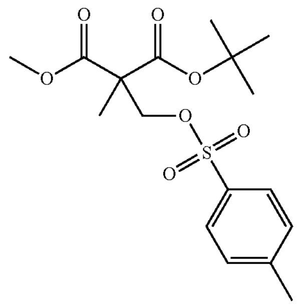
(II-32)
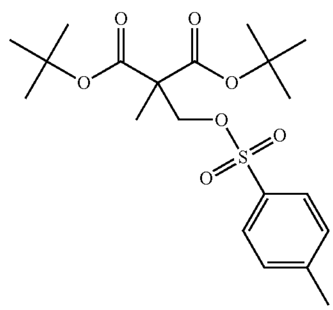
(II-33)
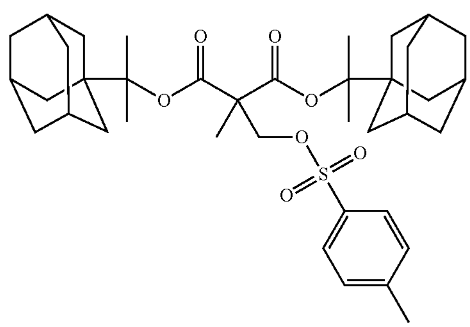
(II-34)
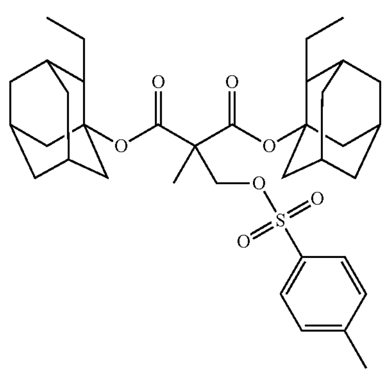

-continued
(II-35)
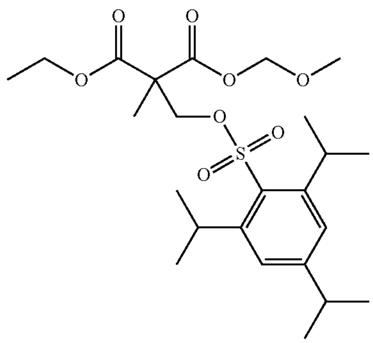
(II-36)
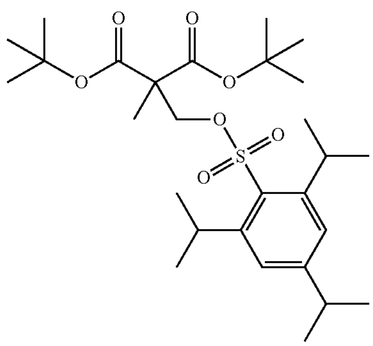
(II-37)
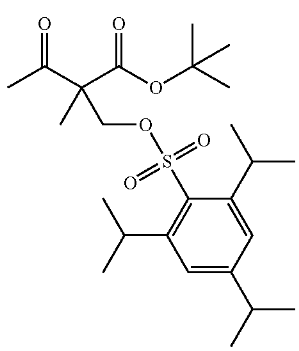
(II-38)
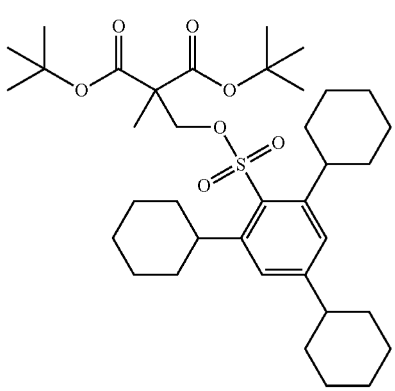
-continued
(II-39)
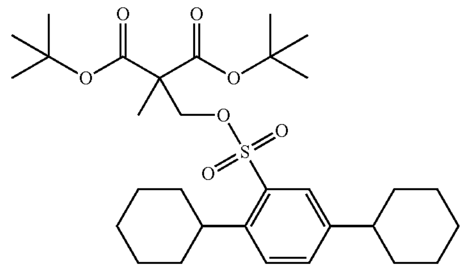
(II-40)
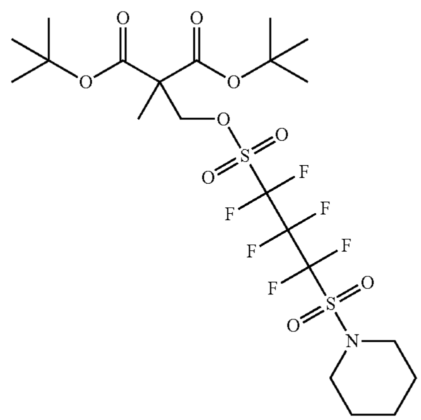
(II-41)
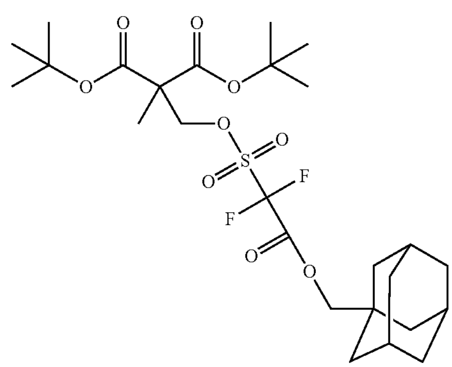
(II-42)
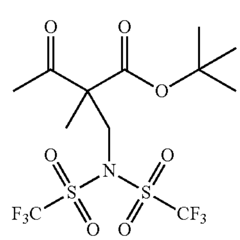
The compounds represented by the following formulae (3) to (6) are described below.
Formula (3)
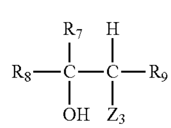

-continued

Formula (4)

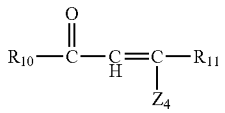

Formula (5)

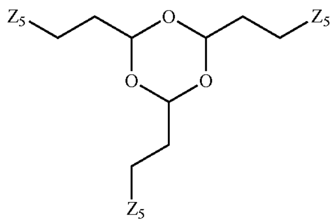

Formula (6)

$$Rb—SO_2—O—R_{12}$$

In formulae (3) to (6), $Z_3$, $Z_4$ and $Z_5$ are as described above.

Rb represents an alkyl group, a cycloalkyl group, an aryl group or an aralkyl group.

$R_7$ represents a hydrogen atom, an alkyl group, a cycloalkyl group, an aryl group or an aralkyl group.

$R_8$ represents an alkyl group, a cycloalkyl group, an aryl group or an aralkyl group.

$R_9$ represents a hydrogen atom, an alkyl group, a cycloalkyl group, an aryl group or an aralkyl group.

$R_9$ may combine with $R_7$ to form a ring.

$R_{10}$ represents an alkyl group, a cycloalkyl group, an alkoxy group, an aryl group, an aralkyl group, an aryloxy group or an alkenyloxy group.

$R_{11}$ represents an alkyl group, a cycloalkyl group, an alkoxy group, an aryl group, an aralkyl group, an aryloxy group or an alkenyl group.

$R_{10}$ and $R_{11}$ may combine with each other to form a ring.

$R_{12}$ represents an alkyl group, a cycloalkyl group, an aryl group, an alkenyl group, an alkynyl group or a cyclic imide group.

In formulae (3) to (6), the alkyl group includes an alkyl group having a carbon number of 1 to 8, and specific examples thereof include a methyl group, an ethyl group, a propyl group, an isopropyl group, a butyl group, and an octyl group.

The cycloalkyl group includes a cycloalkyl group having a carbon number of 4 to 10, and specific examples thereof include a cyclopropyl group, a cyclopentyl group, a cyclohexyl group, a cycloheptyl group, an adamantyl group, a boronyl group, an isoboronyl group, a tricyclodecanyl group, a dicyclopentenyl group, a norbornane epoxy group, a menthyl group, an isomenthyl group, a neomenthyl group, and a tetracyclododecanyl group.

The aryl group includes an aryl group having a carbon number of 6 to 14, and examples thereof include a phenyl group, a naphthyl group, and a tolyl group.

The aralkyl group includes an aralkyl group having a carbon number of 7 to 20, and specific examples thereof include a benzyl group, a phenethyl group and a naphthylethyl group.

The alkoxy group includes an alkoxy group having a carbon number of 1 to 8, and specific examples thereof include a methoxy group, an ethoxy group, a propoxy group, and a butoxy group.

The alkenyl group includes an alkenyl group having a carbon number of 2 to 6, and specific examples thereof include a vinyl group, a propenyl group, an allyl group, a butenyl group, a pentenyl group, a hexenyl group, and a cyclohexenyl group.

The aryloxy group includes an aryloxy group having a carbon number of 6 to 14, and specific examples thereof include a phenoxy group and a naphthoxy group.

The alkenyloxy group includes an alkenyloxy group having a carbon number of 2 to 8, and specific examples thereof include a vinyloxy group and an allyloxy group.

Each of the above-described substituents may further have a substituent, and examples of the substituent include a halogen atom such as Cl, Br and F, a —CN group, an —OH group, an alkyl group having a carbon number of 1 to 4, a cycloalkyl group having a carbon number of 3 to 8, an alkoxy group having a carbon number of 1 to 4, an acylamino group such as acetylamino group, an aralkyl group such as benzyl group and phenethyl group, an aryloxyalkyl group such as phenoxyethyl group, an alkoxycarbonyl group having a carbon number of 2 to 5, and an acyloxy group having a carbon number of 2 to 5, but the range of the substituent is not limited thereto.

Examples of the ring formed by combining $R_4$ and $R_5$ with each other include a 1,3-dioxolane ring and a 1,3-dioxane ring.

Examples of the ring formed by combining $R_7$ and $R_9$ with each other include a cyclopentyl ring and a cyclohexyl ring.

Examples of the ring formed by combining $R_{10}$ and $R_{11}$ with each other include a 3-oxocyclohexenyl ring and a 3-oxoindenyl ring, which each may contain an oxygen atom in the ring.

Examples of the group capable of leaving by the action of an acid of $R_0$ include a tertiary alkyl group such as tert-butyl group and tert-amyl group, an isoboronyl group, a 1-alkoxyethyl group such as 1-ethoxyethyl group, 1-butoxyethyl group, 1-isobutoxyethyl group and 1-cyclohexyloxyethyl group, an alkoxymethyl group such as 1-methoxymethyl group and 1-ethoxymethyl group, a tetrahydropyranyl group, a tetrahydropyranyl group, a trialkylsilyl group, and a 3-oxocyclohexyl group.

Preferred examples of the groups Rb and $R_7$ to $R_{11}$ are as follows:

Rb: a methyl group, an ethyl group, a propyl group, a butyl group, an octyl group, a trifluoromethyl group, a nonafluorobutyl group, a heptadecafluorooctyl group, a 2,2,2-trifluoroethyl group, a phenyl group, a pentafluorophenyl group, a methoxyphenyl group, a toluoyl group, a mesityl group, a fluorophenyl group, a naphthyl group, a cyclohexyl group or a camphor group;

$R_7$, $R_9$: a hydrogen atom, a methyl group, an ethyl group, a propyl group, a butyl group, a pentyl group, a cyclopropyl group, a cyclopentyl group, a cyclohexyl group, a phenyl group, a naphthyl group, a benzyl group, a phenethyl group, or groups forming a cyclopentyl ring or a cyclohexyl ring by combining with each other;

$R_8$: a methyl group, an ethyl group, an isopropyl group, a tert-butyl group, a neopentyl group, a cyclohexyl group, a phenyl group or a benzyl group;

$R_{10}$: a methyl group, an ethyl group, a propyl group, an isopropyl group, a butyl group, an isobutyl group, a cyclopropyl group, a cyclopentyl group, a cyclohexyl group, a methoxy group, an ethoxy group, a phenyl group, a naphthyl group, a benzyl group, a phenoxy group, a naphthoxy group, a vinyloxy group, a methylvinyloxy group, or groups forming a 3-oxocyclohexenyl ring or a 3-oxoindenyl ring, which may contain an oxygen atom, by combining with each other; and $R_{11}$: a methyl group, an ethyl group, a propyl group, an isopropyl group, a butyl group, an isobutyl group, a cyclopropyl group, a cyclopentyl group, a cyclohexyl group, a methoxy group, an ethoxy group, a phenyl group, a naphthyl group, a benzyl group, a phenoxy group, a naphthoxy group, a vinyl group, an allyl group, or groups forming a 3-oxocyclohexenyl ring or a 3-oxoindenyl ring, which may contain an oxygen atom, by combining with each other.

In formula (6), when $R_{12}$ represents an alkyl group, the alkyl group includes a linear or branched alkyl group having a carbon number of 1 to 20, and specific examples thereof include a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eicosyl group, an isopropyl group, an isobutyl group, an s-butyl group, a tert-butyl group, an isopentyl group, a neopentyl group, a 1-methylbutyl group, an isohexyl group, a 2-ethylhexyl group, and a 2-methylhexyl group. Among these, a linear alkyl group having a carbon number of 1 to 12, and a branched alkyl group having a carbon number of 3 to 12 are preferred.

When $R_{12}$ represents a cycloalkyl group, the cycloalkyl group includes a cycloalkyl group having a carbon number of 3 to 20, and specific examples thereof include a cyclohexyl group, a cyclopentyl group, and a 2-norbornyl group. Among these, a cycloalkyl group having a carbon number of 5 to 10 is preferred.

When $R_{12}$ represents a substituted alkyl group or a substituted cycloalkyl group, the substituent is a monovalent nonmetallic atom group excluding hydrogen, and preferred examples thereof include a halogen atom (e.g., —F, —Br, —Cl, —I), a hydroxyl group, an alkoxy group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo group (—$SO_3H$) and a conjugate base group thereof (hereinafter referred to as a "sulfonato group"), an alkoxysulfonyl group, an aryloxysulfonyl group, a sulfinamoyl group, an N-alkylsulfinamoyl group, an N,N-dialkylsulfinamoyl group, an N-arylsulfinamoyl group, an N,N-diarylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, a phosphono group (—$PO_3H_2$) and a conjugate base group thereof (hereinafter, referred to as "phosphonato group"), a dialkylphosphono group (—$PO_3$(alkyl)$_2$), a diarylphosphono group (—$PO_3$(aryl)$_2$), an alkylarylphosphono group (—$PO_3$(alkyl)(aryl)), a monoalkylphosphono group (—$PO_3$H(alkyl)) and a conjugate base group thereof (hereinafter, referred to as "alkylphosphonato group"), a monoarylphosphono group (—$PO_3$H(aryl)) and a conjugate base group thereof (hereinafter, referred to as "arylphosphonato group"), a phosphonoxy group (—$OPO_3H_2$) and a conjugate base group thereof (hereinafter, referred to as "phosphonatoxy group"), a dialkylphosphonoxy group (—$OPO_3$(alkyl)$_2$), a diarylphosphonoxy group (—$OPO_3$(aryl)$_2$), an alkylarylphosphonoxy group (—$OPO_3$(alkyl)(aryl)), a monoalkylphosphonoxy group (—$OPO_3$H(alkyl)) and a conjugate base group thereof (hereinafter, referred to as "alkylphosphonatoxy group"), a monoarylphosphonoxy group (—$OPO_3$H(aryl)) and a conjugate base group thereof (hereinafter, referred to as "arylphosphonatoxy group"), a cyano group, a nitro group, an aryl group, an alkenyl group, and an alkynyl group.

In these substituents, specific examples of the alkyl group include the above-described alkyl groups, and specific examples of the aryl group include a phenyl group, a biphenyl group, a naphthyl group, a tolyl group, a xylyl group, a mesityl group, a cumenyl group, a chlorophenyl group, a bromophenyl group, a chloromethylphenyl group, a hydroxyphenyl group, a methoxyphenyl group, an ethoxyphenyl group, a phenoxyphenyl group, an acetoxyphenyl group, a benzoyloxyphenyl group, a methylthiophenyl group, a phenylthiophenyl group, a methylaminophenyl group, a dimethylaminophenyl group, an acetylaminophenyl group, a carboxyphenyl group, a methoxycarbonylphenyl group, an ethoxyphenylcarbonyl group, a phenoxycarbonylphenyl group, an N-phenylcarbamoylphenyl group, a phenyl group, a cyanophenyl group, a sulfophenyl group, a sulfonatophenyl group, a phosphonophenyl group, and a phosphonatophenyl group. Examples of the alkenyl group include a vinyl group, a 1-propenyl group, a 1-butenyl group, a cinnamyl group, and a 2-chloro-1-ethenyl group, and examples of the alkynyl group include an ethynyl group, a 1-propynyl group, a 1-butynyl group, and a trimethylsilylethynyl group. $R_{13}$ in the acyl group ($R_{13}$CO—) is hydrogen or the above-described alkyl, cycloalkyl or aryl group.

Among these substituents, more preferred are a halogen atom (e.g., —F, —Br, —I), an alkoxy group, an aryloxy group, an alkylthio group, an arylthio group, an N-alkylamino group, an N,N-dialkylamino group, an acyloxy group, an N-alkylcarbamoyloxy group, an N-arylcarbamoyloxy group, an acylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N-alkyl-N-arylcarbamoyl group, a sulfo group, a sulfonato group, a sulfamoyl group, an N-alkylsulfamoyl group, an N,N-dialkylsulfamoyl group, an N-arylsulfamoyl group, an N-alkyl-N-arylsulfamoyl group, a phosphono group, a phosphonato group, a dialkylphosphono group, a diarylphosphono group, a monoalkylphosphono group, an alkylphosphonato group, a monoarylphosphono group, an arylphosphonato group, a phosphonoxy group, a phosphonatoxy group, an aryl group, and an alkenyl group.

The alkylene group in the substituted alkyl group includes a divalent organic residue structure formed by removing any one hydrogen atom on the above-described alkyl group having a carbon number of 1 to 20, and a linear alkylene group having a carbon number of 1 to 12, a branched alkylene group having a carbon number of 3 to 12 and a cyclic alkylene group having a carbon number of 5 to 10 are preferred. Specific preferred examples of the substituted alkyl group obtained by combining the above-described substituent and an alkylene group include a chloromethyl group, a bromomethyl group, a 2-chloroethyl group, a trifluoromethyl group, a methoxymethyl group, a methoxyethoxyethyl group, an allyloxymethyl group, a phenoxymethyl group, a methylthiomethyl group, a tolylthiomethyl group, an ethylaminoethyl group, a diethylaminopropyl group, a morpholinopropyl group, an acetyloxymethyl group, a benzoyloxymethyl group, an N-cyclohexylcarbamoyloxyethyl group, an N-phenylcarbamoyloxyethyl group, an acetylaminoethyl group, an N-methylbenzoylaminopropyl group, a 2-oxoethyl group, a 2-oxopropyl group, a carboxypropyl group, a methoxycarbonylethyl group, an allyloxycarbonylbutyl group, a chlorophenoxycarbonylmethyl group, a carbamoylmethyl group, an N-methylcarbamoylethyl group, an N,N-dipropylcarbamoylmethyl group, an N-(methoxyphenyl)carbamoylethyl group, an N-methyl-N-(sulfophenyl)carbamoylmethyl group, a sulfobutyl group, a sulfonatobutyl group, a sulfamoylbutyl group, an N-ethylsulfamoylmethyl group, an N,N-dipropylsulfamoylpropyl group, an N-tolylsulfamoylpropyl group, an N-methyl-N-(phosphonophenyl)sulfamoyloctyl group, a phosphonobutyl group, a phosphonatohexyl group, a diethylphosphonobutyl group, a diphenylphosphonopropyl group, a methylphosphonobutyl group, a methylphosphonatobutyl group, a tolylphosphonohexyl group, a tolylphosphonatohexyl group, a phosphonoxypropyl group, a phosphonatoxybutyl group, a benzyl group, a phenethyl group, an $\alpha$-methylbenzyl group, a 1-methyl-1-phenylethyl group, a p-methylbenzyl group, a cinnamyl group, an allyl group, a 1-propenylmethyl group, a 2-butenyl group, a 2-methylallyl group, a 2-methylpropenylmethyl group, a 2-propynyl group, a 2-butynyl group, and a 3-butynyl group.

When $R_{12}$ represents an aryl group, the aryl group includes a condensed ring formed by fusing 1 to 3 benzene rings, and a condensed ring formed by fusing a benzene ring and a 5-membered unsaturated ring, and specific examples thereof include a phenyl group, a naphthyl group, an anthryl group, a phenanthryl group, an indenyl group, an acenaphthenyl group, and a fluorenyl group. Among these, a phenyl group and a naphthyl group are preferred. Other than the above-described carbocyclic aryl group, the aryl group includes a heterocyclic (hetero) aryl group. As the heterocyclic aryl group, those containing from 3 to 20 carbon atoms and from 1 to 5 heteroatoms, such as pyridyl group, furyl group, quinolyl group fused with another benzene ring, benzofuryl group, thioxanthone group and carbazole group, are used.

When $R_{12}$ represents a substituted aryl group, an aryl group having a monovalent nonmetallic atom group (excluding hydrogen) as a substituent on the ring-forming carbon atom of the above-described aryl group is used as the substituted aryl group. Preferred examples of the substituent include those described above as the substituent on the alkyl and cycloalkyl groups.

Specific preferred examples of the substituted aryl group include a biphenyl group, a tolyl group, a xylyl group, a mesityl group, a cumenyl group, a chlorophenyl group, a bromophenyl group, a fluorophenyl group, a chloromethylphenyl group, a trifluoromethylphenyl group, a hydroxyphenyl group, a methoxyphenyl group, a methoxyethoxyphenyl group, an allyloxyphenyl group, a phenoxyphenyl group, a methylthiophenyl group, a tolylthiophenyl group, an ethylaminophenyl group, a diethylaminophenyl group, a morpholinophenyl group, an acetyloxyphenyl group, a benzoyloxyphenyl group, an N-cyclohexylcarbamoyloxyphenyl group, an N-phenylcarbamoyloxyphenyl group, an acetylaminophenyl group, an N-methylbenzoylaminophenyl group, a carboxyphenyl group, a methoxycarbonylphenyl group, an allyloxycarbonylphenyl group, a chlorophenoxycarbonylphenyl group, a carbamoylphenyl group, an N-methylcarbamoylphenyl group, an N,N-dipropylcarbamoylphenyl group, an N-(methoxyphenyl)carbamoylphenyl group, an N-methyl-N-(sulfophenyl)carbamoylphenyl group, a sulfophenyl group, a sulfonatophenyl group, a sulfamoylphenyl group, an N-ethylsulfamoylphenyl group, an N,N-dipropylsulfamoylphenyl group, an N-tolylsulfamoylphenyl group, an N-methyl-N-(phosphonophenyl)sulfamoylphenyl group, a phosphonophenyl group, a phosphonatophenyl group, a diethylphosphonophenyl group, a diphenylphosphonophenyl group, a methylphosphonophenyl group, a methylphosphonatophenyl group, a tolylphosphonophenyl group, a tolylphosphonatophenyl group, an allyl group, a 1-propenylmethyl group, a 2-butenyl group, a 2-methylallylphenyl group, a 2-methylpropenylphenyl group, a 2-propenylphenyl group, a 2-butynylphenyl group, and a 3-butynylphenyl group.

When $R_{12}$ represents an alkenyl group, a substituted alkenyl group [$—C(R_{14})=C(R_{15})(R_{16})$], an alkynyl group or a substituted alkynyl group [$—C\equiv C(R_{17})$], each of $R_{14}$ to $R_{17}$ may be a monovalent nonmetallic atom group. Preferred examples of $R_{14}$ to $R_{17}$ include a hydrogen atom, a halogen atom, an alkyl group, a substituted alkyl group, an aryl group, and a substituted aryl group. Specific examples of these groups include those described above as examples. The substituents $R_{14}$ to $R_{17}$ are more preferably a hydrogen atom, a halogen atom, or a linear, branched or cyclic alkyl group having a carbon number of 1 to 10. Specific examples of the alkenyl group, substituted alkenyl group, alkynyl group and substituted alkynyl group include a vinyl group, a 1-butenyl group, a 1-pentenyl group, a 1-hexenyl group, a 1-octenyl group, a 1-methyl-1-propenyl group, a 2-methyl-1-propenyl group, a 2-methyl-1-butenyl group, a 2-phenyl-1-ethenyl group, a 2-chloro-1-ethenyl group, an ethynyl group, a propynyl group, and a phenylethyl group.

When $R_{12}$ represents a cyclic imide group, a cyclic imide having a carbon number of 4 to 20, such as succinic acid imide, phthalic acid imide, cyclohexanedicarboxylic acid imide and norbornenedicarboxylic acid imide, may be used as the cyclic imide.

Specific examples of the compounds represented by formulae (3) to (6) are illustrated below, but the contents of the present invention are not limited thereto.

(3-1)

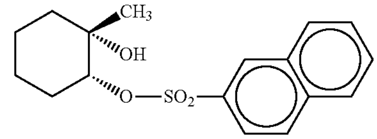

-continued
(3-2)
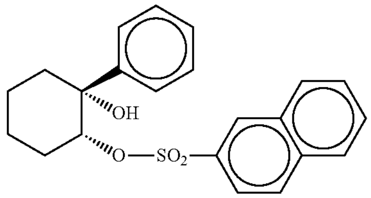
(3-3)
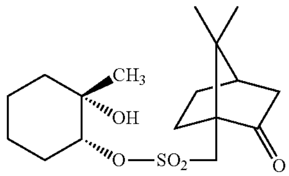
(3-4)
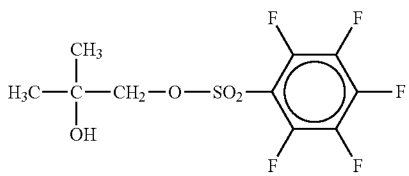
(3-5)
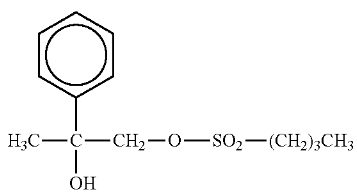
(3-6)
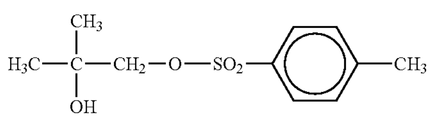
(3-7)
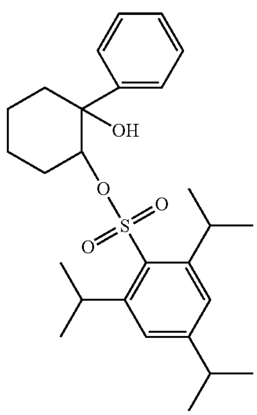
(3-8)
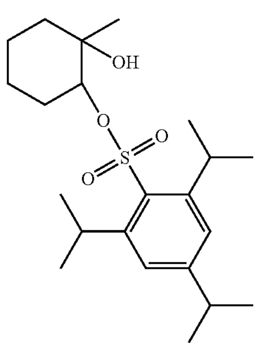
-continued
(3-9)
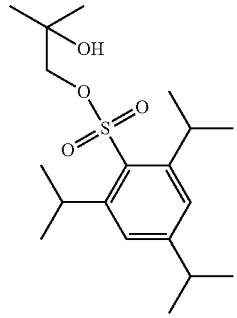
(3-10)
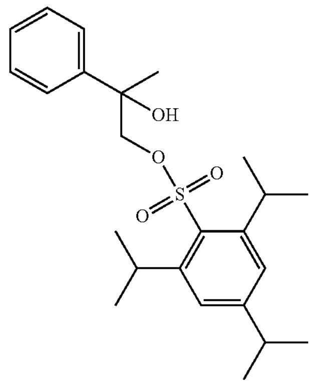
(3-11)
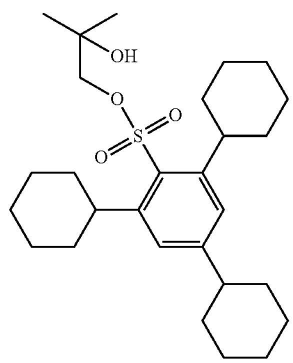
(3-12)
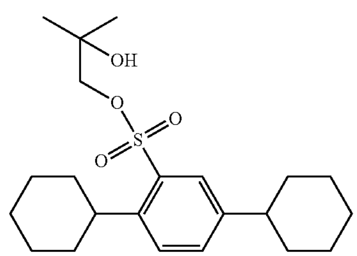

-continued
(3-13)
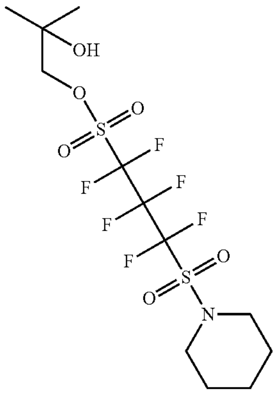
(3-14)
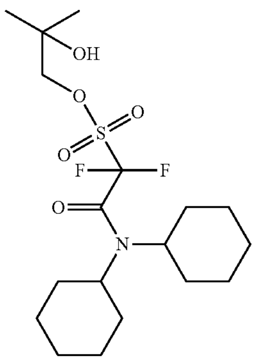
(3-15)
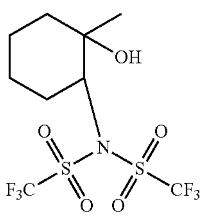
(4-1)
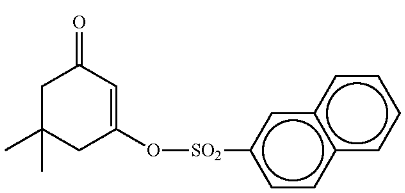
(4-2)
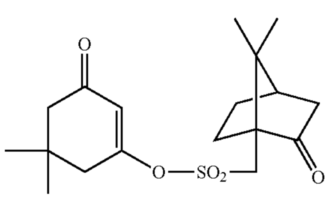
(4-3)
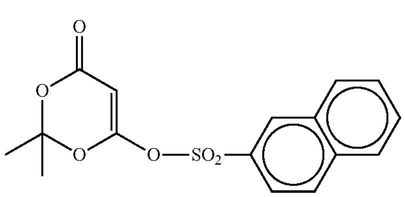
-continued
(4-4)
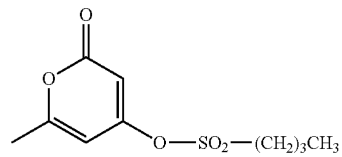
(4-5)
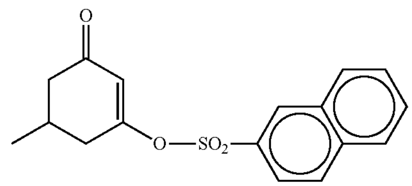
(4-6)
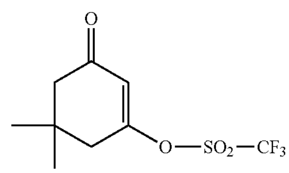
(4-7)
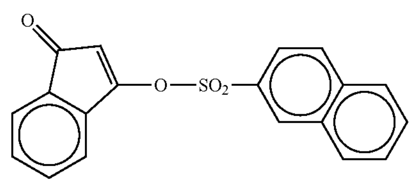
(4-8)
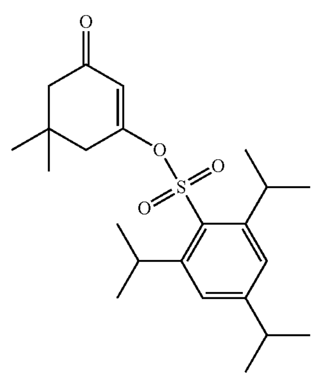
(4-9)
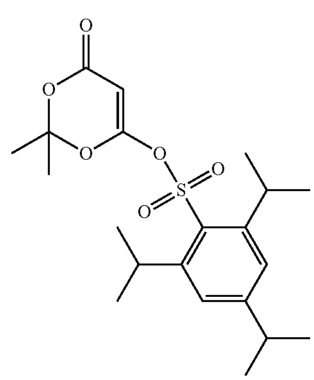

-continued
(4-10)
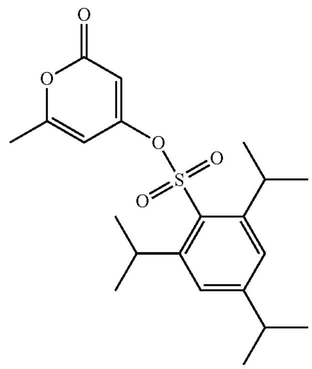
(4-11)
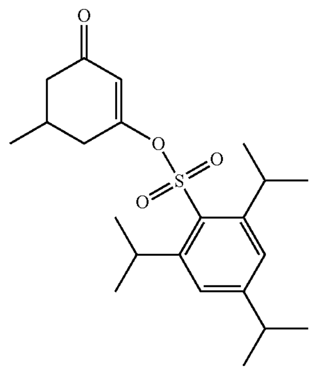
(4-12)
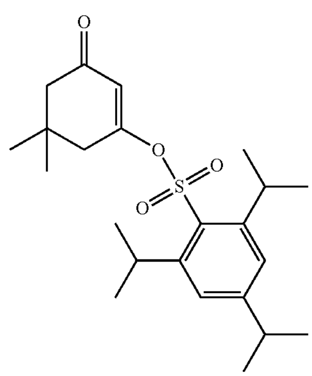
(4-13)
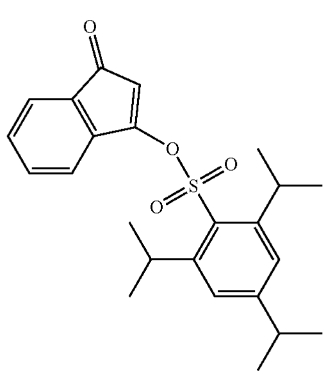
-continued
(4-14)
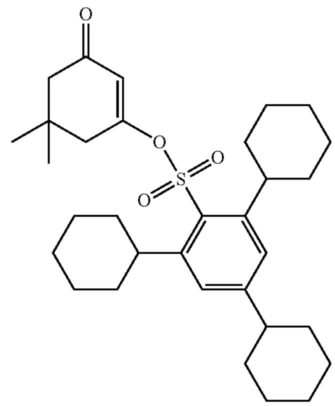
(4-15)
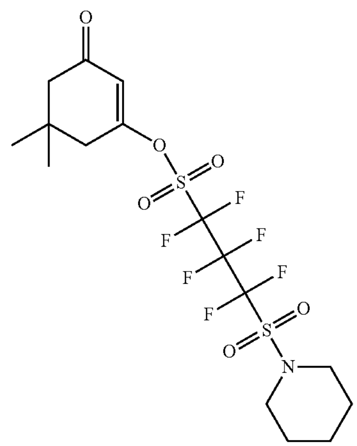
(4-16)
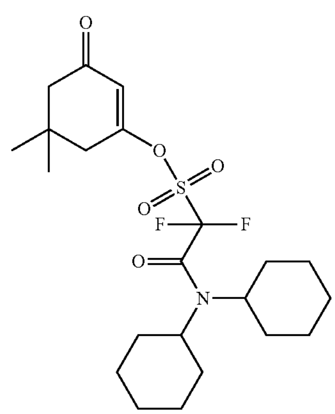
(4-17)
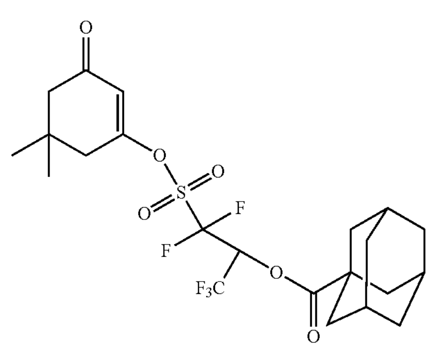

-continued
(4-18)
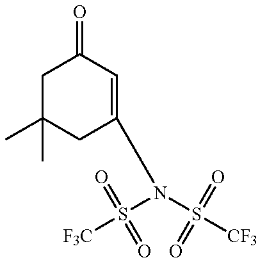
(5-1)
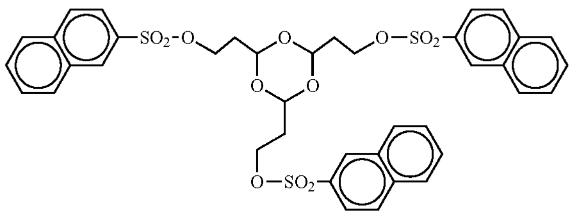
(5-2)
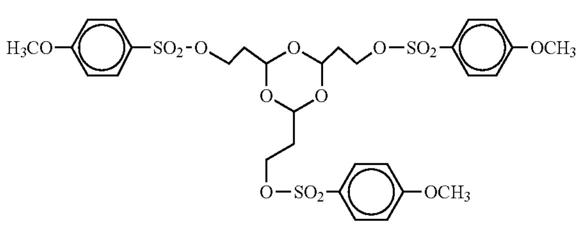
(5-3)
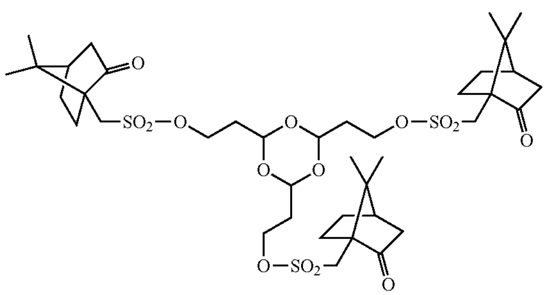
(5-4)
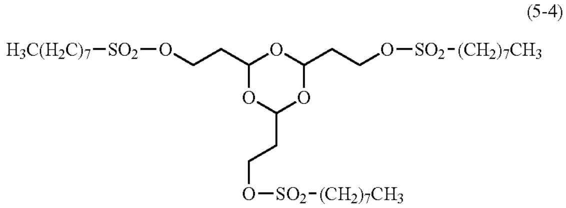
(6-1)
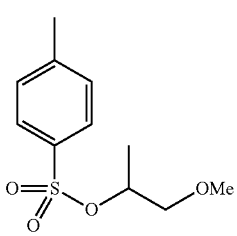
-continued
(6-2)
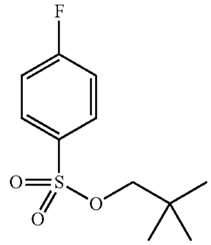
(6-3)
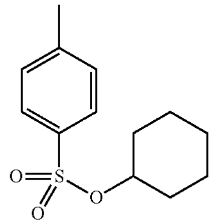
(6-4)
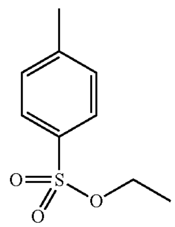
(6-5)
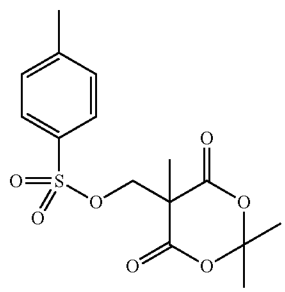
(6-6)
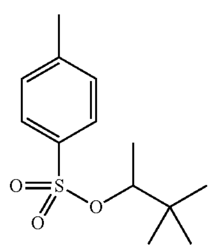
(6-7)
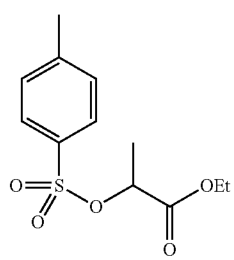

-continued
(6-8)
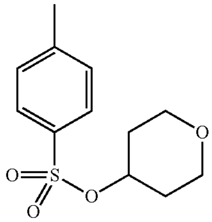
(6-9)
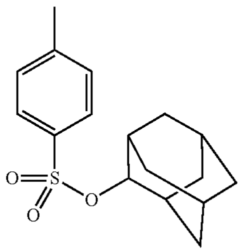
(6-10)
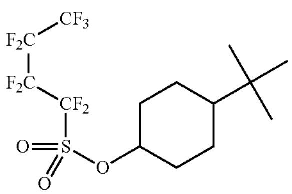
(6-11)
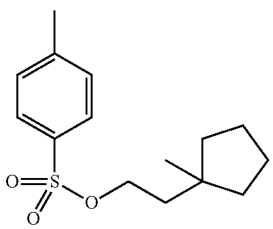
(6-12)
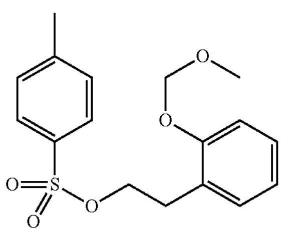
(6-13)
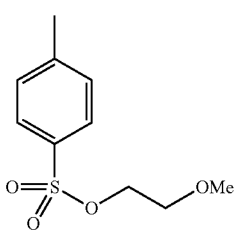
(6-14)
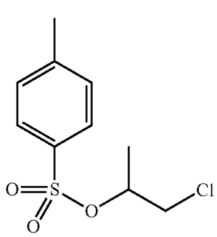
-continued
(6-15)
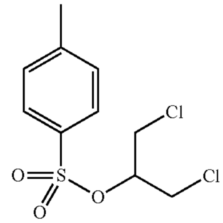
(6-16)
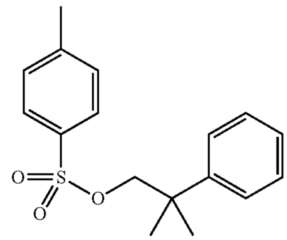
(6-17)
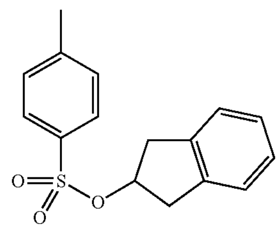
(6-18)
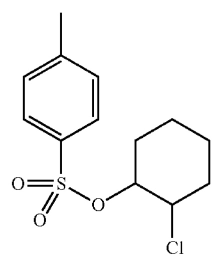
(6-19)
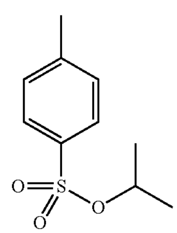
(6-20)
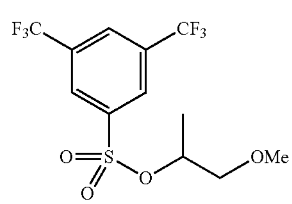
The compound represented by the following formula (7) or (8) is described below.

Formula (7)

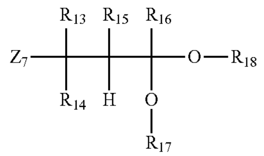

Formula (8)

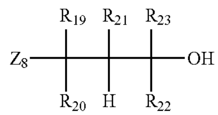

In formulae (7) and (8), each of $R_{13}$ to $R_{16}$ and $R_{19}$ to $R_{23}$ represents a hydrogen atom or a monovalent substituent.

Each of $R_{17}$ and $R_{18}$ represents a monovalent substituent, and $R_{17}$ and $R_{18}$ may combine with each other to form a ring.

$Z_7$ and $Z_8$ are as described above.

Incidentally, the compound represented by formula (7) may have a plurality of groups represented by $Z_7$ in the same molecule. Similarly, the compound represented by formula (8) may have a plurality of groups represented by $Z_8$ in the same molecule.

$R_{13}$ to $R_{16}$ in formula (7) are described below.

In formula (7), each of $R_{13}$ to $R_{16}$ represents a hydrogen atom or a monovalent substituent.

Examples of the monovalent substituent include an alkyl group, a cycloalkyl group, an alkenyl group, an alkynyl group, an aryl group, a halogen atom, an alkoxy group, an aryloxy group, an alkanoyl group, an alkoxycarbonyl group, an aryloxycarbonyl group, an alkylsulfonyloxy group, an arylsulfonyloxy group, an alkylsulfonyl group, an arylsulfonyl group, a cyano group, an alkylthioxy group, an arylthioxy group, and a heterocyclic group. Of these, an alkyl group, a cycloalkyl group, an alkenyl group, an alkynyl group, an aryl group, an alkoxy group, an aryloxy group, an alkanoyl group, an alkoxycarbonyl group, an aryloxycarbonyl group, an alkylsulfonyloxy group, an arylsulfonyloxy group, an alkylsulfonyl group, an arylsulfonyl group, a cyano group, an alkylthioxy group, an arylthioxy group and a heterocyclic group may have a substituent.

The alkyl group is preferably an alkyl group having a carbon number 1 to 30, and examples thereof include a methyl group, an ethyl group, a propyl group, a butyl group, a hexyl group, an octyl group, a decyl group, a dodecyl group, an octadecyl group, an isopropyl group, an isobutyl group, a sec-butyl group, a tert-butyl group, a 1-ethylpentyl group, a trifluoromethyl group, a 2-ethylhexyl group, a phenacyl group, a 1-naphthoylmethyl group, a 2-naphthoylmethyl group, a 4-methylsulfanylphenacyl group, a 4-phenylsulfanylphenacyl group, a 4-dimethylaminophenacyl group, a 4-cyanophenacyl group, a 4-methylphenacyl group, a 2-methylphenacyl group, a 3-fluorophenacyl group, a 3-trifluoromethylphenacyl group, and a 3-nitrophenacyl group.

The cycloalkyl group may have a monocyclic structure or a polycyclic structure. Preferred examples of the cycloalkyl group having a monocyclic structure include a cyclopentyl group, a cyclohexyl group, and a cyclooctyl group. Preferred examples of the cycloalkyl group having a polycyclic structure include a norbornyl group, a tricyclodecanyl group, a tetracyclodecanyl group, a tetracyclododecanyl group, and an adamantyl group. The cycloalkyl group is preferably a cycloalkyl group having a carbon number of 3 to 8, and, for example, a cyclopentyl group and a cyclohexyl group are more preferred.

The alkenyl group is preferably an alkenyl group having a carbon number of 2 to 10, and examples thereof include a vinyl group, an allyl group, and a styryl group.

The alkynyl group is preferably an alkynyl group having a carbon number of 2 to 10, and examples thereof include an ethynyl group, a propynyl group, and a propargyl group.

The aryl group is preferably an aryl group having a carbon number of 6 to 30, and examples thereof include a phenyl group, a biphenyl group, a 1-naphthyl group, a 2-naphthyl group, a 9-anthryl group, a 9-phenanthryl group, a 1-pyrenyl group, a 5-naphthacenyl group, a 1-indenyl group, a 2-azulenyl group, a 9-fluorenyl group, a terphenyl group, a quaterphenyl group, an o-, m- or p-tolyl group, a xylyl group, an o-, m- or p-cumenyl group, a mesityl group, a pentalenyl group, a binaphthalenyl group, a ternaphthalenyl group, a quaternaphthalenyl group, a heptalenyl group, a biphenylenyl group, an indacenyl group, a fluoranthenyl group, an acenaphthylenyl group, an aceanthrylenyl group, a phenalenyl group, a fluorenyl group, an anthryl group, a bianthracenyl group, a teranthracenyl group, a quateranthracenyl group, an anthraquinolyl group, a phenanthryl group, a triphenylenyl group, a pyrenyl group, a chrysenyl group, a naphthacenyl group, a pleiadenyl group, a picenyl group, a perylenyl group, a pentaphenyl group, a pentacenyl group, a tetraphenylenyl group, a hexaphenyl group, a hexacenyl group, a rubicenyl group, a coronenyl group, a trinaphthylenyl group, a heptaphenyl group, a heptacenyl group, a pyranthrenyl group, and an ovalenyl group.

The halogen atom includes a fluorine atom, a chlorine atom, a bromine atom, and an iodine atom.

Examples of the alkoxy group include a methoxy group, an ethoxy group, a propioxy group, an n-butoxy group, a trifluoromethoxy group, a hexyloxy group, a tert-butoxy group, a 2-ethylhexyloxy group, a cyclohexyloxy group, a decyloxy group, and a dodecyloxy group.

Examples of the aryloxy group include a phenyloxy group, a 1-naphthyloxy group, a 2-naphthyloxy group, a tolyloxy group, a methoxyphenyloxy group, a naphthyloxy group, a chlorophenyloxy group, a trifluoromethylphenyloxy group, a cyanophenyloxy group, and a nitrophenyloxy group.

The alkanoyl group is preferably an alkanoyl group having a carbon number of 2 to 20, and examples thereof include an acetyl group, a propanoyl group, a butanoyl group, a trifluoromethylcarbonyl group, a pentanoyl group, a benzoyl group, a 1-naphthoyl group, a 2-naphthoyl group, a 4-methylsulfanylbenzoyl group, a 4-phenylsulfanylbenzoyl group, a 4-dimethylaminobenzoyl group, a 4-diethylaminobenzoyl group, a 2-chlorobenzoyl group, a 2-methylbenzoyl group, a 2-methoxybenzoyl group, a 2-butoxybenzoyl group, a 3-chlorobenzoyl group, a 3-trifluoromethylbenzoyl group, a 3-cyanobenzoyl group, a 3-nitrobenzoyl group, a 4-fluorobenzoyl group, a 4-cyanobenzoyl group, and a 4-methoxybenzoyl group.

The alkoxycarbonyl group is preferably an alkoxycarbonyl group having a carbon number of 2 to 20, and examples thereof include a methoxycarbonyl group, an ethoxycarbonyl group, a propoxycarbonyl group, a butoxycarbonyl group, a hexyloxycarbonyl group, an octyloxycarbonyl group, a decyloxycarbonyl group, an octadecyloxycarbonyl group, and a trifluoromethyloxycarbonyl group.

Examples of the aryloxycarbonyl group include a phenoxycarbonyl group, a 1-naphthyloxycarbonyl group, a 2-naphthyloxycarbonyl group, a 4-methylsulfanylphenyloxycarbonyl group, a 4-phenylsulfanylphenyloxycarbonyl group, a 4-dimethylaminophenyloxycarbonyl group, a 4-diethylaminophenyloxycarbonyl group, a 2-chlorophenyloxycarbonyl group, a 2-methylphenyloxycarbonyl group, a 2-methoxyphenyloxycarbonyl group, a 2-butoxyphenyloxycarbonyl group, a 3-chlorophenyloxycarbonyl group, a 3-trifluoromethylphenyloxycarbonyl group, a 3-cyanophenyloxycarbonyl group, a 3-nitrophenyloxycarbonyl group, a 4-fluorophenyloxycarbonyl group, a 4-cyanophenyloxycarbonyl group, and a 4-methoxyphenyloxycarbonyl group.

The alkylsulfonyloxy group is preferably an alkylsulfonyloxy group having a carbon number of 1 to 20, and examples thereof include a methylsulfonyloxy group, an ethylsulfonyloxy group, a propylsulfonyloxy group, an isopropylsulfonyloxy group, a butylsulfonyloxy group, a hexylsulfonyloxy group, a cyclohexylsulfonyloxy group, an octylsulfonyloxy group, a 2-ethylhexylsulfonyloxy group, a decanoylsulfonyloxy group, a dodecanoylsulfonyloxy group, an octadecanoylsulfonyloxy group, a cyanomethylsulfonyloxy group, a methoxymethylsulfonyloxy group, and a perfluoroalkylsulfonyloxy group.

The arylsulfonyloxy group is preferably an arylsulfonyloxy group having a carbon number of 6 to 30, and examples thereof include a phenylsulfonyloxy group, a 1-naphthylsulfonyloxy group, a 2-naphthylsulfonyloxy group, a 2-chlorophenylsulfonyloxy group, a 2-methylphenylsulfonyloxy group, a 2-methoxyphenylsulfonyloxy group, a 2-butoxyphenylsulfonyloxy group, a 3-chlorophenylsulfonyloxy group, a 3-trifluoromethylphenylsulfonyloxy group, a 3-cyanophenylsulfonyloxy group, a 3-nitrophenylsulfonyloxy group, a 4-fluorophenylsulfonyloxy group, a 4-cyanophenylsulfonyloxy group, a 4-methoxyphenylsulfonyloxy group, a 4-methylsulfanylphenylsulfonyloxy group, a 4-phenylsulfanylphenylsulfonyloxy group, and a 4-dimethylaminophenylsulfonyloxy group.

The alkylsulfonyl group is preferably an alkylsulfonyl group having a carbon number of 1 to 20, and examples thereof include a methylsulfonyl group, an ethylsulfonyl group, a propylsulfonyl group, an isopropylsulfonyl group, a butylsulfonyl group, a hexylsulfonyl group, a cyclohexylsulfonyl group, an octylsulfonyl group, a 2-ethylhexylsulfonyl group, a decanoylsulfonyl group, a dodecanoylsulfonyl group, an octadecanoylsulfonyl group, a cyanomethylsulfonyl group, a methoxymethylsulfonyl group, and a perfluoroalkylsulfonyl group.

The arylsulfonyl group is preferably an arylsulfonyl group having a carbon number of 6 to 30, and examples thereof include a phenylsulfonyl group, a 1-naphthylsulfonyl group, a 2-naphthylsulfonyl group, a 2-chlorophenylsulfonyl group, a 2-methylphenylsulfonyl group, a 2-methoxyphenylsulfonyl group, a 2-butoxyphenylsulfonyl group, a 3-chlorophenylsulfonyl group, a 3-trifluoromethylphenylsulfonyl group, a 3-cyanophenylsulfonyl group, a 3-nitrophenylsulfonyl group, a 4-fluorophenylsulfonyl group, a 4-cyanophenylsulfonyl group, a 4-methoxyphenylsulfonyl group, a 4-methylsulfanylphenylsulfonyl group, a 4-phenylsulfanylphenylsulfonyl group, and a 4-dimethylaminophenylsulfonyl group.

Examples of the alkylthioxy group include a methylthioxy group, an ethylthioxy group, a propylthioxy group, an n-butylthioxy group, a trifluoromethylthioxy group, a hexylthioxy group, a tert-butylthioxy group, a 2-ethylhexylthioxy group, a cyclohexylthioxy group, a decylthioxy group, and a dodecylthioxy group.

Examples of the arylthioxy group include a phenylthioxy group, a 1-naphthylthioxy group, a 2-naphthylthioxy group, a tolylthioxy group, a methoxyphenylthioxy group, a naphthylthioxy group, a chlorophenylthioxy group, a trifluoromethylphenylthioxy group, a cyanophenylthioxy group, and a nitrophenylthioxy group.

The heterocyclic group is preferably an aromatic or aliphatic heterocyclic ring containing a nitrogen atom, an oxygen atom, a sulfur atom or a phosphorus atom. Examples of the heterocyclic group include a thienyl group, a benzo[b]thienyl group, a naphtho[2,3-b]thienyl group, a thianthrenyl group, a furyl group, a pyranyl group, an isobenzofuranyl group, a chromenyl group, a xanthenyl group, a phenoxathiinyl group, a 2H-pyrrolyl group, a pyrrolyl group, an imidazolyl group, a pyrazolyl group, a pyridyl group, a pyrazinyl group, a pyrimidinyl group, a pyridazinyl group, an indolizinyl group, an isoindolyl group, a 3H-indolyl group, an indolyl group, a 1H-indazolyl group, a purinyl group, a 4H-quinolizinyl group, an isoquinolyl group, a quinolyl group, a phthalazinyl group, a naphthyridinyl group, a quinoxalinyl group, a quinazolinyl group, a cinnolinyl group, a pteridinyl group, a 4aH-carbazolyl group, a carbazolyl group, a β-carbolinyl group, a phenanthridinyl group, an acridinyl group, a perimidinyl group, a phenanthrolinyl group, a phenazinyl group, a phenarsazinyl group, an isothiazolyl group, a phenothiazinyl group, an isoxazolyl group, a furazanyl group, a phenoxazinyl group, an isochromanyl group, a chromanyl group, a pyrrolidinyl group, a pyrrolinyl group, an imidazolidinyl group, an imidazolinyl group, a pyrazolidinyl group, a pyrazolinyl group, a piperidyl group, a piperazinyl group, an indolinyl group, an isoindolinyl group, a quinuclidinyl group, a morpholinyl, and a thioxanthryl group.

Examples of the substituent which any one of $R_{13}$ to $R_{16}$ may have include a halogen atom such as fluorine atom, chlorine atom, bromine atom and iodine atom; an alkoxy group such as methoxy group, ethoxy group and tert-butoxy group; an aryloxy group such as phenoxy group and p-tolyloxy group; an alkoxycarbonyl group such as methoxycarbonyl group, butoxycarbonyl group and phenoxycarbonyl group; an acyloxy group such as acetoxy group, propionyloxy group and benzoyloxy group; an acyl group such as acetyl group, benzoyl group, isobutyryl group, acryloyl group, methacryloyl group and methoxalyl group; an alkylsulfanyl group such as methylsulfanyl group and tert-butylsulfanyl group; an arylsulfanyl group such as phenylsulfanyl group and p-tolylsulfanyl group; an alkylamino group such as methylamino group and cyclohexylamino group; a dialkylamino group such as dimethylamino group, diethylamino group, morpholino group and piperidino group; an arylamino group such as phenylamino group and p-tolylamino group; an alkyl group such as methyl group, ethyl group, tert-butyl group and dodecyl group; an aryl group such as phenyl group, p-tolyl group, xylyl group, cumenyl group, naphthyl group, anthryl group and phenanthryl group; a hydroxy group; a carboxy group; a formyl group; a mercapto group; a sulfo group; a mesyl group; a p-toluenesulfonyl group; an amino group; a nitro group; a cyano group; a trifluoromethyl group; a trichloromethyl group; a trimethylsilyl group; a phosphinico group; a phosphono group; a trimethylammoniumyl group; a dimethylsulfoniumyl group; and a triphenylphenancylphosphoniumyl group.

Two or more of $R_{13}$ to $R_{16}$ may combine with each other to form a ring structure. This ring structure may be an aliphatic or aromatic hydrocarbon ring or may be a heterocyclic ring containing a heteroatom. These $R_{13}$ to $R_{16}$ may also form a polycondensed ring.

Examples of the aliphatic or aromatic hydrocarbon ring include those having a 6-membered, 5-membered or 7-membered ring structure. The hydrocarbon ring is preferably a hydrocarbon ring having a 6-membered or 5-membered ring structure, more preferably a hydrocarbon ring having a 5-membered ring structure.

Examples of the heterocyclic ring include those containing a sulfur atom, an oxygen atom or a nitrogen atom as the heteroatom. A heterocyclic ring containing a sulfur atom as the heteroatom is preferred.

Examples of the polycondensed ring include a condensed ring composed of only a hydrocarbon ring. Examples of such a polycondensed ring include a condensed ring formed by fusing 2 to 4 benzene rings, and a condensed ring formed by fusing a benzene ring and a 5-membered unsaturated ring.

The polycondensed ring may be a condensed ring containing at least one heterocyclic ring. Examples of such a polycondensed ring include a condensed ring formed by fusing a benzene ring and a 5-membered heterocyclic ring, and a condensed ring formed by fusing a benzene ring and a 6-membered heterocyclic ring.

Examples of the ring structure which can be formed by $R_{13}$ to $R_{16}$ include a benzene ring, a naphthalene ring, an anthracene ring, a phenanthrene ring, a fluorene ring, a triphenylene ring, a naphthacene ring, a biphenyl ring, a pyrrole ring, a furan ring, a thiophene ring, a dithiolane ring, an oxirane ring, a dioxirane ring, a thiirane ring, a pyrrolidine ring, a piperidine ring, an imidazole ring, an isoxazole ring, a benzothiazole ring, an oxazole ring, a thiazole ring, a benzothiazole ring, a benzimidazole ring, a benzoxazole ring, a pyridine ring, a pyrazine ring, a pyrimidine ring, a pyridazine ring, an indolizine ring, an indole ring, a benzofuran ring, a benzothiophene ring, a benzodithiole ring, an isobenzofuran ring, a quinolizine ring, a quinoline ring, a phthalazine ring, a naphthyridine ring, a quinoxaline ring, a quinazoline ring, an isoquinoline ring, a carbazole ring, a phenanthridine ring, an acridine ring, a phenanthroline ring, a thianthrene ring, a chromene ring, a xanthene ring, a phenoxathiin ring, a phenothiazine ring, and a phenazine ring. Among others, a dithiolane ring, a benzodithiole ring, a benzothiazole ring, a benzimidazole ring and a benzoxazole ring are preferred.

Each of $R_{13}$ to $R_{16}$ is independently preferably a hydrogen atom, an alkyl group, a cycloalkyl group or an aryl group.

$R_{17}$ and $R_{18}$ are described below.

In formula (1), each of $R_{17}$ and $R_{18}$ represents a monovalent substituent. Examples of the monovalent substituent include a monovalent organic group and a silyl group. Examples of the monovalent organic group include an alkyl group, a cycloalkyl group, an alkenyl group, an alkynyl group, an aryl group, an alkanoyl group, an alkoxycarbonyl group, an aryloxycarbonyl group, an alkylsulfonyl group, an arylsulfonyl group, an alkylthiocarbonyl group, an arylthiocarbonyl group, and a dialkylaminocarbonyl group. These monovalent organic groups may further have a substituent.

Examples of the alkyl group, cycloalkyl group, alkenyl group, alkynyl group, aryl group, alkanoyl group, alkoxycarbonyl group, aryloxycarbonyl group, alkylsulfonyl group, arylsulfonyl group, alkylthiocarbonyl group and arylthiocarbonyl group are the same as those described above for $R_{13}$ to $R_{16}$.

Examples of the dialkylaminocarbonyl group which may have a substituent include a dimethylaminocarbonyl group, a diethylaminocarbonyl group, a dipropylaminocarbonyl group, and a dibutylaminocarbonyl group.

$R_{17}$ and $R_{18}$ may combine with each other to form a ring. $R_{17}$ and $R_{18}$ preferably combine with each other to form a cyclic acetal structure. The cyclic acetal structure may have, as a substituent, an aliphatic or aromatic hydrocarbon ring or a heterocyclic ring containing a heteroatom. Also, the hydrocarbon ring and/or the heterocyclic ring may form a condensed ring with the cyclic acetal. Examples of the hydrocarbon ring and heterocyclic ring are the same as those described above for $R_{13}$ to $R_{16}$.

$R_{19}$ to $R_{23}$ in formula (8) are described.

Each of $R_{19}$ to $R_{23}$ represents a hydrogen atom or a monovalent substituent.

$R_{19}$ is, for example, an alkyl group, a cycloalkyl group, an aryl group, an aralkyl group, an alkoxy group, an aryloxy group, an alkenyloxy group or a hydrogen atom.

$R_{20}$ is, for example, an alkyl group, a cycloalkyl group, an aryl group, an aralkyl group, an alkoxy group, an aryloxy group, an alkenyl group or a hydrogen atom.

$R_{21}$ is, for example, an alkyl group, a cycloalkyl group, an aryl group, an aralkyl group, an alkoxy group, an aryloxy group, an alkenyl group or a hydrogen atom.

$R_{22}$ is, for example, an alkyl group, a cycloalkyl group, an aryl group, an aralkyl group, an alkoxy group, an aryloxy group, an alkenyl group or a hydrogen atom.

$R_{23}$ is, for example, an alkyl group, a cycloalkyl group, an aryl group, an aralkyl group, an alkoxy group, an aryloxy group, an alkenyl group or a hydrogen atom.

The alkyl group is preferably an alkyl group having a carbon number of 1 to 8, and examples thereof include a methyl group, an ethyl group, a propyl group, an isopropyl group, a butyl group, and an octyl group.

The cycloalkyl group is preferably a cycloalkyl group having a carbon number of 4 to 10, and examples thereof include a cyclopropyl group, a cyclopentyl group, a cyclohexyl group, a cyclobutyl group, an adamantyl group, a boronyl group, an isoboronyl group, a tricyclodecanyl group, a dicyclopentenyl group, a norbornane epoxy group, a menthyl group, an isomenthyl group, a neomenthyl group, and a tetracyclododecanyl group.

The aryl group is preferably an aryl group having a carbon number of 6 to 14, and examples thereof include a phenyl group, a naphthyl group and a tolyl group.

The aralkyl group includes an aralkyl group having a carbon number of 7 to 20, and specific examples thereof include a benzyl group, a phenethyl group and a naphthylethyl group.

The alkoxy group is preferably an alkoxy group having a carbon number of 1 to 8, and examples thereof include a methoxy group, an ethoxy group, a propoxy group, a cyclohexyloxy group, and a butoxy group.

The aryloxy group is preferably an aryloxy group having a carbon number of 6 to 14, and examples thereof include a phenoxy group and a naphthoxy group.

The alkenyl group is preferably an alkenyl group having a carbon number of 2 to 6, and examples thereof include a vinyl group, a propenyl group, an allyl group, a butenyl group, a pentenyl group, a hexenyl group, and a cyclohexenyl group.

The alkenyloxy group is preferably an alkenyloxy group having a carbon number of 2 to 8, and examples thereof include a vinyloxy group and an allyloxy group.

These alkyl, cycloalkyl, aryl, aralkyl, alkoxy, aryloxy, alkenyl and alkenyloxy groups may have a substituent. Examples of the substituent include a halogen atom such as Cl, Br and F, a —CN group, an —OH group, an alkyl group having a carbon number of 1 to 4, a cycloalkyl group having a carbon number of 3 to 8, an alkoxy group having a carbon number of 1 to 4, an acylamino group such as acetylamino group, an aralkyl group such as benzyl group and phenethyl group, an aryloxyalkyl group such as phenoxyethyl group, an alkoxycarbonyl group having a carbon number of 2 to 5, and an acyloxy group having a carbon number of 2 to 5.

$R_{19}$ is preferably, for example, a hydrogen atom, a methyl group, an ethyl group, a propyl group, an isopropyl group, a butyl group, an isobutyl group, a cyclopropyl group, a cyclopentyl group, a cyclohexyl group, a methoxy group, an ethoxy group, a phenyl group, a naphthyl group, a benzyl group, a phenoxy group, a naphthoxy group, a vinyloxy group or a methylvinyloxy group.

$R_{20}$ is preferably, for example, a hydrogen atom, a methyl group, an ethyl group, a propyl group, an isopropyl group, a butyl group, an isobutyl group, a cyclopropyl group, a cyclopentyl group, a cyclohexyl group, a methoxy group, an ethoxy group, a phenyl group, a naphthyl group, a benzyl group, a phenoxy group, a naphthoxy group, a vinyl group or an allyl group.

$R_{21}$ is preferably, for example, a hydrogen atom, a methyl group, an ethyl group, a propyl group, an isopropyl group, a butyl group, an isobutyl group, a cyclopropyl group, a cyclopentyl group, a cyclohexyl group, a methoxy group, an ethoxy group, a phenyl group, a naphthyl group, a benzyl group, a phenoxy group, a naphthoxy group, a vinyl group or an allyl group.

$R_{22}$ is preferably, for example, a hydrogen atom, a methyl group, an ethyl group, a propyl group, an isopropyl group, a butyl group, an isobutyl group, a cyclopropyl group, a cyclopentyl group, a cyclohexyl group, a methoxy group, an ethoxy group, a phenyl group, a naphthyl group, a benzyl group, a phenoxy group, a naphthoxy group, a vinyl group or an allyl group.

$R_{23}$ is preferably, for example, a hydrogen atom, a methyl group, an ethyl group, a propyl group, an isopropyl group, a butyl group, an isobutyl group, a cyclopropyl group, a cyclopentyl group, a cyclohexyl group, a methoxy group, an ethoxy group, a phenyl group, a naphthyl group, a benzyl group, a phenoxy group, a naphthoxy group, a vinyl group or an allyl group.

At least two of $R_{19}$ to $R_{23}$ may combine with each other to form a ring structure.

Examples of the compound represented by formula (7) or (8) include the followings.

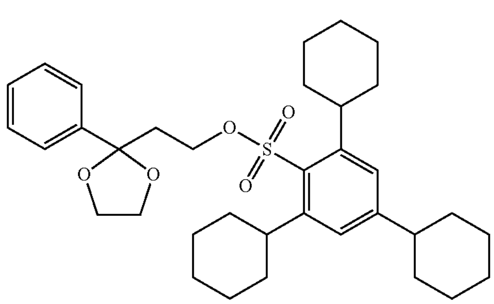

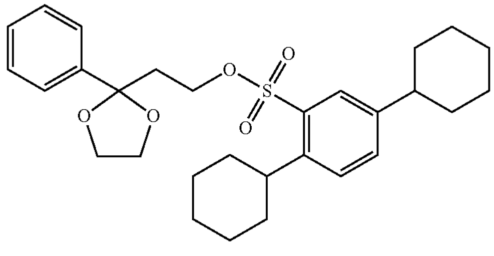

-continued

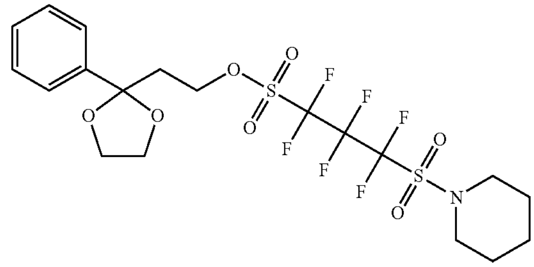

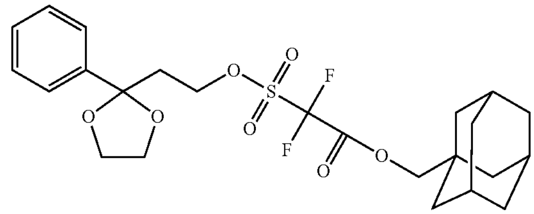

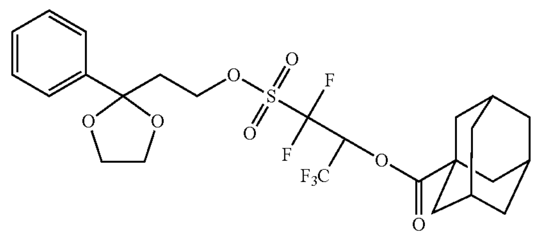

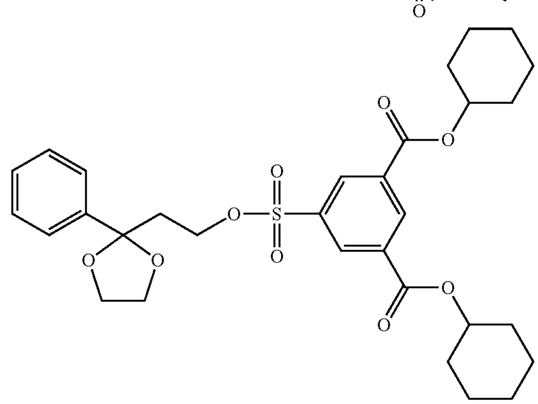

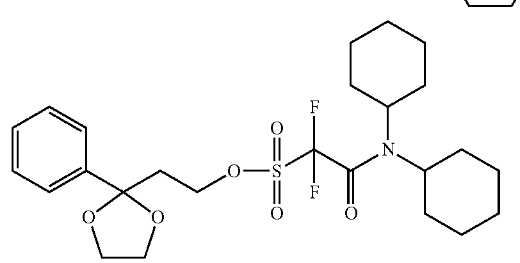

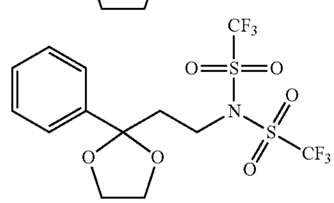

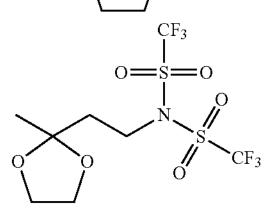

-continued
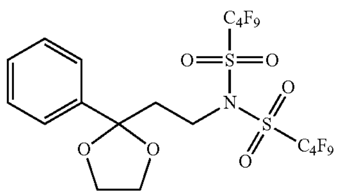
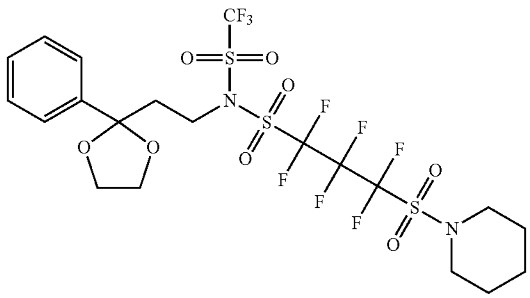
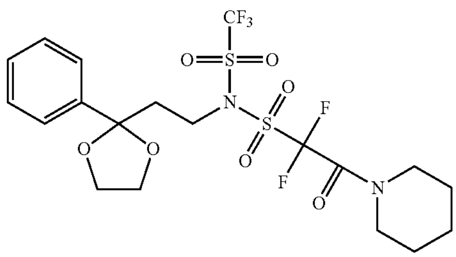
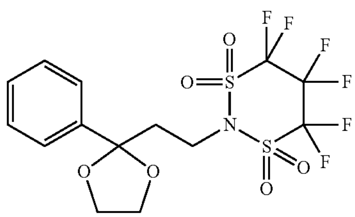
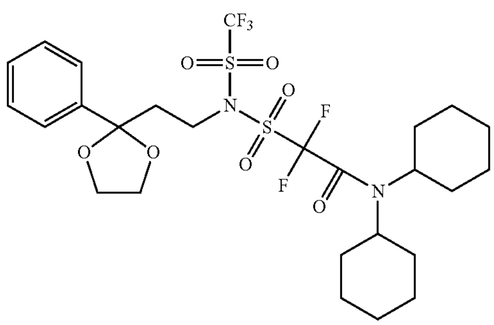
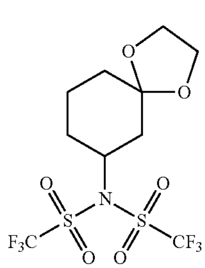
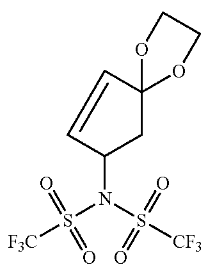
-continued
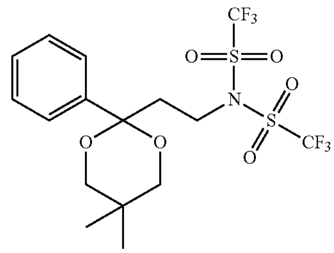
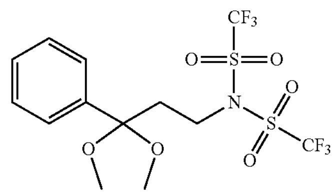
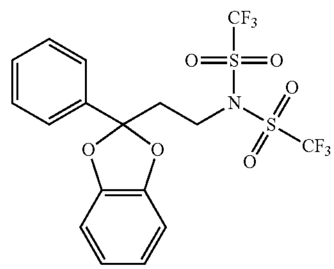
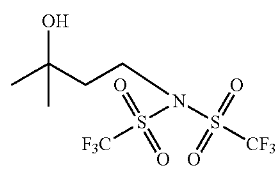
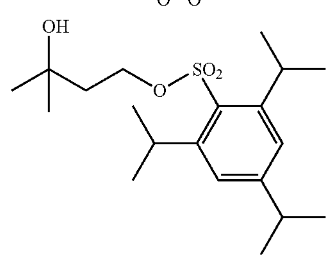
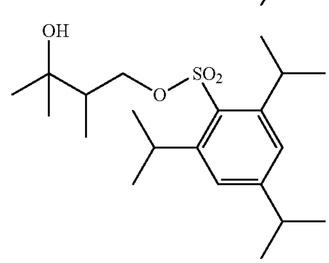
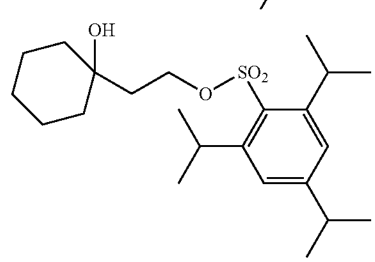

-continued
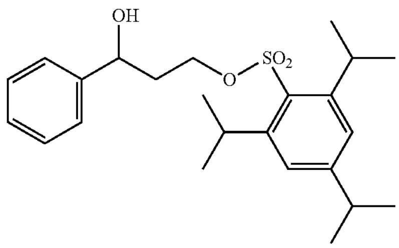
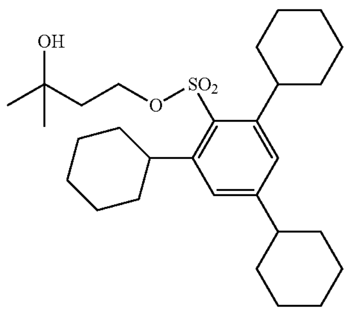
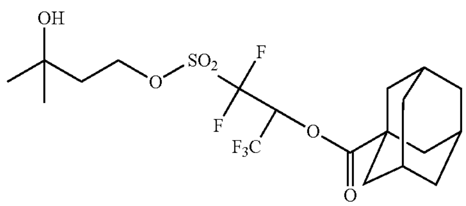
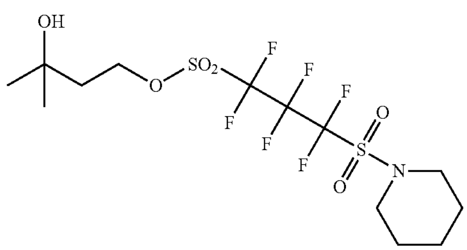
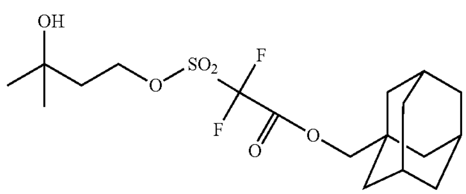
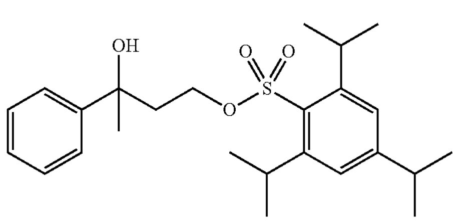
-continued
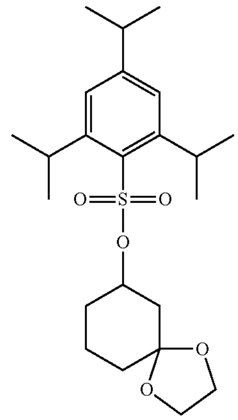
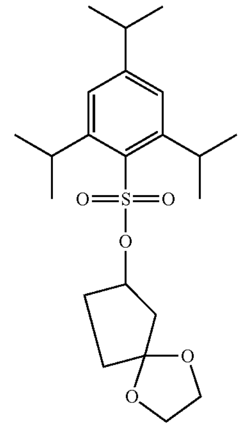
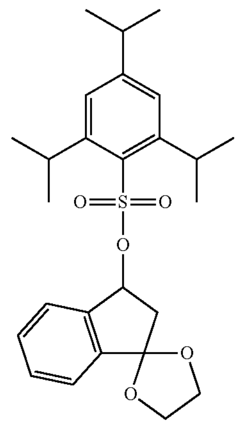
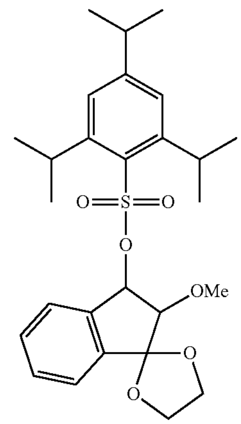
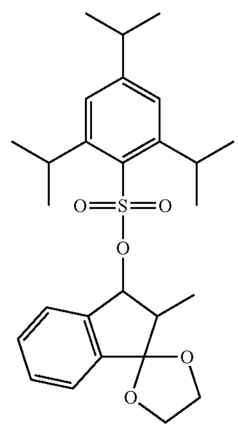
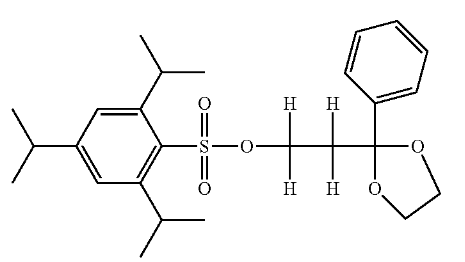

-continued
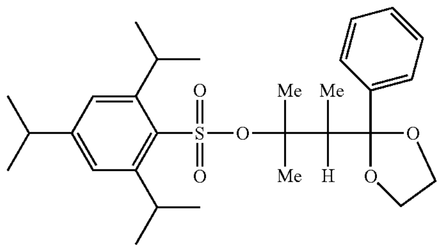
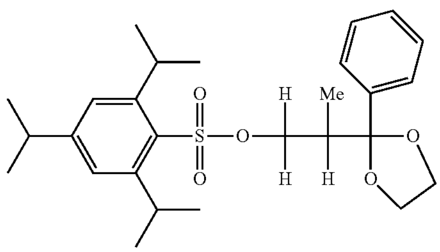
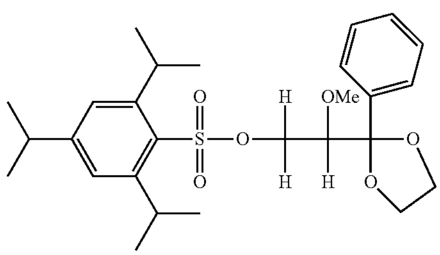
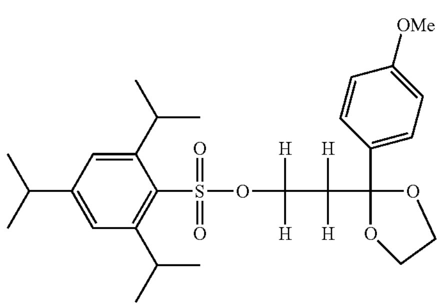
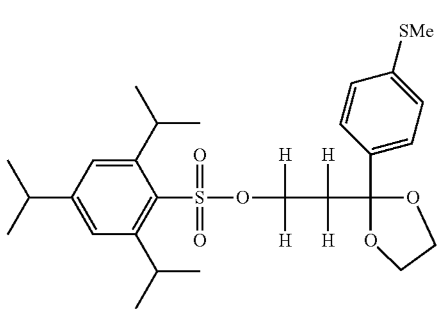
-continued
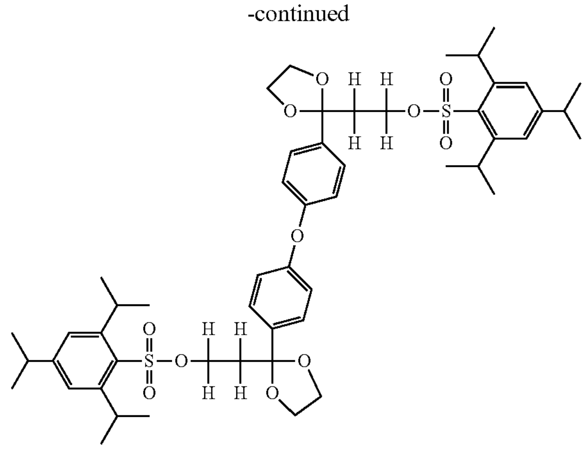
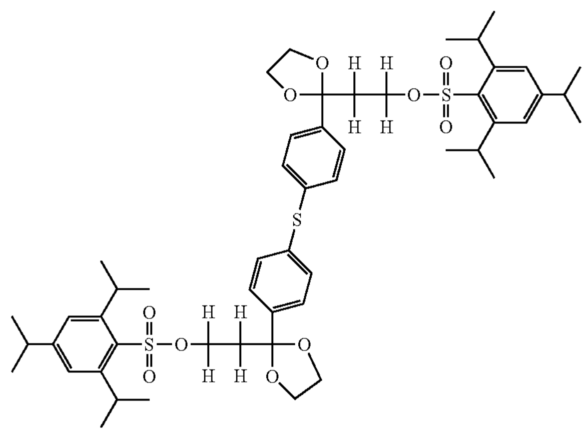
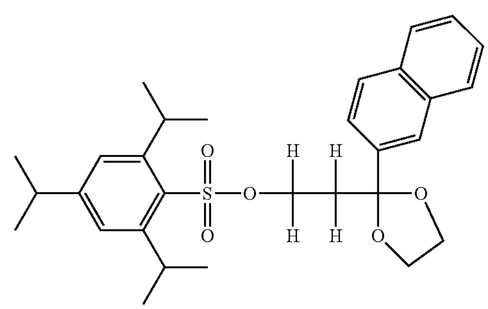
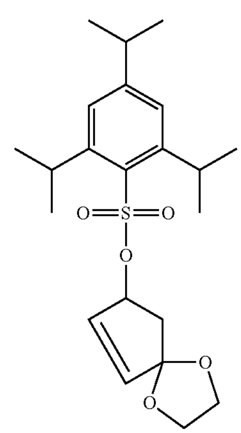

-continued

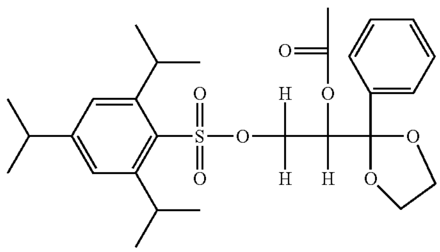

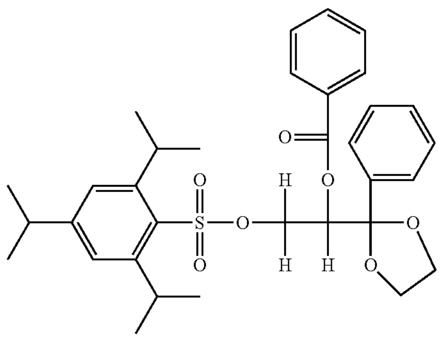

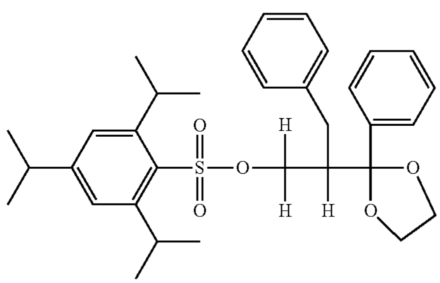

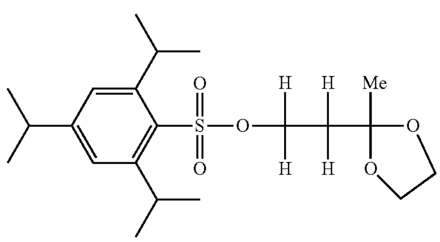

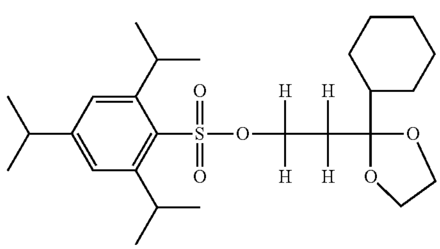

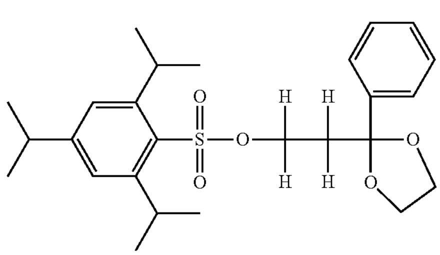

-continued

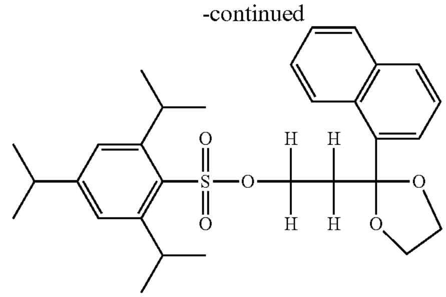

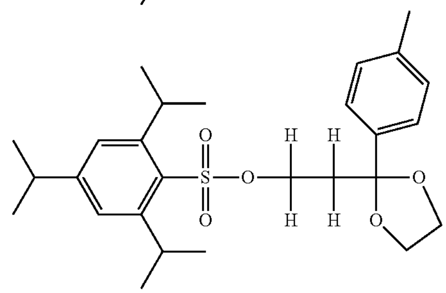

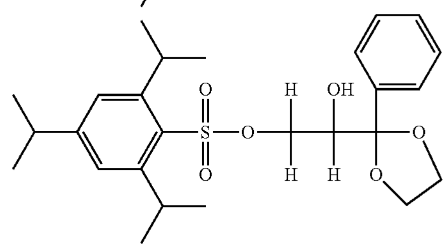

As for the production method of the compound represented by formula (7) or (8), a corresponding alcohol compound and a sulfonyl halide or a sulfonic anhydride are reacted in an inert solvent such as THF, DMF and acetonitrile or a basic solvent such as pyridine in the presence of a base (for example, triethylamine or pyridine), whereby the compound can be easily synthesized. The reaction temperature is preferably from −10 to 60° C.

Also, when an alkylsulfonyl halide, an arylsulfonyl halide or the like is used as the sulfonyl halide above, compounds capable of generating various corresponding sulfonic acids can be synthesized.

The acid generated from the (C) compound capable of decomposing by the action of an acid to generate an acid is preferably a sulfonic acid, an imide acid, a carboxylic acid or a methide acid, more preferably a sulfonic acid or an imide acid, still more preferably a sulfonic acid.

In other words, in formulae (1) to (5), (7) and (8), each of $Z_1$, $Z_1'$, $Z_3$, $Z_4$, $Z_5$, $Z_7$ and $Z_8$ is independently preferably a group ($Rb_1$—$SO_3$—) represented by formula (Z-a).

Above all, it is preferred to generate a sulfonic acid having a volume of 240 Å$^3$ or more. Thanks to a volume of 240 Å$^3$ or more, the acid is bulky, as a result, diffusion of the acid generated can be suppressed, and the resolution can be improved even for a narrow pitch.

The acid generated from the (C) compound capable of decomposing by the action of an acid is preferably a sulfonic acid having a size of 270 Å$^3$ or more in volume, more preferably a sulfonic acid having a size of 300 Å$^3$ or more in volume, still more preferably a sulfonic acid having a size of 400 Å$^3$ or more in volume. However, in view of the sensitivity or the solubility in the coating solvent, the above-described volume is preferably 2,000 Å$^3$ or less, further preferably 1,500 Å$^3$ or less.

Examples of the volume of the sulfonic acid ($Rb_1$—$SO_3H$) are described below together with the structure of the sulfonic acid generated from the acid-increasing agent for use in the present invention.

Incidentally, a computed volume value is affixed to each of these examples.

This value was determined as follows by using "WinMOPAC" produced by Fujitsu Limited. That is, first, the chemical structure of the acid according to each example was input, and then, using this structure as the initial structure, the most stable conformation of each acid was determined by molecular force field calculation using the MM3 method. Thereafter, with respect to the most stable conformation, molecular orbital calculation using the PM3 method was performed, whereby the "accessible volume" of each acid was computed.

The acid generated from the acid-increasing agent for use in the present invention is not limited to the sulfonic acids illustrated below.

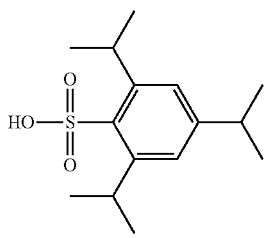

303 Å$^3$

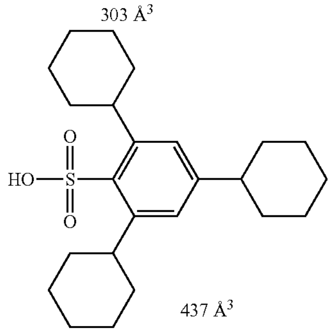

437 Å$^3$

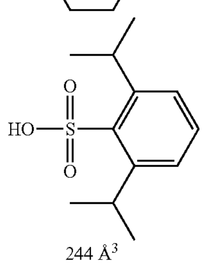

244 Å$^3$

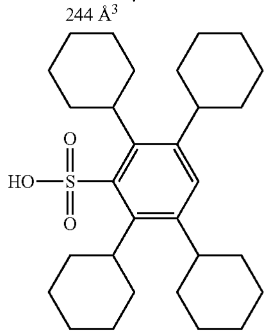

529 Å$^3$

-continued

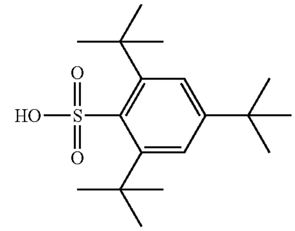

357 Å$^3$

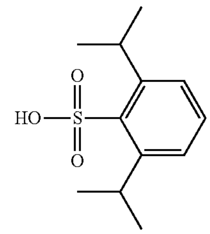

280 Å$^3$

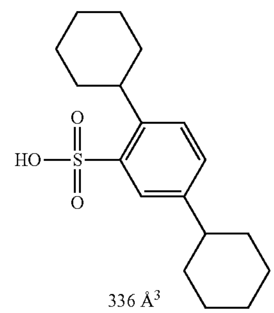

336 Å$^3$

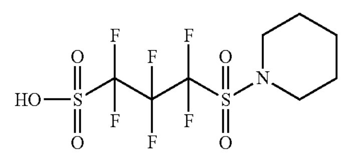

244 Å$^3$

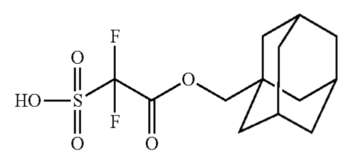

271 Å$^3$

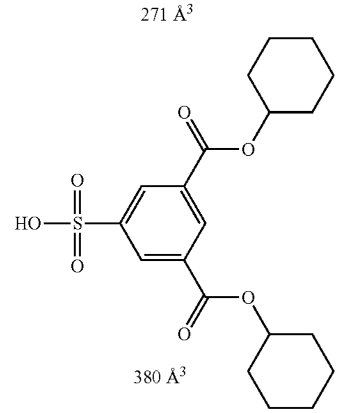

380 Å$^3$

-continued
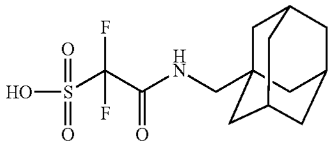
277 Å$^3$
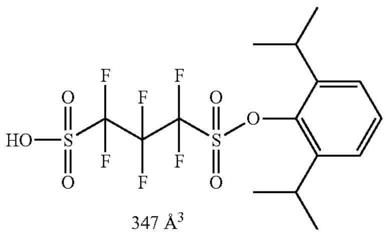
347 Å$^3$
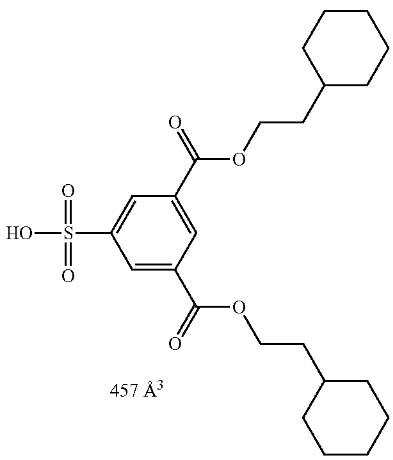
457 Å$^3$
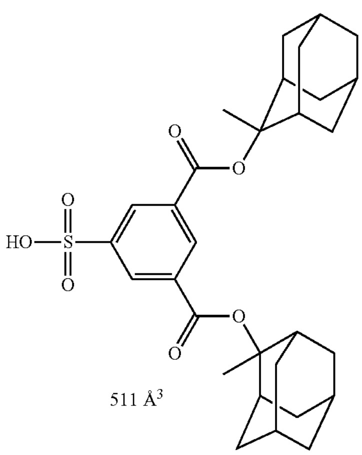
511 Å$^3$
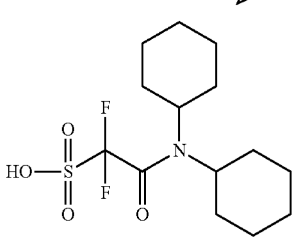
311 Å$^3$
-continued
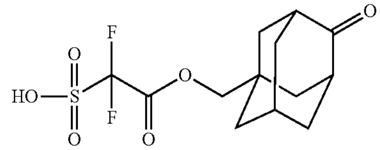
266 Å$^3$
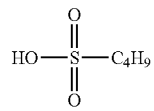
129 Å$^3$
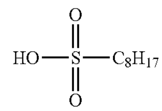
211 Å$^3$
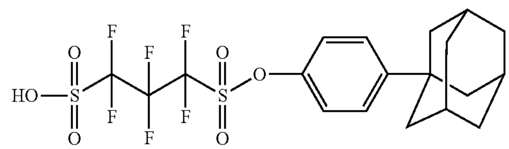
380 Å$^3$
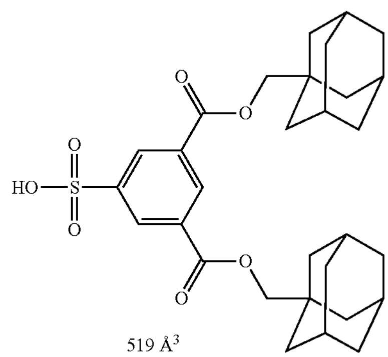
519 Å$^3$
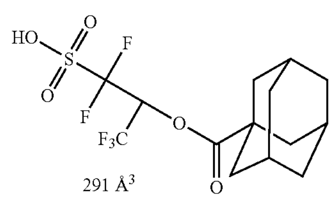
291 Å$^3$
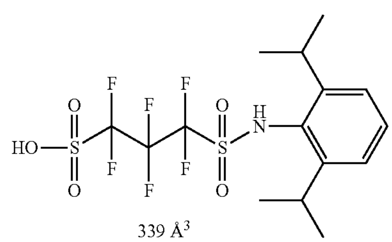
339 Å$^3$
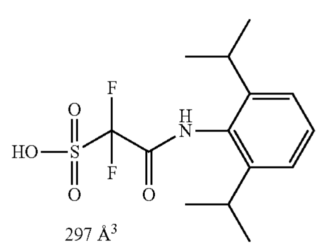
297 Å$^3$

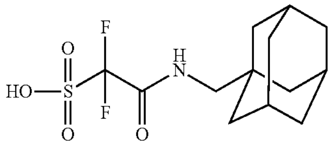
277 Å$^3$
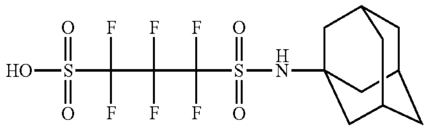
315 Å$^3$
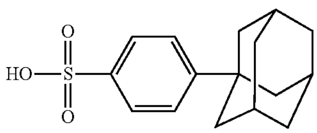
281 Å$^3$
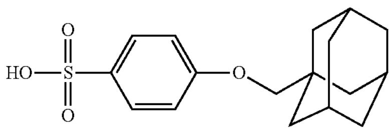
310 Å$^3$
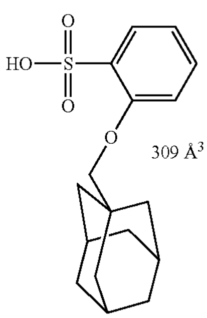
309 Å$^3$
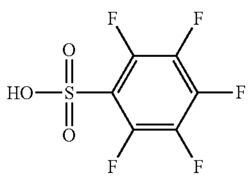
127 Å$^3$
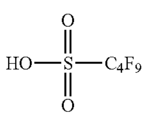
113 Å$^3$
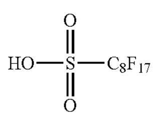
220 Å$^3$
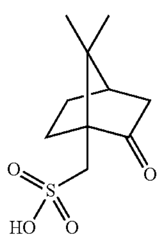
216 Å$^3$
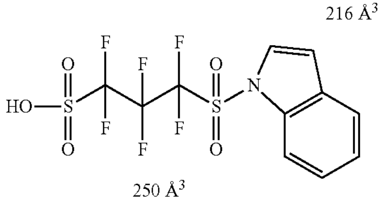
250 Å$^3$
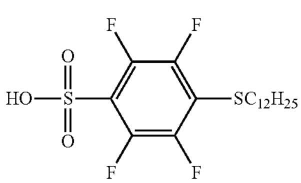
393 Å$^3$
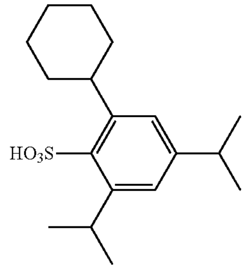
350 Å$^3$
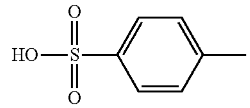
186 Å$^3$
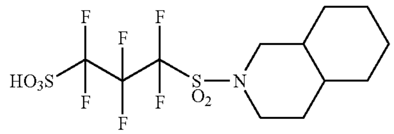
311 Å$^3$
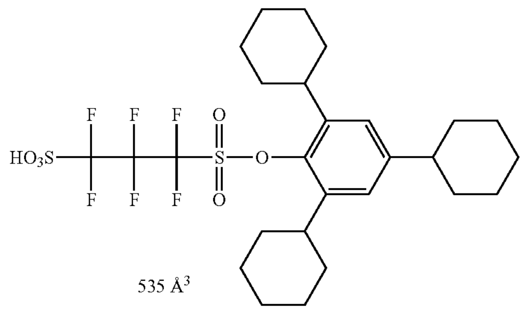
535 Å$^3$
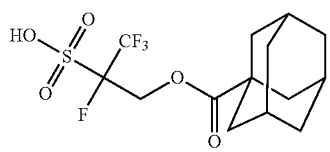
290 Å$^3$
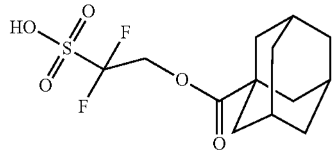
270 Å$^3$
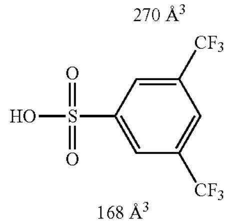
168 Å$^3$
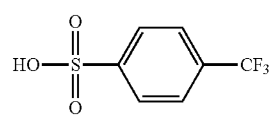
146 Å$^3$
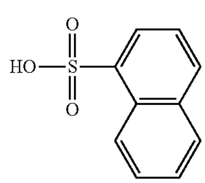
172 Å$^3$
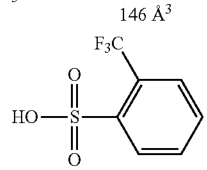
147 Å$^3$ -continued

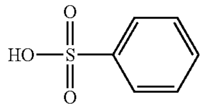

125 Å$^3$

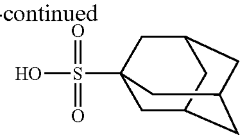

207 Å$^3$

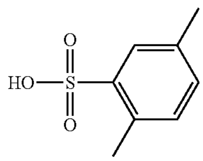

166 Å$^3$

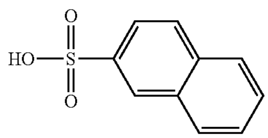

172 Å$^3$

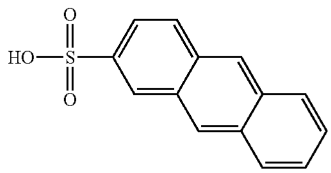

218 Å$^3$

In the present invention, as for the acid-increasing agent, one kind may be used alone, or two or more kinds may be used in combination.

In the present invention, the content of the acid-increasing agent is preferably from 0.1 to 50 mass %, more preferably from 0.5 to 30 mass %, still more preferably from 1.0 to 20 mass %, based on the total solid content of the composition.

The quantitative ratio between the acid-increasing agent and the acid generator (solid content of the acid-increasing agent based on the total solid content in the composition/solid content of the acid generator based on the total solid content in the composition) is not particularly limited but is preferably from 0.01 to 50, more preferably from 0.1 to 20, still more preferably from 0.2 to 1.0.

[4] (D) Resist Solvent (Coating Solvent)

The solvent which can be used when preparing the composition is not particularly limited as long as it dissolves respective components, but examples thereof include an alkylene glycol monoalkyl ether carboxylate (e.g., propylene glycol monomethyl ether acetate (PGMEA; another name: 1-methoxy-2-acetoxypropane)), an alkylene glycol monoalkyl ether (e.g., propylene glycol monomethyl ether (PGME; 1-methoxy-2-propanol)), a lactic acid alkyl ester (e.g., ethyl lactate, methyl lactate), a cyclic lactone (e.g., γ-butyrolactone; preferably having a carbon number of 4 to 10), a chain or cyclic ketone (e.g., 2-heptanone, cyclohexanone; preferably having a carbon number of 4 to 10), an alkylene carbonate (e.g., ethylene carbonate, propylene carbonate), an alkyl carboxylate (preferably an alkyl acetate such as butyl acetate), and an alkyl alkoxyacetate (e.g., ethyl ethoxypropionate). Other examples of the solvent which can be used include solvents described in paragraph [0244] et seq. of U.S. Patent Application Publication No. 2008/0248425A1.

Among the solvents above, an alkylene glycol monoalkyl ether carboxylate and an alkylene glycol monoalkyl ether are preferred.

One of these solvents may be used alone, or two or more thereof may be mixed and used. In the case of mixing two or more solvents, it is preferred to mix a solvent having a hydroxyl group and a solvent having no hydroxyl group. The mass ratio between the solvent having a hydroxyl group and the solvent having no hydroxyl group is from 1/99 to 99/1, preferably from 10/90 to 90/10, more preferably from 20/80 to 60/40.

The solvent having a hydroxy group is preferably an alkylene glycol monoalkyl ether, and the solvent having no hydroxyl group is preferably an alkylene glycol monoalkyl ether carboxylate.

[5] (E) Hydrophobic Resin

The actinic ray-sensitive or radiation-sensitive resin composition of the present invention, particularly when applied to immersion exposure, may contain a hydrophobic resin having at least either a fluorine atom or a silicon atom (hereinafter sometimes referred to as "hydrophobic resin (E)" or simply as "resin (E)"). The hydrophobic resin (E) is unevenly distributed to the surface layer of the film and when the immersion medium is water, the static/dynamic contact angle on the resist film surface for water as well as the followability of the immersion liquid can be enhanced.

The hydrophobic resin (E) is, as described above, unevenly distributed to the interface but unlike a surfactant, need not have necessarily a hydrophilic group in the molecule and may not contribute to uniform mixing of polar/nonpolar substances.

The hydrophobic resin (E) typically contains a fluorine atom and/or a silicon atom. The fluorine atom and/or silicon atom in the hydrophobic resin (E) may be contained in the main chain of the resin or may be contained in the side chain.

In the case of containing a fluorine atom, the hydrophobic resin (E) is preferably a resin having a fluorine atom-containing alkyl group, a fluorine atom-containing cycloalkyl group or a fluorine atom-containing aryl group, as a fluorine atom-containing partial structure.

The fluorine atom-containing alkyl group (preferably having a carbon number of 1 to 10, more preferably a carbon number of 1 to 4) is a linear or branched alkyl group with at least one hydrogen atom being substituted for by a fluorine atom and may further have a substituent other than a fluorine atom.

The fluorine atom-containing cycloalkyl group is a monocyclic or polycyclic cycloalkyl group with at least one hydrogen atom being substituted for by a fluorine atom and may further have a substituent other than a fluorine atom.

The fluorine atom-containing aryl group is an aryl group (e.g., phenyl, naphthyl) with at least one hydrogen atom being substituted for by a fluorine atom and may further have a substituent other than a fluorine atom.

Preferred examples of the fluorine atom-containing alkyl group, fluorine atom-containing cycloalkyl group and fluorine atom-containing aryl group include groups represented by the following formulae (F2) to (F4), but the present invention is not limited thereto:

(F2)

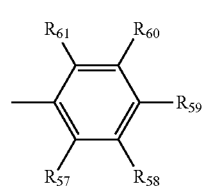

(F3)

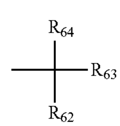

(F4)

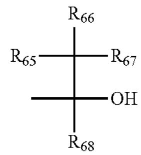

In formulae (F2) to (F4), each of $R_{57}$ to $R_{68}$ independently represents a hydrogen atom, a fluorine atom or an alkyl group (linear or branched), provided that at least one of $R_{57}$ to $R_{61}$, at least one of $R_{62}$ to $R_{64}$ and at least one of $R_{65}$ to $R_{68}$ are independently a fluorine atom or an alkyl group (preferably having a carbon number of 1 to 4) with at least one hydrogen atom being substituted for by a fluorine atom.

It is preferred that all of $R_{57}$ to $R_{61}$ and $R_{65}$ to $R_{67}$ are a fluorine atom. Each of $R_{62}$, $R_{63}$ and $R_{68}$ is preferably an alkyl group (preferably having a carbon number of 1 to 4) with at least one hydrogen atom being substituted for by a fluorine atom, more preferably a perfluoroalkyl group having a carbon number of 1 to 4. $R_{62}$ and $R_{63}$ may combine with each other to form a ring.

Specific examples of the group represented by formula (F2) include a p-fluorophenyl group, a pentafluorophenyl group, and a 3,5-di(trifluoromethyl)phenyl group.

Specific examples of the group represented by formula (F3) include a trifluoroethyl group, a pentafluoropropyl group, a pentafluoroethyl group, a heptafluorobutyl group, a hexafluoroisopropyl group, a heptafluoroisopropyl group, a hexafluoro(2-methyl)isopropyl group, a nonafluorobutyl group, an octafluoroisobutyl group, a nonafluorohexyl group, a nonafluoro-tert-butyl group, a perfluoroisopentyl group, a perfluorooctyl group, a perfluoro(trimethyl)hexyl group, a 2,2,3,3-tetrafluorocyclobutyl group, and a perfluorocyclohexyl group. A hexafluoroisopropyl group, a heptafluoroisopropyl group, a hexafluoro(2-methyl)isopropyl group, an octafluoroisobutyl group, a nonafluoro-tert-butyl group and a perfluoroisopentyl group are preferred, and a hexafluoroisopropyl group and a heptafluoroisopropyl group are more preferred.

Specific examples of the group represented by formula (F4) include —$C(CF_3)_2OH$, —$C(C_2F_5)_2OH$, —$C(CF_3)(CH_3)OH$ and —$CH(CF_3)OH$, with —$C(CF_3)_2OH$ being preferred.

The fluorine-containing partial structure may be directly bonded to the main chain or may be bonded to the main chain through a group selected from the group consisting of an alkylene group, a phenylene group, an ether bond, a thioether bond, a carbonyl group, an ester bond, an amide bond, a urethane bond and a ureylene bond, or a group formed by combining two or more thereof.

Preferred repeating units having a fluorine atom include those shown below.

(C-Ia)

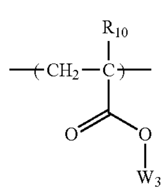

(C-Ib)

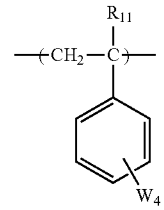

(C-Ic)

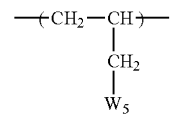

(C-Id)

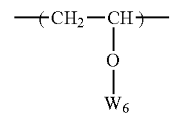

In the formulae, each of $R_{10}$ and $R_{11}$ independently represents a hydrogen atom, a fluorine atom or an alkyl group. The alkyl group is preferably a linear or branched alkyl group having a carbon number of 1 to 4 and may have a substituent. The alkyl group having a substituent includes a fluorinated alkyl group, among others.

Each of $W_3$ to $W_6$ independently represents an organic group having at least one or more fluorine atoms, and specific examples thereof include the atomic groups of (F2) to (F4).

In addition, the hydrophobic resin (E) may contain a unit shown below as the repeating unit having a fluorine atom.

(C-II)

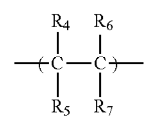

(C-III)

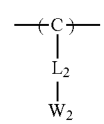

In the formulae, each of $R_4$ to $R_7$ independently represents a hydrogen atom, a fluorine atom or an alkyl group. The alkyl group is preferably a linear or branched alkyl group having a carbon number of 1 to 4 and may have a substituent, and the alkyl group having a substituent includes a fluorinated alkyl group, among others.

However, at least one of $R_4$ to $R_7$ represents a fluorine atom. A pair of $R_4$ and $R_5$ or a pair of $R_6$ and $R_7$ may form a ring.

$W_2$ represents an organic group containing at least one fluorine atom. Specific examples thereof include the atomic groups of (F2) to (F4).

$L_2$ represents a single bond or a divalent linking group. The divalent linking group is a substituted or unsubstituted arylene group, a substituted or unsubstituted alkylene group, a substituted or unsubstituted cycloalkylene group, —O—, —$SO_2$—, —CO—, —N(R)— (wherein R represents a hydrogen atom or an alkyl group), —$NHSO_2$—, or a divalent linking group formed by combining a plurality of these groups.

Q represents an alicyclic structure. The alicyclic structure may have a substituent and may be monocyclic or polycyclic, and in the case of a polycyclic structure, the structure may be crosslinked. The monocyclic structure is preferably a cycloalkyl group having a carbon number of 3 to 8, and examples thereof include a cyclopentyl group, a cyclohexyl group, a cyclobutyl group, and a cyclooctyl group. Examples of the polycyclic structure include a group having a bicyclo, tricyclo or tetracyclo structure having a carbon number of 5 or more. A cycloalkyl group having a carbon number of 6 to 20 is preferred, and examples thereof include an adamantyl group, a norbornyl group, a dicyclopentyl group, a tricyclodecanyl group, and a tetracyclododecyl group. Incidentally, a part of carbon atoms in the cycloalkyl group may be substituted with a heteroatom such as oxygen atom. In particular, Q is preferably, for example, a norbornyl group, a tricyclodecanyl group or a tetracyclododecyl group.

Specific examples of the repeating unit having a fluorine atom are illustrated below, but the present invention is not limited thereto.

In specific examples, $X_1$ represents a hydrogen atom, —$CH_3$, —F or —$CF_3$. $X_2$ represents —F or —$CF_3$.

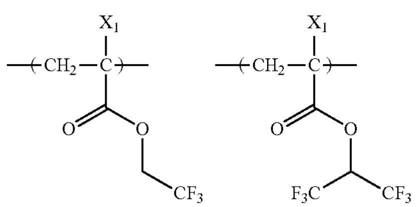

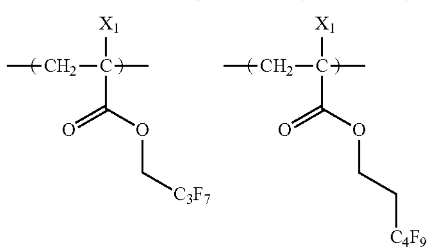

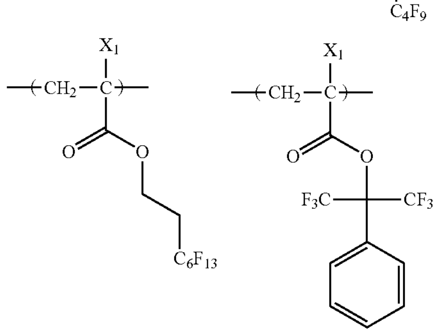

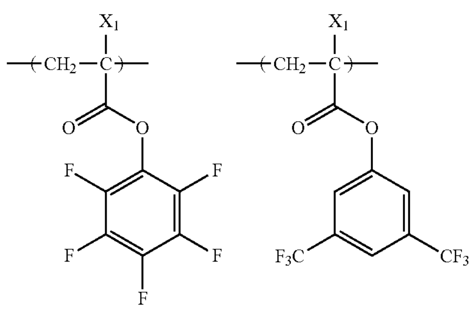

-continued

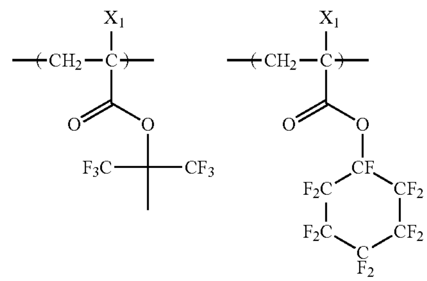

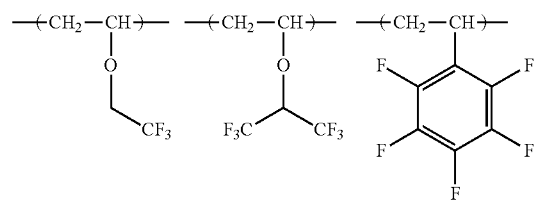

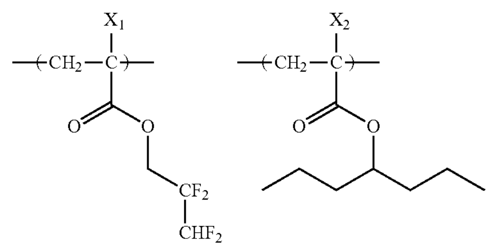

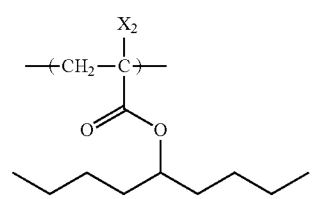

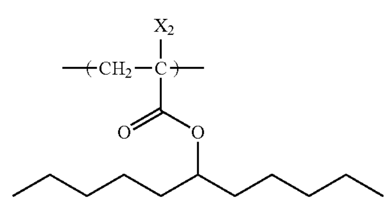

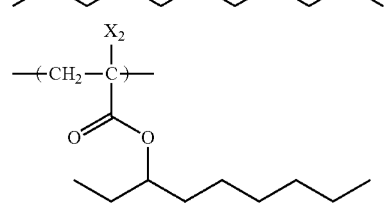

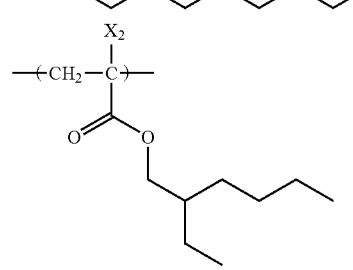

-continued

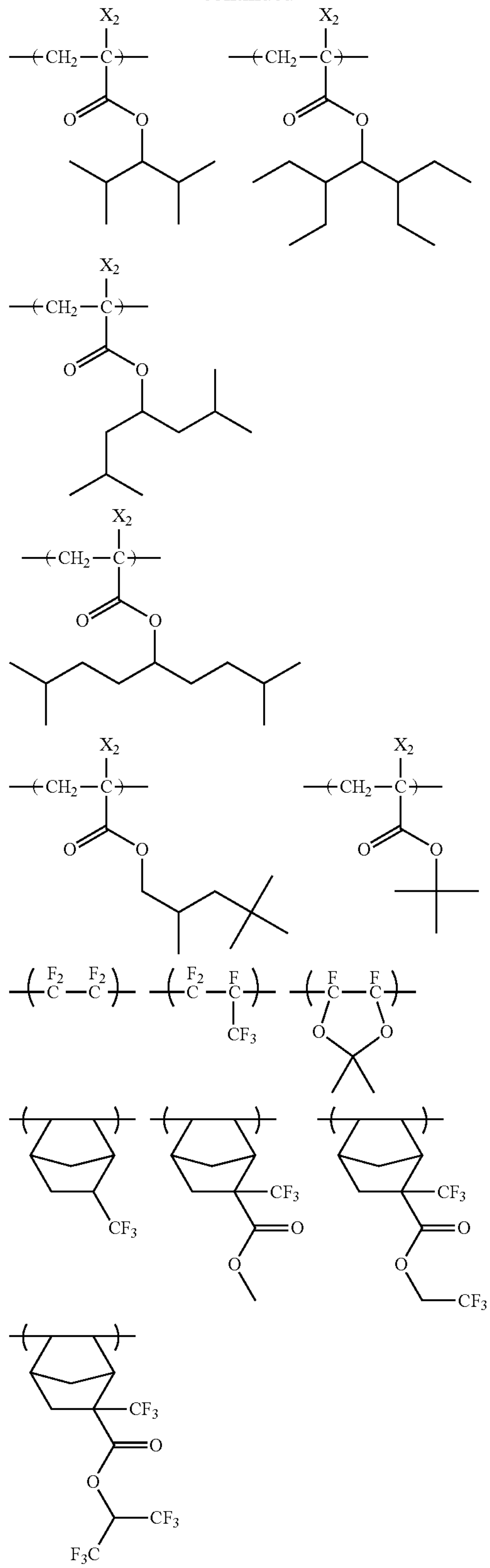

The hydrophobic resin (E) may contain a silicon atom. The resin is preferably a resin having an alkylsilyl structure (preferably a trialkylsilyl group) or a cyclic siloxane structure as a silicon atom-containing partial structure.

The alkylsilyl structure and cyclic siloxane structure specifically include, for example, the groups represented by the following formulae (CS-1) to (CS-3):

(CS-1)

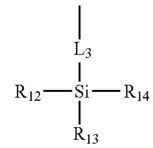

(CS-2)

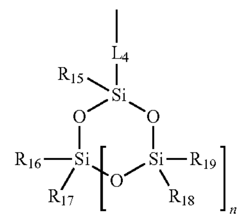

(CS-3)

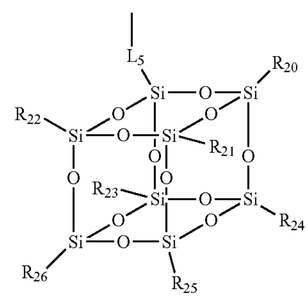

In formulae (CS-1) to (CS-3), each of $R_{12}$ to $R_{26}$ independently represents a linear or branched alkyl group (preferably having a carbon number of 1 to 20) or a cycloalkyl group (preferably having a carbon number of 3 to 20).

Each of $L_3$ to $L_5$ represents a single bond or a divalent linking group. The divalent linking group is a single member selected from the group consisting of an alkylene group, a phenylene group, an ether bond, a thioether bond, a carbonyl group, an ester bond, an amide bond, a urethane bond and a urea bond, or a combination of two or more thereof (preferably having a total carbon number of 12 or less).

n represents an integer of 1 to 5. n is preferably an integer of 2 to 4.

Specific examples of the repeating unit having a group represented by formulae (CS-1) to (CS-3) are illustrated below, but the present invention is not limited thereto. In specific examples, $X_1$ represents a hydrogen atom, —$CH_3$, —F or —$CF_3$.

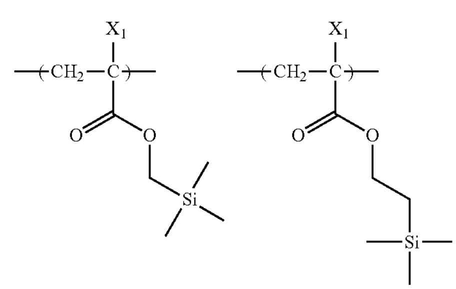

-continued

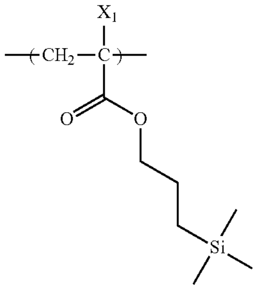

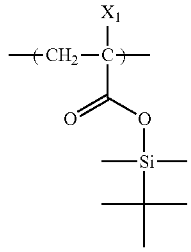

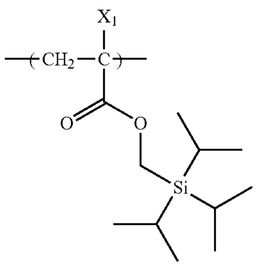

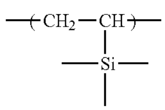

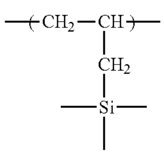

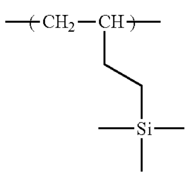

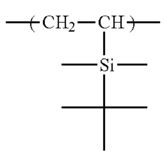

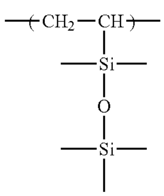

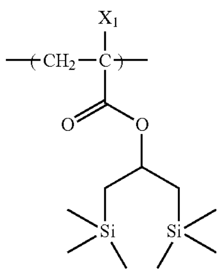

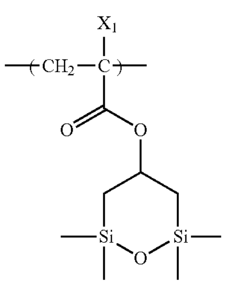

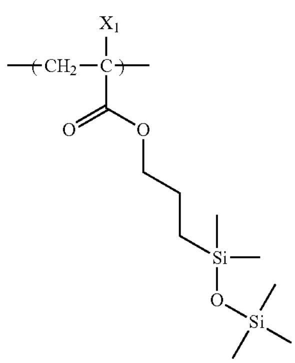

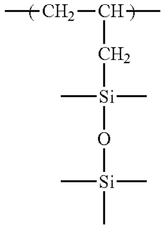

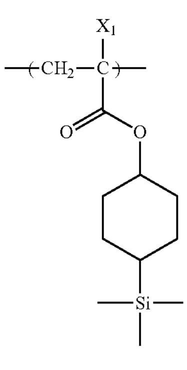

-continued

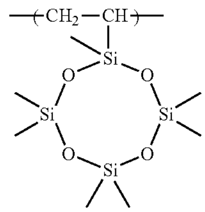

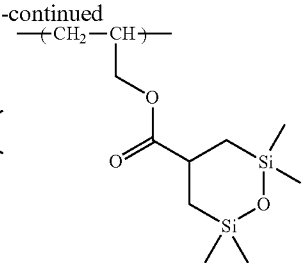

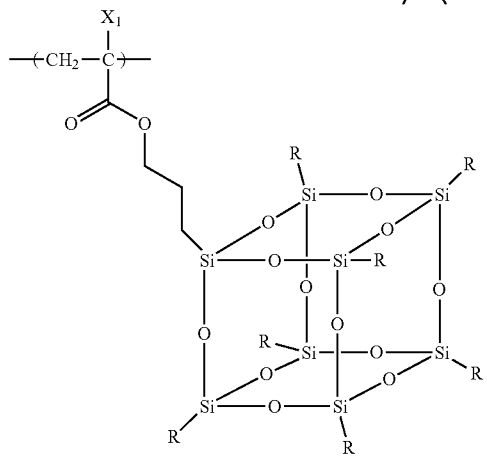

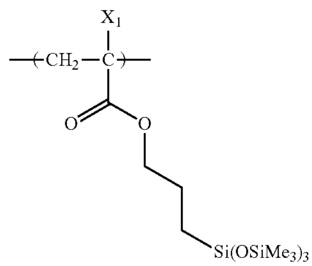

$R = CH_3, C_2H_5, C_3H_7, C_4H_9$

The hydrophobic resin (E) may further contain at least one group selected from the group consisting of the following (x) to (z):

(x) an acid group, (y) a lactone structure-containing group, an acid anhydride group, or an acid imide group, and (z) a group capable of decomposing by the action of an acid.

Examples of the (x) acid group include a phenolic hydroxyl group, a carboxylic acid group, a fluorinated alcohol group, a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group, and a tris(alkylsulfonyl)methylene group.

Preferred acid groups include a fluorinated alcohol group (preferably hexafluoroisopropanol group), a sulfonimide group and a bis(carbonyl)methylene group.

Examples of the repeating unit having (x) an acid group include a repeating unit where an acid group is directly bonded to the main chain of the resin, such as repeating unit by an acrylic acid or a methacrylic acid, and a repeating unit where an acid group is bonded to the main chain of the resin through a linking group. Furthermore, an acid group may be introduced into the terminal of the polymer chain by using an acid group-containing polymerization initiator or chain transfer agent at the polymerization. All of these cases are preferred. The repeating unit having (x) an acid group may have at least either a fluorine atom or a silicon atom.

The content of the repeating unit having (x) an acid group is preferably from 1 to 50 mol %, more preferably from 3 to 35 mol %, still more preferably from 5 to 20 mol %, based on all repeating units in the hydrophobic resin (E).

Specific examples of the repeating unit having (x) an acid group are illustrated below, but the present invention is not limited thereto. In the formulae, Rx represents a hydrogen atom, $CH_3$, $CF_3$ or $CH_2OH$.

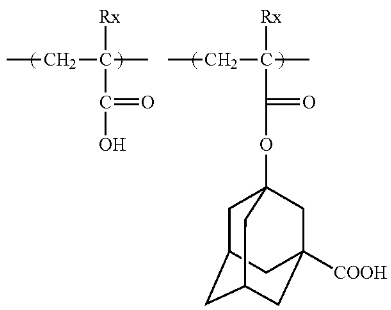

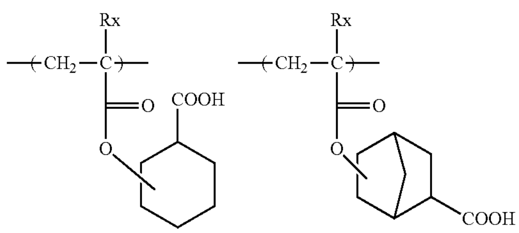

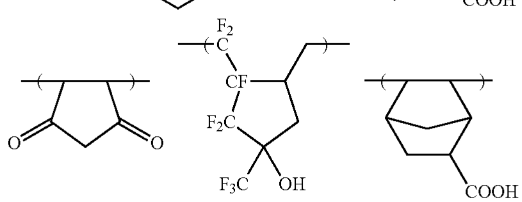

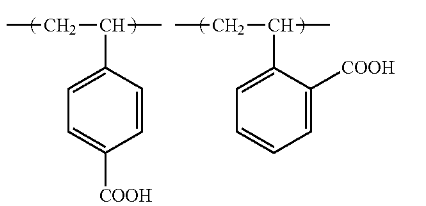

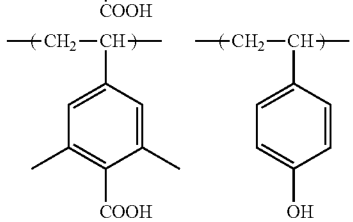

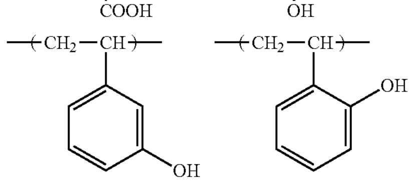

-continued

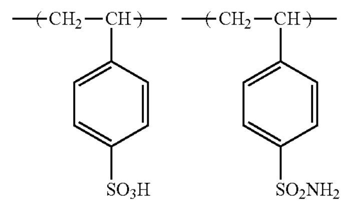

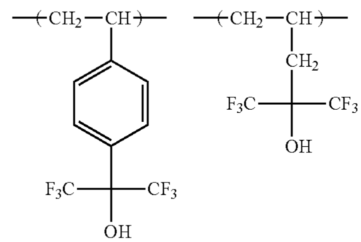

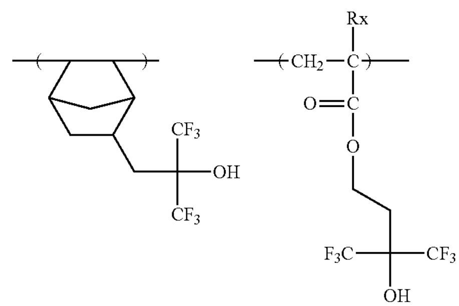

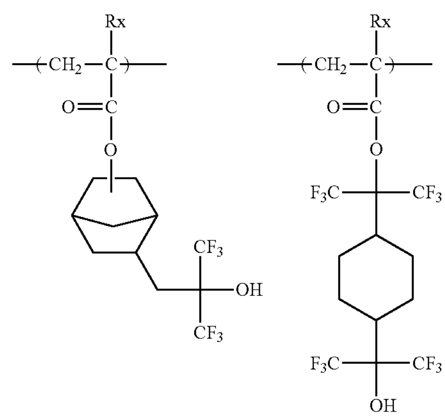

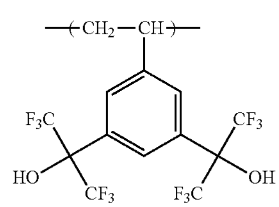

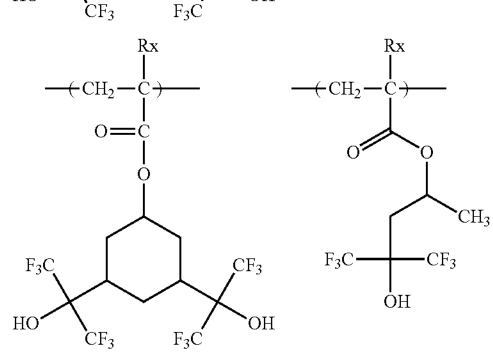

-continued

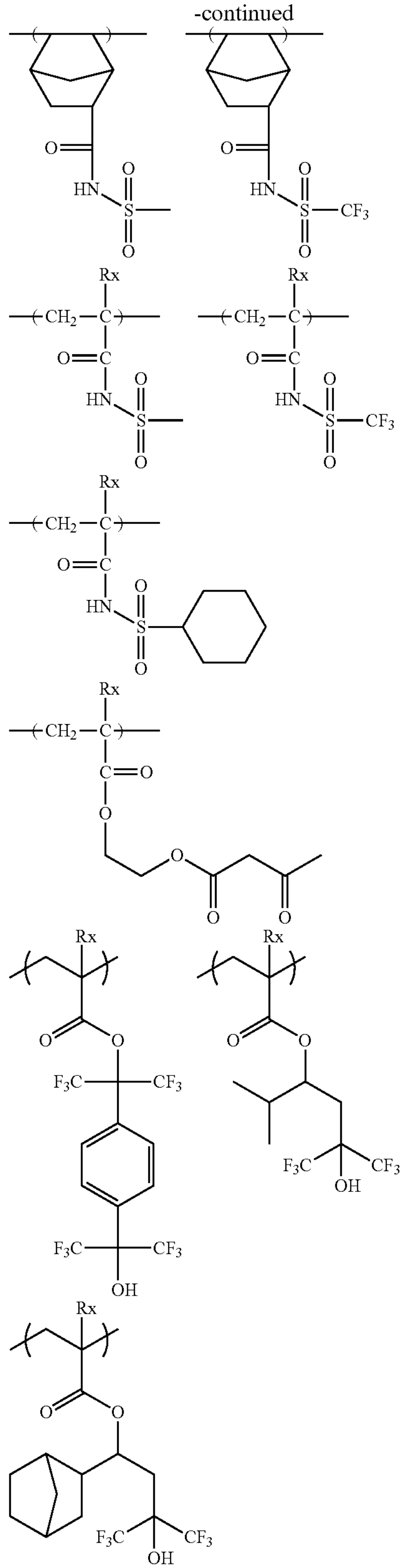

The (y) lactone structure-containing group, acid anhydride group or acid imide group is preferably a lactone structure-containing group.

The repeating unit having such a group is a repeating unit where the group is directly bonded to the main chain of the resin, such as repeating unit by an acrylic acid ester or a methacrylic acid ester. This repeating unit may be also a repeating unit where the group is bonded to the main chain of the resin through a linking group. Alternatively, in this repeating unit, the group may be introduced into the terminal of the resin by using a polymerization initiator or chain transfer agent containing the group at the polymerization.

Examples of the repeating unit having a lactone structure-containing group are the same as those of the repeating unit having a lactone structure described above in the paragraph of the acid-decomposable resin (A).

The content of the repeating unit having a lactone structure-containing group, an acid anhydride group or an acid imide group is preferably from 1 to 100 mol %, more preferably from 3 to 98 mol %, still more preferably from 5 to 95 mol %, based on all repeating units in the hydrophobic resin.

Examples of the repeating unit having (z) a group capable of decomposing by the action of an acid, which is contained in the hydrophobic resin (E), are the same as those of the repeating unit having an acid-decomposable group described for the resin (A). The repeating unit having (z) a group capable of decomposing by the action of an acid may contain at least either a fluorine atom or a silicon atom. The content of the repeating unit having (z) a group capable of decomposing by the action of an acid, in the hydrophobic resin (E), is preferably from 1 to 80 mol %, more preferably from 10 to 80 mol %, still more preferably from 20 to 60 mol %, based on all repeating units in the resin (E).

The hydrophobic resin (E) may further contain a repeating unit represented by the following formula (III):

(III)

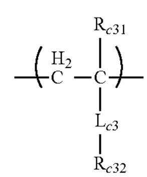

In formula (III), $R_{c31}$ represents a hydrogen atom, an alkyl group (which may be substituted with a fluorine atom or the like), a cyano group, or a —$CH_2$—O-$Rac_2$ group, wherein $Rac_2$ represents a hydrogen atom, an alkyl group or an acyl group. $R_{c31}$ is preferably a hydrogen atom, a methyl group, a hydroxymethyl group or a trifluoromethyl group, more preferably a hydrogen atom or a methyl group.

$R_{c32}$ represents a group having an alkyl group, a cycloalkyl group, an alkenyl group, a cycloalkenyl group or an aryl group. These groups may be substituted with a fluorine atom or a silicon atom-containing group.

$L_{c3}$ represents a single bond or a divalent linking group.

In formula (III), the alkyl group of $R_{c32}$ is preferably a linear or branched alkyl group having a carbon number of 3 to 20.

The cycloalkyl group is preferably a cycloalkyl group having a carbon number of 3 to 20.

The alkenyl group is preferably an alkenyl group having a carbon number of 3 to 20.

The cycloalkenyl group is preferably a cycloalkenyl group having a carbon number of 3 to 20.

The aryl group is preferably an aryl group having a carbon number of 6 to 20, more preferably a phenyl group or a naphthyl group, and these groups may have a substituent.

$R_{c32}$ is preferably an unsubstituted alkyl group or an alkyl group substituted with a fluorine atom.

The divalent linking group of $L_{c3}$ is preferably an alkylene group (preferably having a carbon number of 1 to 5), an ether bond, a phenylene group or an ester bond (a group represented by —COO—).

The content of the repeating unit represented by formula (III) is preferably from 1 to 100 mol %, more preferably from 10 to 90 mol %, still more preferably from 30 to 70 mol %, based on all repeating units in the hydrophobic resin.

It is also preferred that the hydrophobic resin (E) further contains a repeating unit represented by the following formula (CII-AB):

(CII-AB)

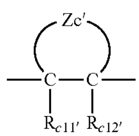

In formula (CII-AB), each of $R_{c11}$' and $R_{c12}$' independently represents a hydrogen atom, a cyano group, a halogen atom or an alkyl group.

$Z_c$' represents an atomic group for forming an alicyclic structure containing two (C—C) to which bonded.

The content of the repeating unit represented by formula (CII-AB) is preferably from 1 to 100 mol %, more preferably from 10 to 90 mol %, still more preferably from 30 to 70 mol %, based on all repeating units in the hydrophobic resin.

Specific examples of the repeating units represented by formulae (III) and (CII-AB) are illustrated below, but the present invention is not limited thereto. In the formulae, Ra represents H, $CH_3$, $CH_2OH$, $CF_3$ or CN.

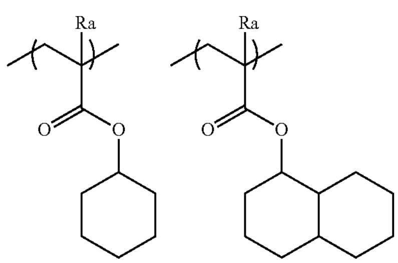

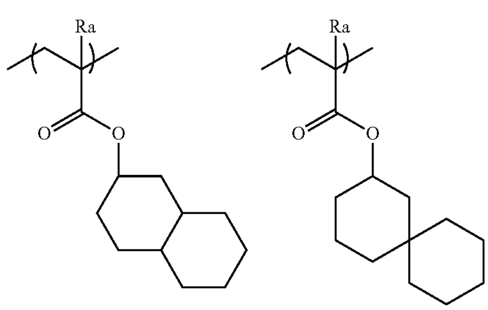

-continued

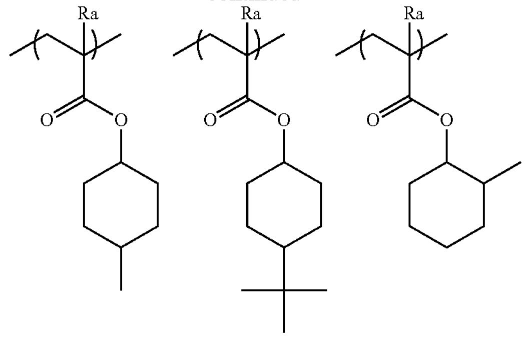

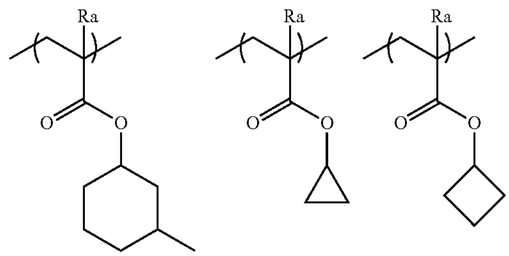

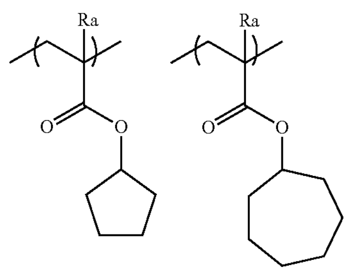

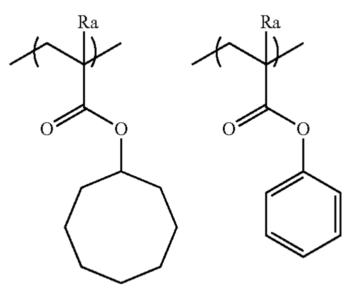

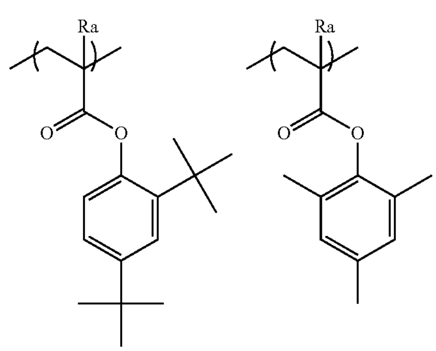

-continued

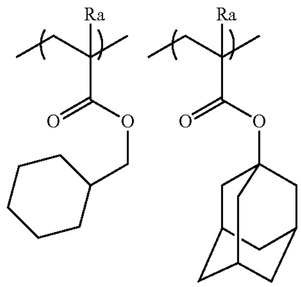

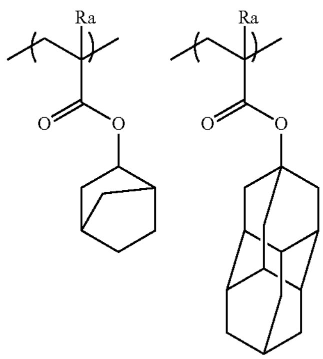

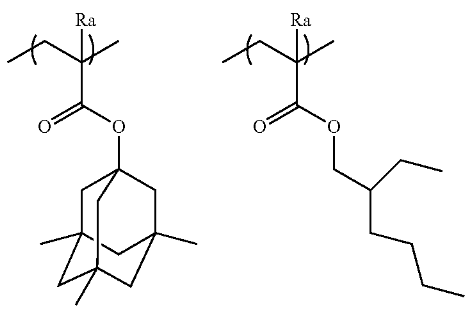

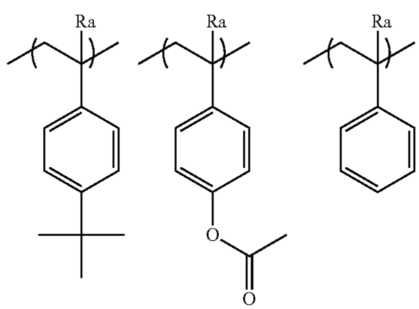

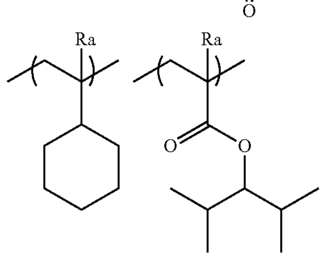

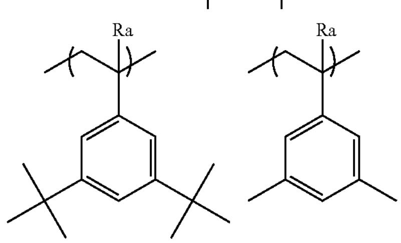

-continued

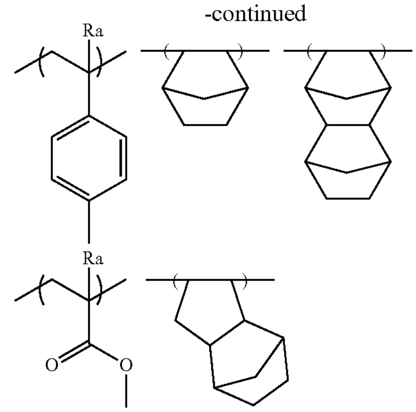

In the case where the hydrophobic resin (E) contains a fluorine atom, the fluorine atom content is preferably from 5 to 80 mass %, more preferably from 10 to 80 mass %, based on the weight average molecular weight of the hydrophobic resin (E). Also, the fluorine atom-containing repeating unit preferably accounts for 10 to 100 mol %, more preferably from 30 to 100 mol %, based on all repeating units contained in the hydrophobic resin (E).

In the case where the hydrophobic resin (E) contains a silicon atom, the silicon atom content is preferably from 2 to 50 mass %, more preferably from 2 to 30 mass %, based on the weight average molecular weight of the hydrophobic resin (E). Also, the silicon atom-containing repeating unit preferably accounts for 10 to 100 mol %, more preferably from 20 to 100 mol %, based on all repeating units contained in the hydrophobic resin (E).

The weight average molecular weight of the hydrophobic resin (E) is preferably from 1,000 to 100,000, more preferably from 1,000 to 50,000, still more preferably from 2,000 to 15,000, in terms of standard polystyrene.

As for the hydrophobic resin (E), one kind of a resin may be used, or a plurality of kinds of resins may be used in combination.

The content of the hydrophobic resin (E) in the composition is preferably from 0.01 to 10 mass %, more preferably from 0.05 to 8 mass %, still more preferably from 0.1 to 5 mass %, based on the total solid content in the composition of the present invention.

In the hydrophobic resin (E), similarly to the resin (A), it is of course preferred that the content of impurities such as metal is small, and the content of residual monomers or oligomer components is also preferably from 0.01 to 5 mass %, more preferably from 0.01 to 3 mass %, still more preferably from 0.05 to 1 mass %. When these conditions are satisfied, an actinic ray-sensitive or radiation-sensitive resin composition free from extraneous substances in liquid or changes with aging of sensitivity or the like can be obtained. Furthermore, in view of resolution, resist profile, sidewall of resist pattern, roughness and the like, the molecular weight distribution (Mw/Mn, sometimes referred to as "polydispersity") is preferably from 1 to 5, more preferably from 1 to 3, still more preferably from 1 to 2.

As the hydrophobic resin (E), various commercially available products may be utilized, or the resin may be synthesized by a conventional method (for example, radical polymerization). Examples of the general synthesis method include a batch polymerization method of dissolving monomer species and an initiator in a solvent and heating the solution, thereby effecting the polymerization, and a dropping polymerization method of adding dropwise a solution containing monomer species and an initiator to a heated solvent over 1 to 10 hours. A dropping polymerization method is preferred.

The reaction solvent, the polymerization initiator, the reaction conditions (e.g., temperature, concentration) and the purification method after reaction are the same as those described for the resin (A), but in the synthesis of the hydrophobic resin (E), the reaction concentration is preferably from 30 to 50 mass %.

Specific examples of the hydrophobic resin (E) are illustrated below. Also, the molar ratio of repeating units (corresponding to repeating units starting from the left), weight average molecular weight and polydispersity of each resin are shown in Tables later.

(HR-1)

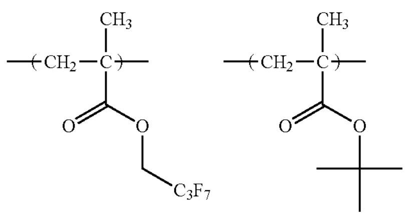

(HR-2)

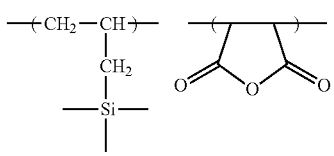

(HR-3)

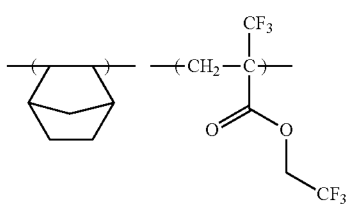

(HR-4)

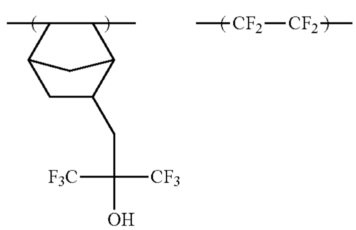

(HR-5)

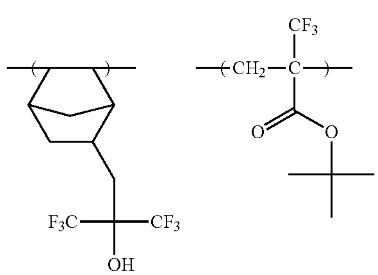

-continued (HR-6)

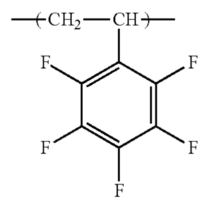

(HR-7)

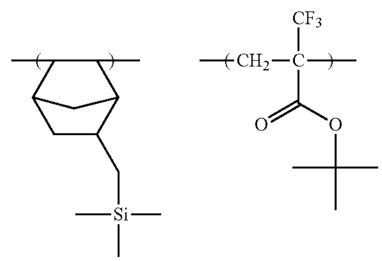

(HR-8)

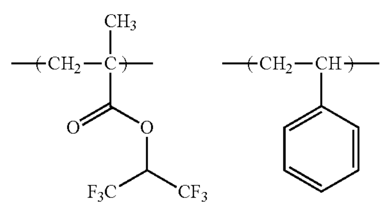

(HR-9)

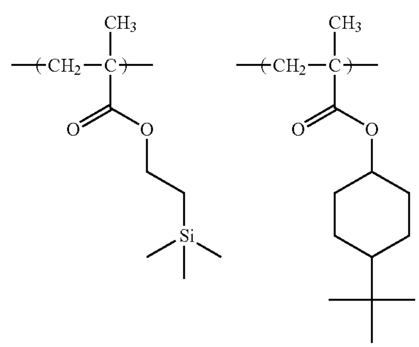

(HR-10)

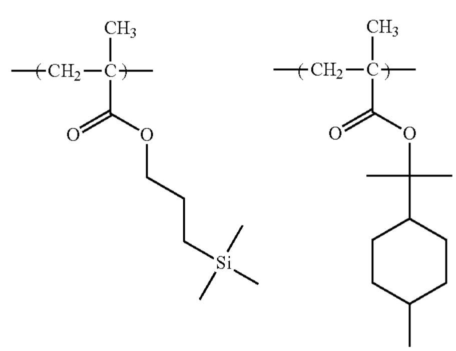

-continued
(HR-11)
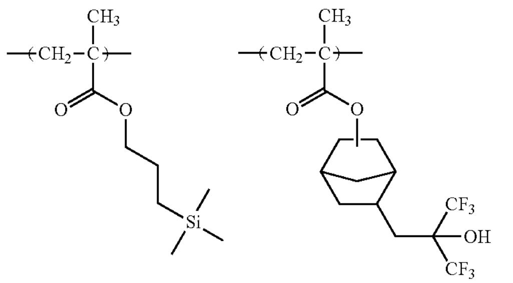
(HR-12)
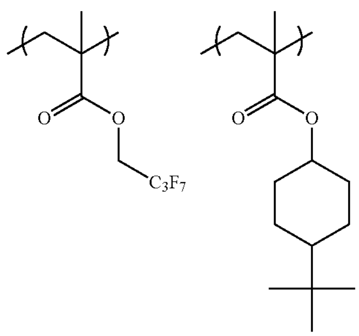
(HR-13)
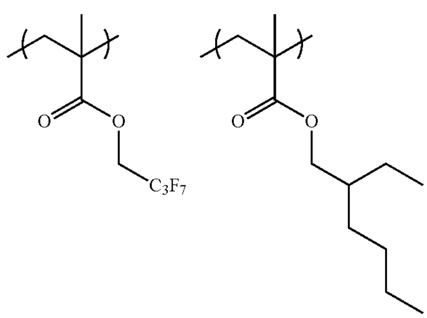
(HR-14)
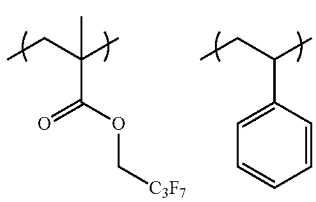
(HR-15)
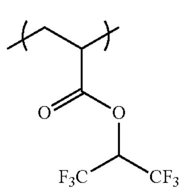
(HR-16)
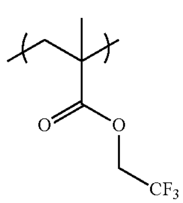
-continued
(HR-17)
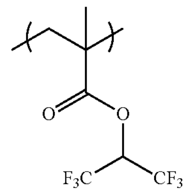
(HR-18)
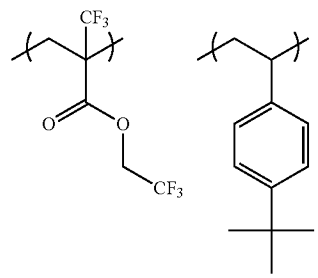
(HR-19)
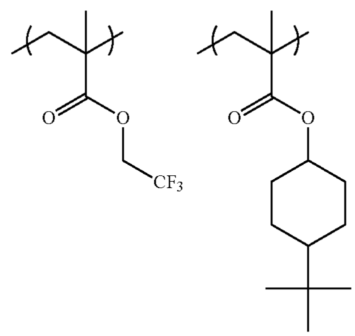
(HR-20)
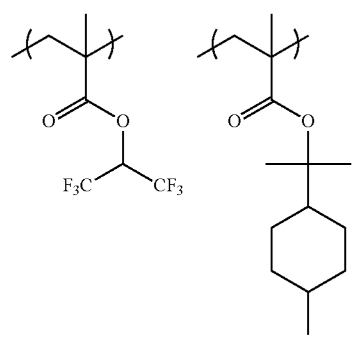
(HR-21)
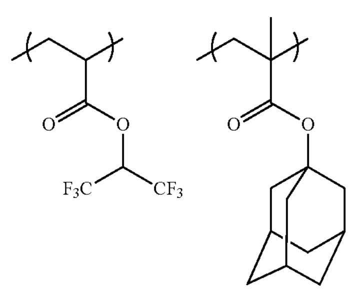
(HR-22)
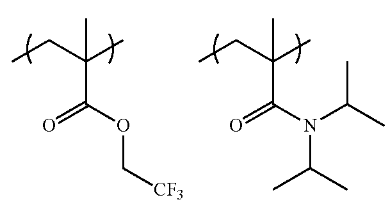

-continued
(HR-23)
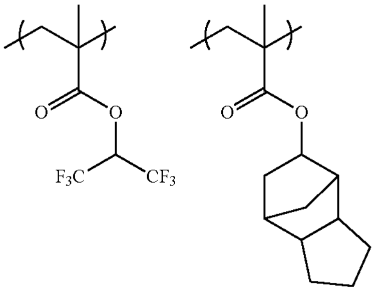
(HR-24)
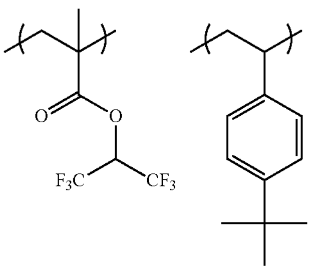
(HR-25)
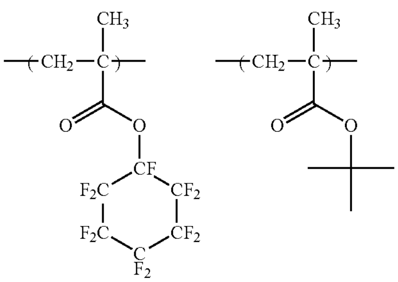
(HR-26)
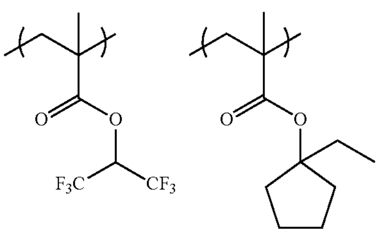
(HR-27)
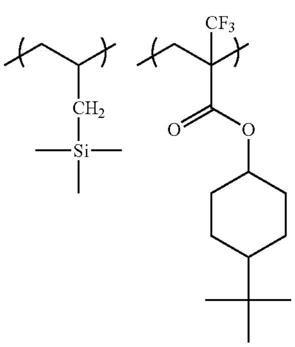
(HR-28)
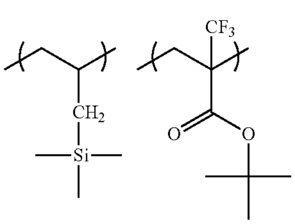
-continued
(HR-29)
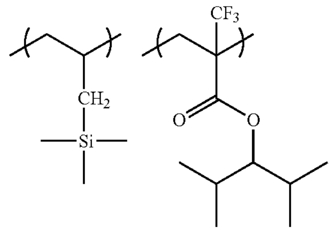
(HR-30)
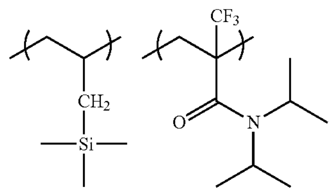
(HR-31)
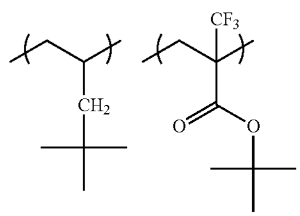
(HR-32)
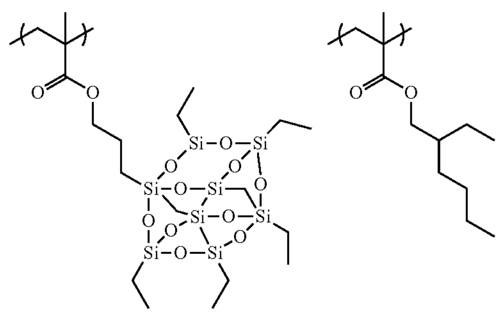
(HR-33)
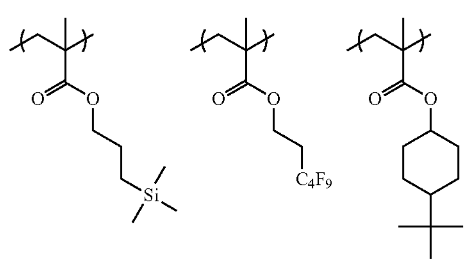
(HR-34)
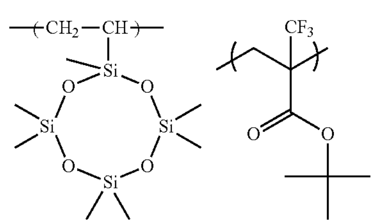

-continued
(HR-35)
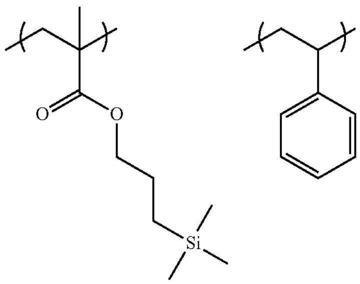
(HR-36)
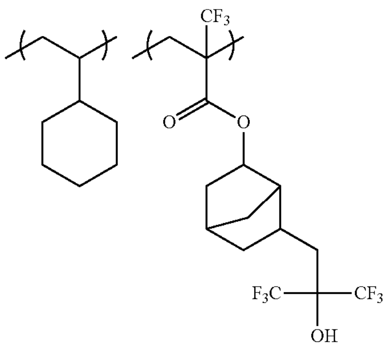
(HR-37)
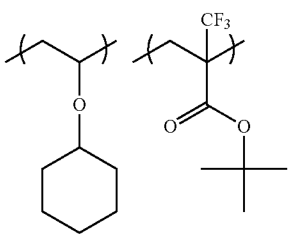
(HR-38)
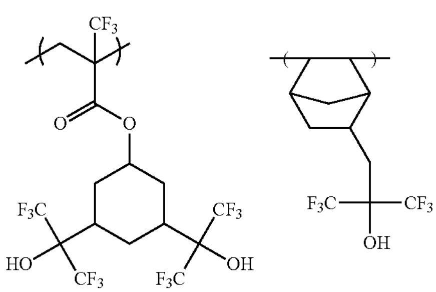
(HR-39)
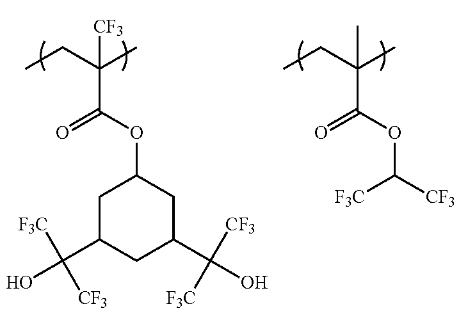
-continued
(HR-40)
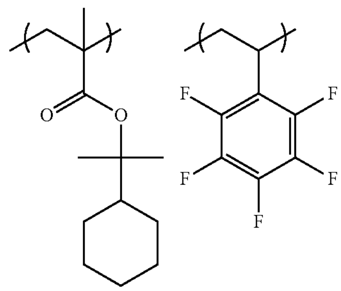
(HR-41)
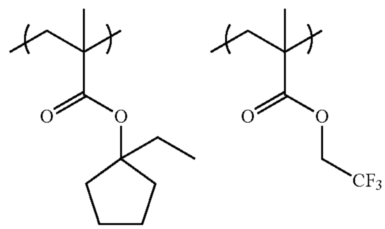
(HR-42)
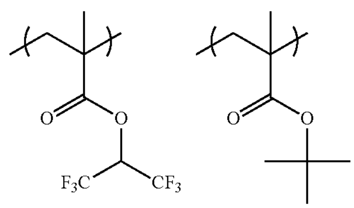
(HR-43)
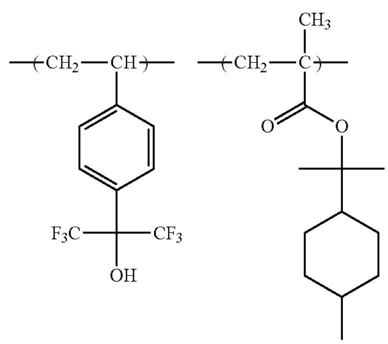
(HR-44)
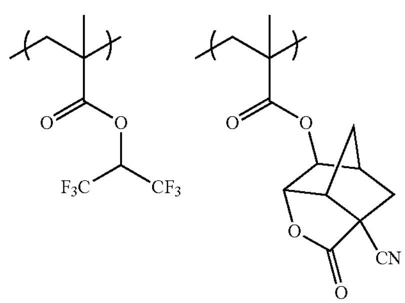
(HR-45)
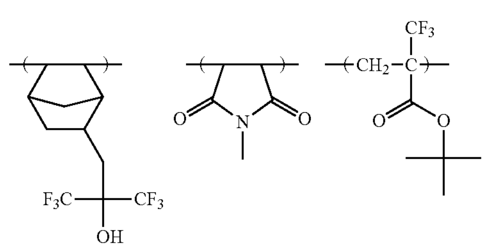

-continued
(HR-46)
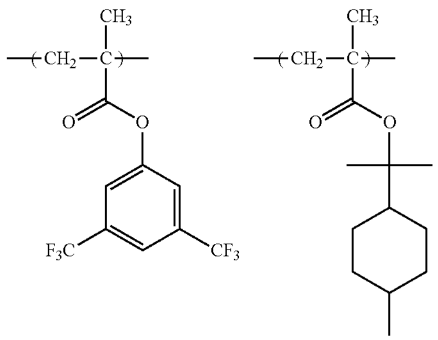
(HR-47)
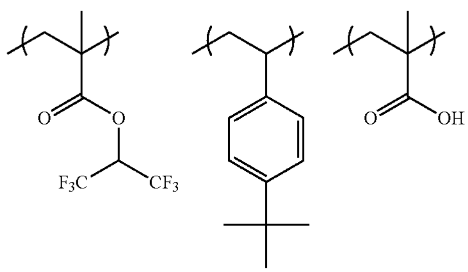
(HR-48)
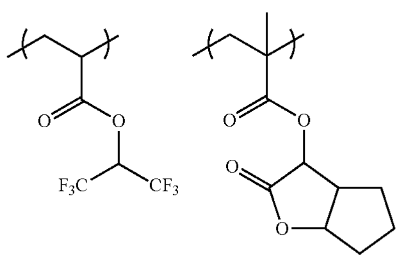
(HR-49)
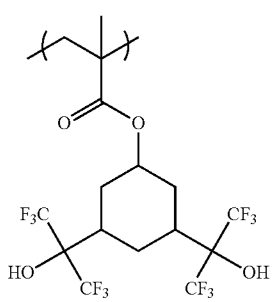
(HR-50)
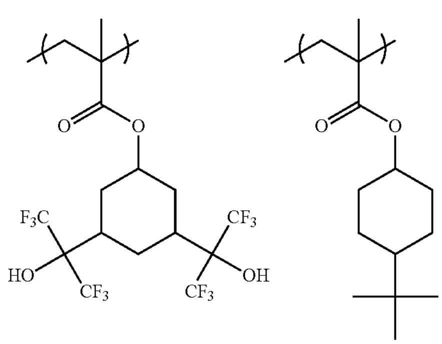
-continued
(HR-51)
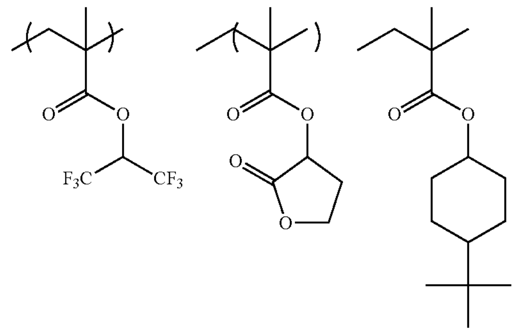
(HR-52)
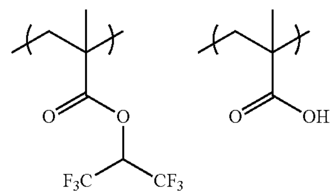
(HR-53)
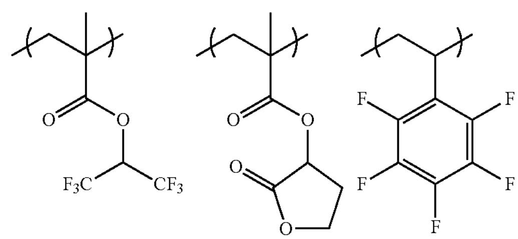
(HR-54)
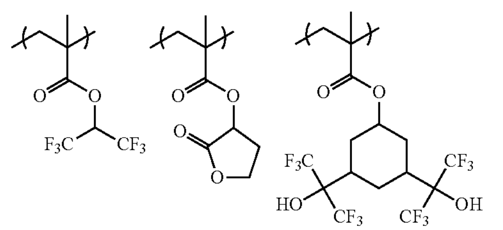
(HR-55)
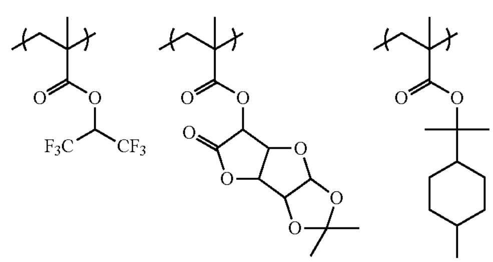
(HR-56)
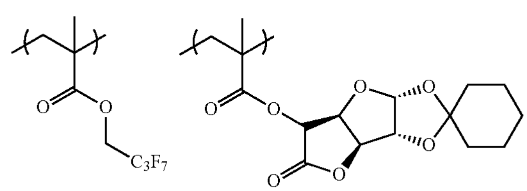

(HR-57)
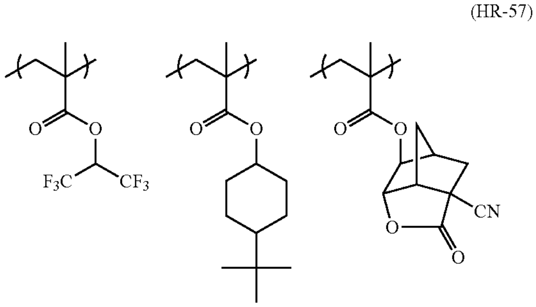
(HR-58)
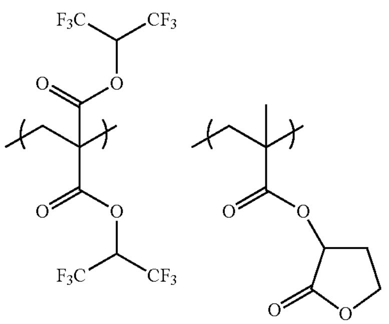
(HR-59)
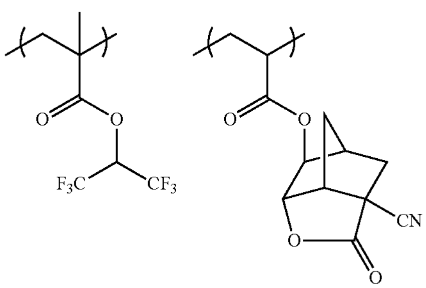
(HR-60)
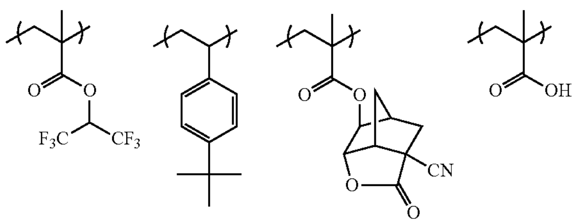
(HR-61)
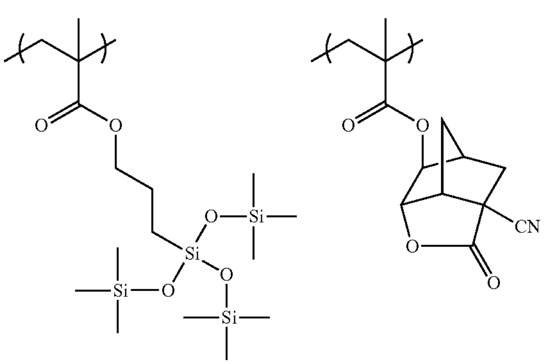
(HR-62)
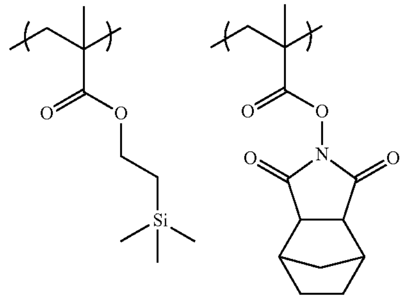
(HR-63)
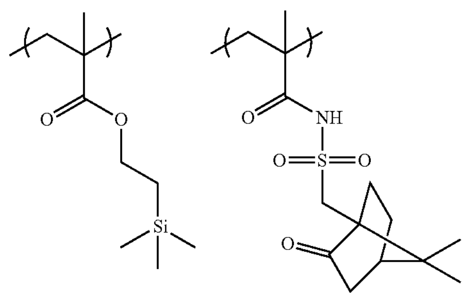
(HR-64)
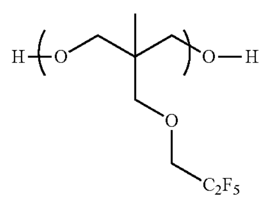
(HR-65)
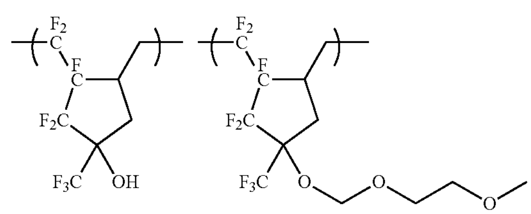
(HR-66)
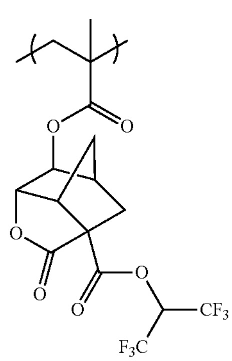

-continued
(HR-67)
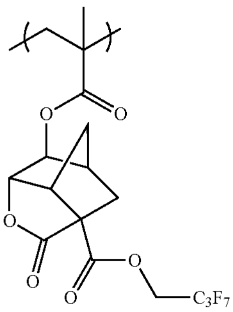
(HR-68)
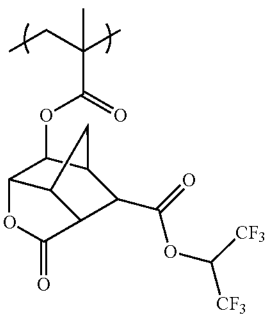
(HR-69)
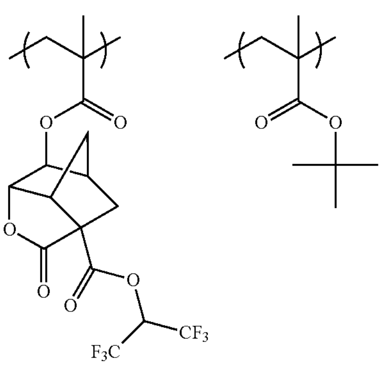
(HR-70)
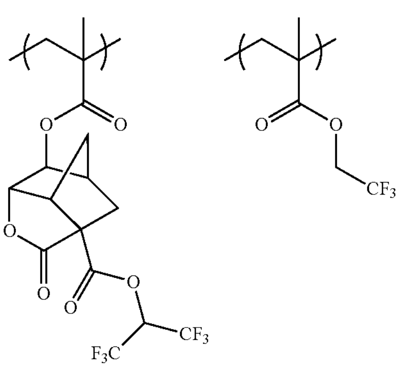
-continued
(HR-71)
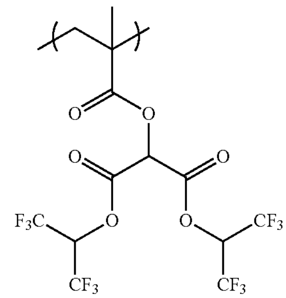
(HR-72)
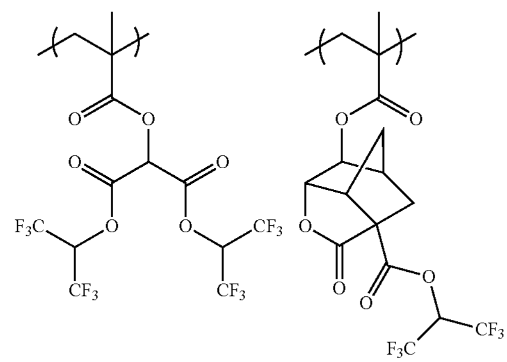
(HR-73)
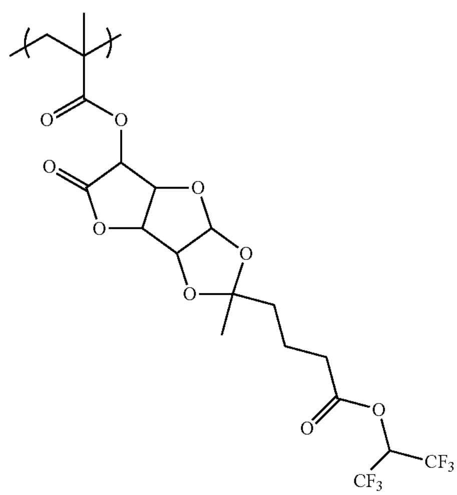
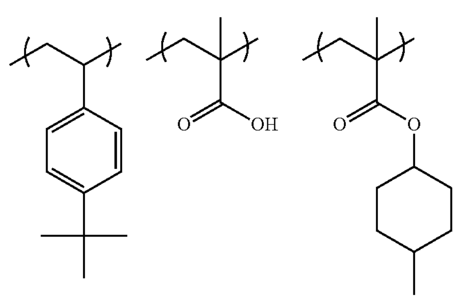

-continued
(HR-74)
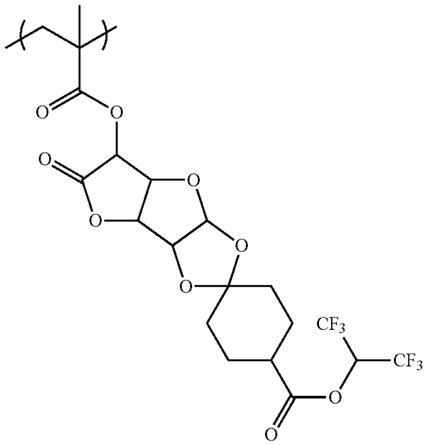
(HR-75)
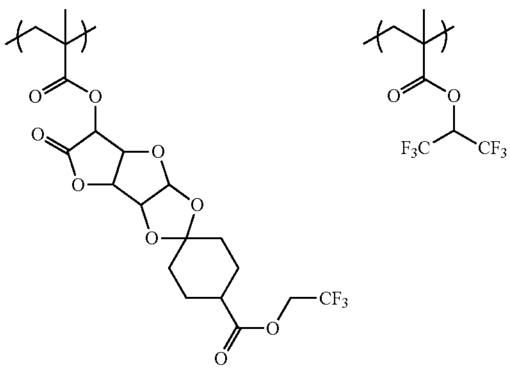
(HR-76)
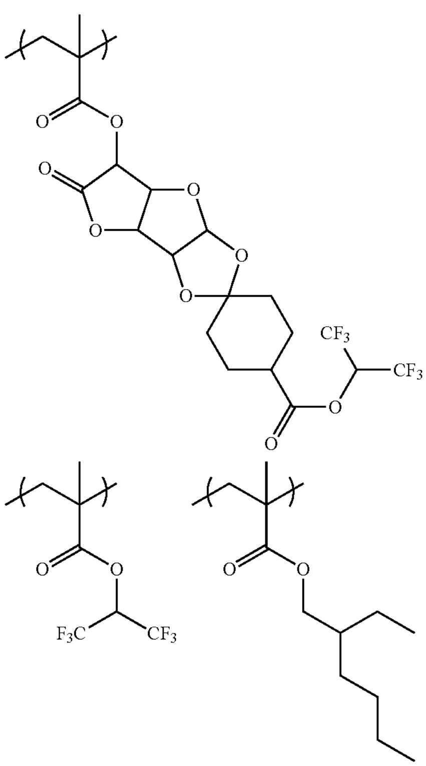
-continued
(HR-77)
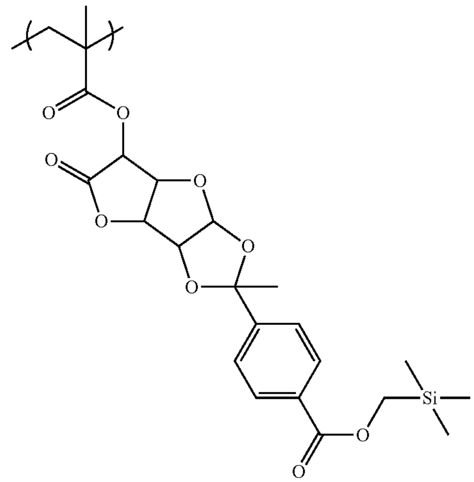
(HR-78)
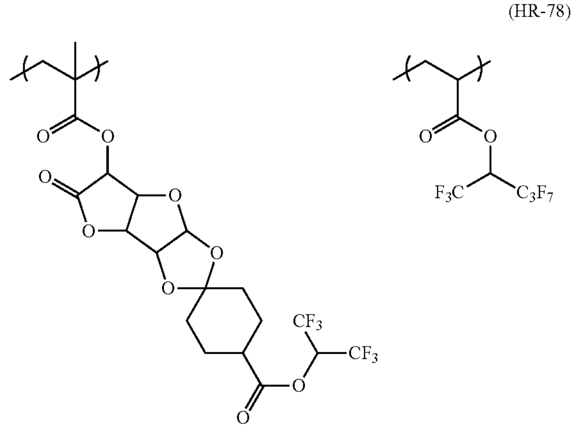
(HR-79)
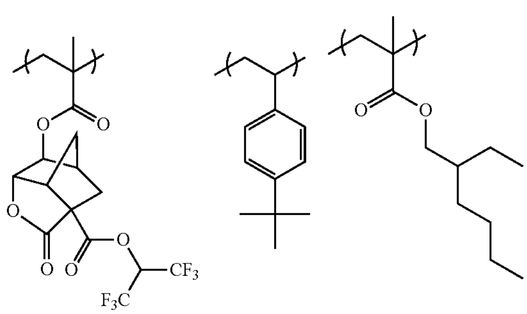
(HR-80)
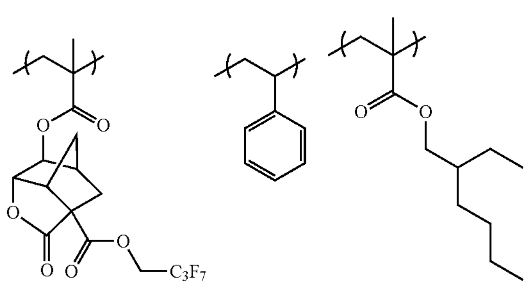

-continued
(HR-81)
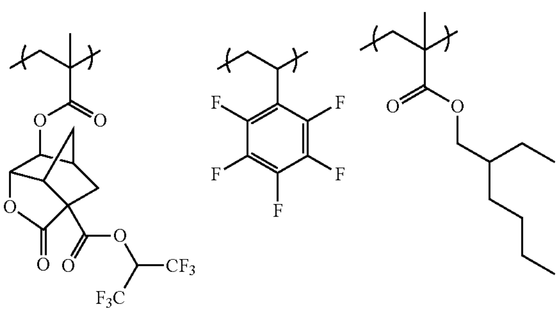
(HR-82)
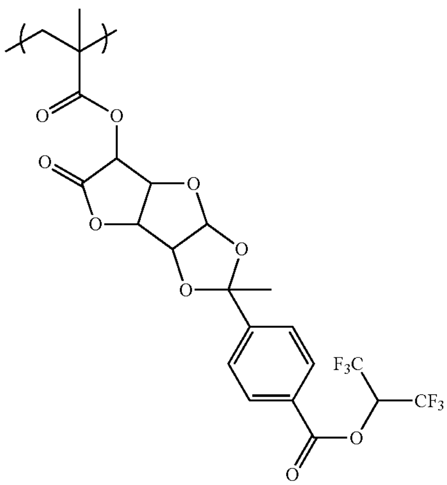
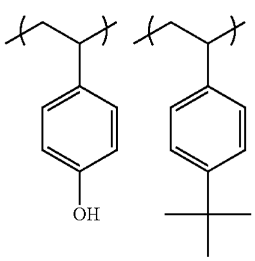
(HR-83)
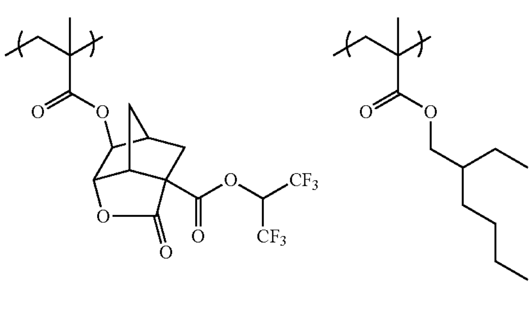
-continued
(HR-84)
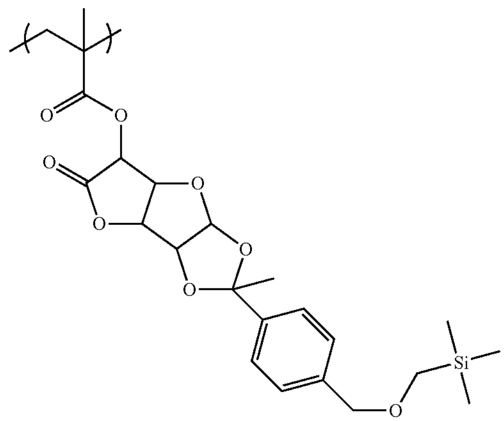
(HR-85)
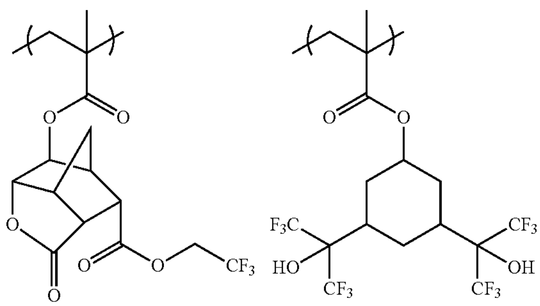
(HR-86)
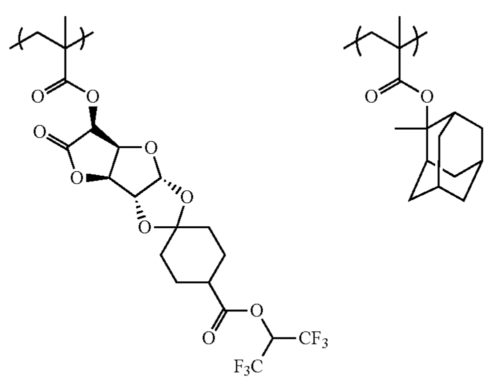
(HR-87)
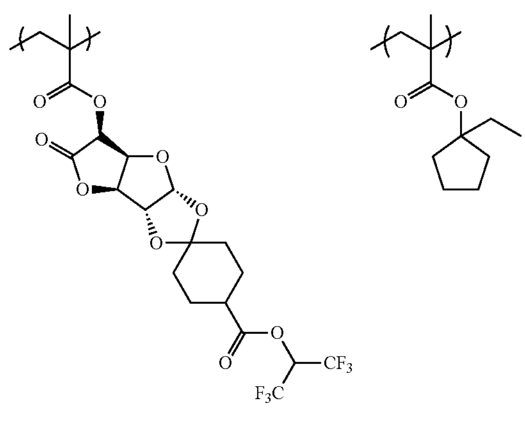

-continued (HR-88)

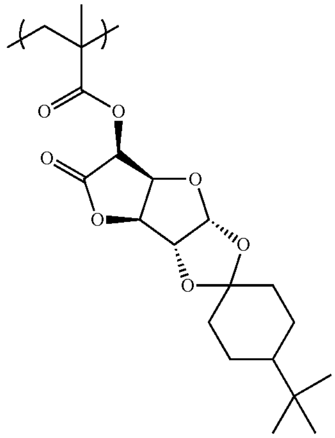

(HR-89)

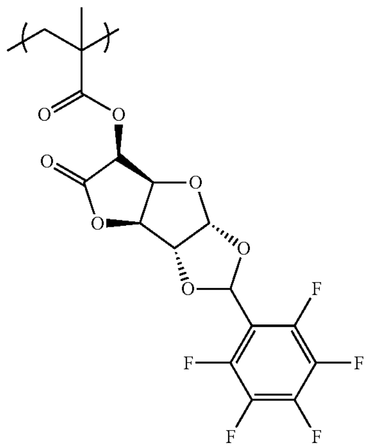

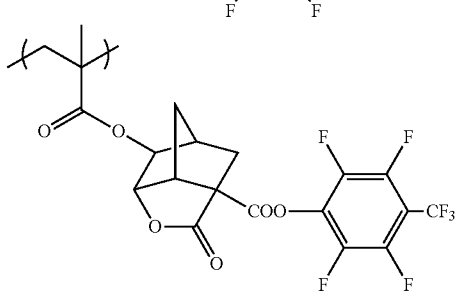

(HR-90)

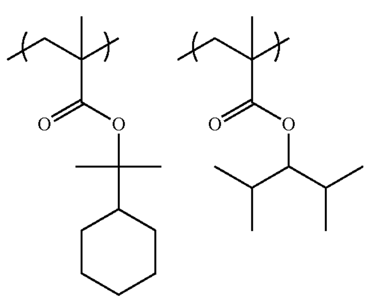

TABLE 1

| Resin | Composition | Mw | Mw/Mn |
|---|---|---|---|
| HR-1 | 50/50 | 4900 | 1.4 |
| HR-2 | 50/50 | 5100 | 1.6 |
| HR-3 | 50/50 | 4800 | 1.5 |

TABLE 1-continued

| Resin | Composition | Mw | Mw/Mn |
|---|---|---|---|
| HR-4 | 50/50 | 5300 | 1.6 |
| HR-5 | 50/50 | 4500 | 1.4 |
| HR-6 | 100 | 5500 | 1.6 |
| HR-7 | 50/50 | 5800 | 1.9 |
| HR-8 | 50/50 | 4200 | 1.3 |
| HR-9 | 50/50 | 5500 | 1.8 |
| HR-10 | 40/60 | 7500 | 1.6 |
| HR-11 | 70/30 | 6600 | 1.8 |
| HR-12 | 40/60 | 3900 | 1.3 |
| HR-13 | 50/50 | 9500 | 1.8 |
| HR-14 | 50/50 | 5300 | 1.6 |
| HR-15 | 100 | 6200 | 1.2 |
| HR-16 | 100 | 5600 | 1.6 |
| HR-17 | 100 | 4400 | 1.3 |
| HR-18 | 50/50 | 4300 | 1.3 |
| HR-19 | 50/50 | 6500 | 1.6 |
| HR-20 | 30/70 | 6500 | 1.5 |
| HR-21 | 50/50 | 6000 | 1.6 |
| HR-22 | 50/50 | 3000 | 1.2 |
| HR-23 | 50/50 | 5000 | 1.5 |
| HR-24 | 50/50 | 4500 | 1.4 |
| HR-25 | 30/70 | 5000 | 1.4 |
| HR-26 | 50/50 | 5500 | 1.6 |
| HR-27 | 50/50 | 3500 | 1.3 |
| HR-28 | 50/50 | 6200 | 1.4 |
| HR-29 | 50/50 | 6500 | 1.6 |
| HR-30 | 50/50 | 6500 | 1.6 |
| HR-31 | 50/50 | 4500 | 1.4 |
| HR-32 | 30/70 | 5000 | 1.6 |
| HR-33 | 30/30/40 | 6500 | 1.8 |
| HR-34 | 50/50 | 4000 | 1.3 |
| HR-35 | 50/50 | 6500 | 1.7 |
| HR-36 | 50/50 | 6000 | 1.5 |
| HR-37 | 50/50 | 5000 | 1.6 |
| HR-38 | 50/50 | 4000 | 1.4 |
| HR-39 | 20/80 | 6000 | 1.4 |
| HR-40 | 50/50 | 7000 | 1.4 |
| HR-41 | 50/50 | 6500 | 1.6 |
| HR-42 | 50/50 | 5200 | 1.6 |
| HR-43 | 50/50 | 6000 | 1.4 |
| HR-44 | 70/30 | 5500 | 1.6 |
| HR-45 | 50/20/30 | 4200 | 1.4 |
| HR-46 | 30/70 | 7500 | 1.6 |
| HR-47 | 40/58/2 | 4300 | L4 |
| HR-48 | 50/50 | 6800 | 1.6 |
| HR-49 | 100 | 6500 | 1.5 |
| HR-50 | 50/50 | 6600 | 1.6 |
| HR-51 | 30/20/50 | 6800 | 1.7 |
| HR-52 | 95/5 | 5900 | 1.6 |
| HR-53 | 40/30/30 | 4500 | 1.3 |
| HR-54 | 50/30/20 | 6500 | 1.8 |
| HR-55 | 30/40/30 | 7000 | 1.5 |
| HR-56 | 60/40 | 5500 | 1.7 |
| HR-57 | 40/40/20 | 4000 | 1.3 |
| HR-58 | 60/40 | 3800 | 1.4 |
| HR-59 | 80/20 | 7400 | 1.6 |
| HR-60 | 40/40/15/5 | 4800 | 1.5 |
| HR-61 | 60/40 | 5600 | 1.5 |
| HR-62 | 50/50 | 5900 | 2.1 |
| HR-63 | 80/20 | 7000 | 1.7 |
| HR-64 | 100 | 5500 | 1.8 |
| HR-65 | 50/50 | 9500 | 1.9 |

TABLE 2

| Resin | Composition | Mw | Mw/Mn |
|---|---|---|---|
| HR-66 | 100 | 6000 | 1.5 |
| HR-67 | 100 | 6000 | 1.4 |
| HR-68 | 100 | 9000 | 1.5 |
| HR-69 | 60/40 | 8000 | 1.3 |
| HR-70 | 80/20 | 5000 | 1.4 |
| HR-71 | 100 | 9500 | 1.5 |
| HR-72 | 40/60 | 8000 | 1.4 |
| HR-73 | 55/30/5/10 | 8000 | 1.3 |

TABLE 2-continued

| Resin | Composition | Mw | Mw/Mn |
|---|---|---|---|
| HR-74 | 100 | 13000 | 1.4 |
| HR-75 | 70/30 | 8000 | 1.3 |
| HR-76 | 50/40/10 | 9500 | 1.5 |
| HR-77 | 100 | 9000 | 1.6 |
| HR-78 | 80/20 | 3500 | 1.4 |
| HR-79 | 90/8/2 | 13000 | 1.5 |
| HR-80 | 85/10/5 | 5000 | 1.5 |
| HR-81 | 80/18/2 | 6000 | 1.5 |
| HR-82 | 50/20/30 | 5000 | 1.3 |
| HR-83 | 90/10 | 8000 | 1.4 |
| HR-84 | 100 | 9000 | 1.6 |
| HR-85 | 80/20 | 15000 | 1.6 |
| HR-86 | 70/30 | 4000 | 1.42 |
| HR-87 | 60/40 | 8000 | 1.32 |
| HR-88 | 100 | 3800 | 1.29 |
| HR-89 | 100 | 6300 | 1.35 |
| HR-90 | 50/40/10 | 8500 | 1.51 |

[6] Basic Compound

The actinic ray-sensitive or radiation-sensitive resin composition of the present invention preferably contains a basic compound.

The basic compound is preferably a nitrogen-containing organic basic compound.

The compound which can be used is not particularly limited but, for example, compounds classified into the following (1) to (4) are preferably used.

(1) Compound Represented by the Following Formula (BS-1)

(BS-1)

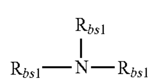

In formula (BS-1), each $R_{bs1}$ independently represents any one of a hydrogen atom, an alkyl group (linear or branched), a cycloalkyl group (monocyclic or polycyclic), an aryl group and an aralkyl group. However, it does not occur that three $R_{bs1}$s all are a hydrogen atom.

The carbon number of the alkyl group as $R_{bs1}$ is not particularly limited but is usually from 1 to 20, preferably from 1 to 12.

The carbon number of the cycloalkyl group as $R_{bs1}$ is not particularly limited but is usually from 3 to 20, preferably from 5 to 15.

The carbon number of the aryl group as $R_{bs1}$ is not particularly limited but is usually from 6 to 20, preferably from 6 to 10. Specific examples thereof include a phenyl group and a naphthyl group.

The carbon number of the aralkyl group as $R_{bs1}$ is not particularly limited but is usually from 7 to 20, preferably from 7 to 11. Specific examples thereof include a benzyl group.

In the alkyl group, cycloalkyl group, aryl group or aralkyl group as $R_{bs1}$, a hydrogen atom may be substituted for by a substituent. Examples of the substituent include an alkyl group, a cycloalkyl group, an aryl group, an aralkyl group, a hydroxyl group, a carboxyl group, an alkoxy group, an aryloxy group, an alkylcarbonyloxy group, and an alkyloxycarbonyl group.

The compound represented by formula (BS-1) is preferably a compound where only one of three $R_{bs1}$s is a hydrogen atom or all $R_{bs1}$s are not a hydrogen atom.

Specific examples of the compound represented by formula (BS-1) include tri-n-butylamine, tri-n-pentylamine, tri-n-octylamine, tri-n-decylamine, triisodecylamine, dicyclohexylmethylamine, tetradecylamine, pentadecylamine, hexadecylamine, octadecylamine, didecylamine, methyloctadecylamine, dimethylundecylamine, N,N-dimethyldodecylamine, methyldioctadecylamine, N,N-dibutylaniline, and N,N-dihexylaniline.

Also, one preferred embodiment is a compound where in formula (BS-1), at least one $R_{bs1}$ is an alkyl group substituted with a hydroxyl group. Specific examples of the compound include triethanolamine and N,N-dihydroxyethylaniline.

The alkyl group as $R_{bs1}$ may have an oxygen atom in the alkyl chain to form an oxyalkylene chain. The oxyalkylene chain is preferably —$CH_2CH_2O$—. Specific examples thereof include tris(methoxyethoxyethyl)amine and compounds exemplified in column 3, line 60 et seq. of U.S. Pat. No. 6,040,112.

(2) Compound Having a Nitrogen-Containing Heterocyclic Structure

The heterocyclic structure may or may not have aromaticity. Also, the heterocyclic structure may contain a plurality of nitrogen atoms and may further contain a heteroatom other than nitrogen. Specific examples of the compound include a compound having an imidazole structure (e.g., 2-phenylbenzimidazole, 2,4,5-triphenylimidazole), a compound having a piperidine structure (e.g., N-hydroxyethylpiperidine, bis(1,2,2,6,6-pentamethyl-4-piperidyl)sebacate), a compound having a pyridine structure (e.g., 4-dimethylaminopyridine), and a compound having an antipyrine structure (e.g., antipyrine, hydroxyantipyrine).

A compound having two or more ring structures is also suitably used. Specific examples thereof include 1,5-diazabicyclo[4.3.0]non-5-ene and 1,8-diazabicyclo[5.4.0]-undec-7-ene.

(3) Amine Compound Having a Phenoxy Group

The amine compound having a phenoxy group is a compound where the alkyl group in an amine compound has a phenoxy group at the terminal opposite the nitrogen atom. The phenoxy group may have a substituent such as alkyl group, alkoxy group, halogen atom, cyano group, nitro group, carboxyl group, carboxylic acid ester group, sulfonic acid ester group, aryl group, aralkyl group, acyloxy group and aryloxy group.

A compound having at least one alkyleneoxy chain between the phenoxy group and the nitrogen atom is preferred. The number of alkyleneoxy chains per molecule is preferably from 3 to 9, more preferably from 4 to 6. Among alkyleneoxy chains, —$CH_2CH_2O$— is preferred.

Specific examples of the compound include 2-[2-{2-(2,2-dimethoxy-phenoxyethoxy)ethyl}-bis-(2-methoxyethyl)]-amine and Compounds (C1-1) to (C3-3) exemplified in paragraph [0066] of U.S. Patent Application Publication No. 2007/0224539A1.

(4) Ammonium Salt

An ammonium salt is also appropriately used. The salt is preferably a hydroxide or a carboxylate. More specifically, a tetraalkylammonium hydroxide typified by tetrabutylammonium hydroxide is preferred. In addition, an ammonium salt derived from amines of (1) to (3) above can be used.

Other examples of the basic compound which can be used include compounds described in JP-A-2011-85926, compounds synthesized in Examples of JP-A-2002-363146, and compounds described in paragraph 0108 of JP-A-2007-298569.

The composition of the present invention may contain, as the basic compound, a low molecular compound having a nitrogen atom and having a group capable of leaving by the action of an acid (hereinafter, sometimes referred to as "low molecular compound (D)" or "component (D)").

The group capable of leaving by the action of an acid is not particularly limited but is preferably an acetal group, a carbonate group, a carbamate group, a tertiary ester group, a tertiary hydroxyl group or a hemiaminal ether group, more preferably a carbamate group or a hemiaminal ether group.

The molecular weight of the compound (D) is preferably from 100 to 1,000, more preferably from 100 to 700, still more preferably from 100 to 500.

The compound (D) is preferably an amine derivative having on the nitrogen atom a group capable of leaving by the action of an acid.

The compound (D) may have a protective group-containing carbamate group on the nitrogen atom. The protective group constituting the carbamate group can be represented, for example, by the following formula (d-1):

(d-1)

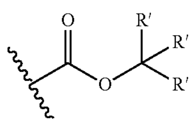

In formula (d-1), each R' independently represents a hydrogen atom, a linear or branched alkyl group, a cycloalkyl group, an aryl group, an aralkyl group or an alkoxyalkyl group. Each R' may combine with every other R' to form a ring.

R' is preferably a linear or branched alkyl group, a cycloalkyl group or an aryl group, more preferably a linear or branched alkyl group or a cycloalkyl group.

Specific structures of this group are illustrated below.

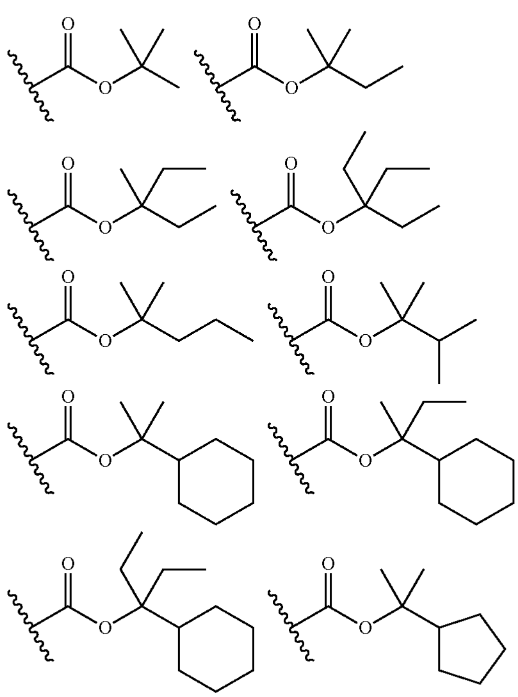

-continued

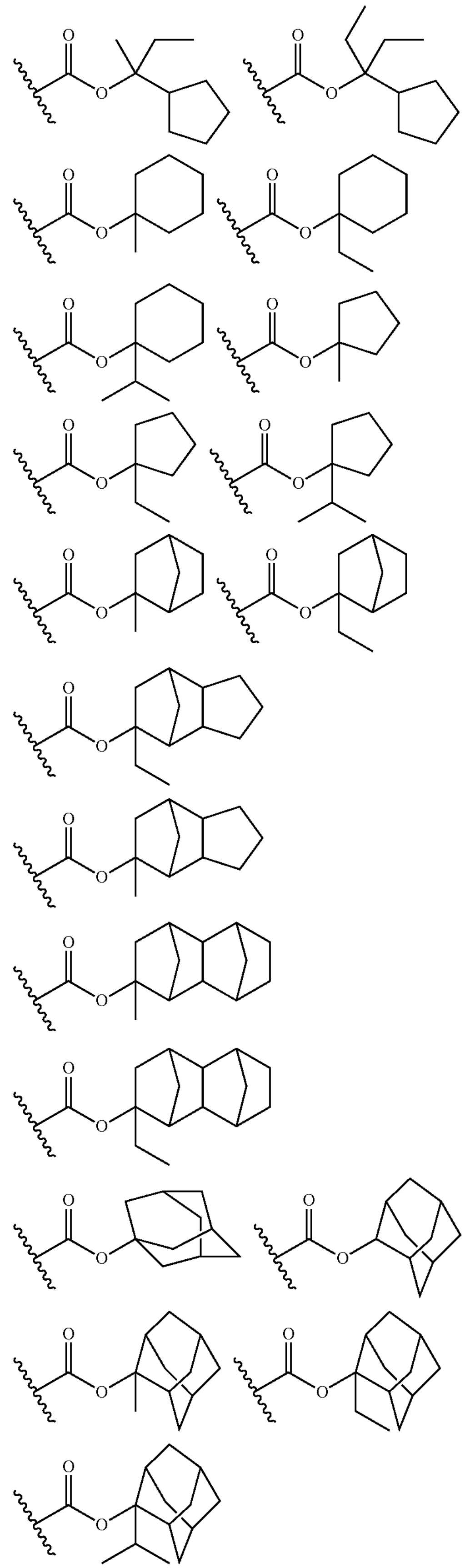

-continued

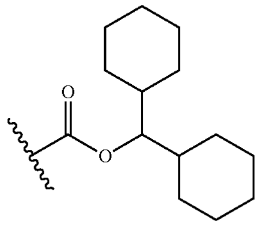

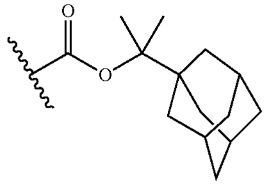

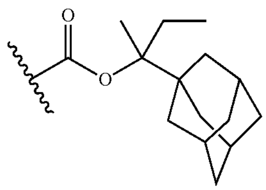

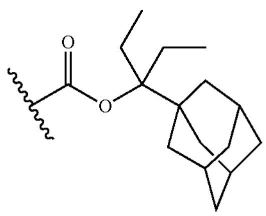

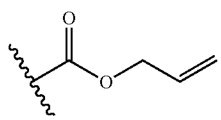

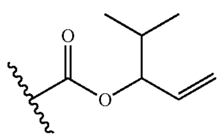

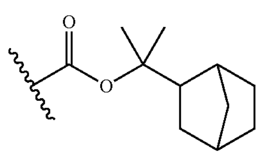

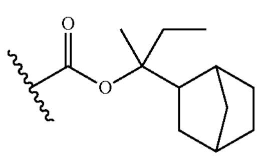

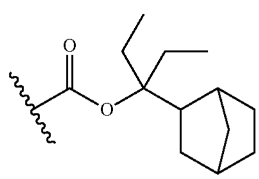

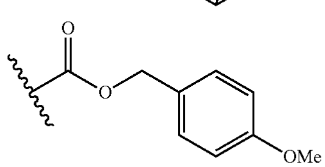

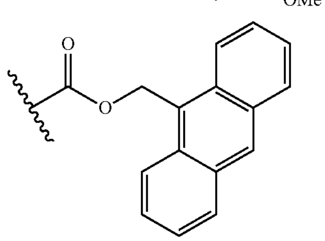

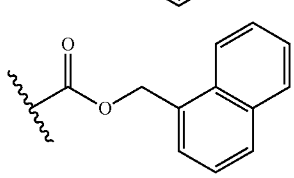

-continued

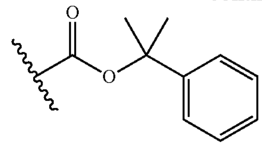

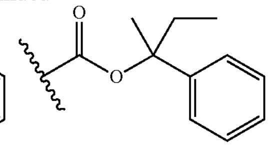

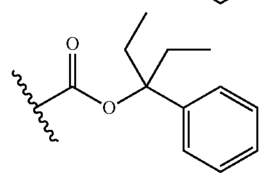

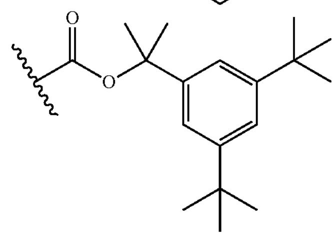

The compound (D) may be also composed by arbitrarily combining various basic compounds described above with the structure represented by formula (d-1).

The compound (D) is more preferably a compound having a structure represented by the following formula (F).

Incidentally, the compound (D) may be a compound corresponding to various basic compounds described above as long as it is a low molecular compound having a group capable of leaving by the action of an acid.

(F)

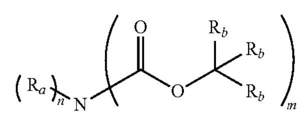

In formula (F), Ra represents a hydrogen atom, an alkyl group, a cycloalkyl group, an aryl group or an aralkyl group. Also, when n=2, two Ra's may be the same or different, and two Ra's may combine with each other to form a divalent heterocyclic hydrocarbon group (preferably having a carbon number of 20 or less) or a derivative thereof.

Each Rb independently represents a hydrogen atom, an alkyl group, a cycloalkyl group, an aryl group, an aralkyl group or an alkoxyalkyl group, provided that when one or more Rb in —C(Rb)(Rb)(Rb) are a hydrogen atom, at least one of remaining Rb is a cyclopropyl group, a 1-alkoxyalkyl group or an aryl group.

At least two Rb's may combine to form an alicyclic hydrocarbon group, an aromatic hydrocarbon group, a heterocyclic hydrocarbon group or a derivative thereof.

n represents an integer of 0 to 2, m represents an integer of 1 to 3, and n+m=3.

In formula (F), the alkyl group, cycloalkyl group, aryl group and aralkyl group represented by Ra and Rb may be substituted with a functional group such as hydroxyl group, cyano group, amino group, pyrrolidino group, piperidino group, morpholino group and oxo group, an alkoxy group or a halogen atom. The same applies to the alkoxyalkyl group represented by Rb.

Examples of the alkyl group, cycloalkyl group, aryl group and aralkyl group (each of these alkyl, cycloalkyl, aryl and aralkyl groups may be substituted with the above-described functional group, an alkoxy group or a halogen atom) of Ra and/or Rb include:

a group derived from a linear or branched alkane such as methane, ethane, propane, butane, pentane, hexane, heptane, octane, nonane, decane, undecane and dodecane, or a group where the group derived from an alkane is substituted with one or more kinds of or one or more groups of cycloalkyl group such as cyclobutyl group, cyclopentyl group and cyclohexyl group;

a group derived from a cycloalkane such as cyclobutane, cyclopentane, cyclohexane, cycloheptane, cyclooctane, norbornane, adamantane and noradamantane, or a group where the group derived from a cycloalkane is substituted with one or more kinds of or one or more groups of linear or branched alkyl group such as methyl group, ethyl group, n-propyl group, i-propyl group, n-butyl group, 2-methylpropyl group, 1-methylpropyl group and tert-butyl group;

a group derived from an aromatic compound such as benzene, naphthalene and anthracene, or a group where the group derived from an aromatic compound is substituted with one or more kinds of or one or more groups of linear or branched alkyl group such as methyl group, ethyl group, n-propyl group, i-propyl group, n-butyl group, 2-methylpropyl group, 1-methylpropyl group and tert-butyl group;

a group derived from a heterocyclic compound such as pyrrolidine, piperidine, morpholine, tetrahydrofuran, tetrahydropyran, indole, indoline, quinoline, perhydroquinoline, indazole and benzimidazole, or a group where the group derived from a heterocyclic compound is substituted with one or more kinds of or one or more groups of linear or branched alkyl group or aromatic compound-derived group; a group where the group derived from a linear or branched alkane or the group derived from a cycloalkane is substituted with one or more kinds of or one or more groups of aromatic compound-derived group such as phenyl group, naphthyl group and anthracenyl group; and a group where the substituent above is substituted with a functional group such as hydroxyl group, cyano group, amino group, pyrrolidino group, piperidino group, morpholino group and oxo group.

Examples of the divalent heterocyclic hydrocarbon group (preferably having a carbon number of 1 to 20) formed by combining Ra's with each other or a derivative thereof include a group derived from a heterocyclic compound such as pyrrolidine, piperidine, morpholine, 1,4,5,6-tetrahydropyrimidine, 1,2,3,4-tetrahydroquinoline, 1,2,3,6-tetrahydropyridine, homopiperazine, 4-azabenzimidazole, benzotriazole, 5-azabenzotriazole, 1H-1,2,3-triazole, 1,4,7-triazacyclononane, tetrazole, 7-azaindole, indazole, benzimidazole, imidazo[1,2-a]pyridine, (1S,4S)-(+)-2,5-diazabicyclo[2.2.1]heptane, 1,5,7-triazabicyclo[4.4.0]dec-5-ene, indole, indoline, 1,2,3,4-tetrahydroquinoxaline, perhydroquinoline and 1,5,9-triazacyclododecane, and a group where the group derived from a heterocyclic compound is substituted with one or more kinds of or one or more groups of linear or branched alkane-derived group, cycloalkane-derived group, aromatic compound-derived group, heterocyclic compound-derived group, and functional group such as hydroxyl group, cyano group, amino group, pyrrolidino group, piperidino group, morpholino group and oxo group.

Specific examples of the compound (D) particularly preferred in the present invention are illustrated below, but the present invention is not limited thereto.

(D-1)

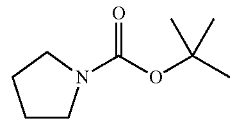

(D-2)

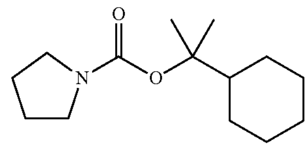

(D-3)

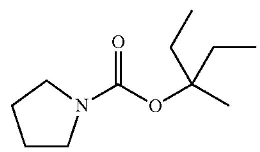

(D-4)

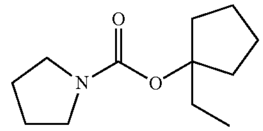

(D-5)

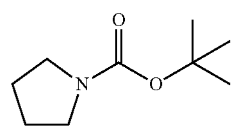

(D-6)

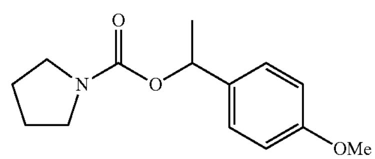

(D-7)

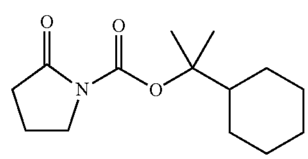

(D-8)

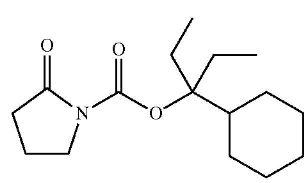

(D-9)

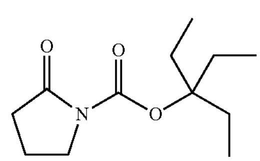

(D-10)

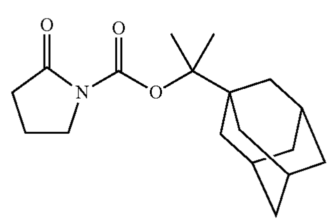

-continued
(D-11)
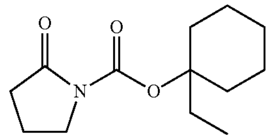
(D-12)
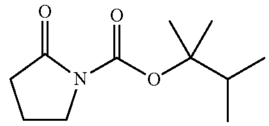
(D-13)
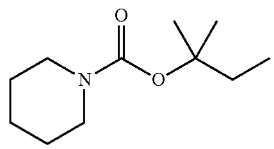
(D-14)
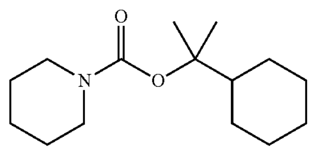
(D-15)
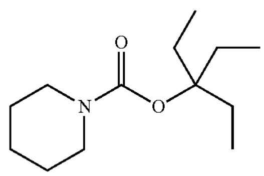
(D-16)
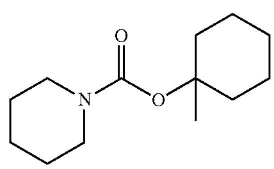
(D-17)
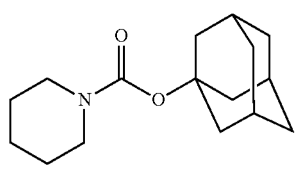
(D-18)
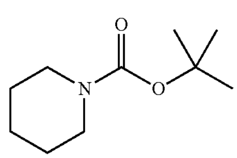
(D-19)
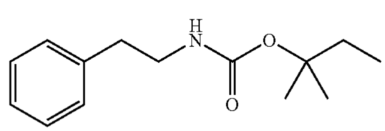
(D-20)
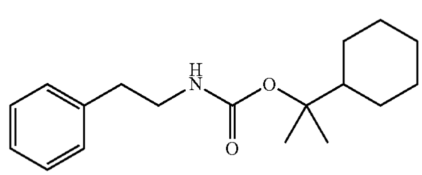
-continued
(D-21)
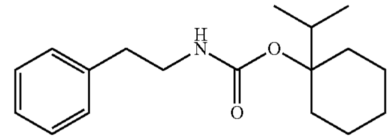
(D-22)
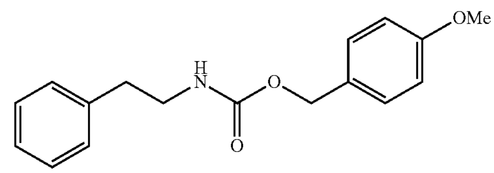
(D-23)
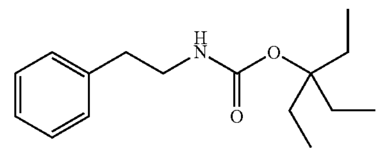
(D-24)
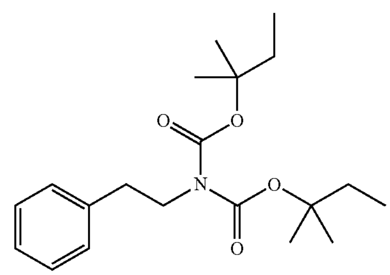
(D-25)
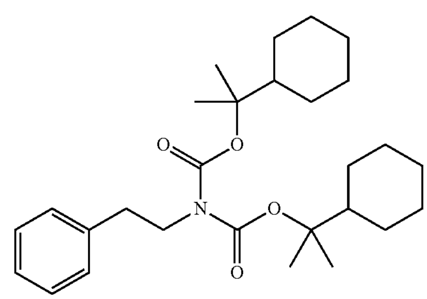
(D-26)
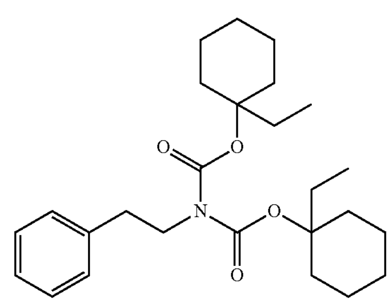

-continued
(D-27)
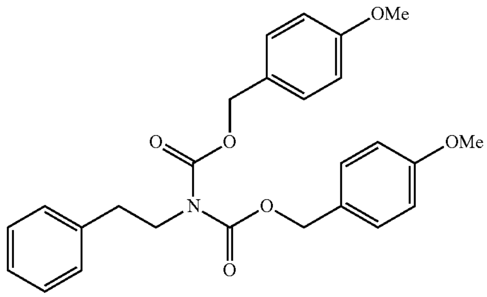
(D-28)
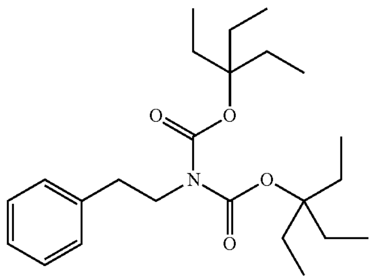
(D-29)
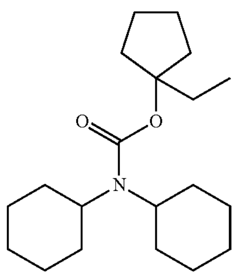
(D-30)
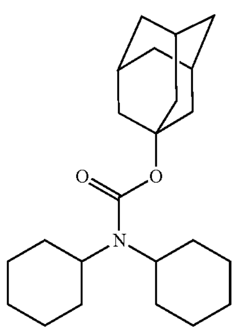
(D-31)
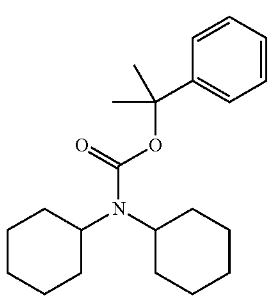
-continued
(D-32)
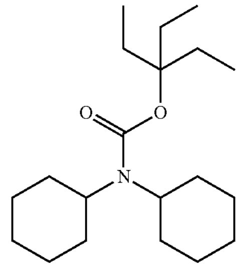
(D-33)
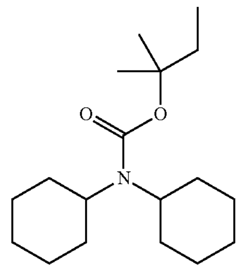
(D-34)
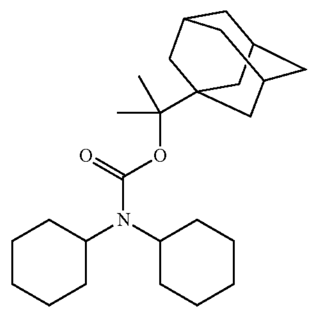
(D-35)
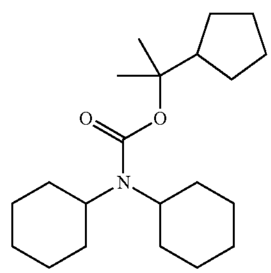
(D-36)
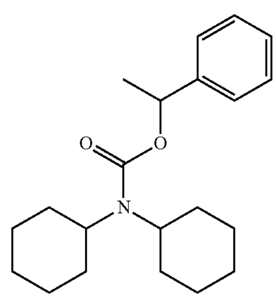
(D-37)
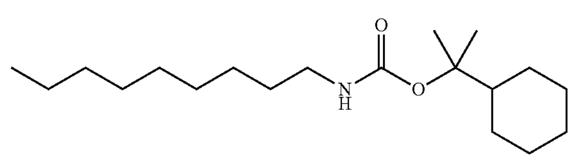

-continued
(D-38)
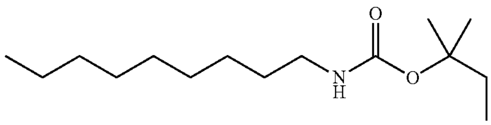
(D-39)
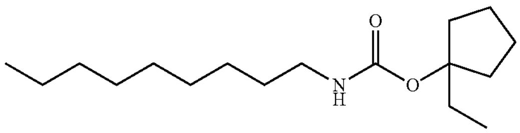
(D-40)
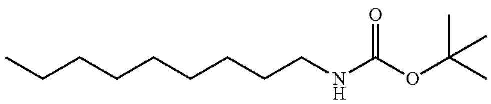
(D-41)
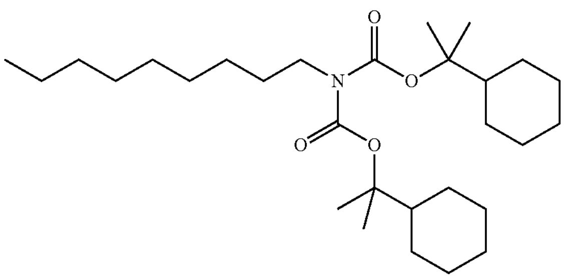
(D-42)
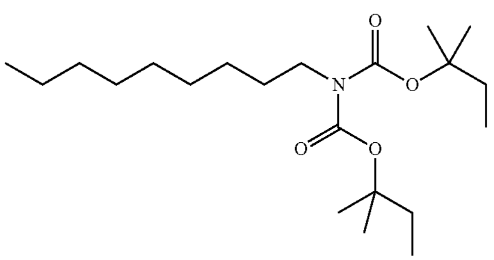
(D-43)
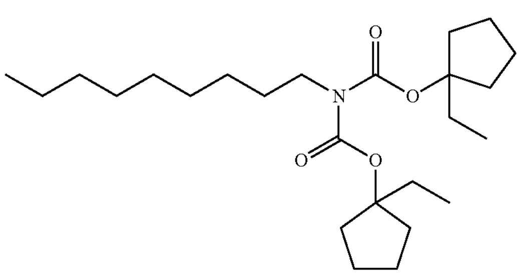
(D-44)
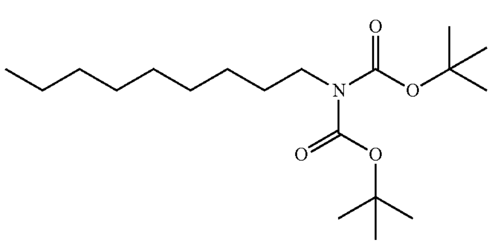
-continued
(D-45)
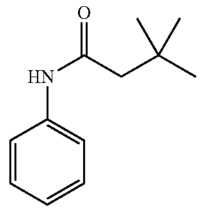
(D-46)
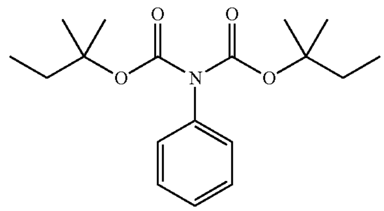
(D-47)
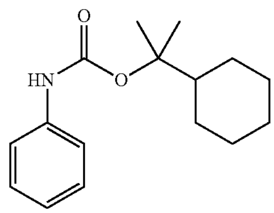
(D-48)
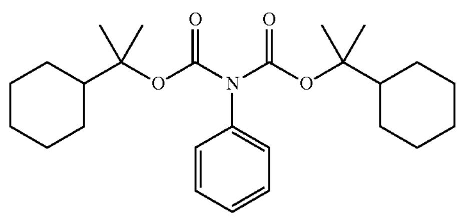
(D-49)
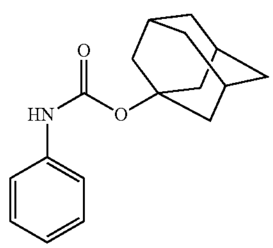
(D-50)
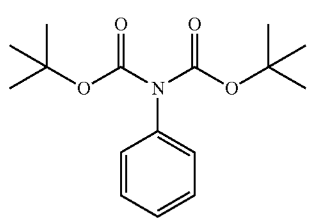
(D-51)
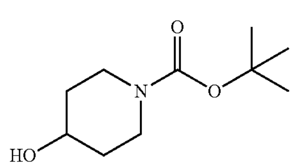

-continued (D-52)

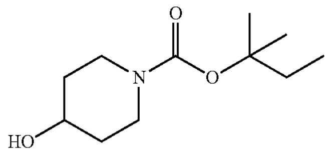

(D-53)

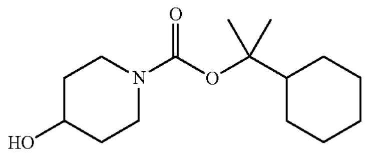

(D-54)

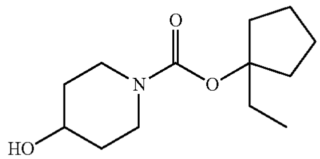

(D-55)

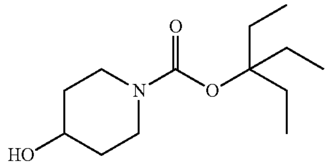

The compound represented by formula (A) can be easily synthesized from a commercially available amine by the method described, for example, in *Protective Groups in Organic Synthesis,* 4th edition. A most general method is a method of causing a dicarbonic acid ester or a haloformic acid ester to act on a commercially available amine to obtain the compound. In the formulae, X represents a halogen atom, and definitions and specific examples of Ra and Rb are the same as those described in formula (F).

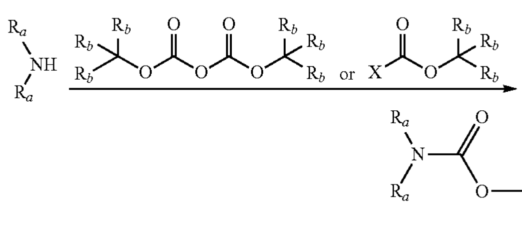

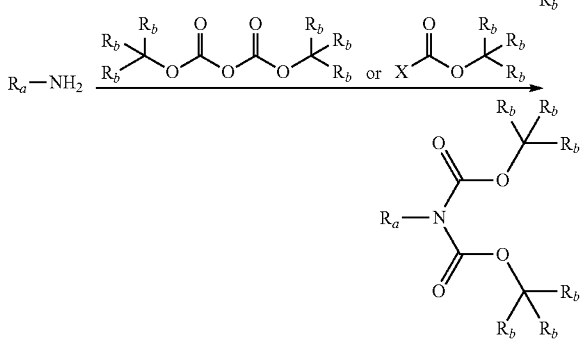

In addition, a photodecomposable basic compound (a compound which initially exhibits basicity because of the action of a basic nitrogen atom as a base but decomposes upon irradiation with an actinic ray or radiation to generate a zwitterionic compound having a basic nitrogen atom and an organic acid moiety and resulting from their neutralization in the molecule, is reduced in or deprived of the basicity; for example, onium salts described in Japanese Patent No. 3,577,743, JP-A-2001-215689, JP-A-2001-166476 and JP-A-2008-102383), and a photobase generator (for example, compounds described in JP-A-2010-243773) may be also appropriately used.

As for the basic compound (including the compound (D), one compound may be used alone, or two or more kinds of compounds may be used in combination.

The amount of the basic compound used is usually from 0.001 to 10 mass %, preferably from 0.01 to 5 mass %, based on the solid content of the composition.

The molar ratio of acid generator/basic compound is preferably from 2.5 to 300. That is, the molar ratio is preferably 2.5 or more in view of sensitivity and resolution and is preferably 300 or less from the standpoint of suppressing the reduction in resolution due to thickening of the pattern with aging after exposure until heat treatment. The molar ratio is more preferably from 5.0 to 200, still more preferably from 7.0 to 150.

[7] Surfactant

The composition of the present invention may further contain a surfactant. By virtue of containing a surfactant, when an exposure light source having a wavelength of 250 nm or less, particularly 220 nm or less, is used, a pattern with good sensitivity, resolution and adherence as well as fewer development defects can be formed.

As the surfactant, it is particularly preferred to use fluorine-containing and/or silicon-containing surfactants.

Examples of the fluorine-containing and/or silicon-containing surfactants include surfactants described in paragraph [0276] of U.S. Patent Application Publication 2008/0248425. There may be also used EFtop EF301 and EF303 (produced by Shin-Akita Kasei K.K.); Florad FC430, 431 and 4430 (produced by Sumitomo 3M Inc.); Megaface F171, F173, F176, F189, F113, F110, F177, F120 and R08 (produced by Dainippon Ink & Chemicals, Inc.); Surflon S-382, SC101, 102, 103, 104, 105 and 106 (produced by Asahi Glass Co., Ltd.); Troysol S-366 (produced by Troy Chemical); GF-300 and GF-150 (produced by Toagosei Chemical Industry Co., Ltd.); Surflon S-393 (produced by Seimi Chemical Co., Ltd.); EFtop EF121, EF122A, EF122B, RF122C, EF125M, EF135M, EF351, EF352, EF801, EF802 and EF601 (produced by JEMCO Inc.); PF636, PF656, PF6320 and PF6520 (produced by OMNOVA); and FTX-204G, 208G, 218G, 230G, 204D, 208D, 212D, 218D and 222D (produced by NEOS Co., Ltd.). Incidentally, Polysiloxane Polymer KP-341 (produced by Shin-Etsu Chemical Co., Ltd.) may be also used as the silicon-containing surfactant.

As the surfactant, other than these known surfactants, a surfactant may be synthesized by using a fluoro-aliphatic compound produced by a telomerization process (also called a telomer process) or an oligomerization process (also called an oligomer process). Specifically, a fluoro-aliphatic group-containing polymer derived from the fluoro-aliphatic compound may be used as the surfactant. The fluoro-aliphatic compound can be synthesized by the method described, for example, in JP-A-2002-90991.

The polymer having a fluoro-aliphatic group is preferably a copolymer of a fluoro-aliphatic group-containing monomer with a (poly(oxyalkylene)) acrylate or methacrylate and/or a (poly(oxyalkylene)) methacrylate, and the polymer may have an irregular distribution or may be a block copolymer.

Examples of the poly(oxyalkylene) group include a poly (oxyethylene) group, a poly(oxypropylene) group and a poly(oxybutylene) group. This group may be also a unit having alkylenes differing in the chain length within the same chain, such as block-linked poly(oxyethylene, oxypropylene and oxyethylene) and block-linked poly(oxyethylene and oxypropylene).

Furthermore, the copolymer of a fluoro-aliphatic group-containing monomer and a (poly(oxyalkylene)) acrylate or methacrylate may be also a ternary or higher copolymer obtained by simultaneously copolymerizing two or more different fluoro-aliphatic group-containing monomers or two or more different (poly(oxyalkylene)) acrylates or methacrylates.

Examples thereof include, as the commercially available surfactant, Megaface F178, F-470, F-473, F-475, F-476 and F-472 (produced by Dainippon Ink & Chemicals, Inc.) and further include a copolymer of a $C_6F_{13}$ group-containing acrylate or methacrylate with a (poly(oxyalkylene)) acrylate or methacrylate, a copolymer of a $C_6F_{13}$ group-containing acrylate or methacrylate with a (poly(oxyalkylene)) acrylate or methacrylate and a (poly(oxypropylene))acrylate or methacrylate, a copolymer of a $C_8F_{17}$ group-containing acrylate or methacrylate with a (poly(oxyethylene)) acrylate or methacrylate, and a copolymer of a $C_8F_{17}$ group-containing acrylate or methacrylate with a (poly(oxyethylene)) acrylate or methacrylate and a (poly(oxypropylene)) acrylate or methacrylate.

Surfactants other than the fluorine-containing and/or silicon-containing surfactants, described in paragraph [0280] of U.S. Patent Application Publication No. 2008/0248425, may be also used.

As for these surfactants, one kind may be used alone, or two or more kinds may be used in combination.

In the case where the composition of the present invention contains a surfactant, the content of the surfactant is preferably from 0 to 2 mass %, more preferably from 0.0001 to 2 mass %, still more preferably from 0.0005 to 1 mass %, based on the total solid content of the composition.

[8] Other Additives

The composition of the present invention may appropriately contain, in addition to the components described above, a carboxylic acid, an onium carboxylate, a dissolution inhibiting compound having a molecular weight of 3,000 or less described, for example, in *Proceeding of SPIE,* 2724, 355 (1996), a dye, a plasticizer, a photosensitizer, a light absorber, an antioxidant and the like.

In particular, a carboxylic acid is suitably used for enhancing the performance. The carboxylic acid is preferably an aromatic carboxylic acid such as benzoic acid and naphthoic acid.

The content of the carboxylic acid is preferably from 0.01 to 10 mass %, more preferably from 0.01 to 5 mass %, still more preferably from 0.01 to 3 mass %, based on the total solid content concentration of the composition.

From the standpoint of enhancing the resolution, the actinic ray-sensitive or radiation-sensitive resin composition of the present invention is preferably used in a film thickness of 10 to 250 nm, more preferably from 20 to 200 nm, still more preferably from 30 to 100 nm. Such a film thickness can be achieved by setting the solid content concentration in the composition to an appropriate range, thereby imparting an appropriate viscosity and enhancing the coatability and film-forming property.

The solid content concentration in the actinic ray-sensitive or radiation-sensitive resin composition of the present invention is usually from 1.0 to 10 mass %, preferably from 2.0 to 5.7 mass %, more preferably from 2.0 to 5.3 mass %. By setting the solid content concentration to the range above, the resist solution can be uniformly coated on a substrate and furthermore, a resist pattern improved in the line width roughness can be formed. The reason therefor is not clearly known, but it is considered that probably thanks to a solid content concentration of 10 mass % or less, preferably 5.7 mass % or less, aggregation of materials, particularly a photoacid generator, in the resist solution is suppressed, as a result, a uniform resist film can be formed.

The solid content concentration is a weight percentage of the weight of resist components excluding the solvent, based on the total weight of the actinic ray-sensitive or radiation-sensitive resin composition.

The actinic ray-sensitive or radiation-sensitive resin composition of the present invention is used by dissolving the components above in a predetermined organic solvent, preferably in the above-described mixed solvent, filtering the solution through a filter, and coating it on a predetermined support (substrate). The filter used for filtration is preferably a polytetrafluoroethylene-, polyethylene- or nylon-made filter having a pore size of 0.1 μm or less, more preferably 0.05 μm or less, still more preferably 0.03 μm or less. In the filtration through a filter, as described, for example, in JP-A-2002-62667, circulating filtration may be performed, or the filtration may be performed by connecting a plurality of kinds of filters in series or in parallel. Also, the composition may be filtered a plurality of times. Furthermore, a deaeration treatment or the like may be applied to the composition before and after filtration through a filter.

[Usage]

The pattern forming method of the present invention is suitably used for the fabrication of a semiconductor microcircuit, for example, in the production of VLSI or a high-capacity microchip. Incidentally, at the fabrication of a semiconductor microcircuit, the resist film having formed therein a pattern is subjected to circuit formation or etching and the remaining resist film part is finally removed with a solvent or the like. Therefore, unlike a so-called permanent resist used for a printed board and the like, the resist film derived from the actinic ray-sensitive or radiation-sensitive resin composition of the present invention does not remain in the final product such as microchip.

The present invention also relates to a method for manufacturing an electronic device, comprising the pattern forming method of the present invention, and an electronic device manufactured by this manufacturing method.

The electronic device of the present invention is suitably mounted on electric electronic equipment (such as home appliances, OA•media-related device, optical device and communication device).

EXAMPLES

The present invention is described in greater detail below by referring to Examples, but the present invention should not be construed as being limited to these Examples.

Synthesis Example 1

Synthesis of Resin (A1-1-1)

In a nitrogen stream, 20 g of cyclohexanone was charged into a three-neck flask and heated at 80° C. (Solvent 1). Subsequently, M-1, M-2, M-3 and M-4 shown below were dissolved in the cyclohexanone at a ratio of 40/10/40/10 by mol to prepare a monomer solution (200 g) of 22 mass %.

Furthermore, a solution obtained by adding and dissolving polymerization initiator V-601 (produced by Wako Pure Chemical Industries, Ltd.) in a ratio of 6 mol % based on the monomers was added dropwise to (Solvent 1) over 6 hours. After the completion of dropwise addition, the solution was further reacted at 80° C. for 2 hours. The reaction solution was allowed to cool and then added dropwise to a mixed solution of 1,400 ml of hexane/600 ml of ethyl acetate, and the precipitated powder was collected by filtration and dried to obtain 37 g of Resin (A1-1-1). The weight average molecular weight (Mw: in terms of polystyrene) as determined by GPC of Resin (A1-1-1) obtained was 10,000, and the polydispersity (Mw/Mn) was 1.60.

M-1

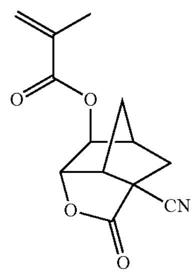

M-2

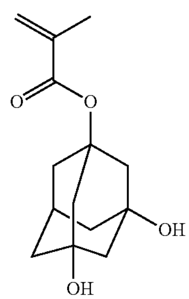

M-3

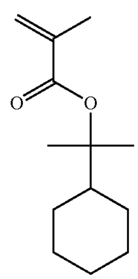

M-4

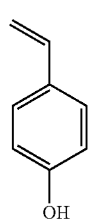

Resins (A1-1-2) and (A1-2) to (A1-15) were synthesized by the same method. The polymer structure, weight average molecular weight (Mw) and polydispersity (Mw/Mn) of each of resins synthesized are shown below. Also, the compositional ratio of respective repeating units in the polymer structure is shown by molar ratio.

(A1-1-1)

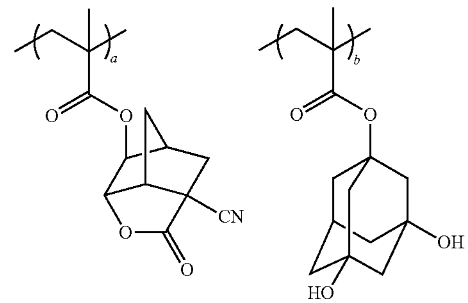

(A1-1-2)

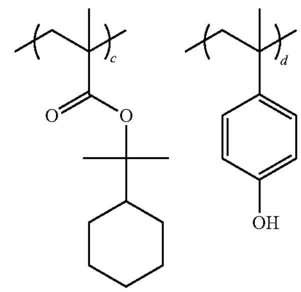

a/b/c/d = 40/10/40/10
MW = 10000, Mw/Mn = 1.60
a/b/c/d = 40/10/46/4
MW = 11000, Mw/Mn = 1.60

(A1-2)

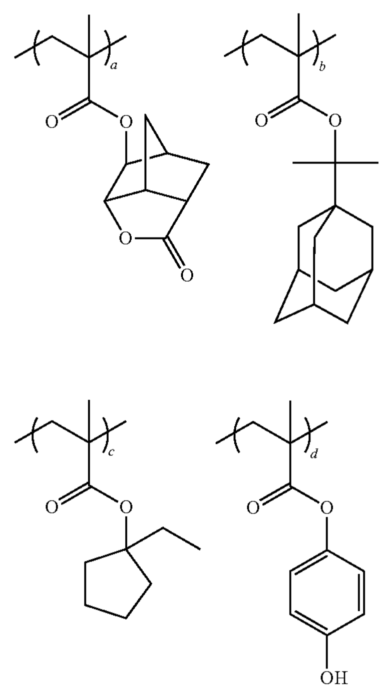

a/b/c/d = 40/10/47/3
MW = 11000, Mw/Mn = 1.85

-continued
(A1-3)
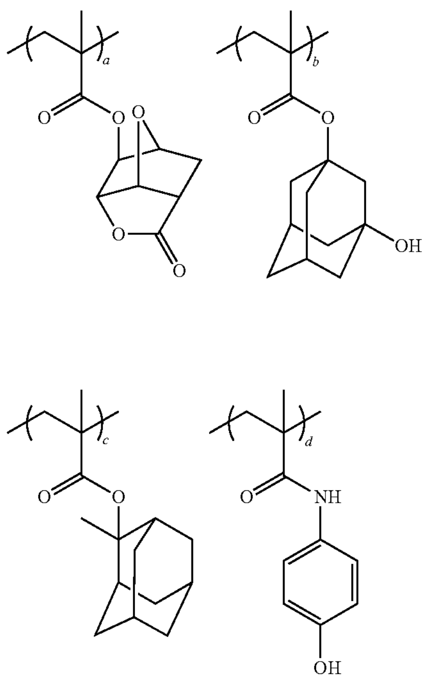
a/b/c/d = 40/12/45/3
MW = 8000, Mw/Mn = 1.65
(A1-4)
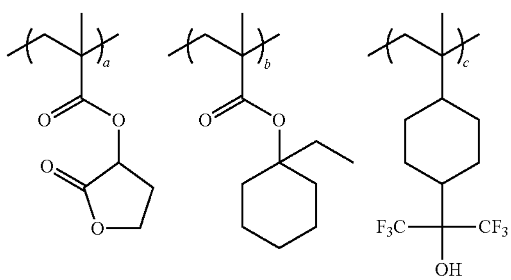
a/b/c = 46/50/4
Mw = 26000, Mw/Mn = 1.85
(A1-5)
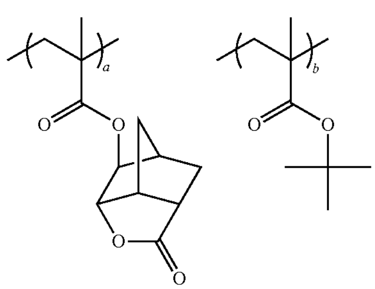
a/b = 60/40
MW = 5500, Mw/Mn = 1.40
-continued
(A1-6)
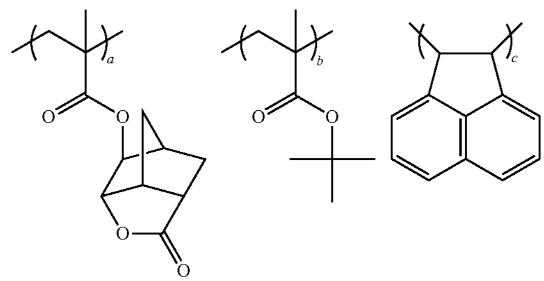
a/b/c = 40/45/15
MW = 7500, Mw/Mn = 1.50
(A1-7)
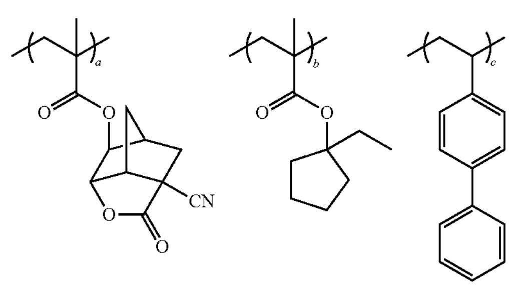
a/b/c = 40/40/20
MW = 7000, Mw/Mn = 1.65
(A1-8)
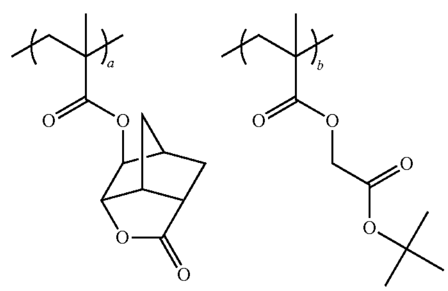
a/b = 40/60
MW = 6000, Mw/Mn = 1.40
(A1-9)
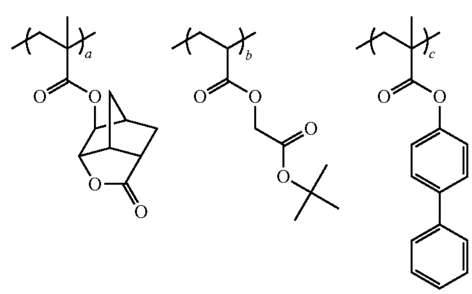
a/b/c = 40/45/15
MW = 19000, Mw/Mn = 1.70

-continued (A1-10)

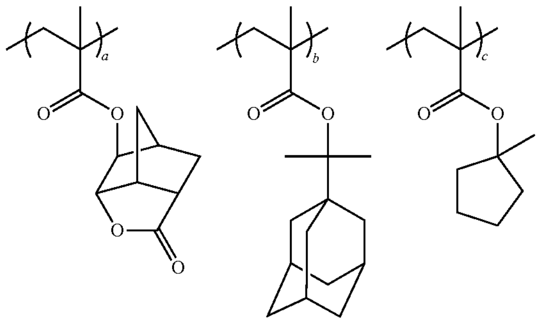

a/b/c = 40/40/20
MW = 11000,
Mw/Mn = 1.80

(A1-11)

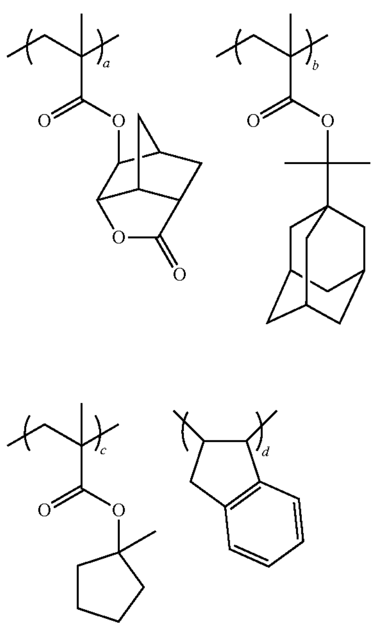

a/b/c/d = 35/35/20/10
MW = 21000, Mw/Mn = 1.60

(A1-12)

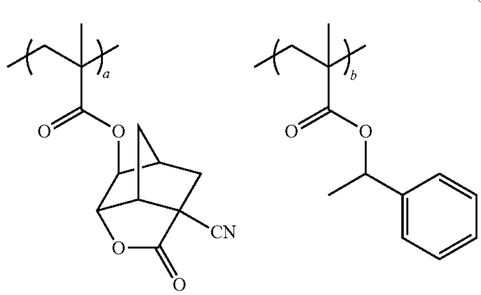

a/b = 60/40
MW = 6500, Mw/Mn = 1.50

-continued (A1-13)

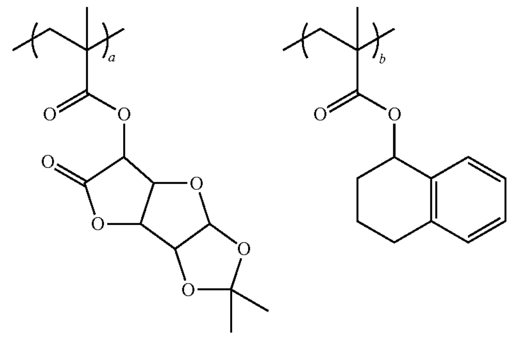

a/b = 50/50
MW = 28500, Mw/Mn = 1.55

(A1-14)

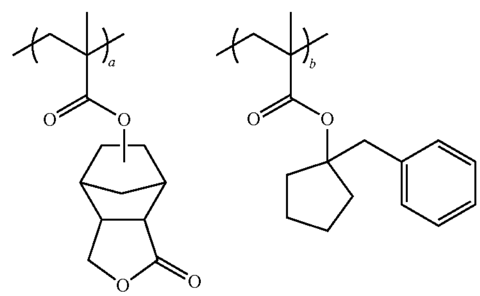

a/b = 70/30
MW = 8000, Mw/Mn = 1.85

(A1-15)

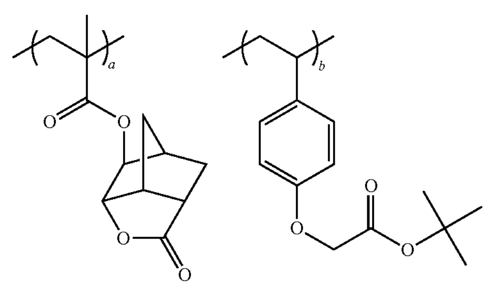

a/b = 60/40
MW = 7000, Mw/Mn = 1.65

Synthesis Example 2

Synthesis of Resin (A2-1)

4.66 Parts by mass of 1-methoxy-2-propanol was heated at 80° C. in a nitrogen stream, and while stirring this solution, a mixed solution containing 7.0 parts by mass of 4-hydroxystyrene, 6.4 parts by mass of Monomer (M-5), 18.6 parts by mass of 1-methoxy-2-propanol and 1.36 parts by mass of dimethyl 2,2'-azobisisobutyrate [V-601, produced by Wako Pure Chemical Industries, Ltd.] was added dropwise over 2 hours. After the completion of dropwise addition, the solution was further stirred at 80° C. for 4 hour. The reaction solution was allowed to cool, then reprecipitated from a large amount of hexane/ethyl acetate and vacuum-dried to obtain 5.9 parts by mass of Resin (A2-1) of the present invention.

The weight average molecular weight (Mw, in terms of polystyrene) as determined by GPC was Mw=15,100, and the polydispersity (Mw/Mn) was 1.40.

M-5

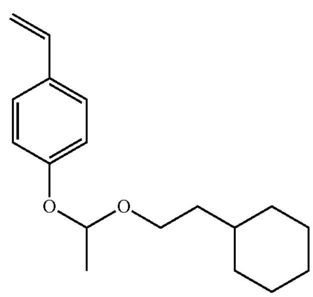

Resins (A2-2) to (A2-4) were synthesized by the same method. The polymer structure, weight average molecular weight (Mw) and polydispersity (Mw/Mn) of each of the resins synthesized are shown below. Also, the compositional ratio of respective repeating units in the polymer structure is shown by molar ratio.

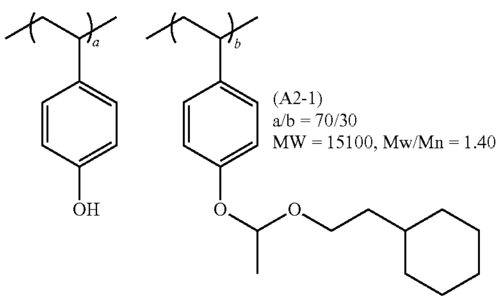

(A2-1)
a/b = 70/30
MW = 15100, Mw/Mn = 1.40

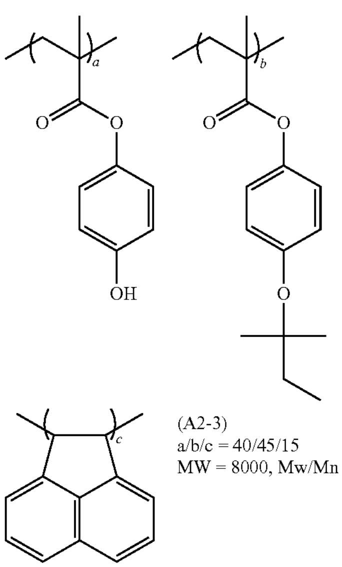

(A2-3)
a/b/c = 40/45/15
MW = 8000, Mw/Mn = 1.35

-continued

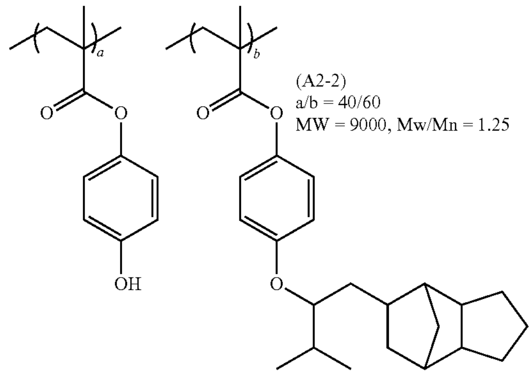

(A2-2)
a/b = 40/60
MW = 9000, Mw/Mn = 1.25

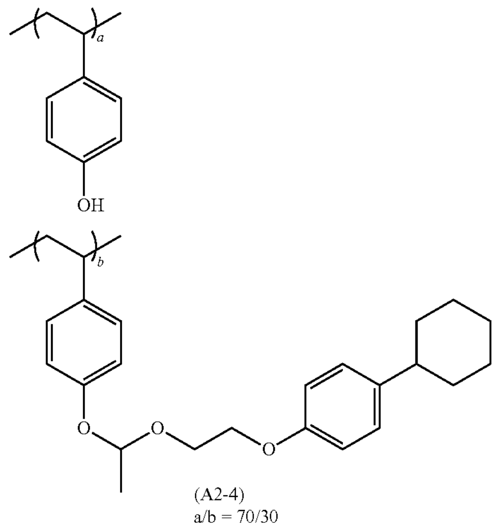

(A2-4)
a/b = 70/30
MW = 4800, Mw/Mn = 1.15

The acid-increasing agents used in Examples and Comparative Examples are as follows.

(PA-1)

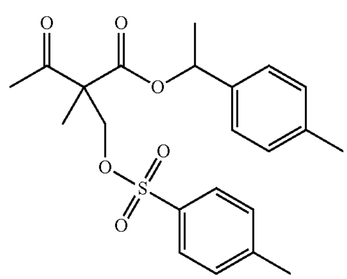

(PA-2)

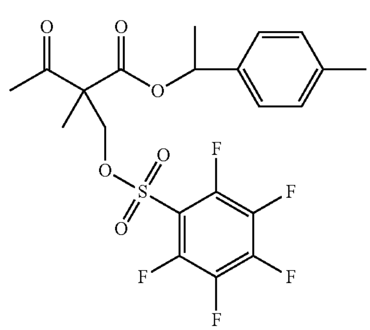

-continued
(PA-3)
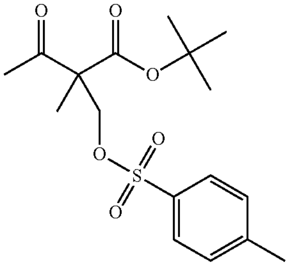
(PA-4)
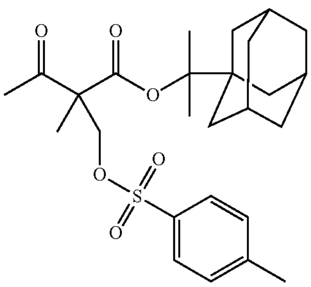
(PA-5)
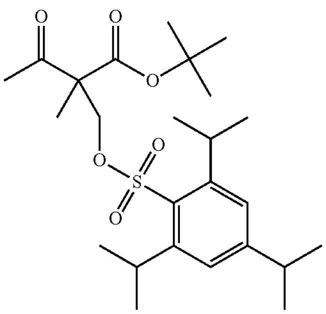
(PA-6)
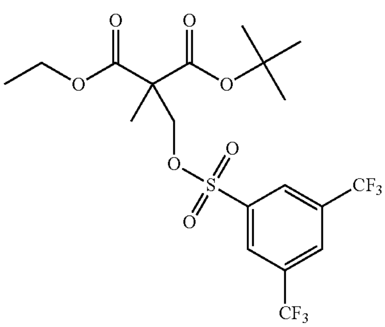
(PA-7)
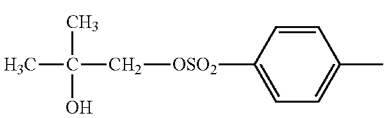
(PA-8)
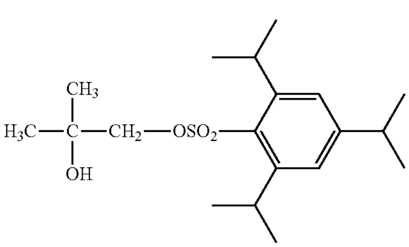
-continued
(PA-9)
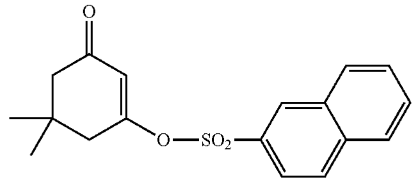
(PA-10)
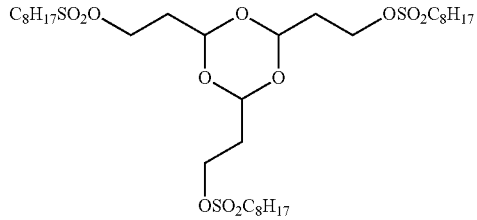
(PA-11)
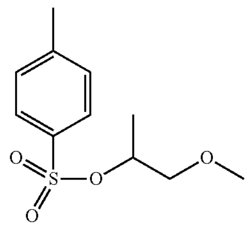
(PA-12)
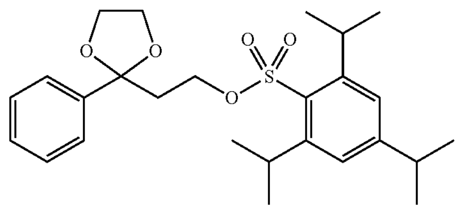
(PA-13)
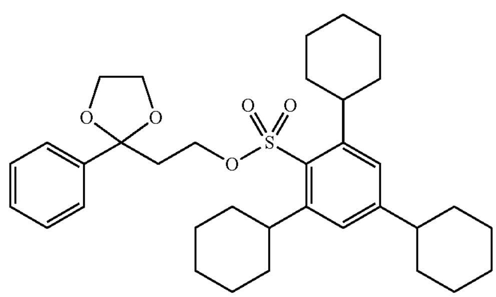
(PA-14)
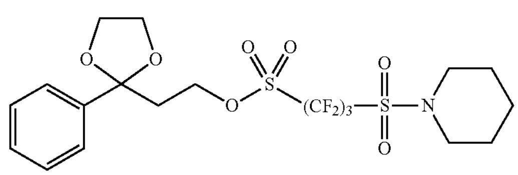
(PA-15)
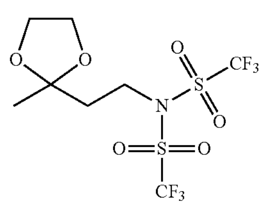

-continued (PA-16)

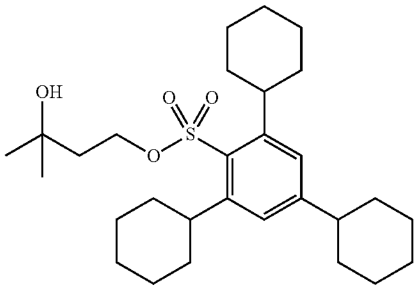

(PA-17)

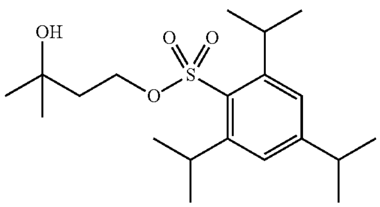

(PA-18)

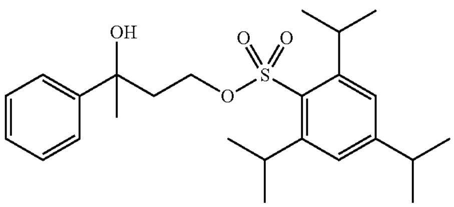

Examples 1 to 28 and Comparative Examples 1 to 4

Electron Beam (EB) Exposure (1) Preparation of Coating Solution of Actinic Ray-Sensitive or Radiation-Sensitive Resin Composition, and Coating The coating solution composition according to the formulation shown in the Table below was microfiltered through a membrane filter having a pore size of 0.1 μm to obtain an actinic ray-sensitive or radiation-sensitive resin composition (resist composition) solution.

This actinic ray-sensitive or radiation-sensitive resin composition solution was coated on a 6-inch Si wafer previously subjected to a hexamethyldisilazane (HMDS) treatment, by using a spin coater, Mark 8, manufactured by Tokyo Electron Ltd. and dried on a hot plate at 100° C. for 60 seconds to obtain a resist film having a thickness of 50 nm.

(2) EB Exposure and Development

The resist film-coated wafer obtained in (1) above was patternwise irradiated by using an electron beam lithography apparatus (HL750, manufactured by Hitachi, Ltd., accelerating voltage: 50 keV). At this time, the lithography was performed to form a 1:1 line-and-space pattern. After the electron beam lithography, the wafer was heated on a hot plate at 110° C. for 60 seconds, then developed for 30 seconds by puddling the organic developer shown in the Table below, rinsed by using the rinsing solution shown in the Table below, rotated at a rotational speed of 4,000 rpm for 30 seconds and heated at 90° C. for 60 seconds to obtain a resist pattern composed of a 1:1 line-and-space pattern having a line width of 50 nm.

Comparative Examples 5 and 6 (Electron Beam (EB) Exposure)

Preparation of an actinic ray-sensitive or radiation-sensitive resin composition and pattern formation were performed in the same manner as in Example 1 except for changing the formulation as shown in the Table below, performing the development with an aqueous alkali solution (TMAH, an aqueous 2.38 mass % tetramethylammonium hydroxide solution) in pace of the organic developer, and using water as the rinsing solution.

(3) Evaluation of Resist Pattern

The obtained resist pattern was evaluated for sensitivity, resolution and LWR by means of a scanning electron microscope (S-9220, manufacture by Hitachi Ltd.) by the following methods. The results obtained are shown in the Tables below.

(3-1) Sensitivity

The irradiation energy below which the 1:1 line-and-space pattern having a line width of 50 nm cannot be resolved was taken as the sensitivity (Eop). A smaller value indicates higher performance.

(3-2) Resolution

The minimum line width below which the line-and-space (1:1) pattern at the Eop above cannot be separated was taken as the resolution. A smaller value indicates higher performance.

(3-3) Line Width Roughness (LWR)

With respect to the line width roughness, at arbitrary 50 points in the longitudinal 0.5 μm region of the line-and-space space pattern having a line width of 50 nm (in Comparative Examples 5 and 6, the 1:1 line-and-space pattern having a line width of 100 nm), the line width at the Eop above was measured and after determining the standard deviation thereof, 3σ was computed. A smaller value indicates higher performance.

TABLE 3

| EB exposure | | | | | | | | | | | |
|---|---|---|---|---|---|---|---|---|---|---|---|
| | Resin (A) | Acid Generator (B) | Acid-Increasing Agent (compound (C)) | Solvent (mass ratio) (40 g) | Basic Compound | Surfactant (5 mg) | Developer (mass ratio) | Rinsing Solution | Sensitivity (μC/cm$^2$) | Resolution (nm) | LWR (nm) |
| Example 1 | A1-1-1 (0.794 g) | z45 (0.160 g) | PA-17 (0.035 g) | S-1/S-2 (80/20) | D-3 (6 mg) | W-1 | S-5 | S-8 | 11.3 | 32..0 | 3.6 |
| Example 2 | A1-1-2 (0.652 g) | z45 (0.250 g) | PA-13 (0.087 g) | S-1/S-2 (80/20) | D-3 (6 mg) | W-1 | S-5 | S-8 | 11.0 | 31.5 | 3.5 |
| Example 3 | A1-2 (0.733 g) | z117 (0.210 g) | PA-18 (0.052 g) | S-1 | D-1 (5 mg) | None | S-5 | S-8 | 11.4 | 32.0 | 3.7 |
| Example 4 | A1-3 (0.856 g) | z119 (0.100 g) | PA-2 (0.031 g) | S-1/S-2 (40/60) | D-1 (8 mg) | W-2 | S-5 | S-10 | 12.5 | 32.0 | 3.9 |
| Example 5 | A1-4 (0.813 g) | z120 (0.150 g) | PA-7 (0.027 g) | S-1 | D-4 (5 mg) | W-3 | S-5 | S-12 | 12.5 | 33.0 | 4.1 |
| Example 6 | A1-5 (0.728 g) | z114 (0.210 g) | PA-5 (0.053 g) | S-1/S-2 (80/20) | D-3 (4 mg) | W-1 | S-5 | S-8 | 11.8 | 32.0 | 3.7 |

TABLE 3-continued

| EB exposure | | | | | | | | | | | |
|---|---|---|---|---|---|---|---|---|---|---|---|
| | Resin (A) | Acid Generator (B) | Acid-Increasing Agent (compound (C)) | Solvent (mass ratio) (40 g) | Basic Compound | Surfactant (5 mg) | Developer (mass ratio) | Rinsing Solution | Sensitivity ($\mu C/cm^2$) | Resolution (nm) | LWR (nm) |
| Example 7 | A1-5<br>(0.666 g) | z114<br>(0.260 g) | PA-12<br>(0.065 g) | S-1/S-2<br>(80/20) | D-3<br>(4 mg) | W-1 | S-5 | S-8 | 11.2 | 31.0 | 3.6 |
| Example 8 | A1-5<br>(0.723 g) | z114<br>(0.210 g) | PA-16<br>(0.058 g) | S-1/S-2<br>(80/20) | D-3<br>(4 mg) | W-1 | S-5 | S-8 | 10.9 | 30.5 | 3.5 |
| Example 9 | A1-5<br>(0.665 g) | z114<br>(0.210 g) | PA-16<br>(0.116 g) | S-1/S-2<br>(80/20) | D-3<br>(4 mg) | W-1 | S-5 | S-8 | 10.6 | 31.5 | 3.5 |
| Example 10 | A1-6<br>(0.629 g) | z115<br>(0.300 g) | PA-6<br>(0.063 g) | S-1/S-4<br>(80/20) | D-1<br>(3 mg) | W-4 | S-7 | S-9 | 12.2 | 31.5 | 3.9 |
| Example 11 | A1-7<br>(0.588 g)<br>A1-5<br>(0.100 g) | z69<br>(0.260 g) | PA-15<br>(0.045 g) | S-3 | D-1<br>(2 mg) | W-2 | S-5/S-6<br>(80/20) | S-11 | 12.2 | 32.0 | 3.8 |
| Example 12 | A1-8<br>(0.600 g) | z116<br>(0.200 g)<br>z115<br>(0.100 g) | PA-4<br>(0.090 g) | S-1 | D-3<br>(5 mg) | W-1 | S-13 | S-10 | 11.5 | 31.0 | 3.6 |
| Example 13 | A1-9<br>(0.724 g) | z18<br>(0.200 g) | PA-14<br>(0.069 g) | S-1/S-2<br>(70/30) | D-4<br>(2 mg) | W-2 | S-14 | S-8 | 12.2 | 31.0 | 3.6 |
| Example 14 | A1-10<br>(0.757 g) | Z108<br>(0.180 g) | PA-5<br>(0.055 g) | S-1/S-2<br>(60/40) | D-3<br>(3 mg) | W-1 | S-5 | S-8 | 12.3 | 30.5 | 3.6 |
| Example 15 | A1-10<br>(0.700 g) | Z108<br>(0.210 g) | PA-13<br>(0.082 g) | S-1/S-2<br>(60/40) | D-3<br>(3 mg) | W-1 | S-5 | S-8 | 11.7 | 30.0 | 3.5 |
| Example 16 | A1-10<br>(0.670 g) | Z108<br>(0.158 g) | PA-13<br>(0.164 g) | S-1/S-2<br>(60/40) | D-3<br>(3 mg) | W-1 | S-5 | S-8 | 11.5 | 30.5 | 3.6 |
| Example 17 | A1-10<br>(0.669 g) | Z108<br>(0.260 g) | PA-17<br>(0.063 g) | S-1/S-2<br>(60/40) | D-3<br>(3 mg) | W-1 | S-5 | S-8 | 11.6 | 30.5 | 3.5 |
| Example 18 | A1-11<br>(0.747 g) | z45<br>(0.200 g) | PA-8<br>(0.042 g) | S-1 | D-2<br>(6 mg) | W-3 | S-6 | S-12 | 12.2 | 31.0 | 3.8 |
| Example 19 | A1-12<br>(0.724 g) | z45<br>(0.180 g) | PA-1<br>(0.088 g) | S-1/S-4<br>(80/20) | D-1<br>(3 mg) | W-4 | S-5 | S-11 | 12.3 | 30.5 | 3.6 |
| Example 20 | A1-13<br>(0.811 g) | z39<br>(0.150 g) | PA-9<br>(0.034 g) | S-1/S-4<br>(70/30) | D-3<br>(5 mg) | none | S-5 | S-8 | 12.8 | 31.5 | 4.0 |
| Example 21 | A1-14<br>(0.728 g) | z19<br>(0.200 g) | PA-10<br>(0.061 g) | S-1 | D-4<br>(6 mg) | W-2 | S-6 | S-10 | 13.0 | 31.5 | 3.8 |
| Example 22 | A1-15<br>(0.631 g) | z2<br>(0.310 g) | PA-11<br>(0.050 g) | S-1 | D-3<br>(4 mg) | W-1 | S-7 | S-8 | 12.9 | 32.0 | 3.8 |
| Example 23 | A2-1<br>(0.622 g) | z4<br>(0.150 g)<br>z10<br>(0.100 g) | PA-13<br>(0.111 g) | S-1 | D-1<br>(12 mg) | W-1 | S-5 | S-8 | 12.7 | 33.5 | 3.9 |
| Example 24 | A2-2<br>(0.595 g) | z99<br>(0.310 g) | PA-12<br>(0.075 g) | S-1 | D-1<br>(20 mg) | none | S-7 | S-10 | 12.6 | 33.5 | 3.9 |
| Example 25 | A2-3<br>(0.769 g) | z118<br>(0.180 g) | PA-3<br>(0.036 g) | S-1/S-2<br>(80/20) | D-1<br>(10 mg) | W-1 | S-5 | S-8 | 13.0 | 34.0 | 4.2 |
| Example 26 | A2-3<br>(0.602 g) | z118<br>(0.300 g) | PA-14<br>(0.083 g) | S-1/S-2<br>(80/20) | D-1<br>(10 mg) | W-1 | S-5 | S-8 | 12.6 | 33.5 | 4.0 |
| Example 27 | A2-3<br>(0.736 g) | z118<br>(0.200 g) | PA-18<br>(0.049 g) | S-1/S-2<br>(80/20) | D-1<br>(10 mg) | W-1 | S-5 | S-8 | 12.3 | 33.0 | 3.8 |
| Example 28 | A2-4<br>(0.615 g) | z113<br>(0.310 g) | PA-17<br>(0.057 g) | S-1 | D-2<br>(8 mg) | W-4 | S-6 | S-10 | 12.3 | 33.0 | 3.9 |
| Comparative Example 1 | A1-1-1<br>(0.829 g) | z45<br>(0.160 g) | — | S-1/S-2<br>(80/20) | D-3<br>(6 mg) | W-1 | S-5 | S-8 | 17.4 | 35.5 | 5.0 |
| Comparative Example 2 | A1-10<br>(0.812 g) | z108<br>(0.180 g) | — | S-1/S-2<br>(60/40) | D-3<br>(3 mg) | W-1 | S-5 | S-8 | 17.0 | 35.5 | 4.9 |
| Comparative Example 3 | A1-12<br>(0.812 g) | z45<br>(0.180 g) | — | S-1/S-4<br>(80/20) | D-1<br>(3 mg) | W-4 | S-5 | S-11 | 15.9 | 35.5 | 4.9 |
| Comparative Example 4 | A2-3<br>(0.785 g) | z118<br>(0.200 g) | — | S-1/S-2<br>(80/20) | D-1<br>(10 mg) | W-1 | S-5 | S-8 | 14.7 | 37.0 | 5.0 |
| Comparative Example 5 | A1-5<br>(0.728 g) | z114<br>(0.210 g) | PA-5<br>(0.053 g) | S-1/S-2<br>(80/20) | D-3<br>(4 mg) | W-1 | TMAH<br>(positive development) | water | 45.4 | 65.0 | 5.9 |
| Comparative Example 6 | A1-10<br>(0.700 g) | z108<br>(0.210 g) | PA-13<br>(0.082 g) | S-1/S-2<br>(60/40) | D-3<br>(3 mg) | W-1 | TMAH<br>(positive development) | water | 28.7 | 46.0 | 4.9 |

In the Table, abbreviations stand for specific examples above or the followings.

<Basic Compound>

D-1: Tetra-(n-butyl)ammonium hydroxide

D-2: 1,8-Diazabicyclo[5.4.0]-7-undecene

D-3: 2,4,5-Triphenylimidazole

D-4: Tridodecylamine

<Surfactant>

W-1: Megaface F176 (produced by Dainippon Ink & Chemicals, Inc.) (fluorine-containing)

W-2: Megaface R08 (produced by Dainippon Ink & Chemicals, Inc.) (fluorine- and silicon-containing)
W-3: Polysiloxane Polymer KP-341 (produced by Shin-Etsu Chemical Co., Ltd.) (silicon-containing)
W-4: PF-6320 (produced by OMNOVA Solutions Inc.) (fluorine-containing)
<Coating Solvent>
S-1: Propylene glycol monomethyl ether acetate (PGMEA)
S-2: Propylene glycol monomethyl ether (PGME)
S-3: Tetrahydrofuran
S-4: Cyclohexanone
<Developer, Rinsing Solution>
S-5: Butyl acetate
S-6: Pentyl acetate
S-7: Anisole
S-8: 1-Hexanol
S-9: 4-Methyl-2-pentanol
S-10: Decane
S-11: Octane
S-12: Ethylbenzene
S-13: Propylene glycol monomethyl ether acetate (PGMEA)
S-14: Ethoxybenzene
TMAH: An aqueous 2.38 mass % tetramethylammonium hydroxide solution As apparent from the results shown in the Tables above, in Comparative Examples 1 to 3 not using an acid-increasing agent, all of sensitivity, resolution and LWR are poor.

On the other hand, in Examples 1 to 28 using an acid-increasing agent, all of sensitivity, resolution and LWR performance are excellent.

It is considered that as compared with Comparative Examples 1 to 3 not using an acid-increasing agent, the sensitivity and LWR performance are excellent in Examples 1 to 28, because the amount of acid generated in the exposed area was amplified. Also, it is considered that as compared with Comparative Examples 1 to 3 not using an acid-increasing agent, the resolution is also excellent in Examples 1 to 28 using an acid-increasing agent, because due to amplification of the amount of acid in the exposed area, decomposition of the acid-decomposable group of the resin (A) was accelerated to insolubilize the resin in an organic developer, as a result, the contrast between the exposed area and the unexposed area was increased.

In particular, as apparent from comparison of Examples 6 and 16 with Comparative Examples 5 and 6 where positive development with an alkali developer was performed using the same resist compositions as in those Examples, a pattern with high resolution, high sensitivity and high LWR performance could be formed by employing the pattern forming method of the present invention using an organic developer. This is considered to result because as described above, in comparison with the case using an alkali developer, the capillary force imposed on the sidewall of the pattern was reduced due to use of an organic developer and in turn, the resolution, sensitivity and LWR performance were enhanced.

Examples 101 to 128 and Comparative Examples 101 to 104

Extreme-Ultraviolet (EUV) Exposure (4) Preparation of Coating Solution of Actinic Ray-Sensitive or Radiation-Sensitive Resin Composition, and Coating The coating solution composition according to the formulation shown in the Table below was microfiltered through a membrane filter having a pore size of 0.05 μm to obtain an actinic ray-sensitive or radiation-sensitive resin composition (resist composition) solution.

This actinic ray-sensitive or radiation-sensitive resin composition solution was coated on a 6-inch Si wafer previously subjected to a hexamethyldisilazane (HMDS) treatment, by using a spin coater, Mark 8, manufactured by Tokyo Electron Ltd. and dried on a hot plate at 100° C. for 60 seconds to obtain a resist film having a thickness of 50 nm.

(5) EUV Exposure and Development

The resist film-coated wafer obtained in (4) above was patternwise exposed through an exposure mask (line/space=1/1) by using an EUV exposure apparatus (Micro Exposure Tool, manufactured by Exitech, NA: 0.3, quadrupole, outer sigma: 0.68, inner sigma: 0.36). After the irradiation, the wafer was heated on a hot plate at 110° C. for 60 seconds, then developed for 30 seconds by puddling the organic developer shown in the Table below, rinsed by using the rinsing solution shown in the Table below, rotated at a rotational speed of 4,000 rpm for 30 seconds and baked at 90° C. for 60 seconds to obtain a resist pattern composed of a 1:1 line-and-space pattern having a line width of 50 nm.

Comparative Examples 105 and 106

Extreme-Ultraviolet (EUV) Exposure

Preparation of an actinic ray-sensitive or radiation-sensitive resin composition and pattern formation were performed in the same manner as in Example 101 except for changing the formulation as shown in the Table below, performing the development with an aqueous alkali solution (TMAH, an aqueous 2.38 mass % tetramethylammonium hydroxide solution) in pace of the organic developer, and using water as the rinsing solution.

(6) Evaluation of Resist Pattern

The obtained resist pattern was evaluated for sensitivity, resolution and LWR by means of a scanning electron microscope (S-9380II, manufacture by Hitachi Ltd.) by the following methods. The results obtained are shown in the Tables below.

(6-1) Sensitivity

The irradiation energy below which a 1:1 line-and-space pattern having a line width of 50 nm cannot be resolved was taken as the sensitivity (Eop). A smaller value indicates higher performance.

(6-2) Resolution

The minimum line width below which the line-and-space (1:1) pattern at the Eop above cannot be separated was taken as the resolution. A smaller value indicates higher performance.

(6-3) Line Width Roughness (LWR)

With respect to the line width roughness, at arbitrary 50 points in the longitudinal 0.5 μm region of the line-and-space space pattern having a line width of 50 nm, the line width at the Eop above was measured and after determining the standard deviation thereof, 3σ was computed. A smaller value indicates higher performance.

TABLE 4

| EUV exposure | | | | | | | | | | | |
|---|---|---|---|---|---|---|---|---|---|---|---|
| | Resin (A) | Acid Generator (B) | Acid-Increasing Agent (compound (C)) | Solvent (mass ratio) (40 g) | Basic Compound | Surfactant (5 mg) | Developer (mass ratio) | Rinsing Solution | Sensitivity (mJ/cm$^2$) | Resolution (nm) | LWR (nm) |
| Example 101 | A1-1-1 (0.794 g) | z45 (0.160 g) | PA-17 (0.035 g) | S-1/S-2 (80/20) | D-3 (6 mg) | W-1 | S-5 | S-8 | 3.5 | 24.0 | 5.3 |
| Example 102 | A1-1-2 (0.652 g) | z45 (0.250 g) | PA-13 (0.087 g) | S-1/S-2 (80/20) | D-3 (6 mg) | W-1 | S-5 | S-8 | 3.6 | 24.0 | 5.1 |
| Example 103 | A1-2 (0.733 g) | z117 (0.210 g) | PA-18 (0.052 g) | S-1 | D-1 (5 mg) | None | S-5 | S-8 | 3.7 | 24.0 | 5.2 |
| Example 104 | A1-3 (0.856 g) | z119 (0.100 g) | PA-2 (0.031 g) | S-1/S-2 (40/60) | D-1 (8 mg) | W-2 | S-5 | S-10 | 3.9 | 24.5 | 5.3 |
| Example 105 | A1-4 (0.813 g) | z120 (0.150 g) | PA-7 (0.027 g) | S-1 | D-4 (5 mg) | W-3 | S-5 | S-12 | 3.8 | 24.5 | 5.4 |
| Example 106 | A1-5 (0.728 g) | z114 (0.210 g) | PA-5 (0.053 g) | S-1/S-2 (80/20) | D-3 (4 mg) | W-1 | S-5 | S-8 | 3.6 | 23.5 | 5.2 |
| Example 107 | A1-5 (0.666 g) | z114 (0.260 g) | PA-12 (0.065 g) | S-1/S-2 (80/20) | D-3 (4 mg) | W-1 | S-5 | S-8 | 3.4 | 23.0 | 4.5 |
| Example 108 | A1-5 (0.723 g) | z114 (0.210 g) | PA-16 (0.058 g) | S-1/S-2 (80/20) | D-3 (4 mg) | W-1 | S-5 | S-8 | 3.3 | 22.5 | 4.4 |
| Example 109 | A1-5 (0.665 g) | z114 (0.210 g) | PA-16 (0.116 g) | S-1/S-2 (80/20) | D-3 (4 mg) | W-1 | S-5 | S-8 | 3.2 | 22.5 | 4.2 |
| Example 110 | A1-6 (0.629 g) | z115 (0.300 g) | PA-6 (0.063 g) | S-1/S-4 (80/20) | D-1 (3 mg) | W-4 | S-7 | S-9 | 3.4 | 23.0 | 4.2 |
| Example 111 | A1-7 (0.588 g) A1-5 (0.100 g) | z69 (0.260 g) | PA-15 (0.045 g) | S-3 | D-1 (2 mg) | W-2 | S-5/S-6 (80/20) | S-11 | 3.3 | 23.0 | 4.2 |
| Example 112 | A1-8 (0.600 g) | z116 (0.200 g) z115 (0.100 g) | PA-4 (0.090 g) | S-1 | D-3 (5 mg) | W-1 | S-13 | S-10 | 3.3 | 23.0 | 4.3 |
| Example 113 | A1-9 (0.724 g) | z18 (0.200 g) | PA-14 (0.069 g) | S-1/S-2 (70/30) | D-4 (2 mg) | W-2 | S-14 | S-8 | 3.4 | 22.5 | 4.2 |
| Example 114 | A1-10 (0.757 g) | z108 (0.180 g) | PA-5 (0.055 g) | S-1/S-2 (60/40) | D-3 (3 mg) | W-1 | S-5 | S-8 | 3.7 | 24.0 | 5.1 |
| Example 115 | A1-10 (0.700 g) | z108 (0.210 g) | PA-13 (0.082 g) | S-1/S-2 (60/40) | D-3 (3 mg) | W-1 | S-5 | S-8 | 3.3 | 22.5 | 4.3 |
| Example 116 | A1-10 (0.670 g) | z108 (0.158 g) | PA-13 (0.164 g) | S-1/S-2 (60/40) | D-3 (3 mg) | W-1 | S-5 | S-8 | 3.2 | 23.0 | 4.4 |
| Example 117 | A1-10 (0.669 g) | z108 (0.260 g) | PA-17 (0.063 g) | S-1/S-2 (60/40) | D-3 (3 mg) | W-1 | S-5 | S-8 | 3.1 | 23.0 | 4.3 |
| Example 118 | A1-11 (0.747 g) | z45 (0.200 g) | PA-8 (0.042 g) | S-1 | D-2 (6 mg) | W-3 | S-6 | S-12 | 3.4 | 23.5 | 4.3 |
| Example 119 | A1-12 (0.724 g) | z45 (0.180 g) | PA-1 (0.088 g) | S-1/S-4 (80/20) | D-1 (3 mg) | W-4 | S-5 | S-11 | 3.5 | 23.0 | 4.0 |
| Example 120 | A1-13 (0.811 g) | z39 (0.150 g) | PA-9 (0.034 g) | S-1/S-4 (70/30) | D-3 (5 mg) | None | S-5 | S-8 | 3.7 | 23.5 | 4.2 |
| Example 121 | A1-14 (0.728 g) | z19 (0.200 g) | PA-10 (0.061 g) | S-1 | D-4 (6 mg) | W-2 | S-6 | S-10 | 3.8 | 24.0 | 4.2 |
| Example 122 | A1-15 (0.631 g) | z2 (0.310 g) | PA-11 (0.050 g) | S-1 | D-3 (4 mg) | W-1 | S-7 | S-8 | 3.8 | 24.0 | 4.3 |
| Example 123 | A2-1 (0.622 g) | z4 (0.150 g) z10 (0.100 g) | PA-13 (0.111 g) | S-1 | D-1 (12 mg) | W-1 | S-5 | S-8 | 1.6 | 24.5 | 5.4 |
| Example 124 | A2-2 (0.595 g) | z99 (0.310 g) | PA-12 (0.075 g) | S-1 | D-1 (20 mg) | None | S-7 | S-10 | 1.7 | 24.0 | 5.2 |
| Example 125 | A2-3 (0.769 g) | z118 (0.180 g) | PA-3 (0.036 g) | S-1/S-2 (80/20) | D-1 (10 mg) | W-1 | S-5 | S-8 | 2.4 | 24.0 | 5.4 |
| Example 126 | A2-3 (0.602 g) | z118 (0.300 g) | PA-14 (0.083 g) | S-1/S-2 (80/20) | D-1 (10 mg) | W-1 | S-5 | S-8 | 2.2 | 24.0 | 5.2 |
| Example 127 | A2-3 (0.736 g) | z118 (0.200 g) | PA-18 (0.049 g) | S-1/S-2 (80/20) | D-1 (10 mg) | w-1 | S-5 | S-8 | 1.7 | 23.5 | 4.7 |
| Example 128 | A2-4 (0.615 g) | z113 (0.310 g) | PA-17 (0.057 g) | S-1 | D-2 (8 mg) | W-4 | S-6 | S-10 | 1.6 | 24.0 | 5.2 |
| Comparative Example 101 | A1-1-1 (0.829 g) | z45 (0.160 g) | — | S-1/S-2 (80/20) | D-3 (6 mg) | W-1 | S-5 | S-8 | 4.4 | 27.0 | 6.0 |
| Comparative Example 102 | A1-10 (0.812 g) | z108 (0.180 g) | — | S-1/S-2 (60/40) | D-3 (3 mg) | W-1 | S-5 | S-8 | 4.3 | 26.5 | 5.7 |
| Comparative Example 103 | A1-12 (0.812 g) | z45 (0.180 g) | — | S-1/S-4 (80/20) | D-1 (3 mg) | W-4 | S-5 | S-11 | 4.2 | 26.5 | 5.7 |
| Comparative Example 104 | A2-3 (0.785 g) | z118 (0.200 g) | — | S-1/S-2 (80/20) | D-1 (10 mg) | W-1 | S-5 | S-8 | 2.8 | 27.0 | 6.1 |
| Comparative Example 105 | A1-5 (0.728 g) | z114 (0.210 g) | PA-5 (0.053 g) | S-1/S-2 (80/20) | D-3 (4 mg) | W-1 | TMAH (positive development) | Water | 21.4 | 39.0 | 6.3 |

TABLE 4-continued

| | EUV exposure | | | | | | | | | | | |
|---|---|---|---|---|---|---|---|---|---|---|---|---|
| | Resin (A) | Acid Generator (B) | Acid-Increasing Agent (compound (C)) | Solvent (mass ratio) (40 g) | Basic Compound | Surfactant (5 mg) | Developer (mass ratio) | Rinsing Solution | Sensitivity ($mJ/cm^2$) | Resolution (nm) | LWR (nm) |
| Comparative Example 106 | A1-10 (0.700 g) | z108 (0.210 g) | PA-13 (0.082 g) | S-1/S-2 (60/40) | D-3 (3 mg) | W-1 | TMAH (positive development) | Water | 17.5 | 34.0 | 5.8 |

Abbreviations in the Tables are as described above.

As apparent from the results shown in the Tables above, in Comparative Examples 101 to 104 not using an acid-increasing agent, all of sensitivity, resolution and LWR are poor.

On the other hand, in Examples 101 to 128 using an acid-increasing agent, all of sensitivity, resolution and LWR performance are excellent.

It is considered that as compared with Comparative Examples 101 to 104 not using an acid-increasing agent, the sensitivity and LWR performance are excellent in Examples 101 to 128, because the amount of acid generated in the exposed area was amplified. Also, it is considered that as compared with Comparative Examples 101 to 104 not using an acid-increasing agent, the resolution is also excellent in Examples 101 to 128 using an acid-increasing agent, because due to amplification of the amount of acid in the exposed area, decomposition of the acid-decomposable group of the resin (A) was accelerated to insolubilize the resin in an organic developer, as a result, the contrast between the exposed area and the unexposed area was increased.

In particular, as apparent from comparison of Examples 106 and 116 with Comparative Examples 105 and 106 where positive development with an alkali developer was performed using the same resist compositions as in those Examples, a pattern with high resolution, high sensitivity and high LWR performance could be formed also in EUV exposure by employing the pattern forming method of the present invention using an organic developer. This is considered to result because as described above, in comparison with the case using an alkali developer, the capillary force imposed on the sidewall of the pattern was reduced due to use of an organic developer and in turn, the resolution, sensitivity and LWR performance were enhanced.

Incidentally, even when the resist compositions of Examples 101 to 128 containing the above-described acid-increasing agents were applied to ArF exposure and evaluated, high resolution, high sensitivity and high LWR performance were obtained similarly.

Furthermore, as understood from the evaluation results of, for example, Examples 111 and 113, when the resin contains a repeating unit having a plurality of aromatic rings, the resolution and LWR performance are more excellent. It is presumed that because the out-of-band light (leakage light generated in the ultraviolet region) in EUV was absorbed and adverse effects thereof (such as surface pattern roughness) were more suppressed.

Incidentally, also in the case of not performing the rinsing step, the same excellent effects as in Examples above are obtained.

INDUSTRIAL APPLICABILITY

According to the present invention, a pattern forming method, an actinic ray-sensitive or radiation-sensitive resin composition, and a resist film, ensuring that in the negative pattern formation by organic solvent development, high sensitivity, high resolution and excellent LWR performance are achieved, can be provided, and a manufacturing method of an electronic device using the same, and an electronic device, can be also provided.

This application is based on a Japanese patent application filed on Feb. 6, 2012 (Japanese Patent Application No. 2012-23386), and the contents thereof are incorporated herein by reference.

The invention claimed is:

1. A pattern forming method comprising:

(1) a step of forming a film by using an actinic ray-sensitive or radiation-sensitive resin composition containing (A) a resin containing an acid-decomposable repeating unit and being capable of decreasing the solubility for an organic solvent-containing developer by the action of an acid, (B) a compound capable of generating an acid upon irradiation with an actinic ray or radiation, (C) a compound capable of decomposing by the action of an acid to generate an acid, and (D) a solvent, (2) a step of exposing the film by using an actinic ray or radiation, and (4) a step of developing the exposed film by using an organic solvent-containing developer to form a negative pattern, wherein the content of the resin (A) is from 40 to 79 mass % based on the total solids content of the resin composition, the content of the compound (C) is from 2.7 to 11.6 mass % based on the total solids content of the composition, and the acid generated from the compound (C) is a sulfonic acid or a methide acid.

2. The pattern forming method as claimed in claim 1, wherein the compound (C) capable of decomposing by the action of an acid to generate an acid is a compound represented by any one of the following formulae (1) to (8):

Formula (1)

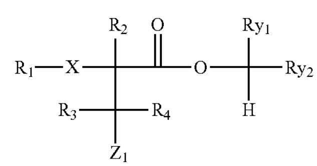

Formula (2)

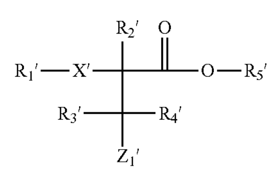

-continued

Formula (3)

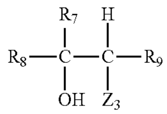

Formula (4)

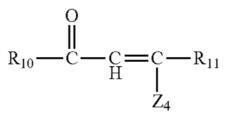

Formula (5)

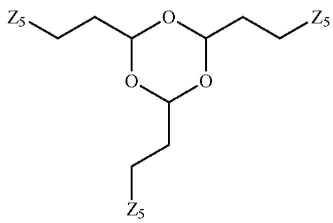

Formula (6)

$Rb—SO_2—O—R_{12}$

Formula (7)

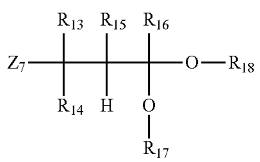

Formula (8)

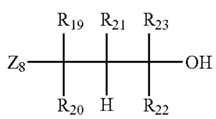

wherein in formula (1), $R_1$ represents an alkyl group, a cycloalkyl group, an alkoxy group, an aryl group or an aryloxy group, $R_2$ represents an alkyl group or a cycloalkyl group, $R_1$ and $R_2$ may combine to form a monocyclic or polycyclic cyclic hydrocarbon structure, each of $R_3$ and $R_4$ independently represents a hydrogen atom or an alkyl group, $Ry_1$ represents a hydrogen atom, an alkyl group, a cycloalkyl group, an alkoxy group, an aryl group, or an alkylene group combining with $Ry_2$, $Ry_2$ represents an aryl group or an aryloxy group, and X represents $—SO_2—$, —SO— or —CO—;

in formula (2), $R_1'$ represents an alkyl group, a cycloalkyl group, an alkoxy group, an aryl group or an aryloxy group, $R_2'$ represents an alkyl group or a cycloalkyl group, $R_1'$ and $R_2'$ may combine to form a monocyclic or polycyclic cyclic hydrocarbon structure, each of $R_3'$ and $R_4'$ independently represents a hydrogen atom or an alkyl group, $R_5'$ represents an aryl group-free group capable of leaving by the action of an acid, and X' represents $—SO_2—$, —SO— or —CO—;

in formulae (3) to (6),

Rb represents an alkyl group, a cycloalkyl group, an aryl group or an aralkyl group, $R_7$ represents a hydrogen atom, an alkyl group, a cycloalkyl group, an aryl group or an aralkyl group, $R_8$ represents an alkyl group, a cycloalkyl group, an aryl group or an aralkyl group, $R_9$ represents a hydrogen atom, an alkyl group, a cycloalkyl group, an aryl group or an aralkyl group, $R_9$ may combine with $R_7$ to form a ring, $R_{10}$ represents an alkyl group, a cycloalkyl group, an alkoxy group, an aryl group, an aralkyl group, an aryloxy group or an alkenyloxy group, $R_{11}$ represents an alkyl group, a cycloalkyl group, an alkoxy group, an aryl group, an aralkyl group, an aryloxy group or an alkenyl group, $R_{10}$ and $R_{11}$ may combine with each other to form a ring, and $R_{12}$ represents an alkyl group, a cycloalkyl group, an aryl group, an alkenyl group, an alkynyl group or a cyclic imide group;

in formulae (7) and (8), each of $R_{13}$ to $R_{16}$ and $R_{19}$ to $R_{23}$ represents a hydrogen atom or a monovalent substituent, each of $R_{17}$ and $R_{18}$ represents a monovalent substituent, and $R_{17}$ and $R_{18}$ may combine with each other to form a ring; and in formulae (1) to (5), (7) and (8), each of $Z_1$, $Z_1'$, $Z_3$, $Z_4$, $Z_5$, $Z_7$ and $Z_8$ is independently a group represented by any one of the following formulae (Z-a) and (Z-d), and each $Z_5$ may be the same as or different from every other $Z_5$:

(Z-a)

$Rb_1—SO_3—$ (Z-d)

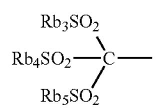

wherein in formulae (Z-a) and (Z-d), $Rb_1$ represents an organic group, each of $Rb_3$, $Rb_4$ and $Rb_5$ independently represents an organic group, and $Rb_3$ and $Rb_4$ may combine to form a ring.

3. The pattern forming method as claimed in claim 2, wherein in formulae (1) to (5), (7) and (8), each of $Z_1$, $Z_1'$, $Z_3$, $Z_4$, $Z_5$, $Z_7$ and $Z_8$ is independently a group ($Rb_1—SO_3—$) represented by formula (Z-a).

4. The pattern forming method as claimed in claim 2, wherein the compound (C) capable of decomposing by the action of an acid to produce an acid is a compound represented by formula (1), (2), (7) or (8).

5. The pattern forming method as claimed in claim 2, wherein the compound (C) capable of decomposing by the action of an acid to generate an acid is a compound represented by any one of the formulae (1), (3) to (6), and (8).

6. The pattern forming method as claimed in claim 1, wherein the resin (A) further contains a repeating unit having a polar group.

7. The pattern forming method as claimed in claim 6, wherein the polar group is selected from a hydroxyl group, a cyano group, a lactone group, a carboxylic acid group, a sulfonic acid group, an amide group, a sulfonamide group, an ammonium group, a sulfonium group, and a group formed by combining two or more thereof.

8. The pattern forming method as claimed in claim 1, wherein the resin (A) further contain a repeating unit having an acidic group.

9. The pattern forming method as claimed in claim 8, wherein the acidic group is a phenolic hydroxyl group, a carboxylic acid group, a sulfonic acid group, a fluorinated alcohol group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group or a tris(alkylsulfonyl)methylene group.

10. The pattern forming method as claimed in claim 1, wherein the actinic ray-sensitive or radiation-sensitive resin composition further contains a hydrophobic resin.

11. The pattern forming method as claimed in claim 1, wherein the exposure is an exposure to an electron beam, an X-ray or EUV light.

12. The pattern forming method as claimed in claim 1, which is used for making a semiconductor fine circuit.

13. A method for manufacturing an electronic device, comprising the pattern forming method claimed in claim 1.

14. The pattern forming method as claimed in claim 1, wherein the acid generated from the compound (C) is a sulfonic acid.

* * * * *